United States Patent
Holman et al.

(10) Patent No.: US 7,072,096 B2
(45) Date of Patent: Jul. 4, 2006

(54) UNIFORM ILLUMINATION SYSTEM

(75) Inventors: Robert L. Holman, Evanston, IL (US);
Arthur Cox, Park Ridge, IL (US)

(73) Assignee: Digital Optics International, Corporation, Evanston, IL (US)

( * ) Notice: Subject to any disclaimer, the term of this patent is extended or adjusted under 35 U.S.C. 154(b) by 167 days.

(21) Appl. No.: 10/319,800

(22) Filed: Dec. 13, 2002

(65) Prior Publication Data

US 2004/0080938 A1    Apr. 29, 2004

Related U.S. Application Data

(60) Provisional application No. 60/340,453, filed on Dec. 14, 2001.

(51) Int. Cl.
| | |
|---|---|
| G02F 1/29 | (2006.01) |
| G02F 1/1335 | (2006.01) |
| G02B 27/14 | (2006.01) |
| G03B 21/60 | (2006.01) |
| F21V 13/00 | (2006.01) |

(52) U.S. Cl. ............ 359/298; 359/618; 359/619; 359/621; 359/631; 359/634; 359/457; 359/599; 362/243; 362/328; 362/331; 349/62; 349/65; 349/9; 353/20; 353/31; 353/94; 385/4

(58) Field of Classification Search ............ 359/618, 359/619, 621, 622, 623, 624, 625, 631, 633, 359/634, 501, 298, 457, 599; 385/4; 362/243, 362/242, 31, 245, 328, 331; 349/9, 62, 65, 349/112, 64, 66; 353/20, 31, 33, 34, 94
See application file for complete search history.

(56) References Cited

U.S. PATENT DOCUMENTS

| | | | | |
|---|---|---|---|---|
| 6,402,325 B1 * | 6/2002 | Yamamoto | .......... | 353/94 |
| 6,421,103 B1 * | 7/2002 | Yamaguchi | .......... | 349/61 |
| 6,442,124 B1 * | 8/2002 | Chung et al. | .......... | 369/112.07 |
| 6,480,634 B1 * | 11/2002 | Corrigan | .......... | 385/4 |
| 6,527,410 B1 * | 3/2003 | Yamaguchi | .......... | 362/243 |
| 6,630,968 B1 * | 10/2003 | Tsuchihashi et al. | .......... | 349/65 |

* cited by examiner

*Primary Examiner*—Loha Ben
(74) *Attorney, Agent, or Firm*—Michael D. Rechtin; Foley & Lardner LLP

(57) ABSTRACT

A compact and efficient optical illumination system featuring planar multi-layered LED light source arrays concentrating their polarized or un-polarized output within a limited angular range. The optical system manipulates light emitted by a planar light emitters such as electrically-interconnected LED chips. Each light emitting region in the array is surrounded by reflecting sidewalls whose output is processed by elevated prismatic films, polarization converting films, or both. The optical interaction between light emitters, reflecting sidewalls, and the elevated prismatic films create overlapping virtual images between emitting regions that contribute to the greater optical uniformity. Practical illumination applications of such uniform light source arrays include compact LCD or DMD video image projectors, as well as general lighting, automotive lighting, and LCD backlighting.

71 Claims, 85 Drawing Sheets

FIG. 18D.
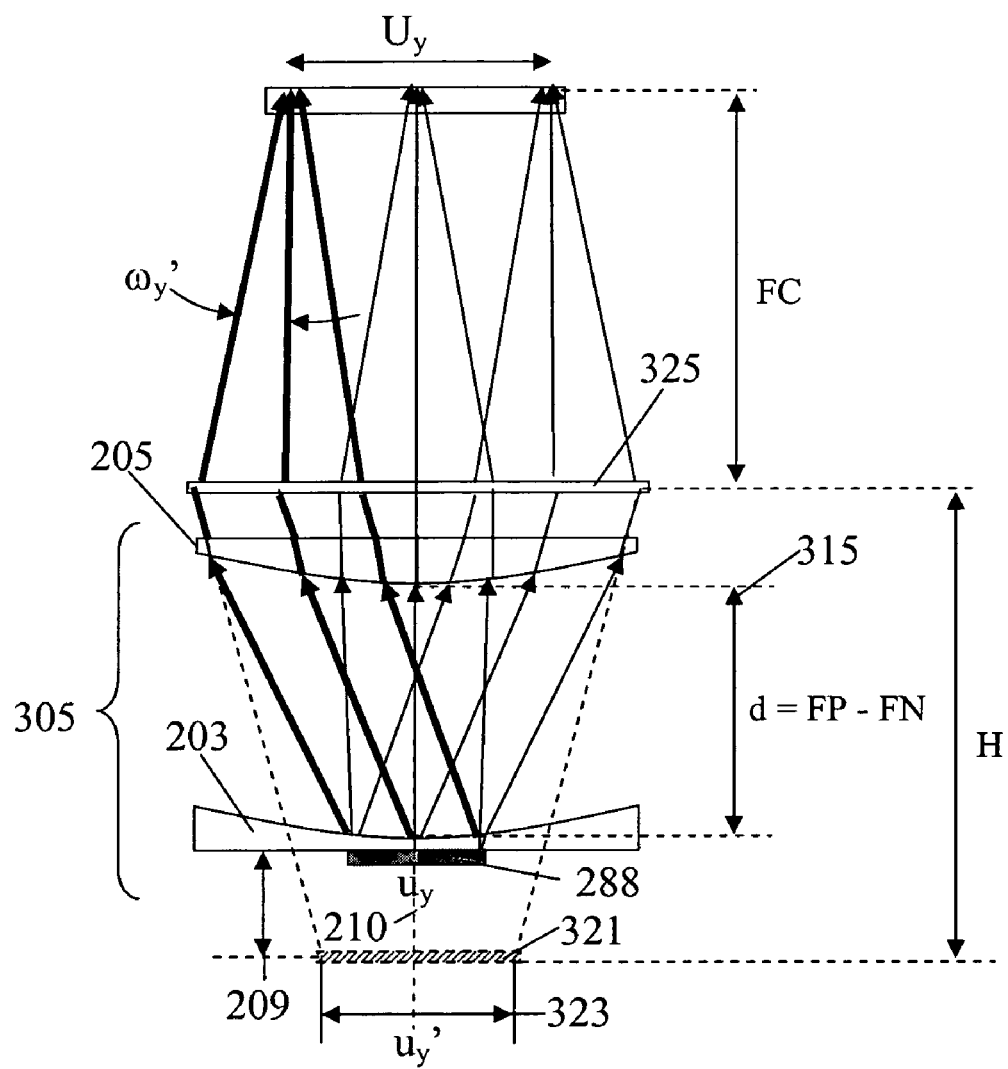

UNIFORM ILLUMINATION SYSTEM

CROSS-REFERENCE TO RELATED PATENT APPLICATIONS

This application is a Non-Provisional of U.S. Application 60/340,453, filed Dec. 14, 2001, incorporated herein by reference in its entirety.

BACKGROUND OF THE INVENTION

The present invention is concerned generally with a thin and compact multi-layered optical system and method for generating well-organized output illumination from a spatially discontinuous one or two-dimensional array of discrete emitters, the output light emanating from one (or opposing sides) of the multi-layered system, uniformly over the system's aperture. The field of illumination produced by the optical systems containing these emitting arrays is rendered visually featureless so as to provide useful rear-illumination for an image to be viewed directly, an illuminating beam for an image to be projected onto a screen, or the illumination itself may be composed of an array of seamlessly arranged and controlled image pixels, the sum of which at any instant forming a spatially modulated image to be viewed directly. The field of even illumination so produced may also be used as a means of general illumination. More particularly, the multi-layer optical system that achieves this favorable performance uses a sequence of at least two optical light directing layers positioned relative to the emitting array surface or surfaces, these layers located at a preferred elevation above the discontinuously emitting source array, the layer constructions designed to even-out the light source array's brightness uniformity and color on the system's output aperture or output screen, and in doing so, form a uniform beam of light. An additional purpose of these precisely elevated optical layers is to establish a fixed angular range for the beam of emitted light. The system's first (and in some cases second) light manipulating layer is designed in such way that it shifts and expands the spatial distribution of input light so as to minimize brightness variations presented to subsequent layers and output screens. The related layer or layers, in configurations that need them, can be conventional light spreading materials such as holographic diffusers, lenticular diffusers, lens arrays, bulk or surface scattering diffusers, opal glass, or ground glass. The related layer or layers can also be a reflective polarizer that holds light of one polarization state within the light source structure until it converts to light of the orthogonal polarization. A base-diffusing layer, positioned just above the light source's emitting plane is added in some applications to introduce additional randomization.

Currently available illumination systems capable of achieving equivalent brightness uniformity using only conventional diffusers do so either less efficiently (in terms of brightness), in a thicker package, or both.

Such improved illumination systems are of primary interest for the projection of images onto screens from such spatial light modulators as reflective and transmissive LCDs and DMDs. Such improved illumination systems are also of interest for the backlighting of LCD screens, where illumination uniformity must be of extremely high quality without sacrificing any amount of brightness or compactness. LCD applications require the highest possible brightness combined with the thinnest possible packaging. Improved illumination systems are also of interest for backlighting passive appliqués used in a myriad of high brightness signage and display applications, including for example, one and two sided EXIT signs. Other applications for such improved illuminations systems include theatrical lighting, automotive headlights, safety warning lights, and certain traffic signals and alerts.

These improved illumination systems are also of interest for their intrinsic ability to display images directly, when the light source involved is made as a discontinuous array of individually-addressed light emitting regions or pixels whose boundaries are not contiguous, but when the multi-layer optical system achieves their seamless arrangement, so as to create an image characterized by both evenness of pixel illumination and maximization of pixel density.

SUMMARY OF THE INVENTION

It is, therefore, an object of the invention to provide an improved illumination system and method of use.

It is another object of the system to provide a novel light source panel system and method for providing efficient and homogeneous rear illumination for such images as those represented by LCD screens.

It is a further object of the invention to provide a novel light source panel system and method for providing efficient and homogeneous rear illumination for the stencils and appliqués used in commercial signage, including potentially "exit signs" and various traffic control signs and announcements.

It is still another object of the invention to provide a novel light source panel system and method for providing an efficient and homogeneous beam of directional illumination to LCD and DMD spatial light modulators within compact video projection systems.

It is an additional object of the invention to provide a novel light source panel system and method for providing a uniformly consolidated light beam from a regular array of substantially square emitting regions such that each emitting region is converted into a virtual emitting square up to twice the width on each edge as the original emitter, and the emitting regions spaced from each other so that the resulting virtual emitter array appears to be filled with substantially contiguous virtual images whose overall aperture appears to emit a directional beam of high uniformity.

It is still another object of the invention to provide a multi-layered packaging means for a novel light source panel structure containing a sparse two dimensional array of light emitting diode chips on a layer that provides for external electrical interconnections to the diodes, and that isolates one or more diode chips within separate diffusely reflecting compartments, the compartments themselves arranged in a two-dimensional array that is covered with a stack of optical layers, one of which is a mechanical spacer that allows light transmission from each compartment to reach two light directing layers that include linear arrays of prism-like grooves made in a clear plastic material, the grooves in each layer aligned at 90-degrees to one another.

It is also an object of the invention to provide a multi-layered packaging means for a novel light source panel structure containing a sparse two dimensional array of single-colored light emitting diode chips on a layer that provides for external electrical interconnections to the diodes, and that isolates each chip within a separate diffusely reflecting compartment, the compartments forming a two-dimensional array with diffusely reflecting spaces between the compartments being between 0.5 and 1.0 times the width of the compartment, the compartments covered with a stack of optical layers, one of which is a transparent spacer allowing light from each compartment to two light directing layers that include linear arrays of prism-like grooves made in a clear plastic material, the grooves aligned at 90-degrees to one another.

It is yet another object of the invention to provide a novel manufacturing method for multi-layer light source panel structures wherein a very large area single lamination of thin multi-layer sheets, including a regular two-dimensional array of bonded light emitting diodes separated from and laminated to a series of light directing layers by an exact spacer thickness, so that the large area lamination can be subsequently sectioned into individual light source panel devices, each containing a constituent array of light emitting diodes and the common multi-layer optical and mechanical structure, where the size and shape of the yielded light source panels is predetermined by the electrical interconnection design.

It is still a further object of the invention to provide a novel means for integrating three separate primary colored light source panels, one each of red, green and blue, into three panel reflective LCD video projection systems, one LCD for each primary color, each light source panel within a reflective non-imaging angle transforming system comprising an LCD, a polarizing beam-splitter, a wide band quarter wave phase retardation film, a concave metallic reflective surface, and a negative field lens.

It is still a further object of the invention to provide a novel means for integrating three separate primary colored light source panels, one each of red, green and blue, into three reflective LCDs, one LCD for each primary color, each light source panel placed within a reflective non-imaging angle transforming system comprising either a reflective or transmissive LCD, a polarizing beam-splitter, a wide band quarterwave phase retardation film, and either a concave metallic reflecting surface or a positive condensing lens, and a negative field lens.

It is yet still a further object of the invention to to provide a novel means for integrating three separate primary colored light source panels, one each of red, green and blue, into three reflective LCDs, one LCD for each primary color, each light source panel on adjacent input faces of a dichroic color mixing system, each corresponding LCD on the corresponding adjacent input faces of a different dichroic color mixing element, each color mixing element on adjacent faces of a polarizing beam splitter, the light source panels facing the combination of a mirror and quarterwave film, the LCDs facing a projection lens.

It is an additional object of the invention to provide a novel means for integrating three separate primary colored light source panels, one each of red, green and blue, into three transmissive LCDs, one LCD for each primary color, each light source panel placed within a transmissive non-imaging angle transforming system each comprising a transmissive LCD and a positive condensing lens system, each LCD on adjacent faces of a color mixing system whose fourth face faces a projection lens.

It is yet one more object of the invention to provide a novel means for integrating three separate primary colored light source panels, one each of red, green and blue, into a single transmissive LCD operated color field sequentially, each light source panel output coupled through three adjacent input faces of a dichroic color mixing system by a positive condensing lens system placed near each face, with the system's forth face adjacent to the LCD and facing a projection lens.

It still yet another object of the invention to provide a novel means for integrating three separate primary colored light source panels, one each of red, green and blue, so that the combined output passes into a single LCD operated in a color field sequential manner, with each light source panel on the three adjacent input faces of a dichroic color mixing system whose whose output face provides input for a polarizing beam splitter system whose two opposing faces are occupied by a combination of concave metallic reflecting mirror, quarterwave films, and a metallic mirror plane, and beyond whose fourth or output face resides the LCD and a projection lens.

It is also an additional object of the invention to provide a novel means for integrating three separate primary colored light source panels, one each of red, green and blue, so that the combined color sequential output passes into a single LCD operated in a color field sequential manner, with each light source panel on the three adjacent input faces of a dichroic color mixing system and the combined output passing through a positive condensing lens system, the transmissive LCD and a projection lens.

It is also an object of the invention to provide a novel means for integrating three separate primary colored light source panels, one each of red, green and blue, each light source panel on the three adjacent input faces of a dichroic color mixing system so that the combined color sequential output passes outwards from the output face of the color mixing system through a positive condensing lens system and a right angled prism into a reflective color field sequential digital micro-mirror device, with its reflected output passing in turn through a second prism and a projection lens.

It is still another object of the invention to provide a novel means for integrating three separate primary colored LED-based angle-transforming reflector systems, one each of red, green and blue LEDs, each angle-transforming reflector system's output aperture located on the three adjacent input faces of a dichroic color mixing system so that the combine output passes through a fourth face of the mixing system.

It is a further object of the invention to provide a novel means for combining as a single electrically-controllable output beam, the light beams from three separate primary colored LED-based light source systems, one each of red, green and blue LEDs, each of whose planar output apertures are located on three input faces of a dichroic color mixing system so that the beams spatially overlap each other through a fourth face of the dichroic mixing system.

It is an additional object of the invention to provide a novel means for combining as a single output beam whose color is electrically adjustable by means of control signals from a micro-processor and when necessary, an external sensor, the light beams from three separate planar primary colored LED-based light source systems, one each of red, green and blue LEDs, each of whose output apertures are located on three input faces of a dichroic color mixing system so that the beams spatially overlap each other through a fourth face of the dichroic mixing system and a positive or negative lens system so that the color adjustable output is suitable for automotive head lighting, stage and event lighting street lighting, traffic lighting or task lighting.

It is also an object of the invention to provide a novel means for coupling the color-mixed output beam from the output face of a dichroic color mixing system through an angle transforming light pipe or light pipes so as to produce suitable input light for a conventional dot-pattern light pipe type backlight, such as those used to provide rear illumination for directly-viewed LCD panels.

It is still an additional object of the invention to provide a novel means for using an LED containing planar light source array whose array elements include all white LEDs or a mixture of red, green and blue LEDs in conjunction with a lens or system of lenses so as to evenly illuminate an essentially square or rectangular target, such as in interior task lighting of a desk or table surface or as in the exterior lighting of of a designated area.

It is yet another object of the invention to provide an improved system and a method for diffusing the inhomogeneous light emitted by a two-sided discontinuously emitting array, such that the dimmer regions in between the more strongly emitting regions of the array are strengthened in light intensity in part by the refracting action of the pre-diffuser, whose unique elevation above the emitting array is specifically chosen for optimum output uniformity.

It is yet another object of the invention to provide an improved system and a method for diffusing the inhomogeneous light emitted by a two-sided discontinuously emitting array, such that the dimmer regions in between the more strongly emitting regions of the array are strengthened in light intensity in part by the refracting action of the pre-diffuser, whose unique elevation above the emitting array is specifically chosen for optimum output uniformity.

It is a further object of the invention to provide an improved system and a method for homogenizing the uneven light distribution of a double-sided discontinuously emitting source, using a sheet consisting of linear micro prisms (or prism-like elements) formed in an array and positioned a fixed elevation above the emitting source.

It is yet another object of the invention to provide an improved system and a method for homogenizing the uneven light distribution presented by a discontinuous two-dimensional array of light emitting diodes or regions containing light emitting diodes, each diode (or diode containing region) having length and width W, and equal separation from adjacent regions, W (or less than W), by using two parallel but orthogonal sheets of linear micro prisms, the exact elevation of these sheets from the emitting plane set approximately at height generally between W and 0.5 W, so as to produce maximum evenness of output brightness within the output beam so created.

It is still another object of the invention of provide an improved system and a method for homogenizing the uneven light distribution presented by a two-dimensional array of light emitting diodes, each diode contained in a separate emitting cavity whose output aperture is separated from two parallel but orthogonal sheets of linear micro prisms, the separation created by a spacer layer composed of an array of reflecting cavities of specified sidewall slope.

It is still another object of the invention of provide an improved system and method for homogenizing the uneven light distribution presented by a two-dimensional array of light emitting diodes, each diode contained in a discrete commercial package, each package separated from each other by a space equal to or less than the width of the package, and whose output apertures are covered with a diffusing material, the array separated from two parallel but orthogonal sheets of linear micro prisms by a transparent spacer layer of thickness falling generally between 0.5 and 1,0 times the width of the packages in the array.

BRIEF DESCRIPTION OF THE DRAWINGS

FIG. 18D illustrates one cross-sectional meridian view of the single colored reflective non-imaging angle transformer shown in FIG. 18B with the angle modifying means of FIG. 18C integrated as a single cylindrical negative lens element and a biconically shaped concave metallic reflecting surface.

FIG. 71 illustrates the general type of brightness uniformity created by the prism array in a multi-level illumination system of FIG. 1 when emitter separations are made about half the emitting width W, and prism elevation above the emitters is adjusted for image displacements of less than W/2.

FIG. 72 illustrates the general type of brightness uniformity with the conditions of FIG. 71, but where there is also an intrinsic brightness fall off near the emitting element edges.

FIG. 73 shows the maximum to minimum brightness ratio as a function of the virtual image shift, Δ, associated with prism elevation for an array of 8 mm wide emitters, each showing a sinusoidal brightness falloff from center to edge, as a function of the spacing between emitters in the array.

FIG. 74 shows the maximum to minimum brightness ratio as a function of virtual image shift, Δ, for an array of 12 mm wide emitters, each showing a sinusoidal brightness falloff from center to edge.

Figure 75:
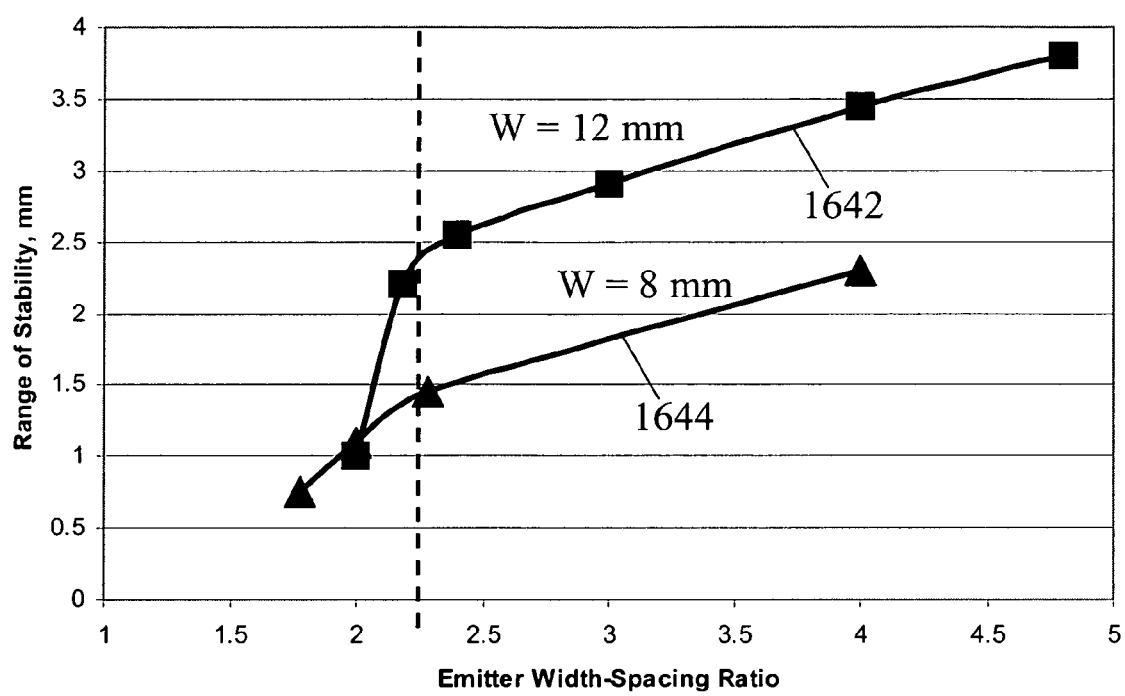

FIG. 75 shows the range of stability in millimeters for output brightness smoothness in a multi-level illumination system with 8 mm and 12 mm wide emitters at various emitter width-to-spacing ratios between 1.5 and 5.

DETAILED DESCRIPTION OF THE PREFERRED EMBODIMENTS

One form of the present invention involves the use of a stack of light directing layers disposed above a plane of separated emitters arranged either as an array of parallel stripes or as a two-dimensional array of bounded emitting regions such that a directed output beam of even uniformity is created as if from a continuous emitter of area equal to that to the output aperture. One (or two) of the light directing layers are prism sheets whose geometry and elevation above the plane of emitters is chosen uniquely so as to create the required overlap and diffusion of emitter images.

Figure 1:
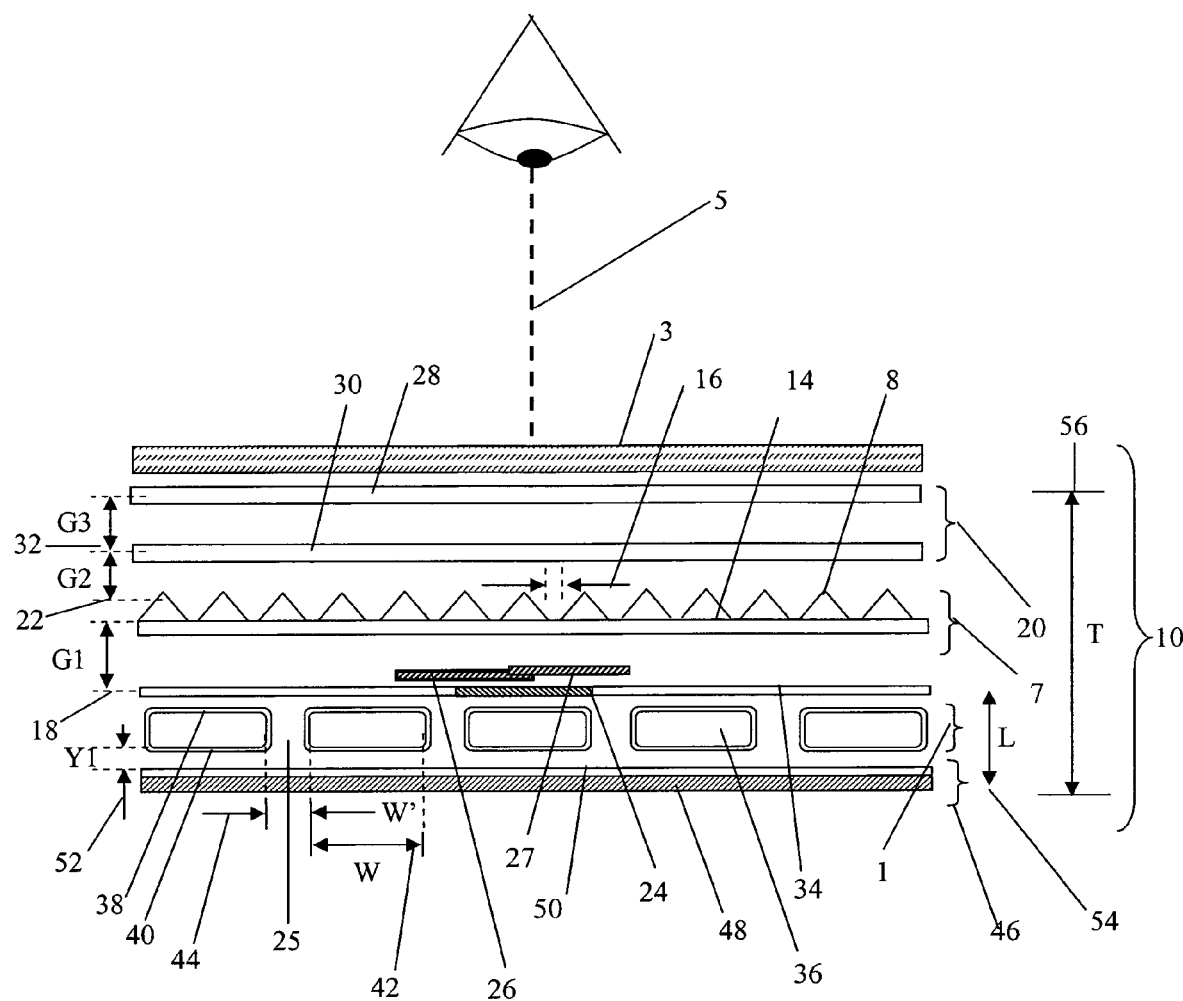
FIG. 1 illustrates a side view of a multi-layered light source panel optical system for a one-dimensional array of discrete surface emitting light channels (rods, tubes, plane surfaces) including an elevated prismatic light directing film and an elevated light scattering film arranged to provide uniform illumination for the image formed by a directly viewed spatial light modulator or other transparent image element.

An optical system constructed in accordance with one principal form of the invention is indicated generally in FIG. 1 and represents a side elevation. The optical system 10 embodies a structure and method, which uses various optical elements, disposed in a compact geometry relative to an intrinsically discontinuous light source 1 formed by an array of emitters, and manipulates this light to generate uniform output illumination over a wide range of illumination directions on an output screen 28 placed the minimum possible distance from the plane of light source 1. Light from this output screen then provides the required even field of featureless back illumination, either continuously white in color, or pulsed rapidly and sequentially in periods of red, green and blue emission for a directly viewed image display device 3 placed against it, device 3 which may be a spatial light modulator (SLM) image display such as a conventional liquid crystal display ("LCD") imaging device or other active image display devices that do not generate light of their own but rather modulate brightness of the tiny component parts of the image known as pixels. The image display device 3 may also be any one of a variety of passive or static image sources such as photographic transparencies, wherein for example the system 10 can be used as an improved illuminator for medical x-ray films.

The behavior of the system of FIG. 1 and that of each of its elements is described in greater detail below. In summary, the height of prism sheet 7 is used to form overlapping virtual images 26, 27 of the output plane 34 of light source 1. Light from the overlapping emitter images is then used to fill in the non-emitting spaces 25 between emitters as evenly as can be arranged, and thereby reduce the maximum and minimum brightness that would otherwise be observed. Subsequent conventional light scattering layers 28 and 30 are elevated above the vertex points 12 of the image-displacing prism array 7 by distances G2 and G2+G3 respectively to add further spatial mixing to the result and also to widen the range of output angles that exit the effective output screen 28. As will be shown below, the exact height of the prism sheet 7 above the output plane 34 of light source 1, whether this is the discrete emitting channels themselves, or a diffusively scattering layer above the emitters, depends on the geometry of the prism units and on the degree of image displacement that is desired. The prism's apex angle and size can each be varied so that the distance 18, G1, is the smallest possible, which in some cases might be zero.

Back-reflector 46 in FIG. 1 is composed of a metal or plastic support substrate 48, a reflecting layer 50 which may be diffusely reflecting, and a gap 52, whose medium (air or dielectric) and thickness 52 are adjusted to provide a balanced transfer of back-reflected light back through the channels and through the non-emitting gaps 25. When the support substrate 48 is an electrically conductive one, it becomes a capacitive part of the electrical equivalent circuit of light source 1. When the support substrate 48 is a thermally conductive one, it equalizes the distribution of heat throughout the lamp in a manner that has become traditional in many light source systems when spatial light modulator 3 is an LCD screen. The conductive plane provides a means for preventing LCD image contrast changes caused by its exposure to local heating. When the support substrate 48 is an electrical ground plane, the purpose of separation distance 52 is also to prevent (or minimize) electrical power losses to ground from leakage of the current flowing in light source 1 through the plane's distributed capacitance. This plane can also be used to isolate electronics used to control the spatial light modulator 3 from the electrical drive fields of light source 1. Generally, the performance of this conducting plane 48 is maximized when made of the most electrically conductive metals such as stainless steel and aluminum. The diffusely reflecting layer can be any material loaded with highly reflective white light scattering particulates such as those plastic sheets called REFWHITE manufactured by Kimoto Co., LTD. of Japan.

The prism sheet 7 may be one of the 90-degree offerings manufactured by the Minnesota Mining & Manufacturing Company (3M) under the trade name BEF, as in brightness enhancement film. The prism sheet 7 may also be a more specifically suited custom designed prism array molded, embossed or cast in an optically transparent material such as acrylic, polyester or polycarbonate, wherein the apex angle of the prism is not 90 degrees, but rather an angle matched to the exact performance required, and perhaps the prism shape modified, as described below, to fine tune the particular image displacement characteristics needed. Since direct view of the prisms themselves is obscured from view by the diffusive layers 20 the width of the prisms, any cosmetic defects on their surfaces and any dead space 16 between the individual elements, is cannot be seen. Widespread commercial applications of 3M's BEF products in backlit LCD screen systems place the BEF sheets just behind the LCD screen, where any discontinuities or defects in its optical performance are seen directly, even through weak diffuser sheets. Consequently, those principally brightness enhancing features of the 3M prism sheet materials require extreme levels of cosmetic perfection in both manufacturing and handling.

For practical applications, the total system 10 thickness 56, T, in FIG. 1, G3+G2+G1+L, is made the smallest possible commensurate with suppressing visibility of the discontinuous nature of light source 1. A practical example will be given further below for a new flat, parallel-emitting-channel fluorescent lamp developed by Corning, Inc.

Figure 2:
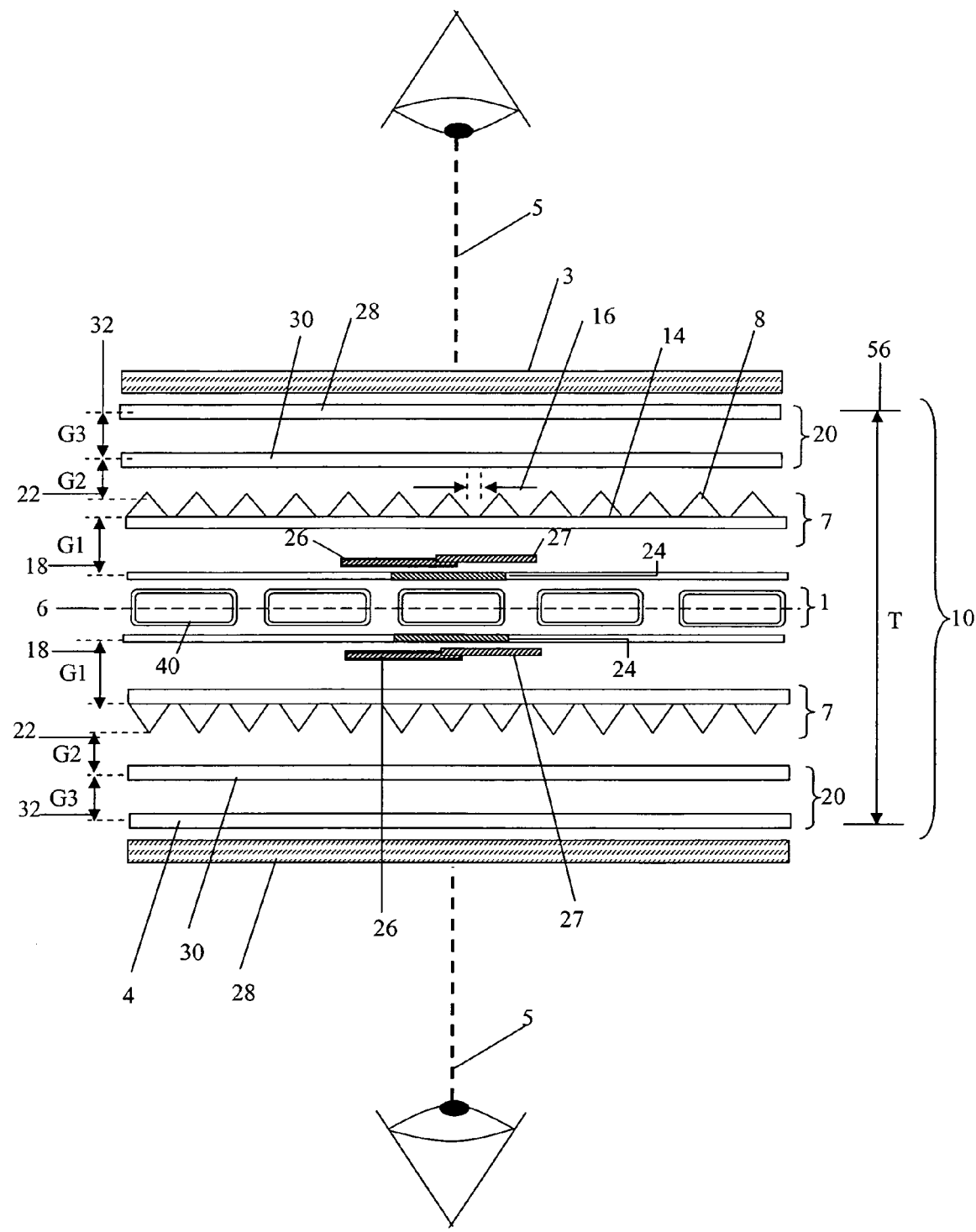
FIG. 2 illustrates a side view of a multi-layered light source panel optical system for a one-dimensional array of discrete surface emitting light channels (rods, tubes, plane surfaces) including elevated prismatic light directing films and light scattering films arranged on both sides of the light emitting array to provide uniform illumination to directly-viewed images formed on either side of the illuminator.

Another embodiment of the invention of FIG. 1 is given in FIG. 2, which also represents a side elevation. In this case, the single light source 1, which as above emits light from its entire internal surface, in both forward and rearward directions, does so surrounded by a completely symmetric image display system 10 featuring both forward and rearward spatial light modulators 3 and 4 positioned on opposing sides of light source 1, each with its own interior and exterior intervening diffusing layers 20. The result is a particularly thin two-sided display device whose bright and uniformly illuminated images can be seen from either side. In this case, half the total lumens produced by the light source are routed through each side's set of intervening multi-layers 7 and 11.

The configuration of FIG. 2 is exactly that of FIG. 1 with its structure disposed symmetrically on each side of the system's mirror plane 6. Virtually identical emitting patterns 24 are produced on the outermost light scattering surfaces 34 of light source 1, and it is these light patterns that are displaced as virtual images 26 and 27 by the prism sheets 7, governed by their apex angles 8 and their relative heights (G1) 18 above the object planes 34. In this two-sided structure, any light reflected back towards light source 1 by the upper prism sheet 7 is either re-scattered by the upper side of light source 1 or transmits through light source 1 and becomes a part of the light emitted by the lower side of light source 1.

Practical applications of this double-sided invention format include two-sided televisions, two-sided desktop computer monitors, two-sided commercial signs such as "EXIT" signs, and two-sided passive signs displaying a different message depending on the side viewed.

A two-dimensional emitting array is formed by arranging rows and columns of discrete square (or rectangular) emitting apertures, as opposed to the rows of one-dimensional emitting stripes involved above. In this case, the discrete emitting regions are separated from each other by non-emitting regions, and the need is for a means to provide light evenly distributed over the entire array aperture. Such means is provided in the present invention by a bi-layered extension of the elevated single prism sheet method of FIGS. 1 and 2, as well as by arrays of discretely tapered micro reflectors. Both two-dimensional approaches couple light collected from the discrete emitting elements in the array to a collective and spatially unified output beam that appears to have come from a single output aperture encompassing the entire array.

A. Prism Sheet Elevation and Virtual Image Displacement

The precise elevation of two orthogonal prism sheet layers 58 and 60 is applied to create a two-dimensional array of virtual images, four virtual emitter images associated with every emitting object in the underlying emitting array. By taking this bi-layered, rather than mono-layered prism sheet approach, a completely contiguous output array of emitter images can be achieved without any appreciable non-emitting regions between them. As one example, square emitters, W millimeters on a side, separated from each other by non-emitting gaps W millimeters wide are so converted into a contiguous array of W millimeter square emitter images, each conveying about a quarter of the original light flux emitted (less the transfer efficiency of the light through the two prism layers 58 and 60). Moreover, this organized output light is constrained to a concentrated range of output angles characteristic of the prism geometries used within each prism sheet, and relatively independent of the considerably wider angular range of input light emitted. In this manner, an emitting array whose original emitting area is only 25% of the overall array aperture, converts to an output array whose emitting area becomes 100% of the overall array aperture, and whose emission is contained within a reduced range of emission angles. The practical advantages of beams with such uniformity and directionality will be illustrated in a set of examples to follow below.

This bi-layer prism sheet approach is implemented in one of two illustrative two-dimensional configurations related to the one-dimensional method of FIG. 1. A first approach, shown schematically in FIG. 3 relays the contiguous virtual images created by the two elevated prism sheets to the output plane by means of an array of micro lenses. A second approach, generally preferable to the first with regard to compactness, is illustrated schematically in FIG. 7, and uses the two prism sheets alone, with light projecting outwards to the output plane from the underlying virtual images themselves. The spatial relationship between the virtual images created by any given emitting aperture is illustrated graphically in FIG. 4. One example of a compartmentalized spacer layer between the emitting array and the prism sheets, showing one isolated compartment per emitter, is conveyed in FIG. 5. Then, the form of a tool enabling fabrication of this spacer layer is given in FIG. 6.

B. Tri-Layered Prism Sheet Illuminator

Figure 3:
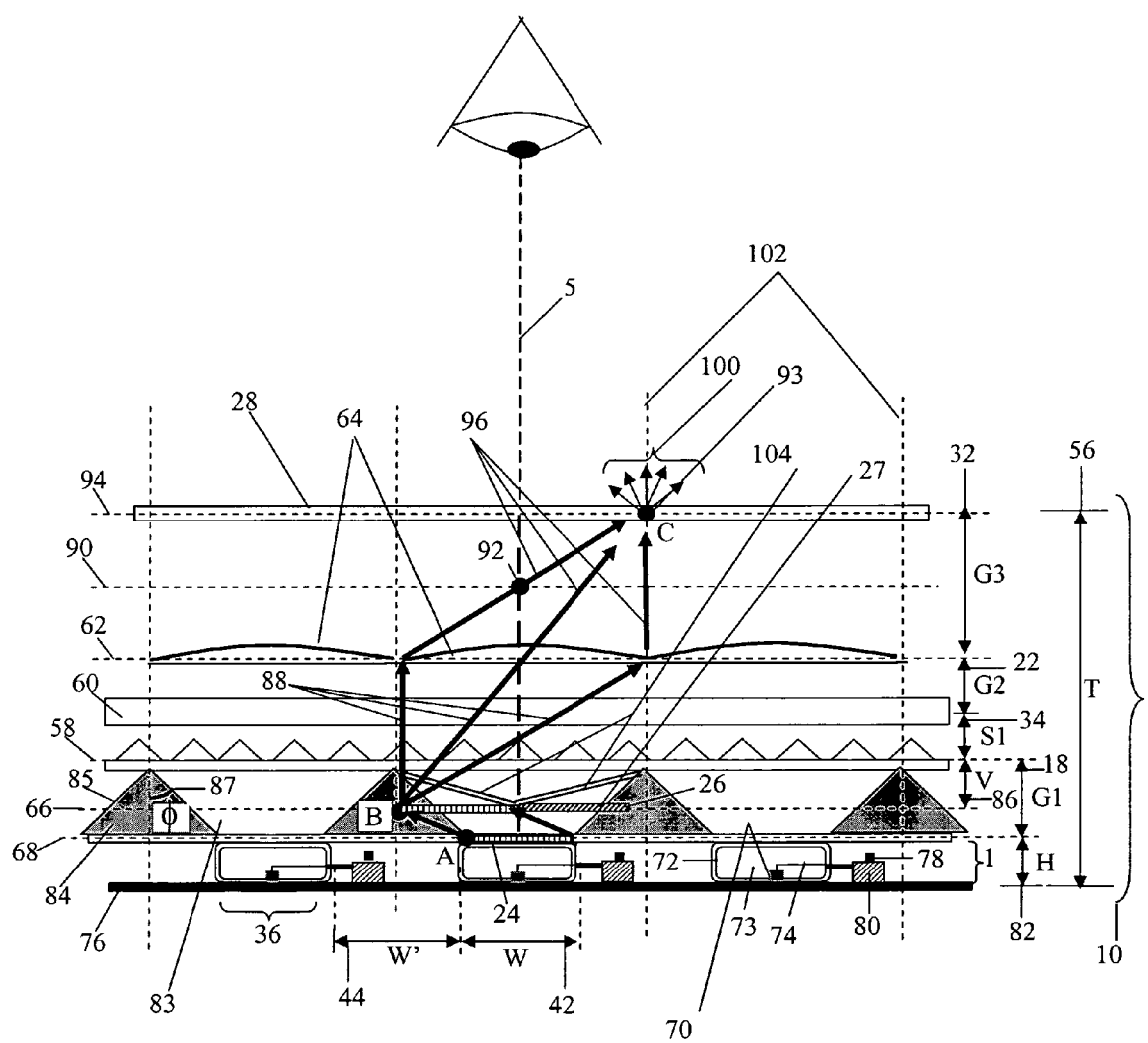
FIG. 3 illustrates a side view of a multi-layered light source panel optical system for a two-dimensional array of discrete light emitting apertures separated from one another by a diffusely reflecting, non-emitting regions beneath two elevated layers of prismatic light directing film oriented with orthogonal groove axes, covered by an elevated lens array having one lens element per emitting region and a light scattering layer.
Figure 4:
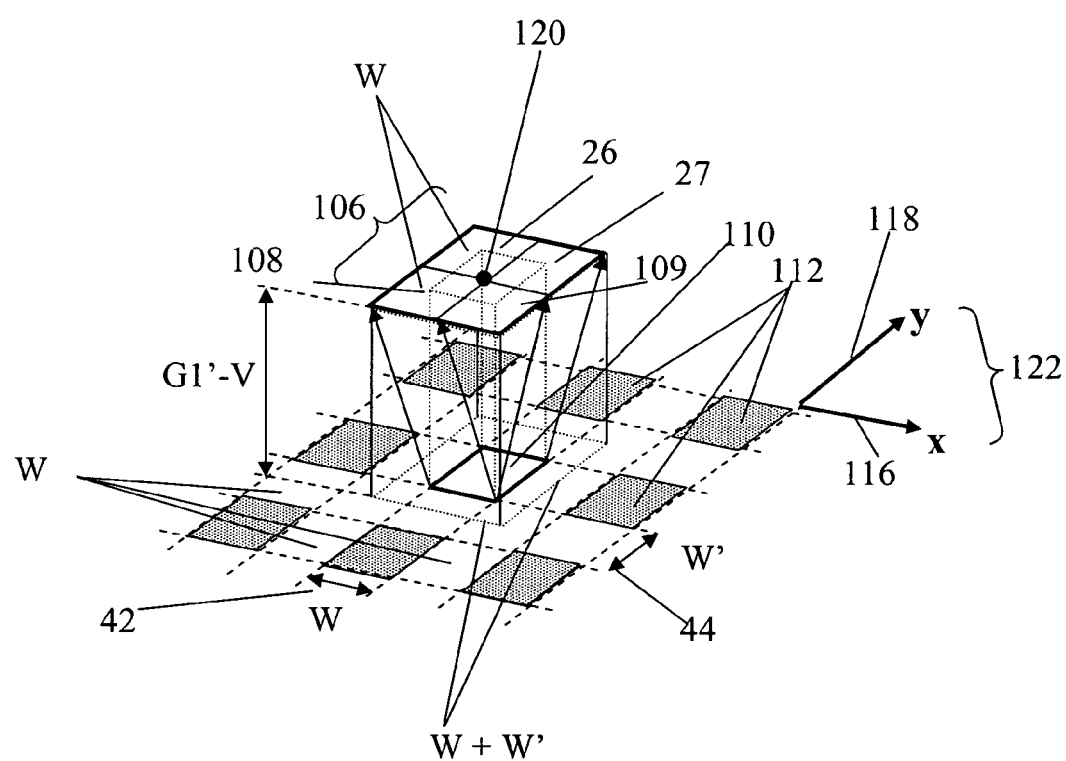
FIG. 4 illustrates a perspective view of a two-dimensional plane of emitting apertures and how the two properly-elevated prismatic light directing layers above them, as in FIG. 3 form a virtual image plane with four nearly-contiguous virtual images related to any given emitting aperture.

A cross-sectional view is given in FIG. 3 of one two-dimensional multi-layered emitting array consisting of two prism sheet layers and one micro lens layer. In this example, output screen 28 is arranged to display a contiguous or slightly overlapping array of well-defined and controllable image (or illumination) elements (sometimes referred to equivalently as pixels) that result from the system's manipulation of light from, in this case its two-dimensional array of individually controlled emitting entities 72 whose square (or rectangular) emitting apertures 24 form the base layer of light source 1. Two prism sheets, 58 and 60, are used in tandem, both sets of prism vertices pointing towards the viewer, with the planar axis of each sheet (x axis 116 for sheet 58 and y axis 118 for sheet 60) made perpendicular to each other and the relative spacings G1' and S1, 19 and 34, adjusted so that, as shown in the cross-sectional perspective of FIG. 3, two orthogonal sets of shifted virtual images 106 are created, thereby converting every emitting area 110 into a cluster 106 of four essentially contiguous virtual images 26, 27, 108, and 109 of the original emitting region 110 (shown more clearly in the perspective drawing of FIG. 4). In this case, the lower prism sheet 58 creates a pair of shifted virtual images 26 and 27 in the plane of the cross-section in FIG. 3 and similar to those described in FIG. 1, while the upper prism sheet 60 splits this pair into a pair of virtual image doublets shifted into and out from the plane of the cross-section, one doublet composed of images 26 and 27, the other composed of images 108 and 109, as in FIG. 4. FIG. 4 provides a three-dimensional view of these spatial relations, with emitting region 110 shown as a white square in relation to its four shifted virtual images 26, 27, 108 and 109, and the surrounding eight emitting regions 112, each of these shown shaded. The spatial boundary of the resulting virtual pixel is highlighted with a black frame 114 for additional clarity. Each of the four virtual images of emitting region 110 are shifted a distance W', 44, from center 120 in each of the two orthogonal directions x, 116 and y, 118. The plane of the cluster of virtual images 106 resides at a height, 124, G1'-V above the emitting plane 122, where V 86 is the depth of this plane beneath the plane of the lower prisms 58, which will be established more exactly later on.

A viewer looking at the output side of the prism sheets 58 and 60 in FIG. 3 sees the virtual image plane as a contiguous array of discrete regions, each consisting of the 4-image cluster 106 (FIG. 4) of each underlying emitting region 110. While this alone might be suitable for some direct viewing applications, there are some limitations to take into consideration. One limitation is that output light from the virtual image plane is confined to a narrow cone of viewing angles (+/−22.5 degrees to half peak power) that is an intrinsic feature of transmission through two orthogonal prism sheets. The second limitation is that demarcation lines within each 4-image cluster and the demarcation lines between the individual 4-element pixels themselves, might give rise to a visible pixel structure distracting to a direct viewer.

Figure 7:
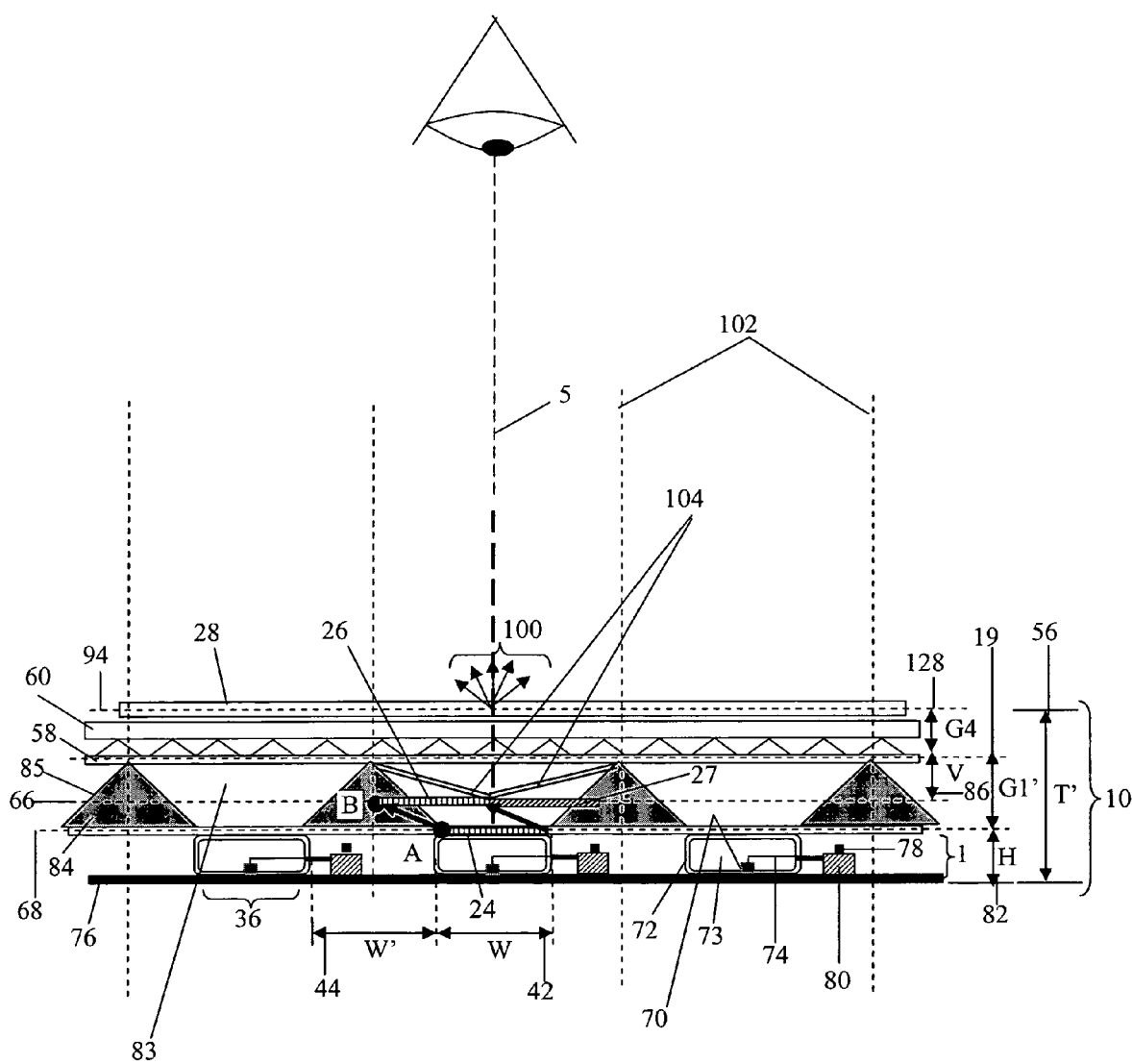
FIG. 7 illustrates a side view of a multi-layered light source panel optical system for a two-dimensional array of discrete light emitting apertures separated from one another by a diffusely reflecting, non-emitting regions formed as a spacer layer of specific thickness beneath two so-elevated layers of prismatic light directing film oriented with their groove axes orthogonal, and covered by a light scattering layer.

Practical applications of the two-dimensional illumination systems of FIGS. 3 and 7, however, relate both to those involving direct view of the illuminator and those wherein the system's output light beam 100 is used to provide illumination to external elements that are themselves viewed. In some applications, it is preferable that light from the illuminator's aperture be smooth in its spatial uniformity, but the emission confined to a narrow range of angles. In other applications, not only must the spatial uniformity be smooth, but the illumination must also be made visible over a wide range of viewing directions.

In direct view applications, one solution to the demarcation lines and the viewing angle restrictions is provided within the multi-layer structure of FIG. 3 by the array of micro lenses 62 that are used to relay a real image of the virtual image plane at unity magnification to an output scattering layer 94 placed within (or on) output viewing screen 24. FIG. 3 symbolizes only one lens unit per pixel region 102, but sub-arrays of lenses may also be used as dimensions require and allow. The exact height (G3) 32 of the viewing screen can be adjusted to defocus the system just enough blur to soften the appearance of the demarcation lines. And, the more Lambertian the behavior of the scattering mechanism involved, the wider becomes the associated output viewing angles 100. The generalized behavior of lens array 62 is illustrated in FIG. 3 with rays 88 from virtual image point B (corresponding to one set of rays from point A on emitting region 24) collected and imaged as rays 96 forming real image point C on the lenses image plane 94, whereupon they are scattered by viewing screen 28 into a fan of output rays 100.

In direct beam illumination applications, a solution to the demarcation lines between virtual images is to defocus the system, so that the relayed output images are not sharply focused on output screen 28 (used with little or no scattering layer 94).

Lens array 62 may be a two-dimensional array of plano-convex aspheric surfaces, each having square (or rectangular) boundaries as needed to correspond to pixel dimensions, which in the examples given are 2W by 2W. The lens array 62 may also be composed of aspheric Fresnel lens elements, or two parallel sheets of aspheric plano-convex or Fresnel cylinder lens arrays, each cylinder lens having a width corresponding to that of the corresponding pixel width (2W). In this latter case, the two sets of cylinder lens arrays are oriented so that their cylinder axes are orthogonal to each other. For shortest possible focal length, however, a stack of two aspheric plano-convex lenses (bulk or Fresnel), vertices facing each other, might be used for each pixel. This would mean using registering two parallel sheets of lens arrays in place of the single sheet depicted in FIG. 3. For larger sized pixels, more than one shorter focal length lens can be used within each pixel region. Regardless of the lens format used, the effective lens focal length is set so that it is approximately half the lens's elevation above the virtual image plane 66, which can be no closer than G2+S1+V. At the same time, the viewing screen 28 is elevated above the lens plane an equal distance G3. In this situation, the total thickness, 26, T of system 10, becomes 4F+G1'-V, where F is the minimum focal length of lens array 62, G1' approximately the width of the emitting region 110, and V the depth of the virtual image plane 66 below the plane of prism sheet 58 (which as will be proven later is about 0.75 W).

When the emitting regions are taken as 8 mm squares, the thickness of two prism sheets, 0.3 mm, and the spacing between them, S1, near zero, the minimum focal length of lens array 62, when composed of only one lens element per pixel, becomes about (0.75 W+0.3)/2 or 3.15 mm, which is shorter than practical for a single pixel-sized lens element. The shortest practical single lens focal length covering the entire 16 mm×16 mm aperture (22.6 mm diagonal) would be about twice the semi-diameter or 22.6 mm, making total thickness 26, more than 90 mm. One practical way of achieving the more preferable focal length of 3.15 mm is to use a 7×7 or 49 lenslet sub-array covering each 16 mm×16 mm pixel area, with each lenslet in the sub-arrays truncated for this example to 2.28 mm squares each having an effective spherical radius of curvature of 1.57 mm. If this were done, total thickness 26 becomes about 12 mm plus the thickness of light source 1, which is more suited to the applications of interest.

In this manner, the arrangement shown in FIG. 3 converts each emitting area 24 on light source 1 to a corresponding emitting area or pixel (102 in FIG. 3, 108 in FIG. 4) on output screen 28 with the spaces between the original emitters (24 in FIGS. 3 and 110 in FIG. 4) effectively eliminated by the optical manipulations. System performance is improved considerably, however, adding a physical structure 84 in between and otherwise bounding all emitting areas (24 in FIGS. 3 and 110 in FIG. 4), both to minimize pixel-to-pixel cross talk and to serve as a natural spacer of thickness G1' for the lower prism sheet 58. The processing of virtual images 26, 27, 108 and 109 in FIG. 3 and FIG. 4 is independent of the presence of structure 84 and its sidewalls 85. The sidewalls serve to restrict any high angle light rays from the emitting region 24 itself, and any initially reflected light from prism sheet layers 58 and 60 from reaching or returning to prism sheets 58 or 60 outside the boundary lines 102 of the corresponding output pixel. When these sidewalls 85 are made reflecting, such rays scatter within the cavity until they are randomly converted to one of the correct angles for transmission as output light from prism layers 58 and 60 within the pixel boundary.

C. Array Structure Core: Compartmentalized Prism Spacing Layers

Figure 5:
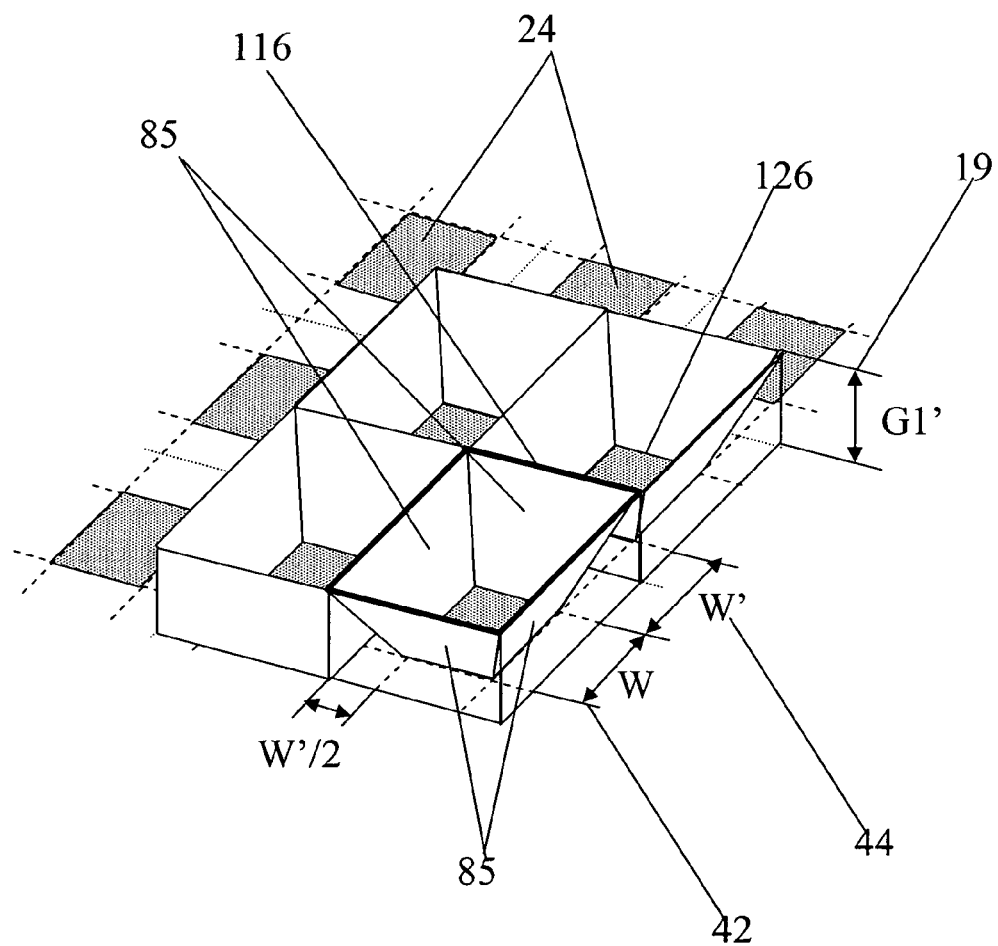
FIG. 5 illustrates a perspective view of a two-dimensional plane of emitting apertures and an example of the contiguous structure of a compartmentalized spacer layer between the emitters of FIG. 3 and the elevated light directing films placed above them, each compartment surrounding an emitting aperture with diffusely reflecting tapered sidewalls.
Figure 6:
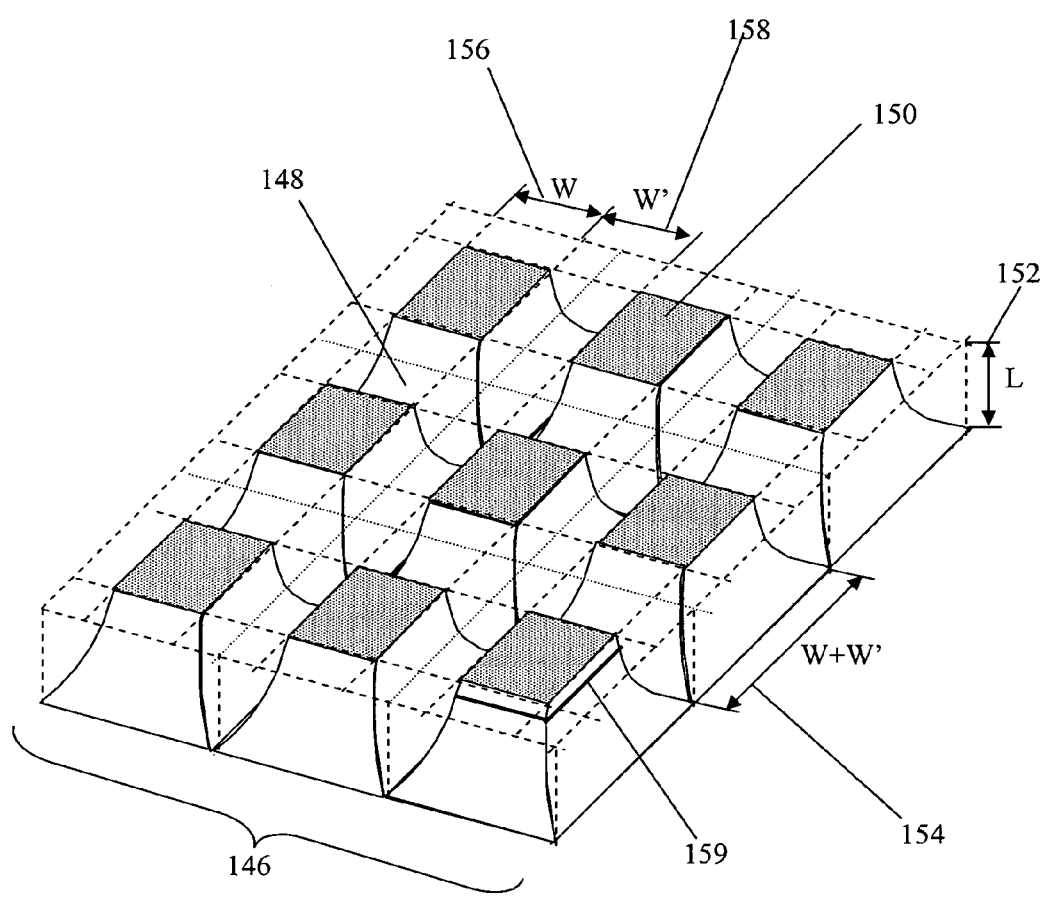
FIG. 6 illustrates a perspective view of the forming tool used to form the compartmentalized spacer layer of FIG. 4 having tapered sidewalls.

A generalized three-dimensional view of one such structure 84 is given in FIG. 5 showing a hollow faceted version wherein the sidewalls 85 surrounding any discrete emitting region 24 are tilted at an angle 87, $\phi$, relative to the system axis 5, $\tan^{-1}$ (W/2G1'). If this hollow isolating structure is made of (or coated with) a white diffusely reflecting material, which is preferable, the sidewalls of the structure 58 and the base layer of prism sheet 58 form boundaries of an effective integrating cavity whose multiplicity of reflections improves the percentage of light transmission through the prism sheets and the light distribution uniformity within any pixel's output area (102 in FIG. 3 or 116 in FIG. 5). The structure shown in FIG. 5 can be compression or injection molded in a plastic such as acrylic or polycarbonate that has been filled with particles of a finely divided white light scattering material such as titanium dioxide. The structure can also be formed, in plastic sheets up to about 10 mm in thickness, by an embossing (or casting) process wherein the pyramidal tooling needed to generate each of the four common sidewalls, one version shown in FIG. 6, is made thicker than the film (or resin) itself so that it punches through the molten sheet (or resin) material to a non-molten carrier layer (or air above the resin), and so generates the array of clear holes 126 needed in FIG. 5 to permit efficient light transfer from the emitting regions 24 of light source 1. The molded, embossed or cast material can also be a composite of polymer and any second phase including glass, ceramic or metal, so as to achieve specific mechanical, thermal and/or optical properties.

The compatibility of this structure with the image-shifting function of the prism sheets themselves, as well as some other beneficial forms for this layer, will be covered in more detail below. Qualitatively, however, the most important concept is that any light scattered from the sidewalls that then appears as if emitted by sidewall surfaces themselves, contributes to virtual images of those same sidewalls that shift only inwards towards the center of the cavity, otherwise overlapping the shifted virtual images 26, 27, 108, and 109 of the emitting region itself. As will be explained more thoroughly below, the distance light from any point is shifted by the prism layers 58 and 60, relates to the specific depth of from the base of the prisms of any point of emission, and as mentioned earlier, the apex angle 8 of the prisms themselves. The closer the particular emission point is to the base of the prisms, the smaller is the shift, the further the point from the base of the prisms, the larger the shift, for any given apex angle 8. Because of this, sidewall light is unable to shift into neighboring cavities, and appears as the tilted images 104 in FIG. 3. This is beneficial to image-forming performance of the pixels as it virtually eliminates pixel-to-pixel cross talk.

D. Simple Prism Sheet Illuminator

A thinner bi- rather than tri-layered alternative to the arrangement of FIG. 3 is indicated generally in FIG. 7, where micro lens array 62 of FIG. 3 has been eliminated, and output screen 28 arranged to display or convey light from a contiguous or slightly overlapping array of well-defined virtual images 27 that result from the system's prismatic manipulation of input light. A chief advantage of the bi-layered approach is that by eliminating relay lens layer 62 of FIG. 3, the system of FIG. 7 can be made significantly thinner. Total thickness 22 of the bi-layered system, T, reduces to G4+G1' plus the thickness of light source 1. With 16 mm square output pixels and the 3.15 mm focal length relay lens array used in FIG. 3, the total thickness in FIG. 7 depends primarily on the prism offset G1' needed to make the 8 mm emitting regions appear contiguous on the output plane 94. When using a single 90-degree prism sheet, the condition of contiguous displacement occurs when the offset G1 is substantially equal to the emitter width W. When using two orthogonal 90-degree prism sheets, however, the offset G1' is somewhat less than W. By both ray trace modeling (using the optical system modeling software ASAP™ produced by Breault Manufacturing Organization) and direct laboratory experiment, it is determined that G1' is approximately 0.625 W. This means that with prism sheets having prism elements with standard 90-degree apex angles can be less than about 5 mm plus the thickness of light source 1, about a 2.5× thickness reduction over the 12 mm thick system of FIG. 3. Then since the prism sheet offset distance, G1', for the perfect image displacement of FIG. 4 can be reduced by means of adjustments to the prism element's apex angle 8, even thinner systems 10 can be created, when so desired.

Being able to truncate the illuminator system thickness at the height of the upper prism sheet contributes considerable thickness reduction. The compartmentalized spacer layer 84, whose sidewalls 85 can be made diffusively reflective, reduces visibility of virtual image demarcation lines, as does any scattering layer 94 used within output screen 28.

The multi-layer arrangements of FIGS. 3 and. 7 are generally preferable for illumination applications involving tightly spaced emitters arrays, where the spaces between emitting elements is about equal to or less than the size of the emitting apertures themselves. When applications call for considerably larger area output pixels, the prism sheet layers are replaced by an array of micro reflectors whose input apertures match the emitting apertures, and whose output apertures are contiguous by design.

Figure 8A:
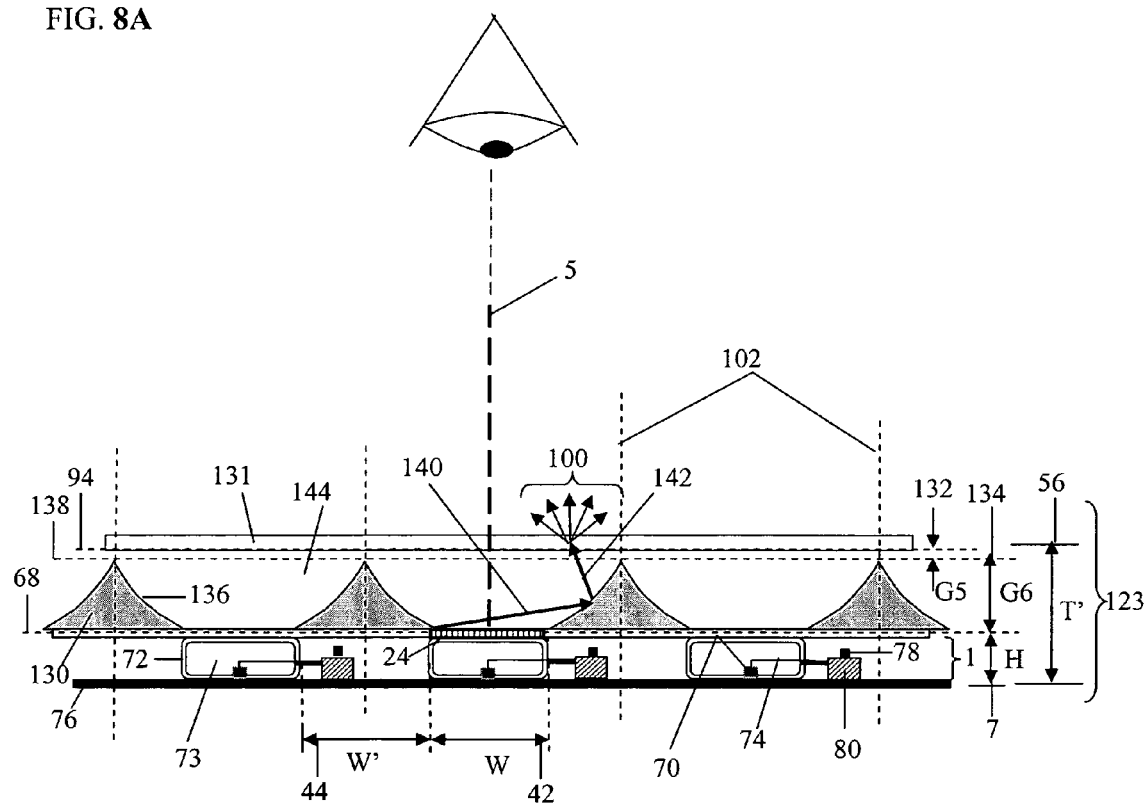
FIG. 8A illustrates a cross-sectional side view of a multi-layered optical system for a two-dimensional array of discrete light emitting apertures separated from one another other by non-emitting regions, the emitting regions aligned with input openings in a compartmentalized spacer layer having specularly-reflecting mathematically shaped sidewalls, this layer covered with a polarization-selective multi-layers, including a quarter wave phase retardation film, a reflective polarizer film and a light scattering film.
Figure 8B:
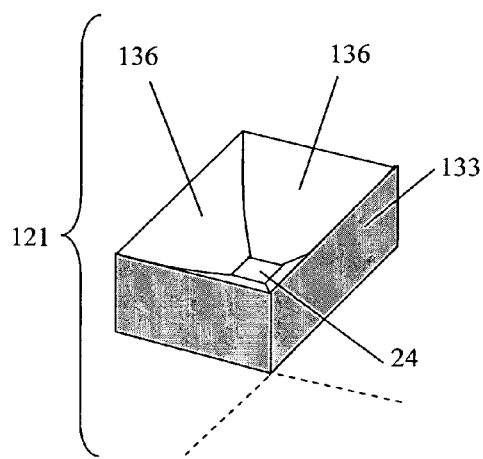
FIG. 8B is a perspective view of one compartment in the spacer layer depicted in the cross-section of FIG. 8A having four orthogonal specularly-reflecting mathematically shaped sidewalls.
Figure 8C:
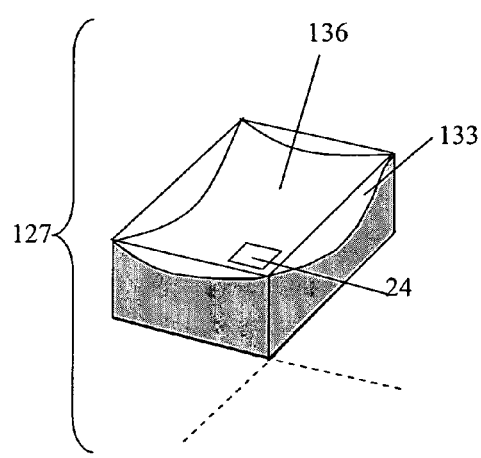
FIG. 8C is a perspective view of one compartment in the spacer layer depicted in the cross-section of FIG. 8A having spherically symmetric specularly-reflecting sidewall.

An alternative output array structure is illustrated in FIGS. 8A–C in which the virtual image forming prism sheets 58 and 60 of FIGS. 3 and 7 have been replaced by a two-dimensional layer of micro-reflectors similar to the compartmentalized diffusely-reflecting spacer layer 84 shown previously in FIGS. 3, 5 and 7. In this instance, however, the reflecting sidewall 136 is a specularly reflecting one and its mathematically derived shape, critical to function. Wide angle input light from each emitting aperture 24 enters the associated specular reflecting cavities of FIG. 8, wherein it is transformed by the series of specular reflections that result, into output light whose angular spread is reduced from the input spread in a determinable manner. Since the reflecting elements are themselves made two-dimensionally contiguous, as in FIG. 5, the output light emitted from the array is itself similarly contiguous. The micro reflector boundaries do form visible demarcation lines in the output light, but these generally fine boundaries can be blurred in numerous ways, including allowance of some purposeful light leakage or cross-over to occur at the reflector boundaries.

FIGS. 8A–C shows the cross-section 123 of several emitting pixels as well as the three-dimensional perspectives of single pixel units 121 and 127. The pixel design of perspective 121 crosses appropriate two-dimensional sidewall shapes in the orthogonal (x and y) meridians, whereas perspective 127 is for a reflector having spherical symmetry. On the other hand, when called for, physical boundary walls 133 can be added to isolate the light and its reflections within one pixel from another, thereby substantially eliminating the number of light rays crossing over from one pixel's reflector into the space of a neighboring pixel.

By means of micro reflectors, it is possible to magnify emitting region areas beyond the fourfold expansion achieved using bi-layered prism sheets 58 and 60. Because the micro reflector's sidewalls are made sloping outwards towards an enlarged output aperture 102, in principle every input light ray is transmitted as output. No input rays can be trapped internally within specular reflectors 130, as they can by total internal reflections within prism sheets 58 and 60. The reason for this is that there is no combination of specular reflections from outward sloping sidewalls 136 that prevents any input rays from becoming output rays. Then if the outward sloping reflecting sidewalls are shaped purposefully, substantially all output rays can be made to behave in an organized manner.

There are at least two advantageous ways of shaping the outward sloping reflector sidewalls for an efficient conversion of input light to output light. One advantageous sidewall shape is that of a concave conicoidal reflector used in conjunction with polarization-selective mirror plane, such as has been described for other illumination applications in U.S. Pat. No. 6,213,606. In this case input light is injected through a small aperture made in the reflector's vertex, and multiply reflected output light exits through the reflector's outermost aperture. Another advantageous sidewall shape is provided by tapered non-imaging optical concentrators similar to integrating bars. In this case, input light enters the smaller end of the reflecting element and exits the larger end.

Figure 9:
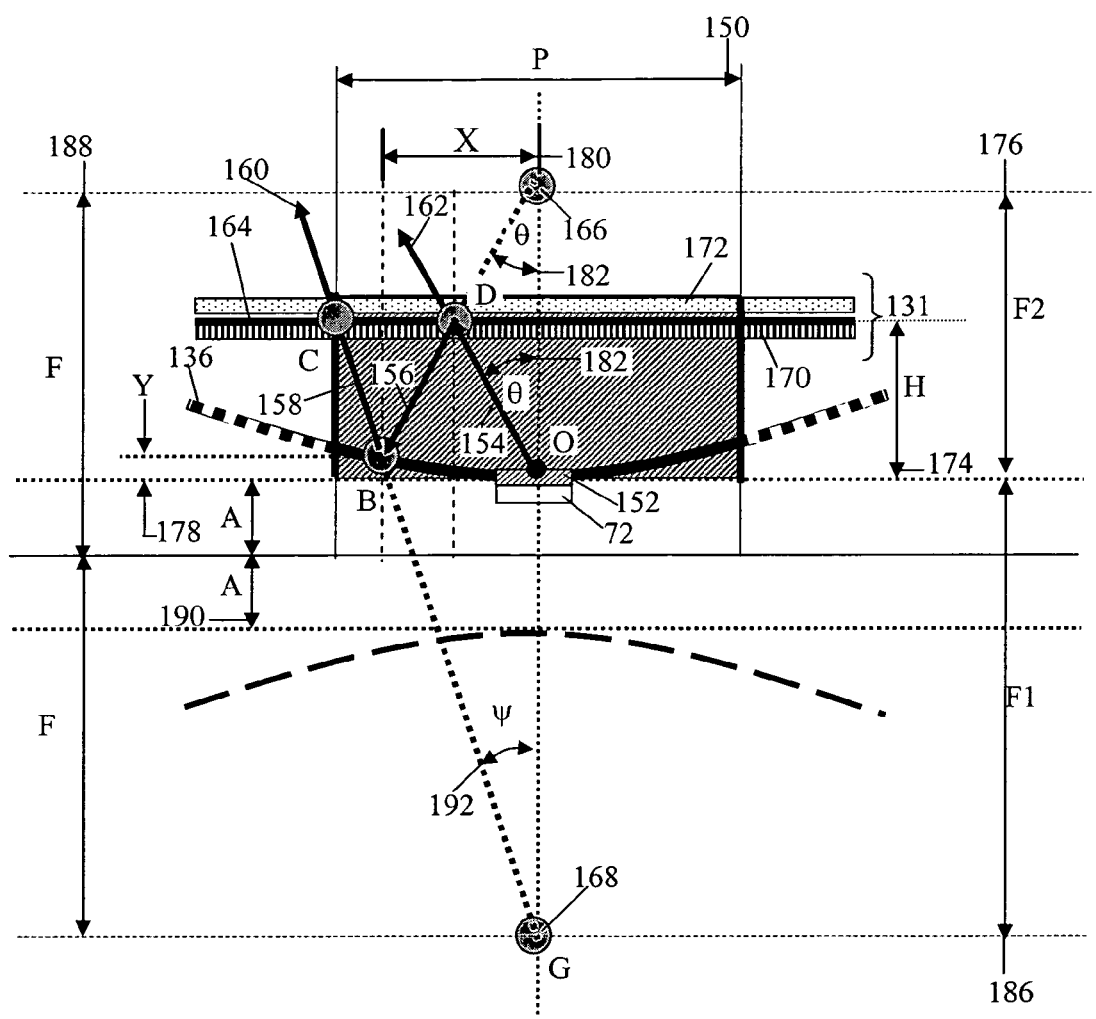
FIG. 9 illustrates with reference to FIG. 8, a side view of the sidewall shape of a hyperbolically sloping spacer layer and its mathematical relation to the light directing polarization selective layers covering its aperture, including the path taken by an illustrative input ray.

A hyperboloidal reflective sidewall shape is shown schematically in FIG. 9 for the side view of any single pixel unit of what is actually a contiguous two-dimensional array. In this case, the output aperture of the pixel, 150, is made considerably larger than the size of the input aperture, 152, to prevent or minimize any losses associated with light return and re-radiation by this aperture 152. As above, the input emitting aperture may be either the output emitting-surface of a light emitting device such as an LED (or OLED) 70, or the diffusive aperture 24 of a cavity 72 (such as in FIG. 8) containing one or more light emitting devices 70. If the input aperture 152 were 2 mm in diameter, the output aperture would be preferably 10–20 mm in diameter or larger. The total lumens flowing out of input aperture 152 becomes substantially the total lumens flowing out of the output aperture 150 less any losses due to absorption and total internal reflections along the way.

The optical path of a given extreme ray 154 leaving from point O on input aperture 152 to point D on the output aperture 150 is in its simplest configuration a 3-step process, as illustrated by rays 156, 158, and 160 in FIG. 9. Input light ray 154 may be polarized or unpolarized. When it strikes the output screen 131 at point D it is either polarized linearly by the reflective polarizing layer 162 itself, with one linearly polarized ray reflecting as 156, the other linearly polarized ray transmitting as ray 160, or just reflecting as linearly polarized ray 156. In either case, the reflected ray 156 proceeds back towards the shaped concave reflecting sidewall 136, as if from a front focal point 166 of the hyperbolically shaped concave reflecting sidewall 136. This ray 156, on reaching the concave reflecting surface at point B reflects back towards the output screen as if emanating from the reflector's rear focal point 168, and passes through all layers comprising output screen 131, including a wide band quarter wave retardation film 170, the reflective polarizer 164 and the screen 172. The screen 172 may contain a diffusely scattering layer to spread out the light, a collimating lens to narrow the angular output or both. The reflecting sidewall 136 may be smooth and purely specular, may have a stippled surface to create a range of reflected directions or a smooth reflecting surface and an external scattering layer to create a range of reflected directions. The purpose of adding some light scattering on or near the reflective sidewall, whether by stippling of its surface or by an external scattering layer near its surface is to soften any non-uniformities associated with the input aperture, thereby improving the spatial uniformity of the output light.

A special case is presented when input ray 154 is unpolarized. Selective reflecting layer 164 linearly polarizes the directly transmitted output ray 162, and the multi-step (O-D-B-C) reflection process converts output ray 160 to the same polarization as ray 162. As a result, there is a composite output distribution with half the lumens spread over $+/-\theta$ as if emanating from point O, and the other half spread over $+/-\Psi$, as if emanating from point G, 168. Uncorrected, such an angular (and spatial) mix may not be appropriate for every lighting and display application, but may have special benefits for others, particularly in general lighting when providing directed and flood illumination simultaneously.

The principal purpose of reflective sidewall structure 131 is to spread out the lumens delivered by the input aperture 152 over a geometrically expanded output aperture (the contiguous pixel) 150 with the smallest loss of light, the least cross-talk with neighboring pixels, and in the thinnest overall multi-layer system thickness, T, possible. When this sidewall shape is made hyperbolic (or approximately so), as in the cross-section FIG. 9, the input light rays follow the deterministic paths described when the reflective polarizer plane 164 is placed a distance 174, H, above the plane of the hyperbola's vertex point O, H being equal to 0.5 times the distance between the front focal plane and the vertex plane, F2. This positioning extends the total optical path length significantly without increasing the system's thickness. Even though the light originates at point O, its exit through the output aperture 150 at point C is as if the light actually originated at the hyperbola's back focal point 168, a distance F+A further below, F and A being the parameters of the hyperbolic function. When A becomes very large, the hyperbolic function behaves more and more as a parabola, the output rays 160 appear to come from infinity, and are nearly parallel rather than diverging.

The mathematics of a hyperbolic reflector is summarized by equations 1–3, which describe the hyperbolic reflector's concave sag 178, Y, as a function of the effective semi-diameter 180, X, which can be thought of as the reflector's radial coordinate, and the salient reflected ray.

$$X = B\sqrt{\frac{(Y+A)^2}{A^2} - 1} \quad (1)$$

$$X = \text{Tan}\theta(F2 - Y) \quad (2)$$

$$\text{Tan}\Psi = \frac{Xo}{F1 + Yo} \quad (3)$$

The parameters A (190 in FIG. 9), B, C, F1 (186 in FIG. 9) and F2 (176 in FIG. 9) are the hyperbolic constants, θ, the angle 182 that an extreme ray 152 makes with the system axis. The concave sag at any point B, $Y_o$ is determined by equating equations 1 and 2. Once solved for $Y_o$, the corresponding $X_o$ is determined by substitution in equation 2. Then, the resulting maximum output angle 192, Ψ, is set by equation 3.

The salient hyperbolic parameters, A, B and C are given in equations 4–7 for the system of FIG. 9. When F1 approaches −infinity, the reflector shape of equation 1 is parabolic, and the output rays 160 proceed generally along the system axis, the angle Ψ approaching zero.

$$A = K1 - F2 + 2H1 \quad (4)$$

$$C = F2 - H1 + A \quad (5)$$

$$B = (C^2 - A^2)^{0.5} \quad (6)$$

$$K1 = [|F1| + |F2|]/2 \quad (7)$$

H1 in these equations is the location of the hyperbolic vertex point O on the Y-axis (nominally 0), F1, is the location on the Y-axis of the back focal point 168, and F2 is the location on the Y-axis of the front focal point, 166. F2 is a positive number and F1, a negative number. The true focal length, F, is F2+A (188 in FIG. 9). The reflector's eccentricity, E, is as always, F/A.

The wider the angular spread of emitted light, θ, the larger the output aperture satisfying the above conditions. Choosing the extreme ray of the emitted input light determines the reflector size and thereby, the size of the illuminating pixel. Examples of reflector sizes can be calculated directly from these expressions, with reflecting plane 164 at the prescribed height 174 above the vertex point O, F2/2. As one illustration of this, suppose we wanted to place a 0.5 mm×0.5 mm LED having a +/−60-degree angular spread in input aperture 152 of a hyperboloidal surface of revolution with rectangular (or square) truncation. With hyperboloidal parameters F=38 and A=32, the reflector reaches a rim height of almost 2 mm at the final reflection point B in FIG. 9. The semi-diameter of this point is about 7 mm, meaning that the output aperture is approximately a 10 mm by 10 mm square. In this case, the reflective polarizing plane 164 is at a height of 4 mm above the reflector's vertex. This configuration would be accomplished when the phase retardation substrate thickness is about 1 mm. In this case, and without an output lens, the maximum output angle, Y, is just less than +/−6 degrees, and the reflector, almost parabolic. The conic constant is −1.09, which if an ideal parabola would be −1.

The pixel's output brightness to a viewer depends, as always, on the angular spread over which the lumens are distributed. The wider the angular spread, the wider the range of possible viewing directions, but the lower the brightness. The narrower the angular spread, the higher the brightness, but the more limited the range of possible viewing directions. Layer 184 in FIG. 9, a light spreading light scattering layer, is used to set both the pixel brightness and the angular extent.

E. Mathematically-Shaped Non-Imaging Optic Micro-Reflector Elements

Specularly reflecting sidewalls 136 mathematically shaped so that the number of sidewall reflections a ray experiences between input and output apertures are minimized, and so that an even distribution of output power is created throughout the aperture, are generally known in the prior art as non-imaging concentrators (and sometimes as compound parabolic concentrators). A two-dimensional array of such reflectors arranged similarly to the array conveyed in FIG. 5 can be used to collect light from an array of input light emitters while generating a cohesive output beam 100 whose angular range has been restricted by the details of the sidewall design. More generally, such ideal power transfer can be arranged to behave as an array of $\theta_i/\theta_o$ concentrators, in that the collective array transforms input light of maximum angle $\theta_i$ to output light of maximum angle $\theta_o$ by virtue of the well established Sine Law: $A_i \text{Sin}^2\theta_i = A_o \text{Sin}^2\theta_o$, where $A_i$ is the area of each individual emitting region, $A_o$ is the area of each individual output aperture, and $\theta_i$ and $\theta_o$ the respective input and output half angles. Such ideal etendue preserving designs, even for an array, transfer the brightness (and uniformity) of the source apertures, which in this case are the set of well-separated emitter regions 24, to the collective output aperture made up of the sum of individual output apertures 102. Less ideal sidewall designs, such as for example, the linearly tapered walls of FIGS. 3 and 7 when used without prism sheets 58 and 60, may transfer nearly the same output power as the ideal designs, but spread that power over a larger than ideal angular range, and show greater levels of spatial non-uniformity than the ideally shaped sidewalls would.

Such non-imaging micro reflector array configurations are most beneficial when each micro reflector's emitting aperture is relatively small (less than 5 mm on diagonal) and when asymmetric output angles are desired in the two output meridians. When the emitting aperture is larger than this (i.e. more than 5 mm on diagonal), the non-imaging concentrator approach leads to reflector depths that may be considered too large for practical multi-layer systems in many situations.

One example of a potentially beneficial use of a non-imaging reflector shape is provided by a two-dimensional array of 0.5 mm square emitting apertures 24, such would result from the wide-angle outputs of light emitting diode (LED) chips. When output angles of +/−22.5 degrees and +/−17.26 degrees are required in the two output meridians, the reflector's output aperture in accordance with the Sine Law becomes 0.5/Sin (22.5) or 1.31 mm and 0.5/Sin (17.26) or 1.69 mm. This aperture size imposes a limit on the emitting array's density, which becomes in general, $A_{in}/A_{out}$, and in this example, only 11%. By comparison, emitter densities possible by means of the method of FIGS. 3, 4 and 7 are greater than 25%, with $A_{in}/A_{out}$ becoming $(W^2)/(2W)^2$. Yet as will be discussed later, the throughput efficiency of a non-imaging reflector is potentially much greater than that of the two prism sheets 58 and 60 of FIG. 7, which is approximately 50%. When the non-imaging reflector is a transparent dielectric whose reflecting walls are created by its air-dielectric boundaries, throughput efficiency as high as 90–95% is possible. When the non-imaging reflector is formed by metal-coated sidewalls 136, throughput efficiency is lower, but often as high as 80%–90%. Ideal rays leaving the reflector's input aperture 24 strike only one sidewall a single time, leading to the high efficiency. Non-ideal rays may strike more than one sidewall, reducing theoretical efficiency. When each LED in the array contributes 20 lumens to the input apertures, the air-filled illustrative non-imaging array with 85% efficiency achieves 7.68 lumens/mm². Lumen density increases to 9.9 lumens/mm² when the output aperture is 1.31 mm square. The same array covered by prism sheets 58 and 60 spaced for contiguous virtual images achieves about 10 lumens/mm².

Hence, despite the enlarged output aperture of a non-imaging reflector, the net lumen density possible for the same output conditions is about the same as that achieved with prism sheets 58 and 60. The main tradeoff is layer thickness. The depth (or thickness) of a non-imaging reflector is governed by its input and output aperture sizes and the output angle along the same meridian. For the case where the output angles are +/−22.5 degrees in each output meridian, the reflector length becomes 2.86 mm. While this result is almost 5 times thicker than the comparable two-prism sheet alternative (which can be as thin as 0.3 mm for the two sheets plus the preferable (0.625)(0.5) mm gap spacing), it is still relatively thin for many application examples that follow.

Concentrator length can be truncated, but the larger the truncation, the greater the negative effect on power transfer efficiency and uniformity. The best way to reduce concentrator length, without compromising power transfer efficiency or uniformity, is to decrease the ratio of W to W', W being the emitter width, and W', the width of the non-emitting spaces between emitters. In the above example, W'/W is 2. If this ratio were reduced 33% to 1.5, and the 8 mm emitter width was maintained, the ideal pixel size would fall from 16 mm to 12 mm, making the space between emitters, 4 mm instead of 8 mm. The associated concentrator length drops 86% to 15.8 mm, which is still thicker than preferable in many applications.

The concentrator length can also be reduced by a folded hollow lens mirror combination much like that drawn in FIG. 9, but with polarization conversion layers 164 and 170 replaced by a lens element. In this approach, some non-imaging ray paths are folded back towards the mirror by total internal reflection from the lens.

F. Fabrication of Micro-Reflectors

Whether using linearly tapered sidewalls or the mathematically shaped sidewalls nearer to those of either the hyperboloid or the ideal concentrator, light leaving the emitting region 24 enters the pixel medium 144 (air or dielectric) that fills the volume defined by specularly reflecting sidewalls 136. When this medium 144 is a transparent dielectric such as acrylic or silicone, specular reflection occurs by total internal reflection at the sidewalls provided the gray shaded volumes 130 in FIG. 7 or FIGS. 8A–C are filled with air or another lower refractive index material. When the gray shaded volume 130 in FIG. 7 is made of a transparent material, an opaque material, or one that has low specular reflectivity, it must be coated with a thin specularly reflective layer or film such as for example, aluminum, enhanced aluminum or silver, to provide the basis for efficient specular reflection. Once the smoothly shaped sidewalls 136 are coated, all light rays 140 that strike them will be reflected with an efficiency determined by the reflectivity of the coating, and these rays 142 will generally exit without further reflection through the structures output aperture 138 within a prescribed range of output angles as bounded by the Sine relation above.

As described earlier, the reflective spacer structure 84 (in FIG. 3 and FIG. 7) or 130 in FIG. 9 can be fabricated as a plastic sheet using a forming tool 146 such as the one represented schematically in FIG. 6. Whether casting and curing, embossing injection molding, or compression molding, the cured or cooled plastic or plastic-composite sheet can be pulled away from the linearly or functionally tapering sidewalls 148 of the tool 146 without interference. Each element in the tool has a base width 154, W+W', and a top surface 150 of width 156, W. The salient molding tool dimensions 154, 156, and 158 in FIG. 6 are traditionally made slightly greater (or less than) the target dimensions reflected in FIG. 3, FIG. 7, FIG. 8, and FIG. 9 to allow for any process expansions and shrinkages. When casting or embossing, top surface 150 is made to extend slightly beyond the specified spacer heights G1' and G6 as given in FIG. 7 and FIGS. 8A–C (i.e. L-G1' or L-G6). The reason for this is to assure that the process yields a clean clear hole in the molded sheet that matches the size of the emitting region. When casting, the casting material is filled to stop line 159 in FIG. 6. When embossing, tool 146 actually protrudes through the (L-G1') or (L-G6) mm thick sheet to be embossed into a compliant carrier film material attached to it.

G. Suitable Emitting Arrays: Packaged LEDS, LED Chips and Fluorescent Lamps

In general, the present invention applies to one-dimensional arrays of emitting stripes (FIGS. 1–2) and to two-dimensional arrays of emitting regions (FIGS. 3–9).

Preferable one-dimensional emitting arrays are sets of parallel fluorescent tubes or channels, parallel fluorescent tube lamps, a lengthy single fluorescent tube lamp bent (or molded) into a serpentine pattern whose major sections run parallel to each other, or a planar device within which a gaseous plasma has been forced into concentrated stripe-like or zone-like regions. This emitter type is best suited to specialized LCD backlighting applications, as will be illustrated by subsequent example.

Preferable two-dimensional emitting arrays are spatial arrangements of discrete emitting regions, including planar arrays of pre-packaged LEDs or bare LED chips. These discrete arrays may be a single line of equally spaced elements or a series of equally spaced lines of equally spaced elements.

Emitter elements within the array whether fluorescent stripes or discrete LEDs, are powered (separately or in groups) by external controlling electronics. The controlling electronics for fluorescent stripes is a ballast supply that provides the high frequency form of high voltage needed to create and maintain the emitter's gaseous discharge. The controlling electronics for LED arrays is a switchable source of low voltage dc interconnected to sets of LEDs having the same color, leading to widespread uses in lighting and illumination—applications that will be described by specific examples below. The controlling electronics may also be applied to individual LEDs via an image processor circuit (or circuits) that determines proper timing, emission duration, and power-level (color balance) for each LED (or LED sub-group) in the array. Individually powered LED arrays lead to applications in the display of two-dimensional images.

The range of lighting applications enabled by LED arrays within the present invention are extensive and will be considered in detail, including preferable packaging arrangements and application examples. After this, an example will be given for the use of fluorescent stripes and tubes in the special cases of LCD and transparent image backlighting.

H. Pre-Packaged LEDS in Multi-Layered Arrays

Commercial LEDs can be arranged in arrays, but the output of the array is ordinarily very non-uniform and spread over a wide range of angles. Lenses and diffusers can be used to improve uniformity and directivity, but such improvements reduce efficiency.

With the present invention, in the form of FIG. 7 (8 or 9), commercial LED arrays can produce uniform beams of light in thinner structures and with higher efficiency than conventional alternatives.

A wide variety of LEDs are presently manufactured in two types of packages: clear plastic elements of a wide variety of sizes and shapes, or 1.5–3.0 mm square ceramic surface mounts suitable for conventional printed circuit boards. The physical package size determines how many lumens can be supplied in a given application area. The package's optical design determines the characteristic with which the lumens are emitted. Some packages have a lens that causes a more directional emission of light. Other packages emit light in all directions. All present packages are larger than their emitting apertures, making light strongest from the center of the package and giving conventionally packaged LEDs a point-like appearance.

Figure 10A:
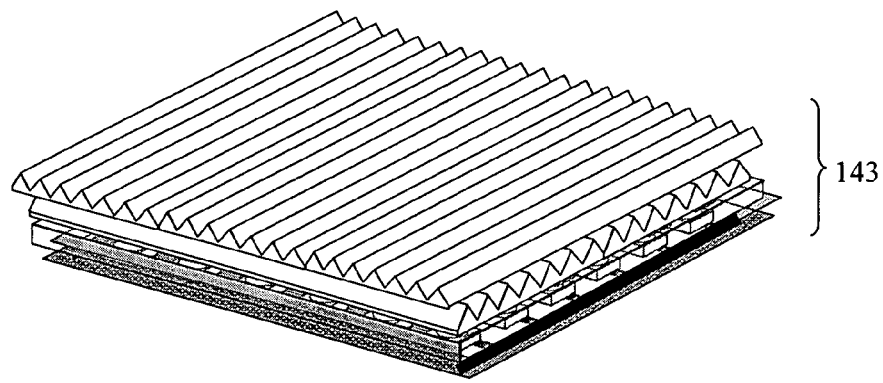
FIG. 10A illustrates in collapsed perspective view, a practical usage for a two-dimensional array of commercially packaged light emitting diodes including one overlaying diffusive element per package, a transparent spacer layer of unique thickness, and two crossed prismatic light directing layers.
Figure 10B:
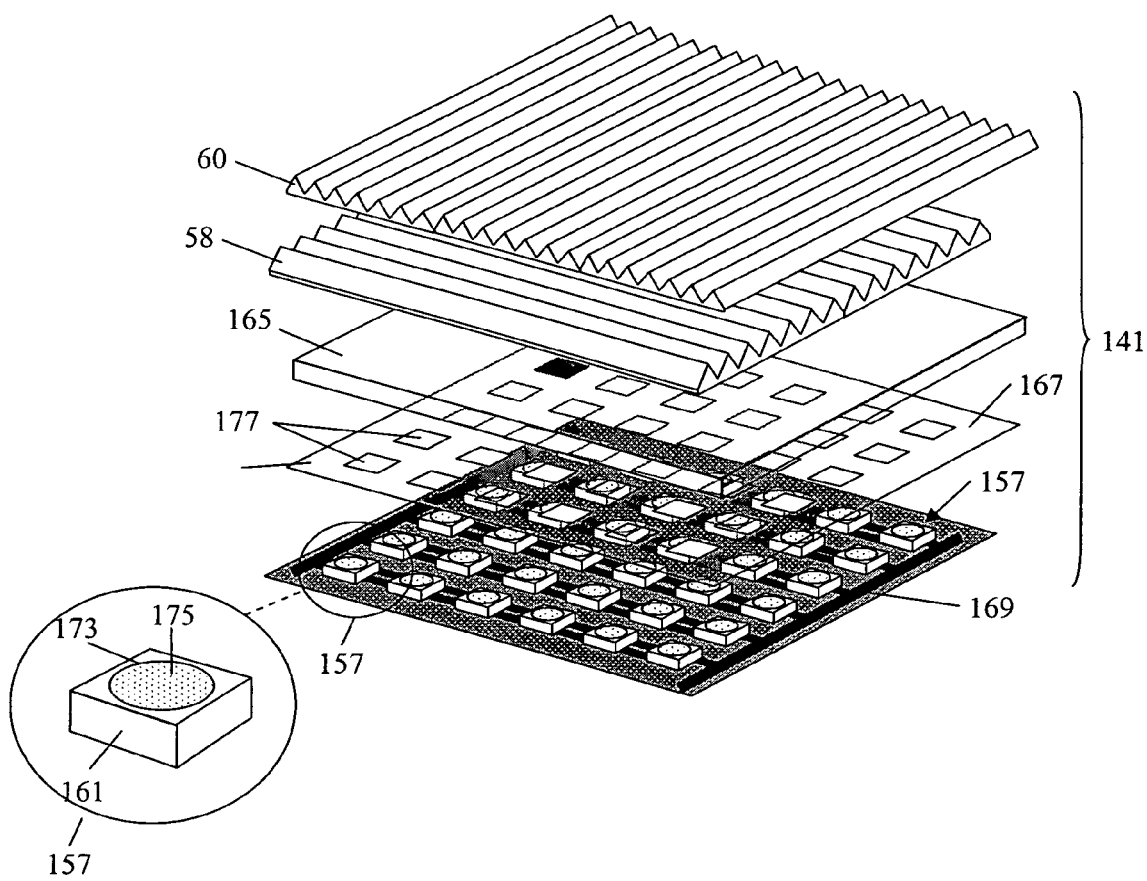
FIG. 10B illustrates an exploded view of the perspective layout shown in FIG. 10A.

FIG. 10A provides a perspective view of one example of the way commercially packaged LEDs can be used within the present invention. For greater clarity of this architecture, an exploded view is provided in FIG. 10B. Discretely packaged LEDs (or groups of LEDs) 157 can be used as the array elements themselves (i.e. 36 in FIG. 7) by soldering their discrete packages 161 in equally spaced rows and columns on a printed circuit board 163 or a ceramic circuit substrate, and then arranging appropriate spacer layer 165 and diffuser layers 167, so as to best implement the cross-section of FIGS. 7 (8 or 9). Bus bar circuitry 169 (anode) and 171 (cathode) is provided for each type of LED used. For simplicity, the circuit illustrated in FIG. 10B is for a single type of LED, such that all LEDs in the array are powered simultaneously. More complex circuitry is provided when each package 161 contains separate red, green and blue LEDs.

The specific example of FIGS. 10A–B presumes the use of commercially available 3 mm square ceramic surface mount packages 161 such as those manufactured by Nichia whose 2.3 mm diameter circular cavity 173 contains an interconnected LED chip and is encapsulated with optically transparent plastic epoxy 175. Exploded detail 141 as shown in FIG. 10B reveals the internal structure of an idealized 6-package by 6-package array where the spacing between packages 161 is equal to (or less than) their physical width, as described above in conjunction with FIG. 4. Preferably, cavity 173 is better shaped as a square. When this is not possible, diffusive reflecting layer 167 is combined with a matching array of diffusing screens 177 disposed just above each package 161 such that diffusion screens 177 become the actual illumination source from each underlying package 161.

Exploded detail 141 in FIG. 10B also shows the sequence of multi-layer optics arranged according to the approach of FIG. 7 that is used to create the uniform output beam being sought. In this particular example, transparent spacer layer 165 is positioned directly above the emitting apertures 177 to provide the exact spacing needed between the emitting apertures and prism sheet layers 58 and 60 (G1' as in FIG. 7). Prism sheet 58 may be optically coupled (laminated) to transparent spacer layer 165 to minimize any unrecoverable power losses due to total internal reflection within the spacer.

Light is emitted over uniformly over the full aperture of multi-layer illuminator 143 as in FIG. 10A, which for the illustrative 3 mm packages is 36 mm by 36 mm.

Figure 10C:
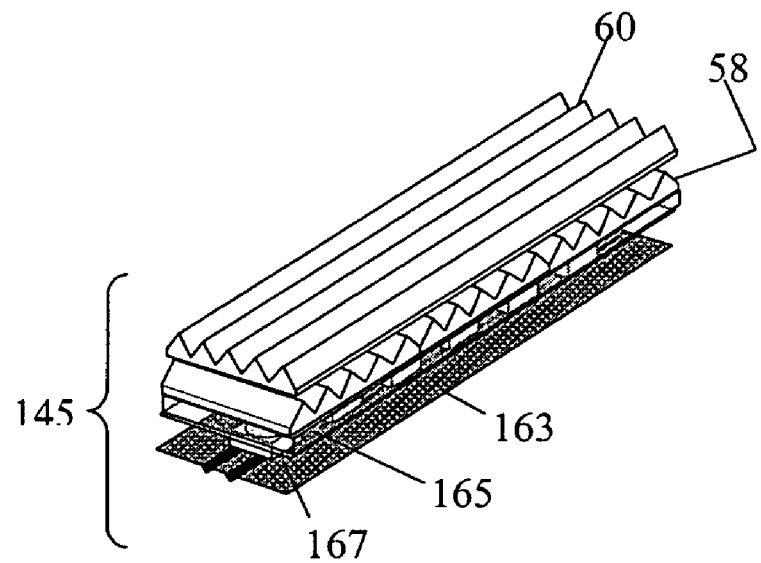
FIG. 10C illustrates in collapsed perspective view, a practical usage for a linear array of commercially packaged light emitting diodes including one overlaying diffusive element per package, a transparent spacer layer of unique thickness, and two crossed prismatic light directing layers.
Figure 10D:
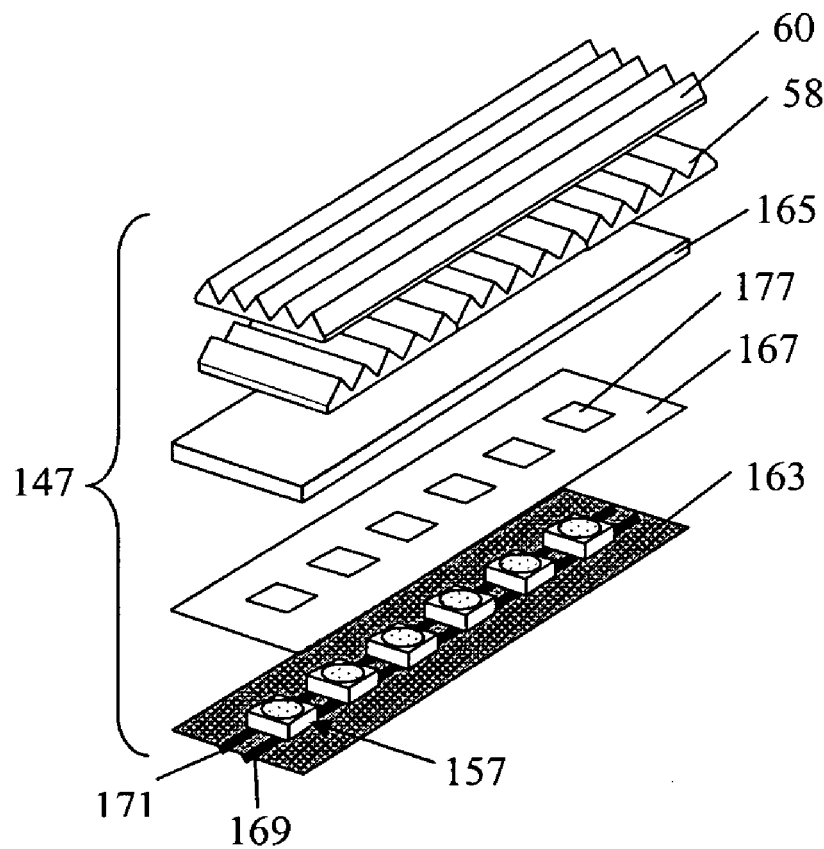
FIG. 10D illustrates an exploded view of the perspective layout shown in FIG. 10C.

The same conventional packaging approach may be used for just a single row of packaged LEDs as illustrated by the perspective view shown in FIG. 10C. Exploded detail 147 in FIG. 10D reveals the same internal vertical layout applied to 6 equally spaced LED packages 161. In this case, the full aperture size is the width of 2 packages and the length of 12 packages. Hence, using the illustrative 3 mm packages 161, and their diffusive output layers 177, output light would emit through layers 58 and 60 over a 6 mm by 36 mm region. Using prism sheets 58 and 60 with 90-degree prisms, the output light would be spread over substantially a +/−22.5-degree angular cone.

Array illuminators 143 and 145 can be used in a variety of lighting and backlight applications, including the red high mount stop lamp on the rear deck of automobiles. For such use, the size of the array and the type of diffusive layers added are adjusted to meet the visual needs of the market. Other applications of these arrays will be described shortly.

The main practical limitations associated with conventional packaging described in FIGS. 10A–D is the physical limit they impose on the number of lumens that can be delivered per unit area density and the wasteful redundancies of discrete packaging leading to higher than necessary manufacturing costs.

These limitations are addressed by introducing a more preferable packaging arrangement, one in which the constituent LED chips are contained in what becomes a single extended package.

I. Monolithically Packaged LEDS in Multi-Layered Arrays

Best use of the present inventions (FIGS. 3, 7–9) occurs when constituent LED chips are arranged in a monolithically laminated multi-layer package.

Figure 11A:
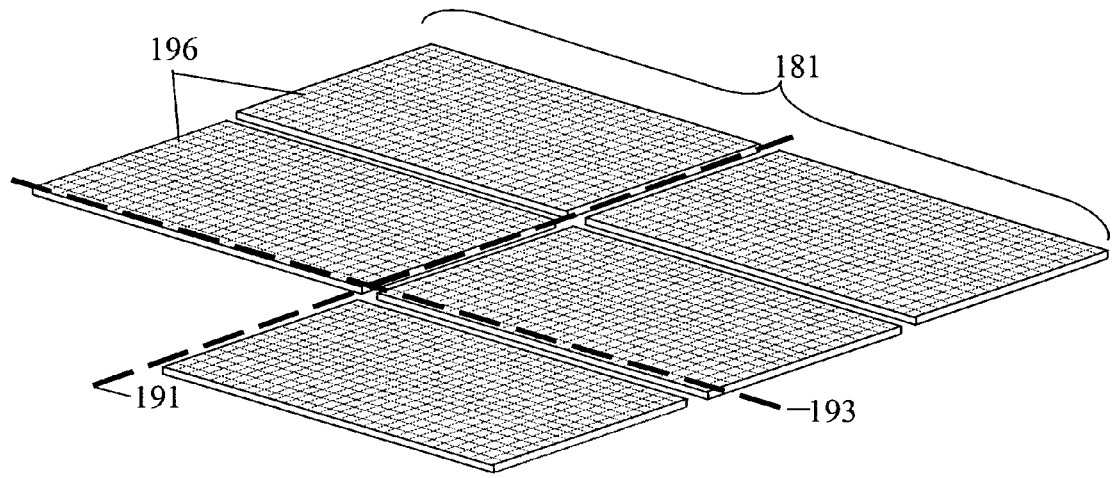
FIG. 11A illustrates a perspective view showing the form of a distributed multi-layer manufacturing process wherein a large number of multi-layered light source panel optical systems related to FIGS. 3, 7 and 8 have been constructed repetitively over a very large continuous array that can be physically sectioned into individually usable units, themselves combinable or further sectioned in a variety of useful ways.
Figure 11B:
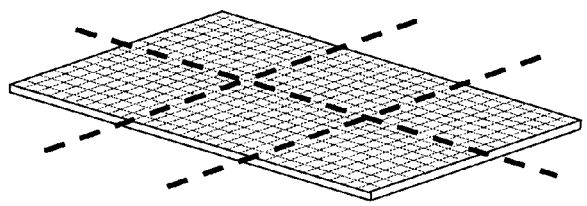
FIG. 11B illustrates a perspective view of the dividing lines used for the further sectioning into a final device element of a multi-layered light source panel such as removed from FIG. 11A.
Figure 11C:
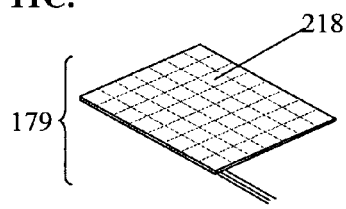
FIG. 11C illustrates a perspective view of a two-dimensional multi-layered light source panel array sectioned from the element shown in FIG. 11B.
Figure 11D:
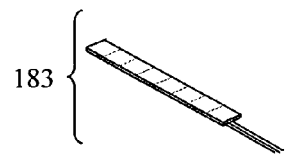
FIG. 11D illustrates yet another perspective view of a multi-layered slight source panel sectioned from the element shown in FIG. 11B and configured as a linear array.
Figure 11E:
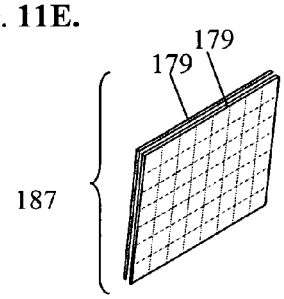
FIG. 11E illustrates a perspective view of the two-side emitting sub-assembly formed by the back-to-back attachment of the multi-layered light source panels shown in FIG. 11C.
Figure 11F:
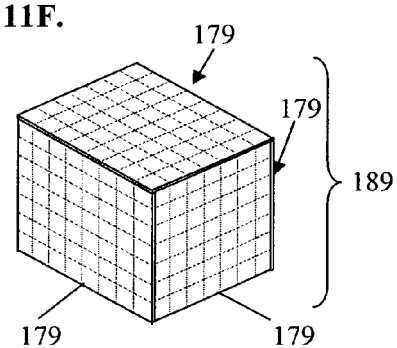
FIG. 11F illustrates a perspective view of the five-sided emitting sub-assembly formed by the attaching the multi-layered light source panels shown in FIG. 11C to the sides of a cube.

A distributed manufacturing approach is adopted wherein there is but a single continuous package structure accommodating every LED arranged in a super-array, containing many sub-arrays. This approach is more inefficient than using discrete printed circuit boards 163 and discretely packaged LEDs 157, as has become common practice, or even extended electronic circuit boards with individually die-bonded LED chips, discrete conventional optics glued above them. The multi-layer invention of FIG. 7, for example, can be implemented using very large (if not continuous) sheets or panels for each and every layer, with no need for the inefficiency of handling discrete elements, other than the LED chips 70, themselves. This distributed multi-layer packaging approach is shown schematically in the sequence of FIGS. 11A–F, in one possible configuration with multi-layer composite panel 181 much larger in physical extent than any constituent sub-panels 179 (FIG. 11C) that are to be used as a yielded product. Unlike the discrete circuit boards 163 and packages 157 of FIGS. 10A–D, the approach of FIGS. 11A–F is more akin to the multi-layer planar processing used in silicon microelectronics, wherein the distributed multi-layer microelectronic wafers are later diced into individually yielded devices with advantageous economies of scale. With similarity, overall multi-layer composite panel 181 is later cut or sliced into separate sub-panels 196 (along preplanned slicing lines 191 and 193, which may in turn be reduced to even smaller illuminating entities such as plates 179 as in FIG. 11C and bars 183 as in FIG. 11D (possibly cut from smaller plates 179. Plates such as 179 may be bonded back-to-back as shown in FIG. 11E, or to the surfaces of a cube as shown in FIG. 11F. If this general approach were applied to the structures shown in FIGS. 10A–D, layers 163, 167, 165 and 58 are would be ruggedly laminated so as to form a basis for plates 179.

Similar attachment of layer 60 above layer 58 is complicated by the need to maintain an air (or low refractive index) gap between them over the output aperture. One solution is to apply a bonding agent between layers 58 and 60 only in the dead regions surrounding the effective sub-array apertures, with these same dead regions exceeding the width of cut lines 191 and 193. Another solution is to add pre-cut pieces of layer 60, and any output diffusing layer 28, as a post process prior to use. Yet another solution is to choose prism refractive index and geometry in layer 58, spacing G1', and the space allowed between the prisms of layers 58 and 60 anticipating a transparent low refractive index media adhesive or epoxy filling the gap between layers 58 and 60, rather than air. Fluorinated polymeric liquids manufactured, for example, by Addison Clear Wave LLC or DSM Desotech, can be polymerized with refractive indices as low as 1.42. Prism elements can be formed in acrylates and other polymer materials with refractive indices as high as about 1.7.

The distributed manufacturing approach symbolized by the multi-layered panels or sheets of FIGS. 11A–F only pre-suppose a practical method for distributing and incorporating large numbers of LED chips efficiently within them. Although conventional pick-and-place methods are compatible with this approach, it would be preferable to place the LED chips in the extended arrays in a collective rather than individual manner. Collective attachment methods are enabled by recent advancements in LED technology creating availability of LEDs with transparent substrates having both electrical contacts on the same side of the chip (allowing so-called flip chip mounting). Such one-sided LEDs can be soldered to metallic circuit elements en masse by heating generally to re-flow deposited solder contacts for all LEDs at the same time. Collective LED placement is enabled by the continuous packaging structure envisioned herein, and introduced further below.

Practical applications vary with the density of illuminating pixel apertures (218 as in FIG. 11C; 102 in FIG. 7), the number of lumens provided by each pixel aperture, and the size and shape of the resulting panel. Some general lighting applications are offered by the present invention used with discrete LED packages, as illustrated by way of two examples that follow. Yet, there is a much wider variety of lighting applications made possible by the distributed packaging approach that will be addresses through additional discussions and examples.

J. General Lighting Applications of Pre-Packaged LEDS in Multi-Layered Arrays

Mono-colored light emitting diodes (LEDs) are usually 0.5 mm to 1.0 mm square chips cut from 2" diameter wafers, 6–10 thousandths of an inch thick (0.010"=0.254 mm). Although the diode itself is formed by epitaxial-layers grown on top of the square substrate's surface, light is emitted from the entire chip, which is preferably transparent. While such a chip makes an ideal emitting region 70, manufacturers prepackage it with wires attached, either in a clear plastic bullet-shaped molding, or as contained on a small ceramic circuit board. In either case, the discretely packaged LED can be arranged to emit through a square emitting aperture, and organized with companion LEDs into a planar array that would be favorably treated by the present invention. As such, an array of pre-packaged LEDs implemented as in FIG. 7 or FIGS. 8A–C could be used, at least in principal, in a variety of practical general lighting application.

As one of the many general lighting applications possible for an illuminator of the form of FIG. 7, consider the case where each conventional package element 161 (FIGS. 10A–D) contains one each of a state-of-the-art red, green and blue LED 70, and that the array of pixels is arranged as in FIGS. 10A–B. Suppose each LED group has an output aperture 24 that is made square and 3 mm on a side, with spacing W' 44 between all emitting squares 24 also 3 mm. Total thickness of multi-layer 143 is approximately 3–3.5 mm, including the 1 mm thickness of LED packages 157, spacer thickness G1' between emitting apertures 177 and prism sheets 58 and 60, and the combined thickness of layers 58 and 60. Spacer thickness G1' for the contiguous output images of FIG. 4 is about 0.625 W (or. 1.875 mm). High-performance semiconductor LEDs, such as those manufactured by LumiLeds, yield approximately 20 lumens per die at drive powers in the range of 0.25–0.35 watts dc. Assuming adequate heat sinking, and an approximate optical transfer efficiency of 50% from output apertures 218 as in FIG. 11C, means that approximately 30 lumens of mixed red, green and blue light could be yielded from each pixel's output aperture. As industry advancements in the number of lumens per die, $L_d$, are made over time, n dies are used per pixel, and as the optical transfer efficiency, $\eta$, is optimized, the number of yieldable lumens per pixel, n $L_d$ $\eta$, may become significantly greater than 30.

K. LED Equivalent of 100-Watt Light Bulb

Yet, with 30 RGB lumens per 6 mm by 6 mm illuminating pixel 218, the luminous equivalent (1690 lumens) of a 100-watt General Electric SoftWhite™ light bulb can be achieved with only 56 discrete LED packages 157 and a total of 168 light emitting diodes. If arranged in a nearly square 7 pixel by 8 pixel array, the resulting panel would be 42 mm×48 mm, and less than 4 mm in overall thickness T', depending on the various layer thickness and offsets used. Such a compact lighting element 179, represented schematically in FIG. 10C, would have many practical uses, as its life expectancy alone exceeds that of incandescent lamps like the General Electric SoftWhite™ light bulb by more than 100 times. With its 168 diodes driven at 0.25 watts apeice, the total electrical power dissipated would be 42 watts. In addition, the color temperature of the white light emitted by the mixture of red, green and blue LEDs is adjustable electronically, allowing user selectable panel color.

L. LED Equivalent of 75-Watt PAR-30 Flood Lamp

As a related example, consider GE's industry standard 75 watt, wide-angle halogen floodlight PAR-30, which delivers 1050 lumens over a useful life of 2000 hours. Using the same configuration and dimensions just mentioned above, equivalent performance can be achieved with the 6-element by 6-element array 179 as illustrated in FIG. 10C. Outside dimensions are 36 mm by 36 mm, and electrical power, 27 watts.

The current worldwide market for all light bulbs is over 1 billion units per year. For solid-state lighting structures of any kind to serve even a small share of this market, manufacturing costs must be reduced towards comparable levels with existing light bulb technologies. Not only does the distributed multi-layer packaging envisioned in FIGS. 11A–F address this need, but facilitates panel combinations such as back-to-back arrangement 187 in FIG. 11E and the five-sided lighting cube 189 shown in FIG. 11F.

The distributed packaging of LED chips within the context of the present invention enables a new class of high lumen-density light sources that potentially replace high-lumen light bulbs currently in use within many commercial application, including video projectors, spot and flood lighting luminaires, automotive head and taillights, to mention just a few.

M. Practical LED Light Sources for LCD and DMD Video Projectors

The most demanding application example for monolithically formed LED light source panels formed by the present inventions involves replacing the 90 to 150 watt halogen arc discharge lamps used in all LCD and DMD front and rear image projectors with comparably performing LED light source panels anticipated, for example, by FIGS. 7 and 11A–F. Applying the present invention to LCD and DMD projectors, however, requires a denser packing of LEDs per unit area than any imagined general lighting or illumination need. The reason for this is that the total illumination provided by the LEDs in a projector must pass through an image aperture that is typically less than about 18.3 mm×24.4 mm in cross-section. Not only is this target illumination area considerably smaller than the conventionally packaged high-lumen panels illustrated in the general lighting examples above, but also the panel's intrinsic +/−22.5-degree output is too wide for efficient usage without additional angular compression. Projector images are created by LCDs and DMDs, which are best illuminated with beams whose angular extent has been reduced to about +/−12 degrees in air. While lenses can be arranged for this purpose, their effect is to further increase beam area, extending the potential for inefficiency. The implication of this reasoning is that the density of the LED arrays must be considerably greater than is allowed physically by the discrete packages sizes of FIGS. 10A–D. The multi-layer packaging approach enabled by the elevated prism sheet bi-layer invention of FIG. 7 is one efficient way to simultaneously satisfy both the beam area and beam angle constraints imposed within efficient projector systems.

Halogen arc lamps are the existing sources of illumination used in modern video (image) projector systems. Intense halogen arcs surrounded by a glass bulb typically deliver 60 lumens/watt into free air (or about 6000 lumens for the relatively long lived Philips 100 watt lamp). After inefficiencies for light collection, beam formation, polarization, infra-red filtration, overlap with the SLM's aperture (spatial and angular), imaging optics, and color filtration, to mention the most significant ones, only about 1000 to 1200 lumens actually make it to the projector system's viewing screen. The most significant arc lamp inefficiency comes from its poor spatial and angular overlap with the rectangular 4:3 aperture format of standard LCD and DMD spatial light modulators used to form the image that is to be projected. Beams of light collected from arc lamps are intrinsically circular which wastes 40% of the collected power.

Best SLM performance comes when the angular extent of light passing through the SLM aperture is limited to about f/2.4 or +/−12 degrees. Such degree of collimation is required in most LCDs to achieve a desirable image contrast ratio. And, with DMDs, such angular limitation is associated with the limited range of micro mirror motion. Bulky reflectors and lenses are used with halogen lamps to provide this degree of collimation. Often, other bulky elements are added to improve beam uniformity and remove infrared heat.

In addition to this, the physical size of the SLM aperture is made as small as possible because SLM unit cost is directly related to aperture area. Typical LCDs are 1.2" on the diagonal and as small as 0.7 inches. DMD size, which depends on the size of its individual micro mirrors (e.g. 17 microns square), also depends on the image resolution. When image resolution along the horizontal axis is 1024 pixels, for example, the DMD diagonal is about 0.9 inches.

N. Rectangular Light Source Apertures for Illuminating Rectangular Images

LED arrays are intrinsically rectangular and therefore can be readily shape-matched spatially to fulfill the needs of the rectangular LCD and DMD image aperture. Angular matching is facilitated by the behavior of prism sheets 58 and 60 (or the micro reflectors 136), which aside from establishing beam uniformity, also pre-condense output beam angle to +/−22.5 degrees or less in each meridian.

These capabilities, plus the ease with which LED illumination is color segregated, enables LED arrays of the present inventions to illuminate LCDs and DMDs as well as halogen discharge lamps generating roughly twice the number of input lumens.

It will be shown, through the series of examples to follow, that with common projection system inefficiencies, a uniform rectangular emitting pixel array matched both spatially and angularly to an associated SLM aperture need only supply about 3000 lumens of white light if the projected screen image is to embody at least 1200 lumens. Then, with each emitting pixel including a red, green and blue LED triad yielding at least 30 lumens of output light within a cone of +/−22.5 degrees, the perfect angular transformation of this light to +/−12 degrees by a lens or mirror system, and the routing of transformed light through a 4:3 SLM aperture with a 1.2 inch (30.48 mm) diagonal, a calculation is made of the number and size of light source pixels involved. The SLM aperture is 24.384 mm along the x-axis and 18.288 mm along the y-axis. The effective light source aperture must then be made smaller than this because of the beam expansion produced by a 22.5 degree to 12-degree angular transformation. The operative equalities between lamp and SLM for these illustrative conditions are therefore $(L_x)$ Sin (22.5) =(24.384) Sin (12) and $(L_y)$ Sin (22.5)=(18.288) Sin (12), where $L_x$ and $L_y$ are the light source dimensions along its two rectangular edges. Consequently, $L_x$ and $L_y$ are 13.25 mm and 9.94 mm respectively. This means that for maximum transfer efficiency the light source's square output pixels must fit completely within this area. Since each tricolor light source pixel is taken as yielding 30 lumens total, we know that at least 100 such pixels are required to yield 3000 lumens. One hundred square pixels distributed in a 4:3 array over this light source aperture forms an array of 11.547 by 8.66 pixels. Since fractional pixels are not realistic physically, the nearest unit pixel array is 12 pixels by 9 pixels, which if feasible, yield 3,240 lumens. For 12 pixels to fit along the source's 13.25 mm edge, each pixel size has to be no larger than 1.1 mm on a side.

The implication of this compaction is that it must be possible to collocate 3 high output LED chips within about a 0.25 mm square. Such compaction is impossible whether using any conventionally discrete package 157 (FIGS. 10A–D) or the fourfold optical expansion method of FIGS. 4 and 7. High output red, green and blue LEDs available commercially are typically 0.5 mm square. This means at best that the LEDs would need to be mounted touching each other if to fit within the 1 square millimeter density required (high output LEDs are about 0.5–1.0 mm on an edge). Creating such a practically continuous LED wafer is impractical because of heat dissipation requirements, which require LEDs be separated by sufficient clear space between units, perhaps as much as their width. With this separation constraint, the smallest optically expanded output pixel size is actually about (2)(2) or 4 mm on an edge, which is too much larger than the 1.1 mm size needed. Using 4 mm output pixels the 13.25 mm×9.94 mm array becomes only 3×2 and yields a total of only 180 RGB lumens—far short of the 3,000 lumens required. Moving the LEDs closer together, so that they squeeze into a 1.75 mm square, only increases total RGB lumens to 360.

O. LED Color Segregation and its Critical Effect on Efficient Illumination of Small Apertures By starting with physically segregated red, green and blue light beams, and then combining them so that they overlap spatially, it is possible to create a composite RGB beam having a significantly higher lumen density and a significantly aperture size than would be otherwise possible using an RGB light source.

The reason for this is that a single planar substrate of red, green and blue LEDs cannot be made small enough in area for practical projector use. As was just discussed, each triad of 0.5 mm square red, green and blue LED chips takes up a square area between 1.75 mm and 2 mm. Hence to generate 3,000 lumens, at 30 yielded RGB lumens per triad, and 100 triads overall, implies a 12×8 triad array. Since to be used with the present invention these triads must be spaced from each other by their width, this implies that the overall aperture is as large as 32 mm×48 mm, exceeding the size of the 1.2" LCD. Then, since the output angle must be reduced from +/−22.5 degrees to +/−12 degrees, using such a panel efficiently requires a 66 mm×88 mm LCD (4.3" on the diagonal).

Segregating three separate mono-colored light source panels, and then providing the means for their optical recombination (discussed in more detail separately below), enables a sufficiently high lumen density within a sufficiently compact aperture area.

By pre-separating the illuminating beam's constituent colors, each monochromatic light source is only required to supply about a third of the total lumens needed for practical image projection, and can each do so over the full 13.25 mm by 9.94 mm illuminating aperture example provided above. With this division, the same 1.1 mm square mono-colored output pixels assumed to yield 10 monochromatic lumens apiece, arranged in the same 12 by 9 pixel array, provide the 1080 lumens minimum needed in each color. Then, as future advancements are made in LED output per chip and in LED coupling efficiency, even more powerful output beams are possible by means of this efficient color segregation method.

Conventional halogen arc lamps supply white light that is a fixed mixture of red, green and blue. Modern projection systems based on these lamps already use dichroic color-splitters in many different arrangements to physically separate this white light into red, green and blue input beams. The reason they do this is not to increase light output per unit area, which is fixed by the halogen lamp's arc, but rather to allow the light source's use with three separate monochrome LCDs.

These same dichroic color splitters will be applied with the present invention as the means for overlapping the three mono-colored light source panel beams. And, only with the LED light source panels of the present invention (FIGS. 7, 8 and 11) can the emission colors be so simply and efficiently segregated into separate beams.

A practical projection system, as in the present 1.2" LCD example, requires an illumination source providing a minimum of 1080 lumens at f/1.4 in each color over a 13.25 mm×9.94 mm illumination aperture. This corresponds to a minimum effective lumen density in each color of 8.2 lumens/mm$^2$, achieved in the present invention with 0.55 mm emitting regions spaced 0.55 mm apart, so as to create 1.1 mm output pixels of best uniformity using the four-fold area expansion method explained in FIGS. 4–5.

Constraints on this color-segregated panel geometry can be relieved, by relaxing uniformity with less than a 4:1 area expansion. The degree of area expansion depends continuously on the exact physical gap spacing, G1', as set by spacing layer 84 in FIG. 7. If we made the gap G1' such that each of the four virtual emitter images 26, 27, 108 and 109 overlapped slightly, the resulting area expansion would be proportionally less than the perfect factor of 4. With the degree of virtual image overlap, V, 217, being the same in both the orthogonal x and y directions, as in FIG. 12, the expression relating the degree of overlap to the resulting pixel area expansion, E, is given as in equation 8. When V=0, equation 8 returns E=4 as expected. Then, the emitter spacing, W', which for perfect fourfold expansion is equal to W, must equal W−V.

The consequence of this approach is that the overlap region, 221, contains twice the lumens, and the overlap region 223, four times the lumens, as the completely displaced regions 225 residing at the four corners of the illumination pixel. This non-uniformity, however, when it is required, can be homogenized by an optical mixing means provided during the global angle transformation process to be used within the associated projector system, as will be explained in the projection system examples that follow.

$$E = \frac{(2W-V)^2}{W^2} \qquad (8)$$

Regardless, it takes a relatively dense two-dimensional packing of LED emitting apertures to enable such a powerful source of output light. For the above projector system example at 8.2 lumens/mm$^2$, which is 8.2 MLux.

P. Compartmentalized Multi-Layer Package for Flip-Chip LED Back Plane Array

The light source system of FIG. 7 provides one example of densely packed LED emitting regions 24 under the present invention. In this case, the output lumen density is limited by the degree to which the area of the emitting apertures 24 exceeds that of the size of the compartmentalized LEDs 70 themselves. Densest possible packing occurs when LED chips 70 themselves become the emitting regions 24 and when no confining structure 72 is used to isolate and homogenize their individual emission from one another. In some situations it may be preferable, nonetheless, to contain each LED chip within its own homogenizing cavity 72.

Figure 13A:
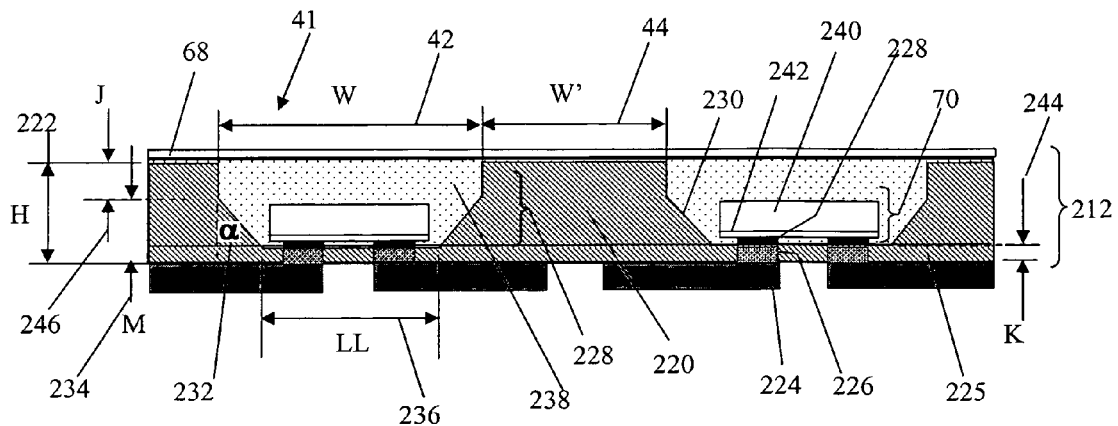
FIG. 13A illustrates a cross-sectional side view of the parallel layers for a two-dimensional array of light emitting diode chips having two electrical contacts on the same side of the chip, the packaging layers including provision for inter-digital electrical interconnection, separate diffusely reflecting compartments surrounding each diode chip, a clear dielectric encapsulant within each compartment, and a light scattering over-layer.
Figure 13B:
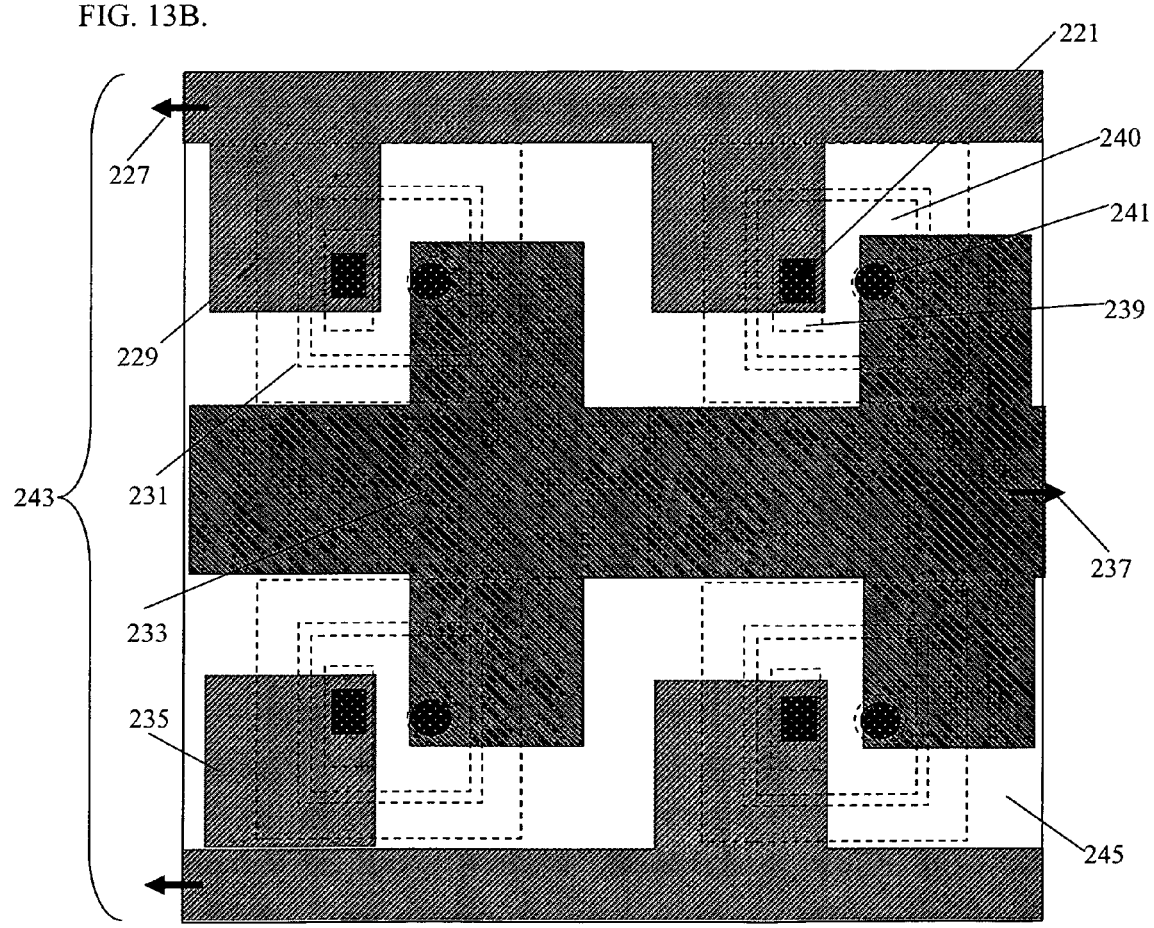
FIG. 13B illustrates a representational bottom view of the multi-layered light source arrays shown in the cross-section of FIG. 13A.

One example of a dense and continuous back plane package structure appropriate for LEDs having planar electrodes is given schematically in within cross-section 212 of FIG. 13A and bottom view 243 of FIG. 13B. The individual LEDs 70 are mounted flip-chip (electrodes below the light emission) on composite, electrically-insulating, reflective base layers 220 and 225 of thickness H, 222, that include appropriate conductive circuits 224 and conductive vias 226 between those circuits and the LED contacts 228.

The illustrative conductive circuits 224 consist of two sets of inter-digital interconnect bars 227 and 233, similar to the approach shown by 171 and 169 in FIG. 10B, each connected to their own common buss or cross bar (not shown). Arrow 227 points in the direction of one common buss bar and arrow 237, the other. All interconnect bars represented by 227 and 235 are generally the same in form and function and interconnect the same side of the LED junction. Interconnect bars like 233 interconnect the opposing side of the diode junctions. The inter-digital metal structure 224 can be formed by vapor deposition and photolithography followed by electroplating, or by a master electrode pattern applied to burn away the open region 245 using a batch machining process such as electro-discharge machining. The via-structure 226 can be formed (or grown) as an array of mesas on top of this pattern. These conductive-patterns are made sufficiently thick to handle not only the electrical power requirements of the LEDs, but also the associated heat dissipation load involved. One way to build the composite of FIGS. 13A–B is to form the circuit structure 224, and then cast onto it a suitable composite insulating layer 225 that is just then enough at thickness K, 244, so that the vias 226 remain exposed. Then the reflective cavity structure layer 220, made separately by molding, embossing, casting or electroforming, would be laminated to insulating layer 225. The hollow cavities 248 within this super-layer also serve as convenient rough alignment guides for the LEDs to be placed within them.

The square (or rectangular) cavities 248 are made only slightly larger in extent than the emitting area of the LEDs themselves. Sloped sidewalls 230 are used to increase the amount of LED light coupled to the cavity's output aperture of width W, 42. The sloped sidewall can be a diffusely reflecting material identical to the base layer material 220 or deposited as an external coating. The sloped sidewall 230 can also be made specularly reflecting. In either case, light emitted by the LED towards the side of the cavity is reflected generally upwards, towards the cavity aperture, 24. In any event, this sidewall is sloped at an angle, α, 232, to the vertical, which may in some cases be nearly 0 degrees, and covers a height M, 234, that is made approximately equal to the thickness of the LED chip 70, which is typically on the order of 0.005 inch. With the LED chip 70 being generally square and LL millimeters on an edge 236, the cavity aperture W, 42, is given by equation 9.

$$W = (2M \tan \alpha) + LL \qquad (9)$$

The cavity medium, 238, can be air, or filled with a high refractive index encapsulating dielectric such as clear silicone, an acrylic resin or a specially formulated transparent epoxy such as is commonly used for encapsulating LEDs, to mention a few. In addition, this cavity medium 238 can be loaded lightly with a sub-micron scale scattering material, to facilitate volume diffusion of out-coupled LED light from the sidewalls and from the LED surfaces themselves, when the additional randomization so provided is preferred. When for example, LL equals 0.5 mm, chip thickness, 0.01 inches, and sidewall angle, 45 degrees the cavity aperture W becomes 0.754 mm and exceeds the chip dimension by 50%, which might be larger than desired in some of the most densely packed applications, such as in the present projector source example. The cavity aperture can be reduced, however, by sharpening the sidewall angle 232 and/or by using a thinner chip. If the sidewall angle were made 30 degrees, for example, the aperture size becomes 0.646 mm, which is only 30% larger than the chip itself. If made 10 degrees, the aperture size becomes 0.545 mm, which is only 10% larger than the chip itself.

In the base layer example of FIGS. 13A–B above, the LED chips 70 are presumed to be, at least for this illustration, of the new semiconductor types that have optically transparent substrates 240. The emitting p-n junction 242, in this case, is mounted preferably facing the interconnect vias, 226. One reason for preferring a junction-down LED orientation (sometimes called flip chip) is to simplify electrical attachment to the base layer. Another reason for this orientation is to facilitate the removal of heat through the vias 226 and the electrical interconnects 224, which can be thickened for example by electroplating in the vicinity of the LEDs so as to serve as a convenient heat sink as well.

The base layer 220 is made of any material that can be molded, cast, or embossed, and that has or is given the appropriate mechanical, thermal, and optical properties. Typically, this means a polymer that has been loaded with a ceramic, glass or metal powder, forming a composite that can withstand the heat dissipated at the LED junction, and into the deposited metal interconnects 224 and vias 226. Each LED chip 70, when operating at full output, may be running at 0.25–0.35 watt, and in some cases even higher. Not only must the base layer material be thermally stable, it must be counted on to service as part of the collective heat sink. The cavity thickness, K, 244, is then chosen as a compromise between physical integrity and thermal transfer ability. One of the possible materials that could be used for this purpose is a new composite system developed by Corning, Inc., called CORTEM™. This new material is a blended alloy of a low melting temperature glass and a co-melted polymer that has excellent thermal and ignition resistance. A wide variety of appropriate glass-polymer and glass-ceramic-polymer composites can be used as well, including those formed from precursor organometallic liquid mixtures based on butoxides and isopropoxides, wherein molecular-scale mixing is used to improve mechanical consistency.

Q. Compartmentalized Multi-Layered Package for Top-Contact LEDS

Cavity gap height J, 246, in FIG. 13, is used to provide some offset between the LED surface and the output diffuser 68. The reason such a gap, J, is introduced, is to extend the cavity's interior scattering or reflecting surface without increasing the width of the cavity aperture 42, thereby providing some diffusive mixing of emitted light, when its wanted. Diffusive mixing is useful not only as a means to soften the tendency for emission hotspots above the LED surface itself, but also as a means to provide some degree of color mixing when using tri-color LED clusters.

Figure 14:
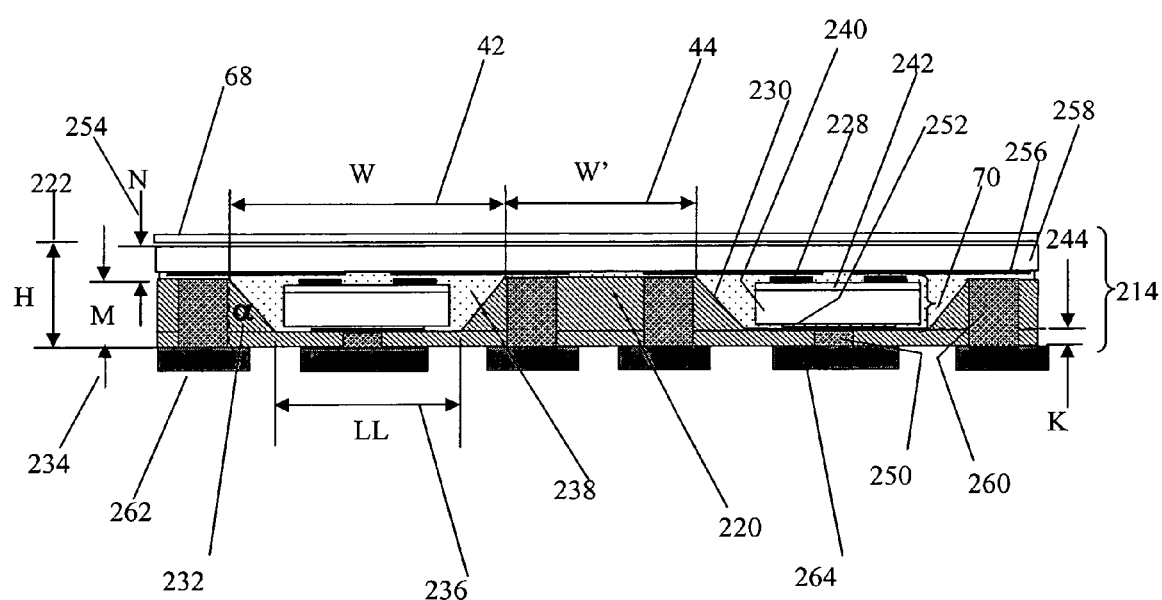
FIG. 14 illustrates a cross-sectional side view of packaging similar to that of FIG. 13, but for light emitting diode chips requiring electrical interconnection to both sides of the chip, or to contacts on one side of the chip, that side having to face towards the primary direction of light emission.

Mounting the LEDs, junction up, is also possible, as for example, in FIG. 14 using such a structured base layer, but in this instance, a transparent mounting layer 258 must be used to support some interconnect circuit bars 256 and the soldered LEDs themselves. In addition, base layer 221 must have vias 260 that pass through the entire layer thickness H, 222, to reach, and connect with these interconnection bars 256. The base layer 221 provides the surrounding reflective cavity as before, but now contains not only the LED interconnection vias 260 and the LED interconnection circuitry base 262, but as necessary, thermal heat sinking vias 250 and heat sink tabs 264. This method can be combined with that of FIGS. 13A–B for LEDs having one electrode on the top and the other on the bottom.

R. Fully Integrated and Compartmentalized Light Source Panels

FIGS. 15A–15D show four possible sets of fully integrated two-dimensional light source panels combining the high-density LED back plane of FIGS. 13A–B with the multi-layer illuminator arrangement of FIG. 7. The same type of integration applies to the arrangements of FIG. 14 and FIG. 7, and also to the light sources of either FIGS. 13A–B or FIG. 14 and the system of FIG. 8.

The four illustrative cross-sections 248 (FIGS. 15A), 221 (FIG. 15B), 223 (FIG. 15C), and 229 (FIG. 15D) all use elevated prism sheets 58 and 60, separated from the plane of emitting apertures by spacer layer 84 (or 217) of thickness G1' or G1", G1' and G1" being the appropriate physical thickness for the degree of virtual image separation required, the spacing medium being air (G1') or transparent dielectric (G1"). Boundary 57 between lower prism sheet 58 and dielectric spacer layer 217 is either a thin air gap formed by mechanically resting one discrete layer 58 on another 217, or a purposeful optical coupling wherein layers 58 and 217 are bonded together, for example, by means of optical adhesive or epoxy. In many cases, the existence of an air boundary between the lower prism sheet and the emitters beneath is preferable, in that it imposes a limit on the range of angles input to the lower prism sheet's substrate layer. While this limitation in turn may limit the percentage of power transferred from layer 217 to layer 58, it leads to a more narrowly confined output beam 219. Making all media boundaries between the LED chips 70 and lower prism sheet layer 58 optically coupled increases the amount of output light 219 emitted in higher angles, generally widening the beam's angular extent.

Preferable choices for cavity dimensions W, H and J, in FIGS. 13, 14 and 15A–D, as well as for the reflective properties (diffuse or specular) given to its interior walls 230 and the optical properties given to its immersing media 238 depend on the size 236 of the LED and the specific system application within which the LED light source array is to be used. These choices, regardless of application are governed by the core value of the optical quantity known as etendue. Core etendue is equivalent to the surface area of the LED's emitting junction (nominally $LL^2$) times $Sin^2\psi$, $\psi$ being the maximum possible emission angle. All subsequent reflection and scattering events undertaken by the emitting light as it leaves the cavity, within transparent substrate 240, against cavity sidewalls 230, within immersing media 238 and from any aperture layer 68, work to increase etendue, primarily by an increase in effective emitting area. The most preferable combination of dimensions and materials are those that keep the etendue of the output aperture as close as possible to that of the core value, and that maximize the ratio of output lumens to those generated in the LED's junction. Yet, when the emitting cavities 228 are to be used in conjunction with the elevated prism sheets 58 and 60 as in FIGS. 15A–D, it is beneficial to couple these layers to the cavities in a way that releases the most to the restricted angle output light 219.

One illustrative structure for FIGS. 15A–D is shown in cross-sectional detail 248 (FIG. 15A), and involves a compartmentalized spacer layer 84 of thickness G1' 19 placed between the emitting array of FIGS. 13A–B and the optical multi-layers 58 and 60 of FIG. 7, as described above. The spacer sidewalls 85 become part of the extended light source as they reflect, diffusely (or specularly), light impinging on them from both optical prism sheet 58 and from emitting apertures 24 (i.e. output layer 68 of emitting cavities 228). For most applications, it is preferable that at least some portion of sidewalls 85 and emitting plane layer 68 involve a scattering mechanism, as randomization of light ray angles and polarization state are required for best system performance, as will be shown in more detail by way of the application examples to follow.

Monolithic light source panel 248 replaces the discrete embodiments shown in FIGS. 10A–D. The printed circuit board 163 and the discretely attached LED packages 157 (of FIG. 10B) it supports are replaced by a continuous backplane layer 220 that includes LED-encapsulating media 238. Discrete LED-encapsulating media 175 and external reflective diffuser sheet 167/177 are replaced by the LED-encapsulating media 238 (which may optionally include scattering particles), the diffusely-scattering surface properties of packaging material 220 and the inclusion of an optional scattering layer 68. Transparent spacer layer 165 is replaced by the compartmentalized spacer layer 84 and by its air-filled compartments 83.

In this case, spacer medium 83 is air, which effects the best value of prism sheet offset G1', the elevation associated with the amount of emitting aperture expansion required, which will be explained in more detail below. G1' is nominally 0.625 W for a fourfold aperture area expansion, as in FIG. 4, with 90-degree prisms in air (W being the edge size of emitting apertures 24).

Figure 15A:
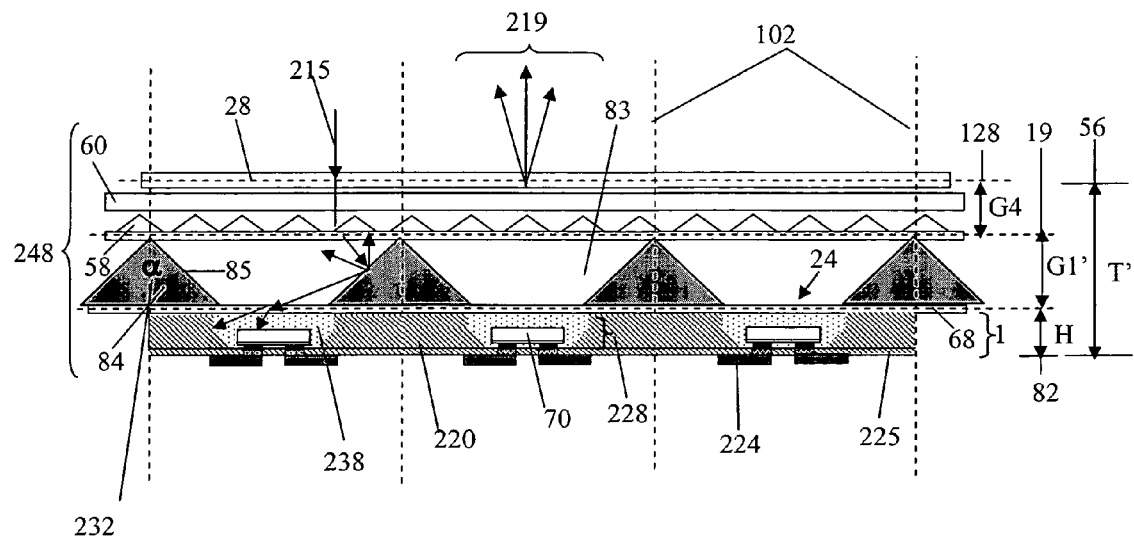
FIG. 15A illustrates a cross-sectional side view of completed two-dimensional multi-layer light source panel illuminator structure for light emitting diode chip interconnections related to FIG. 13 and the elevated prismatic light directing layers of FIG. 7, featuring encapsulated LED chips and air-filled reflecting bins.
Figure 15B:
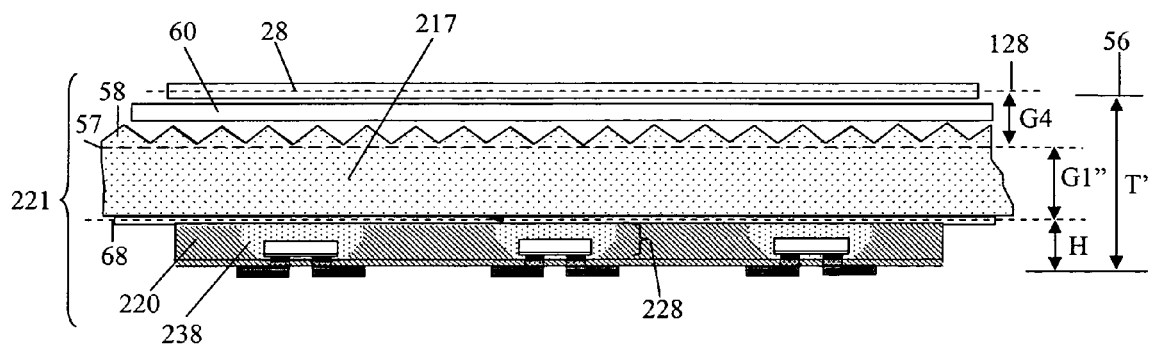
FIG. 15B illustrates cross-sectional side view variation on the completed two-dimensional multi-layer light source panel illuminator structures for light emitting diode chip interconnections of FIG. 15A, but with a dielectric spacer layer replacing the air-filled reflecting bins.

In some cases of practical interest, there is benefit to making spacer medium 83a transparent dielectric of refractive index n, a medium 217 in detail 221 of FIG. 15B that may or may not contain a very small amount of light scattering sites.

If the medium 217 is a transparent dielectric of refractive index n, and is in contact (mechanical or optical) with the substrate layer of prism sheet 58, the correct spacer thickness becomes G1"=nG1', as measured from the base of the micro prisms used. The presence of dielectric medium 217 in the path of the light emitted by apertures 24 increases each effective optical path length of each ray emitted and reflected by means of its effect on the refraction of light. Hence, for emitting apertures of width W, spacer thickness, G1" that enables the preferred four-fold emitting area expansion of FIG. 4 becomes approximately W, rather than approximately 0.625 W, the spacing required in air. The increased thickness may be useful when using smaller LED emitting apertures so that more substantial spacer layers can be used, making it easier to hold tolerance on spacer thickness. If the emitting aperture is 0.65 mm×0.65 mm, the spacer layer thickness in air is about 0.4 mm, but in acrylic is about 0.65 mm.

Figure 15C:
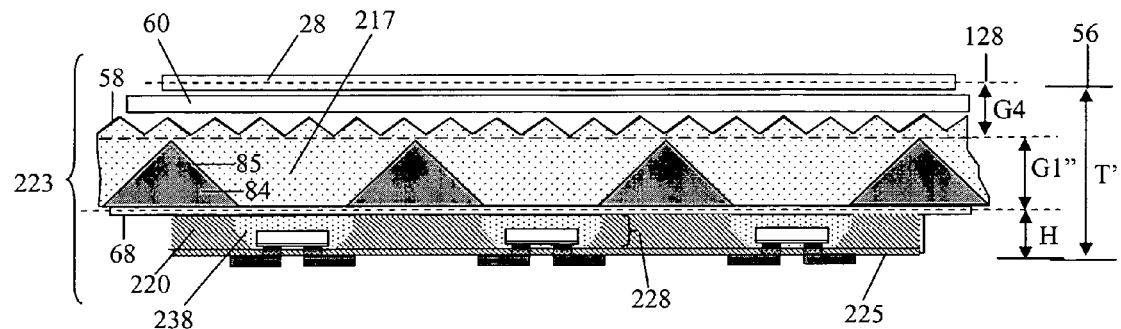
FIG. 15C illustrates another cross-sectional side view variation on the completed two-dimensional multi-layer light source panel illuminator structures for light emitting diode chip interconnections of FIG. 15A, but with dielectrically-filled reflecting bins.
Figure 15D:
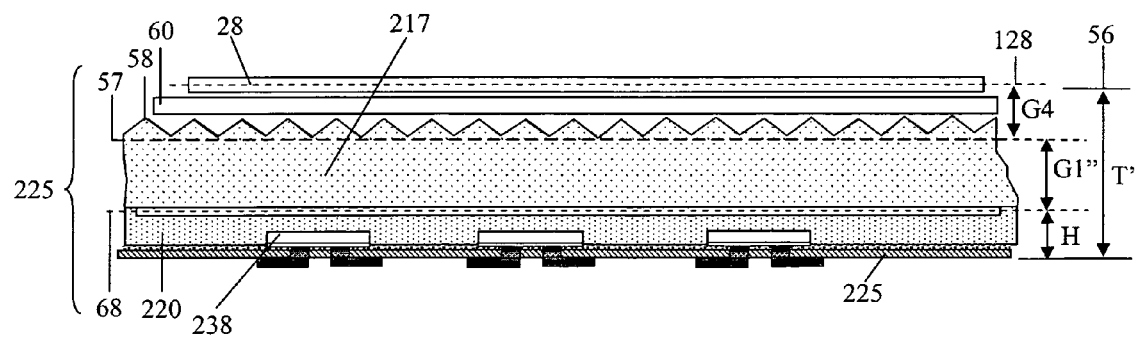
FIG. 15D illustrates yet another cross-sectional side view variation on the completed two-dimensional multi-layer light source panel illuminator structures for light emitting diode chip interconnections of FIG. 15A, but without reflecting sidewalls surrounding each LED chip and with a dielectric spacer layer replacing the air-filled reflecting bins.

There are three possible forms of this variation, shown as cross-sectional details 221, 223 and 229 in FIGS. 15B–D respectively. Variation 221 this form, prism sheet 58 lies on top of spacer layer 217 (or is coupled to it), and light from any one emitting aperture 102 is free to cross over into neighboring emitting apertures 102. Optical randomization in angle and polarization state is provided by diffuse reflections at layer 68 (if any) and by making cavity layer 220 of or coating it with a diffusely scattering material. Additional randomization is added as needed by a scattering phase within the otherwise transparent spacer media 217 and 238. Variation 223 has a composite spacer layer made up of reflecting structure 84, as in detail 248 but adding the transparent dielectric 217 into each reflecting compartment. Again, prism sheet 58 rests on top of (or is coupled to) the transparent medium 2171. Reflecting sidewalls 85 add angle and polarization randomization and, like detail 248, confine output emission to the individual output apertures 102.

Multi-layer variation 229 (FIG. 15D) removes confining cavities 228 from back plane layer 220, and include the LEDs 70 in a common transparent dielectric encapsulant that forms layer 220. Intervening diffusely scattering layer 68 and diffusely reflecting base layer 225 provide the angle and polarization randomization needed, and may be either mechanically or optically coupled to layers 220 and 217 as desired. Preferably, base layer 225, encapsulating layer 220, diffusing layer 68 and spacing layer 217 would all be laminated together monolithically, with boundary 57 between layers 217 and 58 being air. Equally preferably, layers 225, 220 and 68 would be laminated monolithically, as would layers 217 and 58, leaving a small mechanical air gap between layers 68 and 217.

There may be cases where the multi-layer variations 221, 223 and 225 as shown in FIGS. 15A–D respectively are useful because of their efficient index matching with dielectric cavity medium 238 and optional cavity output layer 68 which minimize optical output losses due to total internal reflections at an air dielectric boundary. Such reflections at boundaries between dissimilar dielectrics and especially between air and dielectric, trap reflected angles within the higher refractive index medium. Power losses from such dielectric entrapped limit the full output of emitted light from LED 70 and thereafter from integrating cavity 228. LED substrates have refractive indices between 2.0 and 3.0. Surrounded by air, these dielectrics trap a significant portion of the light emitted within the junction region of the LED itself. To limit this loss, LED manufacturers have routinely packaged commercial LEDs immersed in a transparent plastic encapsulant 175 (FIGS. 10A–D) having as high a refractive index is possible, normally 1.5–1.7. No matter what else is done towards improving output emission efficiency, the boundary between any standard encapsulant and the LED substrate traps a substantial portion of the emitted light within the LED substrate. Only increases to the encapsulating material's refractive index can reduce the fraction of light trapped within the LED. Matching the refractive index of spacer medium 217 to the index of layer 68 and to the cavity medium 238 eliminates any further TIR loss at the associated dielectric boundaries. Then, coupling prism layer 58 to spacer layer medium 217, and matching their respective refractive indices, transfers light trapping to the faceted prism surface itself, which intrinsically reflects and transmits light depending on the angle of incidence. Back reflected light is randomized in both angle and polarization on diffusive scattering within medium 217, layer 68 and on the exposed surfaces of layer 220. Some of this light will return to prism sheets 58 and 60 within output apertures 102 having angles of incidence that are output within the characteristically concentrated output angular range of beam 219.

The aperture expansion (and angle limiting) behavior expected collectively by the prisms in layers 58 and 60 do not depend on either of the prism sheets being bounded on both sides by air. It is only preferable that the two oblique prism faces defining each prism element be immersed in a medium of refractive index that is substantially higher than the refractive index of the prism material itself. Since air has refractive index 1.0, it becomes an ideal bounding medium for plastic prisms that have refractive indices about 1.5 by maximizing the refractive index difference. And, then since layer 60 is positioned above the prism faces of layer 58, it is simplest that layer 60 be bounded on both sides by air. Immersing the prisms of sheet 58 in an encapsulating medium simplifies its lamination to prism sheet 60, but requires compatible changes in prism material and geometry, as discussed earlier in relation to the structures of FIGS. 10A–D.

S. Mixing Colored Output Light from Planar LED Light Source Arrays of FIG. 15

The multi-layer light source panel structures of FIGS. 15A–D (cross-sections 248, 221, 223 and 229 respectively) become useful high lumen density monochromatic light sources for RGB lighting applications such as video projection when their mono-colored output beams are efficiently overlapped as a single composite beam no larger in spatial cross-section or angular divergence than characterized by any one of the input beams. Light beams of different color (wavelength) can be mixed without change in beam profile or divergence because etendue is conserved at each wavelength just the way it is conserved with the orthogonal states of linear polarization. Imagine a white beam of light composed homogeneously of red, green and blue wavelengths. When the white beam is separated into three mono-colored beams, the separated beams retain both the angular divergence and beam size of the original white beam, and by reciprocity, visa versa. Neither the separation nor mixing process changes etendue. Etendue increases or decreases when two beams of the same color are combined or divided.

Preferable methods for mixing three mono-color light source panel beams involve the use of three or four coupled prisms, the adjacent coupled surfaces of which are coated with multi-layer dichroic films selected to reflect and transmit light of specific wavelengths. The best-known configuration for doing this is the four-prism X-cube arrangement shown schematically in FIG. 16A, as detail 279. In this arrangement, two complimentary dichroic coatings 278 and 280 are applied, for example, to the individual prism surfaces of two of the four 45 degree-45 degree-90-degree prisms involved, 193 and 197 as in exploded detail 271 (for example, one coating 278 that reflects green while transmitting red and blue; the other coating 280 that reflects blue while transmitting red and green). Then, bonded together as in 279, illustrative red-colored light ray 249 enters the X-cube along a surface normal to face 199, and makes a 45 degree angle of incidence with coatings 278 and 280, either reflecting from these coatings or transmitting through them. Because of the red wavelength, this ray passes straight through both coatings 278 and 280. Practical dichroic coatings prefer fairly tight incidence angles around the optimized incidence angle (usually 0 degrees or 45 degrees). Departures from the optimum incidence angle cause unwanted polarization changes, wavelength shifts and reflections. Generally, the net efficiency of reflection and transmission decreases for angles of incidence further away from the optimized angle. For this reason, the standard X-cube is best suited to reasonably well-collimated beams and to dichroic coatings whose performance has been optimized for 45-degree incidence angles rather than normal incidence angles.

Figure 16A:
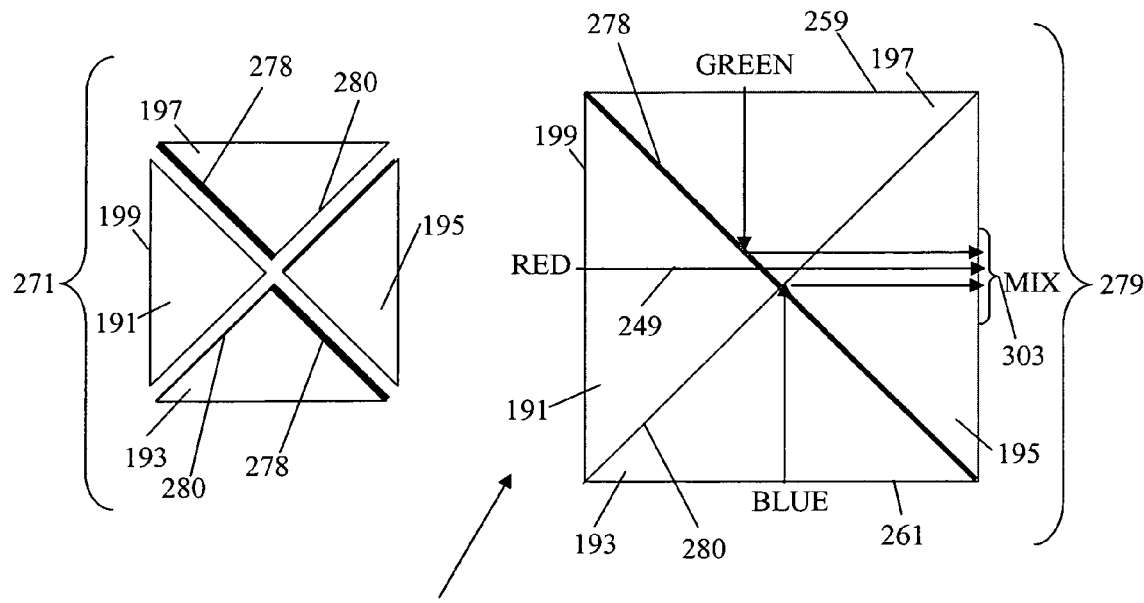
FIG. 16A illustrates the cross-sectional side view (and an exploded detail) of a prior art dichroic film coated prism method for the mixing of three uniquely colored light beams into a composite beam wherein the prisms are arranged with three input faces and one output face in the form of a solid cube.
Figure 16B:
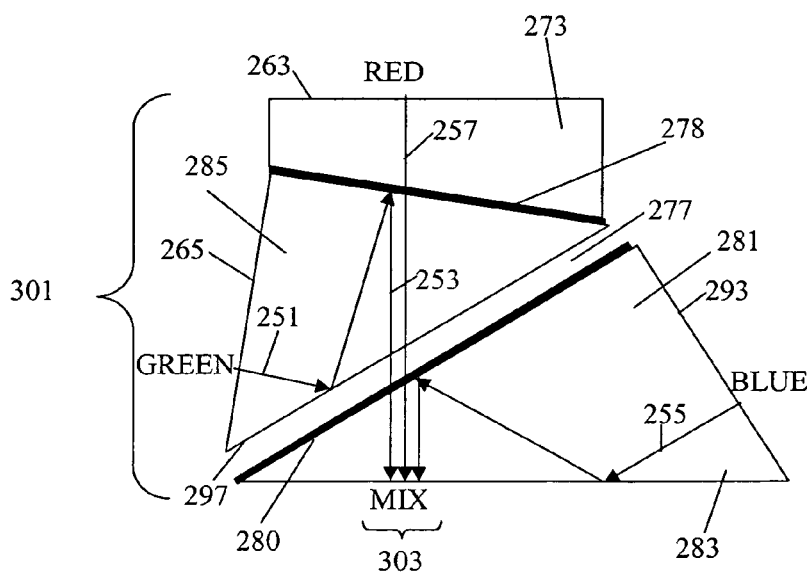
FIG. 16B illustrates the cross-sectional side view of another prior art dichroic film coated prism method for the mixing of three uniquely colored light beams into a composite beam wherein the prisms are arranged with three input faces, one output face and an intervening air gap.

A more tolerant color mixing prism arrangement know as Philips Prisms is shown in cross-sectional detail 301 of FIG. 16B that achieves the same three-color mixing with beams having wider ranges of incidence angles about the optimized angle of incidence. This three-prism involves two prisms 273 and 285 that share common dichroic coating 278, and a third prism 281 that positions its coating 280 across air gap 277 from prism 285. In this approach, the prism geometries are arranged such that refracted light is incident at each dichroic coating substantially along or near the coating's surface normal. The reason for this is that coating optimized for normal incidence all a wider range of incidence angles before showing unwanted reflective and transmissive behaviors. Illustrative green input ray 251 makes a total internal reflection with face 265 and approaches coating 278 at near normal incidence. Reflected ray 253 then transmits through prism face 265 and passes through blue-reflecting dichroic coating 280 as part of output light mixture 303. The comparable blue input ray 255 reflects from blue reflecting dichroic coating 280 and joins output light mixture 303. Comparable red input ray passes straight through all interfaces and also joins output mixture 303. Through this Philips prism arrangement, efficient power transfer performance has been achieved over at least a +/−13-degree angular range within the prism medium about an optimized angle near the coating's surface normal.

The importance of the arrangements shown in FIGS. 16A–B is that they enable the mixing of discrete mono-colored beams on a spatially and angularly overlapping output beam. In ordinary use, these prisms are used in conjunction with an external source of white light, such as the output beam of a reflectorized halogen arc lamp. In these applications, not only is the light source separated physically from the prisms themselves, the purpose of the prisms (and their dichroic-coatings) are to separate the white light into three separate mono-colored output beams. In many of the practical applications of the present invention to follow, these prisms will be combined with the mono-colored light source panels of FIGS. 15A–D to output a composite beam representing their spatial and angular overlap. In these cases, the light source panels of FIGS. 15A–D will be physically attached to the respective red, green and blue input faces (199, 259 and 261 for the X-cube; 263, 265, and 293 for the Philips prisms). The conjunction between these prisms and the associated light source panels, which is described in more detail later on, is unique in both its compactness and efficiency. Not only are the output apertures, square or rectangular, the output beams from the light source panels of FIGS. 15A–D convey no infrared to the prisms that must be removed prior to entry.

The same approaches are also advantageous in combining beams of p and s polarizations states, using reflective polarizer films in place of the dichroics, as will be discussed further below.

T. Examples of Practical Video Projection Systems having Integrated Mono-Colored LED Light Engines One of the more useful applications of such three-beam color mixing using the preferable LED light source structure of FIGS. 15A–D is provided by video image projection displays incorporating LCDs and DMDs. The exact methods of light source coupling depend on whether the projection system is using transmissive or reflective LCDs, or the reflective, beam-deflecting DMD, as will be explained by the examples that follow.

Using the mono-colored LED light source panels of FIGS. 15A–D in place of the presently relied upon halogen arc source illuminators in LCD and DMD projection systems is an advantageous change for numerous reasons. The compact illumination panels remove at least two-thirds of current projection system volume, eliminating the bulky reflector, imaging lenses, heat-reducing filters and cooling fans. As such, traditional projectors commonly considered "ultra-portable" today, improved with solid-state lighting panels may be made small enough to fit in one's hand, and thus "palm-top" in their designation. In addition to system compactness, light source life, currently measured in thousands of hours with halogen bulbs, increases almost 100× with the solid-state LED light source panels. And by using three electronically controlled mono-colored light panels, such improved projection systems offer painless color temperature control and field sequential color operation. In addition, the LED light source panels operate at low dc voltages, thereby eliminating the EMI and physical danger commonly associated with high voltage (and high pressure) halogen bulbs.

Integration of the light source panels of FIG. 15 into practical LCD and DMD projection systems is illustrated by the following thirteen examples, and these examples thereby extend the present invention.

LCDs as used in video projection systems are spatial light modulators containing a flat two-dimensional rectangular array of 480,000 (SVGA) to 786,432 (XGA) separately controlled image pixels arranged typically in a 4:3 aspect ratio. Reduced to its basics, and LCD panel is a thin layer of liquid crystal material sandwiched between two thin sheets of glass. Electrodes and active microelectronic devices on the glass plates can control the voltage applied across each image pixel. Pixel modulation is then achieved by changing the applied voltage so as to change the pixel's electrooptic nature, which in turn changes the way the pixel's effect on the linearly polarized light passing through it. For example, when such pixels are in their on state, linearly polarized light passing through is changed to its orthogonal polarization, and then passes through an output polarizer oriented to block the un-modulated linear polarization. When such pixels are in their off state, linearly polarized light passing through remains unchanged, and is blocked by the output polarizer. Unlike directly viewed counterparts used in laptop computer screens and desktop monitors, LCD pixels in video projectors contain no color filters. As such, image color is provided by the color of the light passing through the projector LCD. Full-color images are achieved in projectors by one of two approaches: three-color mixing or field sequential switching. Arranged for three-color mixing, projectors incorporate three LCD panels, one for each primary color (red, green, and blue), with the monochromatically modulated image beams mixed onto a single full-color output beam. Arranged for field sequential switching, full-color output images are then created by means of a single LCD panel whose input light is made red, green and blue in rapid sequence so that the output beam contains a series of spatially modulated red, green and blue images, which if flashed rapidly enough, appear full-colored.

The LCD panels themselves are made either transmissive, in that modulated (or un-modulated) input light passes through the panel's aperture as output light, or reflective, in that input light passing into and through the panel's aperture is reflected back by a mirror plane located at the LCD's back-plane.

Each of the thirteen examples that follow, illustrate preferable system integrations of mono-colored light source panels within practical LCD projectors.

U. Video Projector Example 1: 3-Panel Reflective LCD (FIGS. 17–18A–E)

Figure 17:
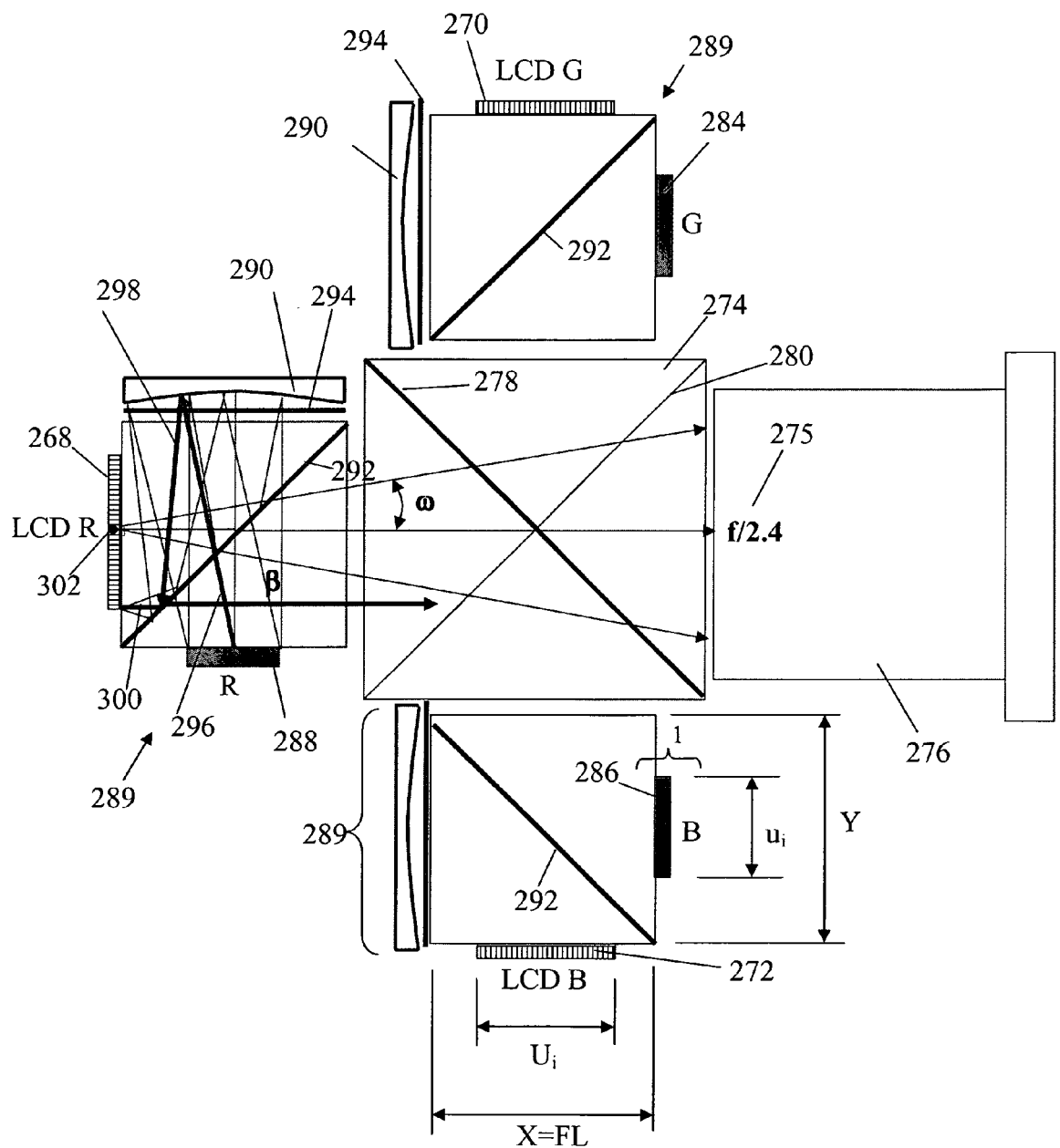
FIG. 17 illustrates a side view of a practical integration of three separate mono-colored light source panel illuminators formed as in FIG. 15A–D, in a compact video projection system using three reflective LCDs by means of three reflective non-imaging angle transformers and a single dichroic color mixing prism cube.
Figure 18A:
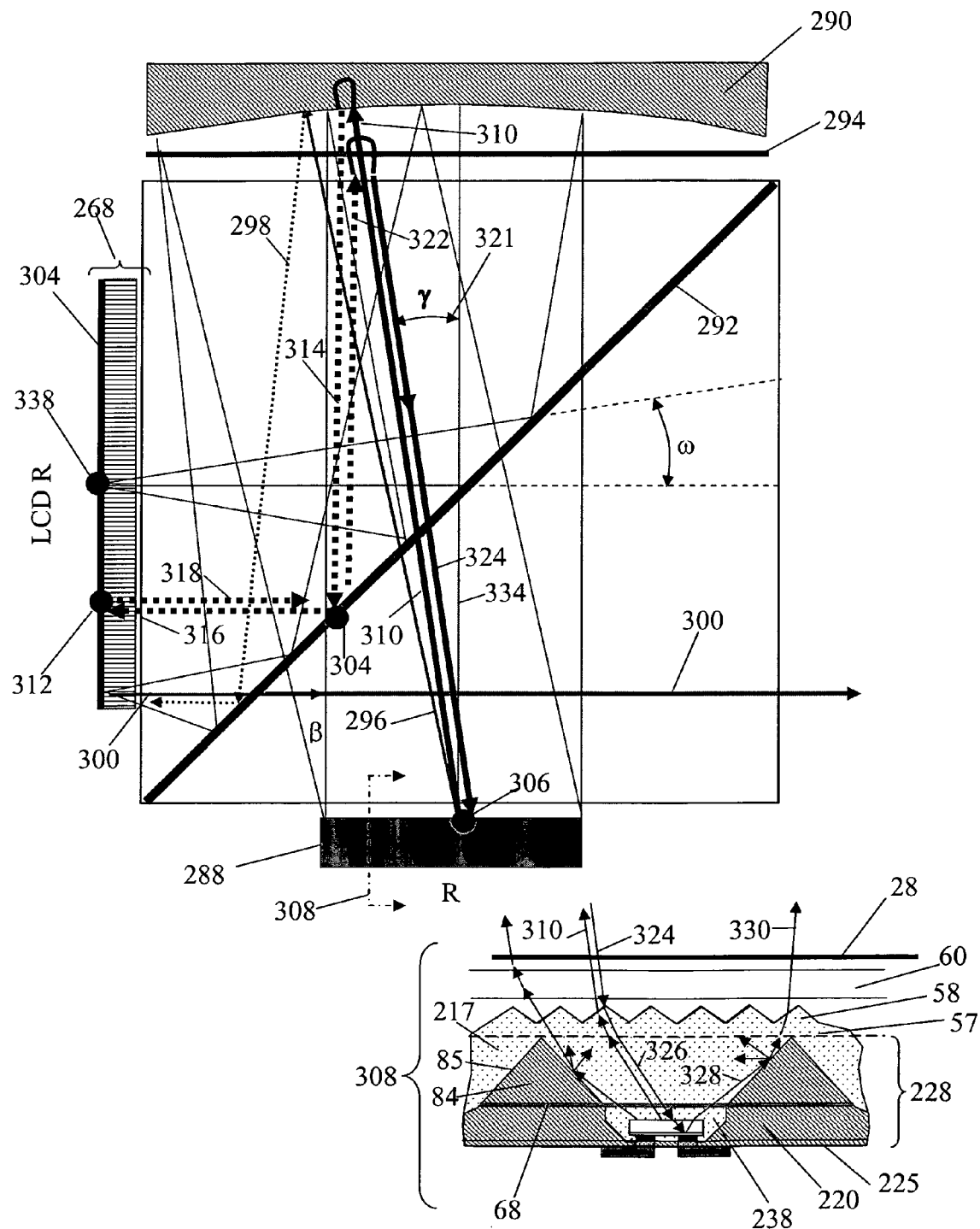
FIG. 18A illustrates a detailed side view of a reflective single-colored non-imaging angle transformer for a reflective LCD that includes, in addition to the light source panel illuminator of FIGS. 15A–D and its illustrated cross-section, a reflective LCD, a reflective polarizer film, a wideband quarter wave phase retardation film and a concave metallic reflecting surface, as well as a few illustrative ray paths.

As a first illustration of the incorporation of mono-colored light source panels within an LCD image projection system, consider the cross-section shown in FIG. 17 for three reflective LCDs, one each for red light 268, green light 270 and blue light 272. Extensive details regarding illustrative ray path, angle transformation, polarization-clean-up, beam uniformity, field coverage, color sensitivities, efficiency, and geometrical relations are provided for this example that applies by reference to the subsequent examples.

The basic systems integration approach involves locating three mono-colored angle transformer units 289 on three sides of a single color-mixing unit 274. Each angle transformer unit collects output light from the respective light source panel, increases angular concentration, directs the reduced angle light to the respective reflective LCD, and provides an output beam of spatially-modulated output light.

Central to this system is standard dichroic X-cube 274 as described in detail 279 of FIG. 16A (alternatively, Philips prism 301 could also be used). Projection lens 276 recombines three resulting mono-colored image beams as a full-color projected image. The f/2.4 projection lens 276 images light reflected from each of the LCDs through the dichroic cube as has become commonplace in some commercial image projectors. The dichroic X-cube is made with thin-film coatings on each of its two intersecting diagonal surfaces designed to reflect one primary color while transmitting the other two. In this manner, dichroic coating 278 transmits red and blue, while reflecting green. Dichroic coating 280 transmits red and green while reflecting blue. The +/−22.5-degree output light from each of the three mono-colored light source panels (red, 288; green, 284; and blue, 286) made illustratively in the form of FIGS. 15A–D are collected and transformed to +/−12-degrees by the three individual folded relay cubes 289, each using a concave mirror 290, a reflective polarizer 292 and a wavelength-independent polarization conversion process enabled by wide band quarter wave phase retardation film 294. This particular folded means of angle transformation, aside from its compactness, significantly improves output beam uniformity by an advantageous pseudo-Kohler averaging process that will be described separately below. The alternative to this means of angle transformation is to apply conventional imaging elements between each light source panel and its corresponding LCD so as to relay a focused image of the light source aperture onto the respective LCD aperture. While direct imaging achieves the angle transformation and field coverage needed in each meridian, any non-uniformity intrinsic to the light source aperture transfers directly to the LCD aperture (and later the projection screen), which may not be preferable. Although defocusing the imaging system softens non-uniformity, the degree to which a strong non-uniformity can be homogenized is rather limited. For example, defocusing may not blur the cross-pattern of FIGS. 13A–B sufficiently invisible.

The behavior of the compact projection system of FIG. 17 is explained in part by the passage of illustrative ray 296. One illustrative 22.5-degree extreme ray 296 starts at the red light source panel's center-point. This p-polarized ray passes straight through the cube's appropriately oriented reflective polarizer layer 292, and also through a wide band quarter wave retardation film 294. On doing so the ray becomes circularly polarized and switches to the orthogonal circular polarization state by reflection at concave mirror 290, whose optical power transforms the angle from 22.5 degrees at the light source 288 to 12 degrees at LCD 268. The reflected ray 298 on passing back through the retardation film 294 is first converted to s-polarization, and on reaching the 45-degree diagonal of the reflective polarizer 292, is reflected towards LCD 268 on an axis perpendicular to the surface of the LCD. When liquid crystal layer in the LCD retards this ray by a quarter wave (which corresponds to maximum or full spatial modulation) it is once again circularly polarized. On reaching the LCD's metallic back-plane reflector, and reflecting from it, the state of circular polarization changes to its orthogonal state, and passes back through the liquid crystal layer, becoming p-polarized on transit. The p-polarized image ray 300 is imaged by the system's projection lens, and transferred through the dichroic cube 274 to the projection screen (not shown).

Imaged light collected by the projection lens from any LCD in FIG. 17 forms the projected spatial image. Regions of the image marked by the absence of light or by lower than maximum brightness are created by effecting less than complete spatial modulation on the LCD pixels in the region. Fore example, complete modulation is characterized by p/2 (or ninety-degree) phase retardation, which effects the same quarter wave phase retardation produced by passive layer 294. Full quarter wave phase retardation in the liquid crystal achieves the maximum output light transmission, illustrated by ray 300 above. When the phase retardation is zero, no polarization occurs, the incoming s-polarized ray 298 remains in s-polarization on its transit through the LCD, on reflection at the LCD's mirror, and on re-transit through the LCD. Without any polarization change whatsoever, all the incoming light reflects back through the system along the path it came in on, returning all the way back to the light source 288. Hence, in this case no light is collected by projection lens 276 for this region, or set of pixels, and the corresponding image region shows absence of the particular color. When the LCD is biased so that this same set of pixels represents an intermediate phase change (between 0 and π/2), a fraction of the available light is converted to collectible output and a fraction remains unconverted. The fraction that remains unconverted also returns to the light source from which it came, along the identical optical path. Light that returns, unused, to the sources from which it came, may be advantageously recycled with potentially important contributions to overall system gain.

The return of off state light back to the light source is an intrinsic feature of reflective LCDs used with 45-degree reflective polarizers. In conventional arc discharge illumination systems, return to the source is generally not considered a favorable circumstance, because of a potentially negative effect on lamp life. In the case of solid-state light source panels such as those of FIGS. 15A–D, however, light return is not a worrisome process, and generates an incremental output flux that adds constructively to the efficiency of the system.

This important light return behavior is illustrated in more detail by way of the expanded cross-sections of FIG. 18A–F, which isolates, for example, on red angle transformation cube 289 of FIG. 17. Another reason that this unused light return is important is that it provides a means for a dynamic brightness gain in the lighted image areas, a gain that increases as the fraction of the overall image that is dim or dark increases. This dynamic image brightness, sometime called dynamic peaking, or image punch (in CRTs), will be explained further by tracing the return mechanism is in detail. No current LCD or DMD image projector is presently known as embodying any dynamic brightness gain mechanism.

The metallic circular-polarization converting back reflector 304, which was not visible in FIG. 17, is shown more clearly on LCD 268 in FIG. 18A. Illustrative p polarized ray 310 leaves center point 306 on light source 288 as before, but at an intermediate angle, γ, whose optical path through the system lands at point 312 on LCD 268 by virtue of sequential passage through reflective polarizer 280 as ray 310, reflection and polarization conversion by the actions of phase retardation layer 294 and mirror element 290 as ray 314, and reflection by reflective polarizer 280 as ray 316. Illuminating ray 316 is then s polarized. The degree to which the returning output ray 318 remains s polarized depends on the amount of phase change imparted to incoming ray 316 on passage through the liquid crystal layers, which can be electrically biased or not. When the field induced birefringent phase change is maximum (i.e. quarter wave or π/2) all the s polarization is converted to p polarization, and all the light passes through reflective polarizer 280 as before. When the field-induced phase change is zero, none of the s polarization converts, and ray 318 is totally reflected at point 320 on the reflective polarizer 280 upwards towards the concave mirror 290 as ray 322. The s polarized ray 318 is then converted into p polarized return ray 324 which heads back to light source 288 along exactly the same optical path it came in on as ray 310. Constrained to return along its incoming illumination path, ray 324 flows back into the light source, one section of which has been magnified in FIG. 18A as cross-section 308, in the illustrative form of FIG. 16 (this time with optional output diffusing layer 28 omitted). Ray 324 first passes through prism sheet layer 60, and then in turn through orthogonal prism sheet layer 58 and light diffusing sheet 68 into the diffusively reflecting optical cavity 228. Once within the cavity, this initially returning cavity ray 326 may strike the LED substrate itself, reflecting refractive and/or scattering. As an example of one of the many statistical possibilities, ray 326 is shown as reflecting internally within the LED substrate, and refracting out as new ray 328, that scatters off reflecting cavity sidewall 85 in a multitude of possible directions, some which may make additional multiple reflections before escaping, and some like ray 330 that passes outwards through layers 58 and 60 as new light that can become part of the lighted image or recycled once again.

The basis for the dynamic image brightness gain is in part due to the pseudo Kohler illumination system arrangement of FIG. 17 wherein all emitted parallel light source rays such as 332, 334 and 336, and like rays everywhere across the emitting aperture of 288 are brought to a single common image point 338 on the LCD. As such, when these rays return to their cavities of origin in light source 288, and become randomized in their eventual output angles by the scattering and reflection processes so described, they may in fact return to a any completely different set of spatial image points. Without such angular randomization being provided within the emitting cavity 228, the return rays would remain trapped between any dark reflecting image point such as 312 and the cavity itself, forever retracing the exact same input and output optical path, without means of becoming a part of the output.

All first LED cavity emissions like ray 310 in FIG. 18A are routed deterministically to a specific spatial image plane point on the LCD that is preset by the emitted output angle 321, γ. On return to the emitting cavity 228, the return ray is randomized. Spatially, the regenerated ray 330 must emit spatially from some point in the aperture of the cavity 228 that launched it. Angularly, however, the new ray has no physical memory of its childhood angle. Hence, the regenerated rays 330 have new angles that must illuminate spatially different image points, potentially adding extra flux to these image points, the amount extra depending on the percentage returned unused to the source in this manner and the losses on transit.

There will be cumulative transit losses suffered by recycled rays 324 that reduce the amount of dynamic brightness peaking that is possible. An extreme example is the case where 1 image pixel is full white, and all other image pixels, full black. The smallest red, green and blue emitting pixel cavities 228 (102 in FIG. 16) are 1 mm×1 mm and that the cavity's output angle varies as explained, +/−22.5 degrees covering the entire LCD aperture. The LCDs 268, 270 and 272 are each taken as being XGA (1028×768) in image pixel resolution and 1.2" in full aperture diagonal, so that their 786,432 pixels are 23.7 microns square. If it is possible for 1600 p polarized image lumens to be projected by lens 276, there would therefore be about $2\times10^{-3}$ lumens per image pixel. This means that about 1600 s polarized lumens make the two-way return trip from the LCD to back to the source and then from the source, after cavity randomization, back again to the LCD, and potentially outwards as incremental energy, to the screen. If the efficiency of this off state recycling is $\eta_{off}$, the total number of projected white lumens, $L_w$, and the number of image pixels, $n_p$, it turns out that the fractional boost in single pixel power reduces to $\eta_{off}$, and the fractional boost in the power of any set of pixels reduces to $\eta_{off} f_{off}$ (where $f_{off}$ is the image pixel fraction in the net off state). This recycling efficiency of the system illustrated in FIG. 17 and FIG. 18A can be expressed by equation 10, with $\eta_{rpr}$ the reflection efficiency of reflective polarizer 292, $\eta_{pc}$ the polarization conversion efficiency of phase retardation and mirror elements 294 and 290, $\eta_{rpt}$ the transmission efficiency of reflective polarizer 292, $\eta_{lcd}$ the LCD passage efficiency, $\eta_{ran}$ the efficiency of the cavity randomization process, $\eta_{com}$ the transmission efficiency of the dichroic combiner cube 274, and the transmission efficiency of the projection lens 276. With most likely efficiency values, the fractional pixel boost ceiling then becomes about $(0.95)^7 (0.75) (0.81) (0.9)^2$ or 34.4%.

$$\eta_{off} = \eta_{rpr}^2 \eta_{pc}^2 \eta_{rpt}^3 \eta_{lcd} \eta_{ran} \eta_{com} \eta_{pl} \qquad (10)$$

Reflective polarizers 292 block off-state light reasonably well. If off-state light is s-polarized, best results demand that there be absolutely no leakage of s-polarized light within the output beam. Off state light leakage reduces image contrast. One way of preventing output leakage is the inclusion of a clean-up polarizer (absorptive or reflective) on the output face of each monochromatic angle-transforming unit 289 is preferable as a means of improving image contrast. Alternatively, a single output polarizer may be disposed just prior to the projection lens 276. In either case, the clean-up polarizer is aligned so as to block passage to the output viewing-screen of the off state polarization. And, yet another option is to include the clean-up polarizer within the multi-layer construction of reflective polarizer 292. If this were done within the context of the standard prior art polarizing beam splitter cube 289, as an example, it could be done by applying identical polarizing dielectric multi-layers to each of the opposing prism faces in cube 289, and cementing a similarly-aligned (s absorbing) absorption polarizer between them. Although this approach increases transmission loss through the expanded layers 292, it thoroughly eliminates s-polarized leakage. Of these choices, the preferable locations for the s-absorbing (or s-reflecting) polarizer are on the entrance or exit faces 77 and 79 of dichroic beam combiner 274, as they deal with only leakage and not genuine off-state return light, which is best returned to the light source panels for recycling.

In conventional arc-lamp-based projections systems, output beam uniformity depends on the uniformity of the arc-lamp illumination system's output beam, which often is enhanced by secondary lens arrays or integrating bars, to provide sources of spatial mixing. In the LED-based image projection system of FIG. 17, output uniformity of light source panels 284, 286 and 288 is modified by passage of this light through angle transformer cubes 289.

The folded telecentric angle transformer means of FIG. 17 is introduced to achieve high beam uniformity.

A projector system's un-modulated output beam (white-field, dark-field, or field of constant color) must be seen as being spatially uniform and without noticeable brightness artifact. For this to be possible, either the system's illumination source must be sufficiently uniform to be directly imaged, or provision made for improving beam uniformity prior to spatial modulation by any LCD.

The light source panels 284, 286 and 288 in the system of FIG. 17 are of the illustrative form described in FIGS. 15A–D, and as such, may show visible internal boundary lines demarcating the 130 illuminating pixels and 520 sub-pixels of a 13×10 array example. Assuming XGA LCDs and the 786,432 image pixels this implies means about 1500 image pixels within each of the 520 demarcated illumination cells. On a 100-inch diagonal projection screen, each demarcated region would appear as a 2.3 inches square, and be easily seen as a window pattern across the screen if not pre-diffused.

The system of FIG. 17 requires almost no pre-diffusion to obscure this pattern, as folded angle transformer 289 has been designed specifically to assure that any illumination aperture structure including these demarcation frames will not show up in the angle-transformed output beam. The brightness of every individual spatial point over the output beam's cross-section is arranged as an average brightness of every spatial point across the entire light source panel (284, 286 and 288) aperture.

This averaging process is accomplished by analogy with traditional Kohler illuminations systems, by locating both the output aperture of light source panels 284, 286 and 288 and the input aperture of reflective LCDs 270, 272 and 302, at the respective focal lengths of illustrative polarization converting concave mirrors 290 (other combinations of lenses and mirrors can be used as well). Reflective polarizer 292 then behaves primarily as a folding mirror sensitive to the polarization state of the light incident upon it. As such, it reflects light from mirrors 290 through a 90-degree bend to the corresponding LCDs. In this manner, light rays arriving at any point 338 (FIG. 18*a*) on LCD 268, for example, represent the average power of rays leaving every aperture point on light source panel 288.

The success of this approach presumes that the total lumens emitted from the light source panel's aperture as a function of angle, remains nearly constant for small angles and then fall off to no less than half-power in a smooth and continuous manner over the angular range utilized. If this is so, beam uniformity will be smooth, and the roll-off from center to field edge of field will be no greater than 2:1.

When a completely flat illumination field is needed for the highest image quality applications, it may be preferable to use an imaging system to relay a proportionally magnified image of the light source panel onto the LCD aperture. For best results, however, this relay system is made telecentric, so the angle transformed illumination is symmetrically disposed about projection lens axis 75 as it is in FIG. 17. One compact system that achieves this performance is a two-stage angle transformation system of the form illustrated in FIG. 18B. In this approach, a first neutral angle transformation stage 267 is used to form virtual focal plane source 251 that may be made the same size as real source 288, but with the smoothly falling center-to-edge spatial characteristics described above. Then, virtual source 251 is positioned as input to second angle transformation stage 289.

Figure 18B:
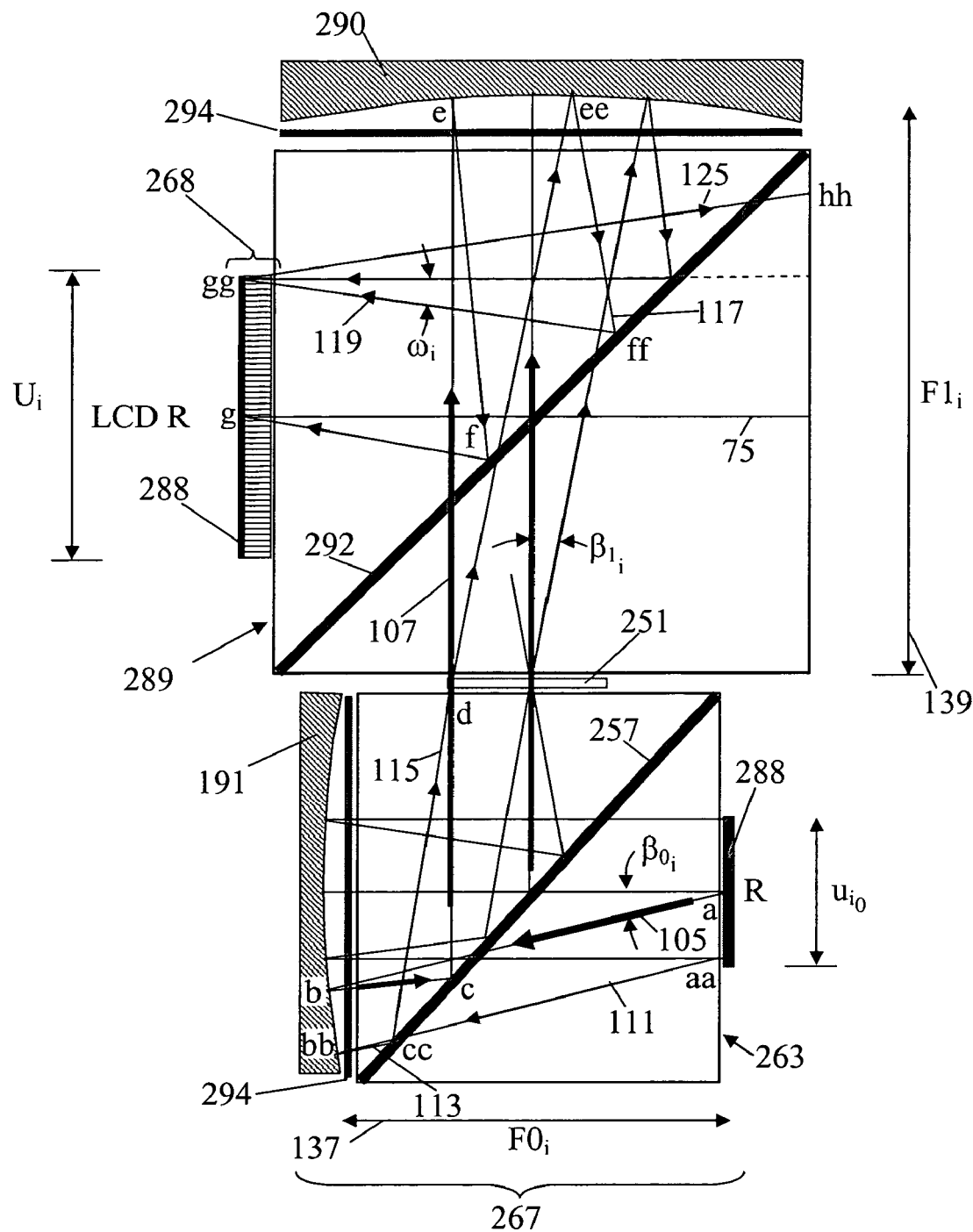
FIG. 18B illustrates a detailed side view of a tandem single LCD variation of FIG. 18A using one light source panel illuminator and two reflective non-imaging angle transformer stages with the first stage's output arranged as the second stage's input.

The coupled (two-stage) angle transformer illustrated in FIG. 18B flattens field uniformity by operating in a pseudo-imaging mode, returning light emitted from points on the light source panel to corresponding points on the LCD. The advantage of this particular construct, however, is that it provides a telecentric means for exactly covering the LCD's rectangular field. Provided the spatial non-uniformity on the light source panel aperture is not too severe, small distortions and defocusing in this layout provide an adequate degree of feature blurring that reduces the appearance of minor non-uniformity while maintaining the light source panel's intrinsically homogeneous field of brightness.

The same point-to-point imaging results can be obtained with the simpler single stage transformer of FIG. 17 when the spacings between elements are adjusted. Yet, the reason that this approach is not preferable for efficient projection systems is that the conditions for telecentric illumination are not met.

The LCD field coverage with a single folded non-imaging angle transformer stage, as its shown in FIG. 17, is governed by the light source panel's angular extent, $\beta_i$, in each meridian, which for the invention of FIGS. 15A–D, is the same in each meridian. Such angular symmetry means that without an efficient means of compensating for it, the illuminator's field coverage is intrinsically square and unmatched to the rectangular LCD aperture. Yet, with the two-stage transformer of FIG. 18B, it's the asymmetry of source shape that the first stage converts into a corresponding angular asymmetry, exactly the angular asymmetry needed for ideal second stage field coverage.

The details of this approach are illustrated by means of numerical example. Reflective LCD 268, FIG. 18B, has a rectangular aperture, 24.384-mm in the x meridian, 18.288-mm in the y meridian. When light source panel 288 is 13.25 mm in the x meridian, the preferable first stage angle transformer 267 (using glass-prisms) is made with concave mirror 191 having a 25 mm (13.25/2 Tan(14.8)) focal length (F0) so that virtual source 251 has exactly the same width (13.25 mm) and inter-stage output angle, $\beta_1^x$ (14.8 degrees in glass) that it started with (i.e. $\beta_0^x = \beta_1^x$). In this manner, the second stage transformer's concave mirror 190 is made with a focal length F1=$U_x$/2 Tan(14.8) or 46.14 mm, so that not only is the LCD's field coverage exactly 24.388 mm in this meridian, but its field angle, $\omega_x$, is 8 degrees in glass (12 degrees in glass) as desired. Under these conditions, equivalently efficient performance is mimicked in the y-meridian, where the narrower width of light source panel 288, 9.94 mm, converts to the same virtual width, 9.94 mm, but with an inter-stage field angle, $\beta_1{}^y=\text{Tan}^{-1}$ ($u_y/2F0$) or 11.244 degrees in glass (rather than 14.8 degrees as in the x-meridian). It is this automatic inter-stage angular compression in the y meridian that allows for correct field coverage in stage two. With $\beta_1{}^y=11.244$ degrees and F1=46.14 mm, the y-meridian field edge is properly (F1) Tan ($\beta_1{}^y$) or 9.17 mm from center.

The mechanism by which this behavior occurs is further illustrated in FIG. 18B by several key ray paths. Extreme source ray 105 leaves the center of light source panel 288 from point-a at an angle, $\beta_0$, of 22.5 degrees in air, 14.8 degrees in the glass prisms of polarizing beam splitter cube 263. Ray 105 starts out in this example purely s-polarized, and reflective polarizer 257, oriented for passage of s-polarized light. Hence, ray 107 passes sequentially through reflective polarizer 257 and quarter wave phase retardation layer 294 before reaching concave mirror 191 at point-b, whereupon it reflects with optical power back through phase retarder 294 and towards reflective polarizer 257, reaching 257 at point-c. As explained above, the s-polarized ray's round trip excursion through phase retarder 294, and its metallic reflection at point-b, combine to convert the ray's polarization state from s to p. Reaching point-c on reflective polarizer 257 with the orthogonal polarization, the ray reflects upwards towards point d on virtual source plane 251, continuing upwards into second angle transformation stage 289 as p-polarized ray 107. Second stage reflective polarizer 292 is oriented to pass p-polarized rays like 107, which then continue towards second concave mirror 290, striking it at point-g. The reflected continuation of ray 107 has been converted to s-polarization and continues to point-f on reflective polarizer 290, whereupon it reflects towards point-g on reflective back-plane 288 of LCD 268. The same procedure is illustrated for the axial ray leaving source point-a, showing its passage through the two stages, also to point-g on LCD 268. And, the ray parallel to ray 105 leaving point-aa on the edge of the light panel's field progresses to points bb, cc, d, ee, ff, and finally to gg.

It can be seen from the behavior of these illustrative rays that the two-stage system of FIG. 18B actually images points on source panel 288 into points on LCD 268, thereby gaining the beneficial field coverage efficiency of an imaging system, but defeating the beneficial brightness averaging process exhibited by a single non-imaging transformer stage acting alone.

It is advantageous then to maintain the non-imaging nature of the single-stage angle transformer of FIG. 17, but with the ideal field coverage efficiency possible using an imaging system.

Special angle transformer designs are needed to achieve efficient telecentric field coverage. The single-stage non-imaging angle transformer of FIG. 17 homogenizes field uniformity by means of the focal plane averaging of source field brightness described above. Yet, because the source panel's angular symmetry in the two meridians, the approach creates a square rather than rectangular illumination field. For best results, substantially all lumens output by the aperture of each light source panel land on the rectangular input apertures of their corresponding LCDs (268, 270, 272) under telecentric conditions and the same field angles in each meridian.

Geometrical relationships and the angular characteristics of the prism-sheet based (58, 60) light source panels of FIGS. 15A–D constrain optimum LCD field coverage as well as the transformer's resulting output angle, $\omega$. Aperture dimensions of the light source panels ($u_i$) and the fixed focal length of concave mirror 290, FL, determine output angle, $\omega$, by means of the geometric expression 2 Tan $\omega=u_i/\text{FL}$, $u_i$ being the appropriate light source edge dimension for each meridian (x, long; y, short). LCD field coverage then depends in turn, on the fixed focal length, FL, of optical reflecting element 290, and the angular range, $\beta$, of the light source panels, by means of analogous expression $U_i=2$ FL Tan $\beta$, $U_i$ being the appropriate LCD edge dimension (x, long; y, short).

When the light source panels of FIGS. 15A–D are constructed with identical prism sheet layers 58 and 60, they produce an isotropic beam having symmetrical angular range in each meridian (i.e. $\beta=\beta_x=\beta_y$). Because of this, when mirror system 290 is made a simple spherical element of fixed focal length (as shown for example in FIG. 17), field coverage on the LCD's 4:3 rectangular aspect ratio becomes a square-like pattern that overfills the rectangular LCD by 25%. Improving on this performance using the pseudo-Kohler non-imaging angle transformer of FIG. 17 requires special means for producing a different angular range in each field meridian. One such means for doing this is shown in FIG. 18B, but resulted in imaging rather than non-imaging system behavior. An alternative approach is shown schematically in FIGS. 18C and 18D that is based on the principles of astronomical Galilean telescopes. A pair of cylindrical lenses, separated by the difference in their focal lengths, is used to compress output angles in one meridian, and not in the other. The lenses may be negative and positive, or positive and positive.

Figure 18C:
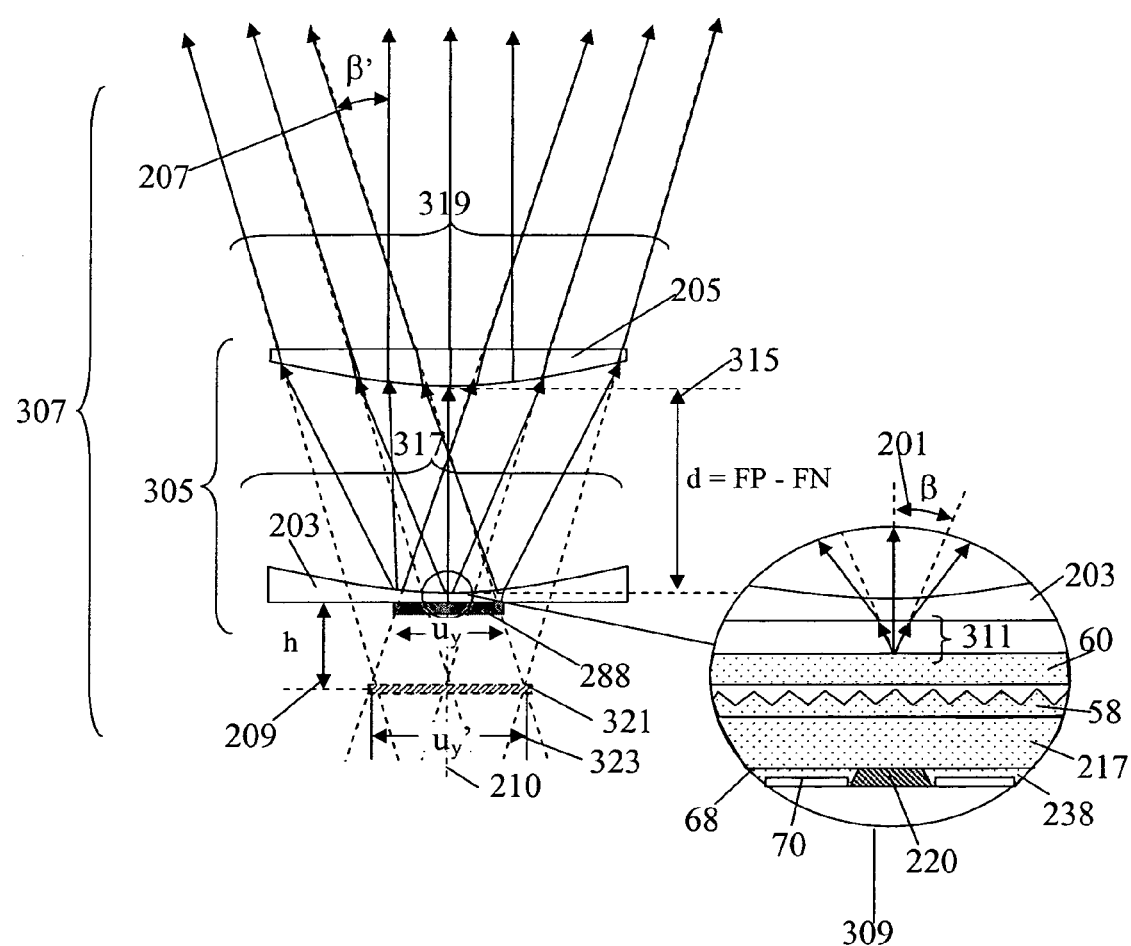
FIG. 18C illustrates a schematic side view of a novel lens pair arrangement that transforms a light source panel's angular output in one meridian and does so in a form compatible with the reflective non-imaging angle transformer means of FIG. 18A.

The behavior of one preferable negative and positive power lens pair 305 of focal lengths FN (negative lens 203) and FP (positive lens 205) is illustrated in cross-sectional detail 307 of FIG. 18C. Similar results can be achieved using a pair of positive lens elements provided the parameters are adjusted accordingly. The perspective of FIG. 18C represents the LCD's short side meridian whose input angle is to be reduced to $\beta'$ (207) from its intrinsic isotropic value, $\beta$ (201), illustratively +/−22.5 degrees in air, as produced intrinsically by the light source panels of FIGS. 15A–D. Illustrative lens elements 203 and 205 are cylindrical so that their optical effect operates chiefly in the meridian shown, and not in the other. Either or both lens elements can be aspherized, formed as cylindrical Fresnel surfaces, and/or implemented as a pair of separate lens elements to reduce aberrations and thickness.

Light source panel 288 is disposed immediately below the first (negative power) lens 203, whose clear aperture is made sufficiently large to accept all emitted light. Magnified detail circle 309 illustrates the cross-section of light source panel 288 (as for example in FIG. 15B, detail 221) and three illustrative output rays 311 which emit into the plane input surface of negative lens 203 at −22.5 degrees, 0 degrees and +22.5 degrees as shown. Passing through the negative lens 203 these rays are diverged into the air space between the two opposing lens elements 203 and 205. The ray paths indicated schematically in FIG. 18C are those of actual rays emitted by a 9.94 mm wide light source aperture emitting into a 1 mm thick piano-concave negative lens 203 have a 41.6 mm spherical radius (FN=83.2 mm), and a 4 mm thick convex-plano positive lens having a 51.85 mm spherical radius (FP=103.7 mm). The vertex-to-vertex lens separation distance 315 is made to be 20.5 mm so that d=FP−FN. When this is done, and the positive lens 205 collects all diverging ray bundles 317 output by negative lens 203, the ray directions are converted such that output ray bundles 319 from positive lens 205 are once again substantially parallel, but at angle, β', 207 from system axis 210, given by the geometrical expression Tan β'=(FN/FP)Tan β. Moreover, parallel output ray bundles 319 appear to come from virtual source 312 whose meridonal width $u_y'$ preserves system etendue, $u_y$ Sin β=$u_y'$ Sin β'. In this example, the converted output angle, β', is thereby compressed from 22.5 degrees in air to about 18 degrees in air (14.8 degrees in glass to about 12 degrees in glass).

In an optimized system, positive lens 205 could be divided into a closely spaced pair of thin piano-convex positive lenses (preferably with convex surfaces facing each other) and with each convex surface aspherized to minimize aberrations that would otherwise degrade performance towards the edges of the field. Positive lens 205 could also be made with a cylindrical Fresnel surface also aspherized to minimize aberrations. Negative lens 203 is preferably aspherized to minimize aberrations.

The effect of adding output angle transformer element 325 is shown in the cross-sectional detail of FIG. 18D, for the short side meridian of illustrative red channel 18.288 mm×24.384 mm LCD 288. The output angle, $\omega_y'$, in the short side meridian shown, is from geometry, $\tan^{-1}(u_y'/2FC)$, with $u_y'$ virtual source width 323 ($u_y$ Sin $β_y$=$u_y'$ Sin $β_y'$) and FC, the transformer's focal length. The transformer's focal length, FC, is set in the long side meridian (not shown in FIG. 18C) as FC=$u_x$/2 Tan $\omega_x$, with $\omega_x$ the projection system's required output angle at LCD 288 and $u_x$, the actual source size in the x or long side meridian. [Note: The convention adopted in FIGS. 18A–F and in the related geometrical expressions is that a prime indicates a value that has been converted by the action of the negative and positive lenses pair 203 and 205.] Since the $u_x$ is 13.25 mm and $\omega_x$ is constrained to be 8 degrees in glass (12 degrees in air), FC is, in this example, 47.1 mm. Then, using the same focal length FC=47.1 mm, $\omega_y'$ becomes, in the short meridian, $\tan^{-1}[u_y'/2FC]$ or 7.4 degrees, with $u_y'$=$u_y$ Sin $β_y$/Sin $β_y'$=12.2 mm.

The importance of the approach represented in FIGS. 18C–D, despite having an angularly symmetrical emitter and a field coverage determined by the emitter's angular extent, is that with the addition of two cylindrical optical elements it is able to provide controllably asymmetric field coverage, both spatially and angularly. This means not only will the LCD's spatial aperture be fully illuminated with minimal waste, but so will its angular aperture.

Element 325 may be spherical with common focal length F in each meridian, or the element may be made toric, with a focal length adjusted for best operation in each meridian. Since the physical height, H, of element 325 above physical source 288 must be the same in each meridian the optimized design is a trade-off manifest by meridonal differences in illumination sharpness. Since sub-system 327 is not meant to function as crisp imaging system, the sharpness of illumination achieved is not a significant factor in the total power transferred to the LCDs. Moreover, some degree of LCD field overfill is required in the final design to allow a reasonable tolerance in the positioning of all optical elements with respect to each other.

If element 325 is made toric, it may be combined physically with positive cylinder lens 205, which results in a considerably more compact optical system.

Figure 18E:
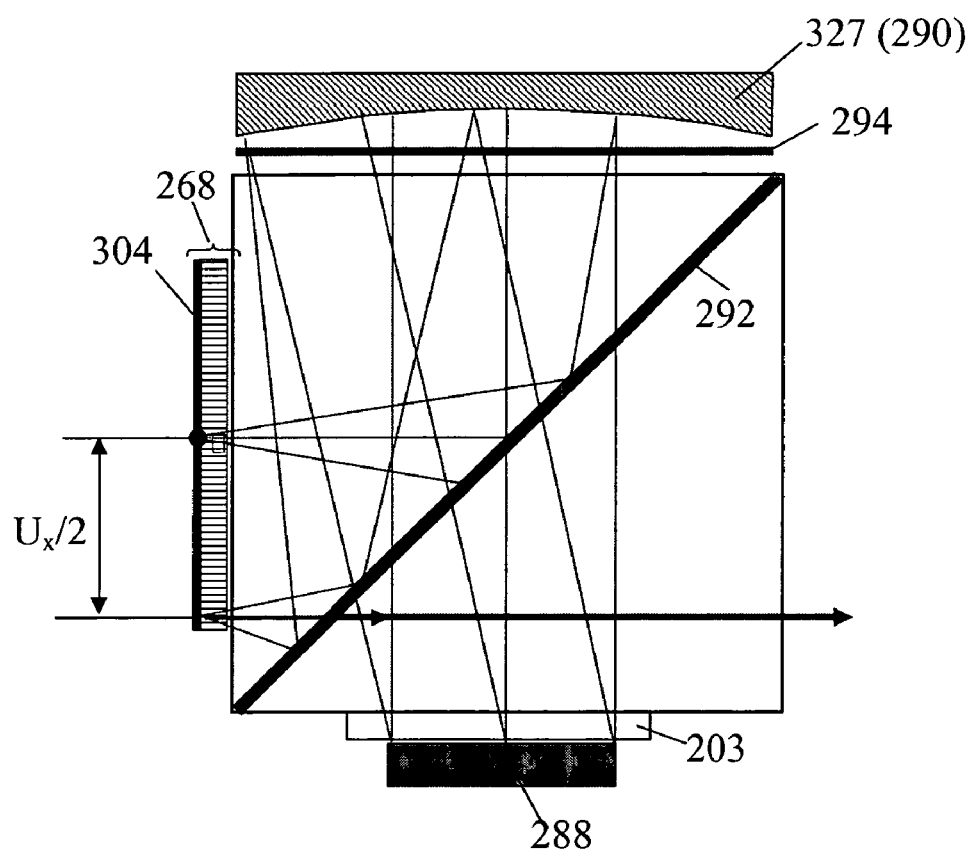
FIG. 18E shows the short side meridian view of a more compact folded reflective version of the non-imaging angle transformer system of FIG. 17 and FIG. 18A.

Yet, even more substantial compaction is possible using the folded form of FIGS. 17 and 18A, in which the optical power is conveyed by concave mirror 327, as in the cross-sectional view of FIGS. 18E, which shows the short side meridian orientation of LCD 268. In this variation, reflecting element 327 is toric with unique focal lengths, FC and FC', in respective long and short meridians. Focal length FC' is a composite focal length combining the angle transformer focal length FC for the short side meridian and the focal length of positive cylindrical lens element 205 using the traditional expression, FC'=(FC)(FP)/(FC+FP).

Another way creating the degree of asymmetric field coverage needed in a rectangular illumination system based on the light source panels of FIGS. 15A–D is to introduce angular asymmetry within the light source panel itself. This is possible by using prism sheets 58 and 60 having deliberately different apex angles. While the relationship between apex angle and output angle is complex for a prism sheet pair, it is the prism apex angle that determines the bi-layer's angular output range. There is a specifically larger apex angle, $α_x$, and a specifically smaller apex angle, $α_y$, whose combination in bi-layer 58 and 60 if FIGS. 15A–D produces output angles $β_x$ and $β_y$. The governing ratio, by geometry, is Tan $β_x$/Tan $β_y$=$U_x$/$U_y$. So, for the 4:3 rectangular aspect ratio 1.2" diagonal LCD, Tan $β_x$/Tan $β_y$ is 1.333. If $β_x$ remains +/−22.5 degrees in air, it is therefore preferable for optimum field coverage, that $β_y$ is about 30% narrower at +/−17.3 degrees in air. Yet, the specific angular limits are less important to optimum field coverage than the asymmetry dictated by their ratio.

One advantage of the color-segregated layout of the projection system of FIG. 17 is that each folded angle transformer cube 289 operates within its own narrow band of wavelengths, and thereby relaxes constraints on the performing bandwidth range of retardation films 294 and reflective polarizers 292, which for full-color use would have to exhibit substantially constant performance over the whole visible spectrum. The phase retardation contributed by films 294 is typically a function of transmitted wavelength. Multi-layer broadband designs are employed by manufacturers such as Nitto Denko to minimize retardation changes that occur across the visible spectrum. Reflective polarizers 292 also show reflectivity differences as a function of incident color. Such effects, however, are isolated in the present system to each mono-colored channel and therefore have no net consequence on overall system performance, as they are automatically compensated by color-balancing adjustments of the power applied to each light source panel.

Accordingly, each separate red, green and blue illumination cube in the system of FIG. 17, perform in approximately a wavelength independent manner. The adjacent dichroic combining cube 274 superimposes the three monochrome image beams so that a single full-color image results on the projection screen (not shown). Each of the angle transforming relay cubes 289 are identical physically, except for the monochromatic color of the LEDs used within each light source. Proper electrical power is applied to the array of LEDs in each source 1 so that the desired mix of white-field color is achieved (e.g. specific color temperature and CIE color coordinates) for every full color composite image frame of superimposed red, green and blue image frames.

Total lumens output by the illustrative projection system of FIG. 17 depends on the product of transfer efficiencies encountered by light rays as they pass through the various sub-systems in each of the system's three parallel mono-colored channels. In the present example, each light source panel is 13.25 mm by 9.94 mm and contain at total of 72 LED array units in a 12 by 9 array. Assuming a minimum of 10 unpolarized lumens per unit, the total number of unpolarized lumens per light source panel is 720. Assuming a polarization recycling gain of 1.5, there are 825 polarized lumens per panel. Then, if the corresponding transfer efficiencies for angle transformation, dichroic re-combination, reflective LCD transit and passage through the projection lens are 0.75, 0.81, 0.9 and 0.9 respectively, the total lumens provided in each color, assuming equal mixing, is about 400, making total white-field screen lumens about 1,200 as planned. Since each LED used outputs 20 lumens, total RGB input lumens are 4320, making total efficiency just less than 30%. This compares with a total efficiency of 20% for conventional halogen arc lamp systems, a 50% improvement.

While 1200 lumens is substantially the same on screen performance that is achieved in systems using a reflectorized short arc discharge lamp such as the 100 W unit manufactured by Philips, it is achieved in this case with the compact solid-state panel lamps of as for example FIGS. 15A–D that don't require optical infra-red filtration, the expense of a surrounding reflector, or a forced air convention fan for cooling, but that do allow for practically instantaneous electronic color temperature adjustments, and 10–20 times the standard service life. In addition, the profile of beams from the rectangular multi-layer illuminating pixel array is more conducive to image display applications than the corresponding profile of the beams collected from short arc discharge lamps, which are fundamentally much more intense in the center than at the edges and circular in cross-section. The percentage of beam light falling outside a 4:3 aspect ratio rectangle inscribed in a circular beam cross-section is 38.9% by geometry. External homogenizing devices such as rectangular cross-section integrating bars, diffusers and lens arrays are used to even out the circular beam profile at extra cost, space and inefficiency. By comparison, the flux density across the output beam of the solid-state panel lamps described above, edge to edge, is nominally constant.

As has become well known in optical system layout, each beam-splitting cube 289 (whether air or glass) and dichroic combiner cube 274, as shown in FIG. 17, needs to be sized properly to handle the angular divergence and optical path lengths involved. For convenience, the operative equations for horizontal size, X, and vertical size, Y, in each meridian are given in equations 11 and 12 in terms of semi angle, $\beta$, of light source 1, the transformed output angle, $\omega$, of the relay, the edge dimension of the light source, $u_i$, and the corresponding edge dimension of the SLM, $U_i$ (i representing either the x horizontal meridian, or the vertical y meridian). The solution for X is given in equation 12. These equations apply to the combiner cube when $\beta=\omega$ and $u_i=U_i=K$, K being the larger of X and Y for the relay cube. When the combiner (or relay) media is dielectric, the defining angles $\beta$ and $\omega$ used must be those in the applicable refractive index, where for example, the angle in the media is $\sin^{-1}(\sin \beta/n)$, n being the refractive index of the media. When, $\beta$ is 22.5 degrees as above, the angle in refractive index 1.49 is actually 14.8 degrees. Similarly, when $\beta$ is 12 degrees, the angle in refractive index 1.49 is actually 8 degrees.

$$Y = u_i + 2X \tan \beta \tag{11}$$

$$X = U_i + 2Y \tan \omega \tag{12}$$

$$X = \frac{\frac{U_1}{2\tan\omega} + u_i}{\frac{1}{2\tan\omega} - 2\tan\beta} \tag{13}$$

For the illustrative 13.25 mm by 9.94 mm light source aperture, 24.384 mm by 18.288 mm LCD aperture, +/−22.5-degree light source cone angle, and +/−12 degree relay angle, the relay cubes needed, if air filled, are approximately 2 inches on a side, and closer to 1" on a side if predominately dielectric (i.e. reflective polarizer 292 is an industry standard polarizing beam splitter cube such as manufactured by Meadowlark Optics. The smallest possible combiner cube needed with the +/−12-degree output from the illustrative 2" relay that is predominately air, is from equation 13, 58 mm on an edge, or about 2.3 inches. If a standard polarizing beam splitter cube made of glass or plastic is used in the system of FIG. 17, this cube has X=Y=33.1 mm and a depth of 24.8 mm. The corresponding combiner cube 274 is in the plane of FIG. 17, a cube 45.9 mm on a side, and 34.5 mm deep.

Reflective polarizer 292 can either be a multi-layer beam splitting plate that contains a reflective polarizing film such as manufactured by Minnesota Mining & Manufacturing Co. as DBEF™ immersed in air, or a conventional transparent dielectric prism cube with inorganic reflective polarizing layers pre-deposited on the prism cube's internal diagonal such as manufactured by Meadowlark Optics for broad band uses. The plate type reflective polarizer has a very thin cover layer on the side facing the projection lens so as to minimize astigmatism. Attachment of the polarizing layer to the thicker substrate layer is such that sufficient optical flatness is preserved to minimize contributions to output side field curvature. Two identically aligned reflective polarizer layers and one absorption polarizer layer can be used to improve rejection of the unwanted polarization state. Doing so in the system of FIG. 17 is not preferred as it decreases transmission from a best possible 0.95 to about 0.81, and offers no real advantage over a clean-up polarizer located on the relay cube's output face as described above. The prism cube type reflective polarizer has higher transmission and reflection efficiency (0.95 and 0.98 respectively), but a standard acceptance angle of +/−2 degrees. Optimized in its design, acceptance angle increases to about +/−6 degrees. Used in a system such as FIG. 17 with a system output angle of +/−12 degrees (+/−8 degrees in glass or plastic), there will be some reduction in reflection efficiency for ray angles beyond 6 degrees, which is not expected to present a problem. Transmission efficiency through the cube is less affected by the beam's angular range.

Both the relay cube and the dichroic combiner cube can be configured in the traditional Philips prism arrangement of FIG. 16B. The advantage of doing so is that the prism arrangements 301 allow for the mono-colored axial rays from each light source panel input to be closer to normal incidence inside the prism medium (glass or acrylic), where all dielectric stacks (whether dichroic or polarization selective reflection) show preferable performance.

V. Video Projector Example 2: 3-Panel Reflective LCD (FIG. 19)

Figure 19:
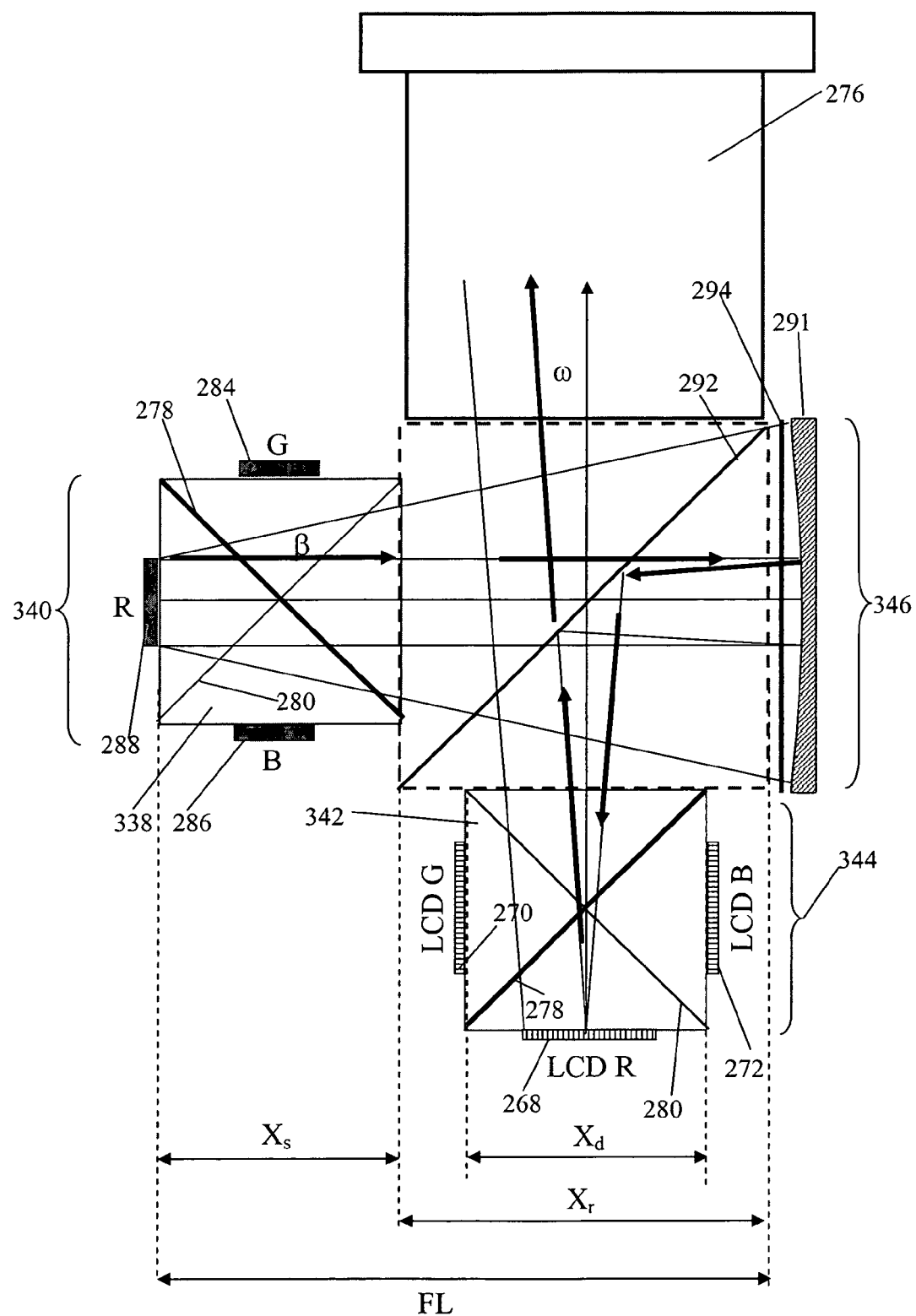
FIG. 19 illustrates a side view of a practical integration of three separate mono-colored light source panel illuminators formed as in FIG. 15, in a compact video projection system using three reflective LCDs, the slight source panels arranged on the input faces of a set of dichroic color mixing prisms, the reflective LCDs arranged on the input faces of a second set of dichroic color mixing prisms, the two color mixing system outputs arranged as adjacent inputs to a reflective non-imaging angle transformer as described in FIGS. 17–18.

A compact variation on the projection system example of FIGS. 17–18 is shown schematically in FIG. 19 that reduces the system footprint significantly. In addition, the number of reflective polarizers 292 and concave mirrors 290 are each reduced from as well. This improvement requires using two dichroic combiner cubes 274 as in FIG. 16A (or Philips prism equivalents as in FIG. 16B), both cubes with identical dichroic layers 278 and 280 as before, one for the reflective LCDs 268, 270, and 272, and another for the monochromatic light sources 284, 286 and 288. In this system, light from the three monochromatic sources is mixed in first combiner cube 338. This light then enters the reflective angle transformer cube 346, which in the current form has twice the focal length, FL, of the configuration used in FIG. 17. Accordingly, this requirement has to be satisfied while applying equations 11–13 to calculate the relative sizes of source cube 340, transformer cube 346 and combiner cube 342. The design approach for doing this is to use equations 11–13 to calculate the minimum size of the source cube 340, $X_s$, and the modulator cube, $X_m$, which will in turn lead to the minimum size for the relay cube, $X_r$. Seeking to satisfy the preferred requirement of any lens system that its front and back focal lengths be equal, $X_s+X_r$ is constrained to equal $X_r+X_d$. Since all three optical structures 340, 344 and 346 are preferentially cubes, this forces $X_s=X_d$. As the input and output angles, β and ω, of such angle transformers similar to those illustrated by 346 are generally not equal, the cube sizes as calculated using equations 11–13 will not be the same. In this instance, the larger cube is taken as the constant for the system. As an example, the long dimension of each light source is as above, 13.5 mm, and the long dimension of each corresponding LCD is 24.384 mm. The input and output angles, in air are +/−22.5 degrees and +/−12 degrees respectively. In the media of each cube, these angles become +/−14.8 degrees and +/−8 degrees respectively. For these illustrative values, $X_s$=28.6 mm and $X_m$=33.86 mm. Physically, each cube 340 and 344 is made 33.9 mm on an edge in the plane of FIG. 19. Then, in using equations 11–13 properly, the values of u and β are taken as 28.6 mm and 14.8 degrees, while the values of U and ω are taken as 33.86 mm and 8 degrees. This allows the minimum size of relay cube 346 to be calculated as $X_r$=49 mm and $Y_r$=54.6 mm, the latter of which is taken as the cube edge in the plane of FIG. 19. The corresponding physical focal length for illustrative concave mirror 290 becomes about 88.5 mm if in air or (88.5)(n) in the dielectric media, n being the refractive index of the optical path.

This means that for the illustrative 1.2" diagonal LCD apertures and the 13.5 mm×9.94 mm light source apertures, the entire image projection engine, less 2.0"–2.5" diameter projection lens 276, can fit inside about a 3.5"×3.5" box, which is the surface of the 3.5" floppy diskette used to store computer data. Box thickness would be less than 1.6". The scale used in FIG. 19 is about 10% larger than actual size.

The power efficiencies of the systems illustrated in FIG. 17 and FIG. 19 are about the same. The number of lumens projected on the screen depend on the number of lumens emitted by the collective light sources multiplied by the sequential inefficiencies suffered along the optical path length to the screen, on transmission, reflection and refraction through the system. As one example, each light source 284, 286 and 288 consists of nominally 1 mm by 1 mm illuminating pixels, each in the general form of detail 308 in FIG. 18A. With each illuminating pixel using one 0.5 mm×0.5 mm transparent substrate LED, such as those manufactured by LumiLeds Lighting, each pixel yields about 15 monochromatic p-polarized lumens in a uniform f/1.3 beam of rectangular cross-section. This output assumes a degree (up to 1.5×) of polarization recycling arranged within each illuminating pixel, as has been described earlier by means of reflective polarizer. In this case, the composite power emitted from the indicated 13.25 mm×9.94 mm two-dimensional array of such pixels (nominally 13 pixels by 10 pixels) then is (13)(10)(15) or 1,950 lumens from each monochromatic red, green and blue source. This means that the total white field beam power so created by sources 284, 286 and 288 is 5,850 p-polarized lumens, assuming equal color mixing. Then, using the system of FIG. 18a as an example, the associated on state optical path efficiency is given in equation 14 with $\eta_{com}$, the dichroic transmission efficiency, $\eta_{rpr}$ the reflection efficiency of reflective polarizer 292, $\eta_{pc}$ the polarization conversion efficiency of phase retardation and mirror elements 294 and 290, $\eta_{rpt}$ the transmission efficiency of reflective polarizer 292, $\eta_{lcd}$ the LCD passage efficiency, and $\eta_{lens}$ the transmission efficiency of the projection lens 276. Using expected values for these inefficiencies, the on state efficiency of the system of FIG. 18a is about as high as 0.36, primarily limited by a total of three light passes through the two dichroic combiner cubes, each pass having about 0.81 transmission efficiency.

$$\eta_{on}=\eta_{com}^3\eta_{pc}\eta_{rpt}^2\eta_{lcd}\eta_{lens}\eta_{rpr} \quad (14)$$

Accordingly, the total white-field lumens projected to a screen by the system of FIG. 18A, is at best (5850)(0.36) or 2,106. Typical commercial projectors deliver 1,200 white-field lumens.

If the polarization recycling applied to each light source yielded only 20% gain rather than the 50% that has become typical, if aggregate light scattering effects reduced usable output by 10%, and if uncompensated Fresnel losses at uncoated air-dielectric surfaces reduced output $(0.94)^4$ or 0.78, the power on the screen still is about 1,200 lumens. If every effort was made to achieve highest on state efficiency possible, 0.36, a substantial relaxation in illuminating pixel size (102 in FIGS. 15A–D) could be effected. The current example assumes a total of 390 illuminating pixels, each having 1 mm×1 mm output apertures and 15-lumen output. If these 390 pixels produce 2,106 white-field lumens, only 222 such pixels would be needed to yield 1,200 lumens. Using fewer LEDs leads to a proportional reduction in total unit cost. Each monochromatic source could contain (222)/3 or 74 square pixels, each in a 10×7 array. Keeping light source aperture size roughly constant at 13.5 mm×9.94 mm, the individual pixel apertures can be increased 35% to about 1.35 mm×1.35 mm, which thereby increases the dead spaces between LEDs in the light source array, if such an increase were deemed desirable.

Other reflective elements with optical power can be used in place of the illustrative concave mirror 290 that has been featured as an example in the structures of FIGS. 17–19. It is equally feasible for the right amount of optical power to be designed into a plano-convex or biconvex refractive lens whose back surface (plane or curved) has been coated with a highly reflective metal film. S alternative units substitute directly for the illustrative element 290. When using such a refractive element, however, the resulting power is adjusted to allow for the light's double pass through what is functionally a lens-mirror system.

W. Video Projector Example 3: 3-Panel Reflective LCD (FIG. 20)

Figure 20:
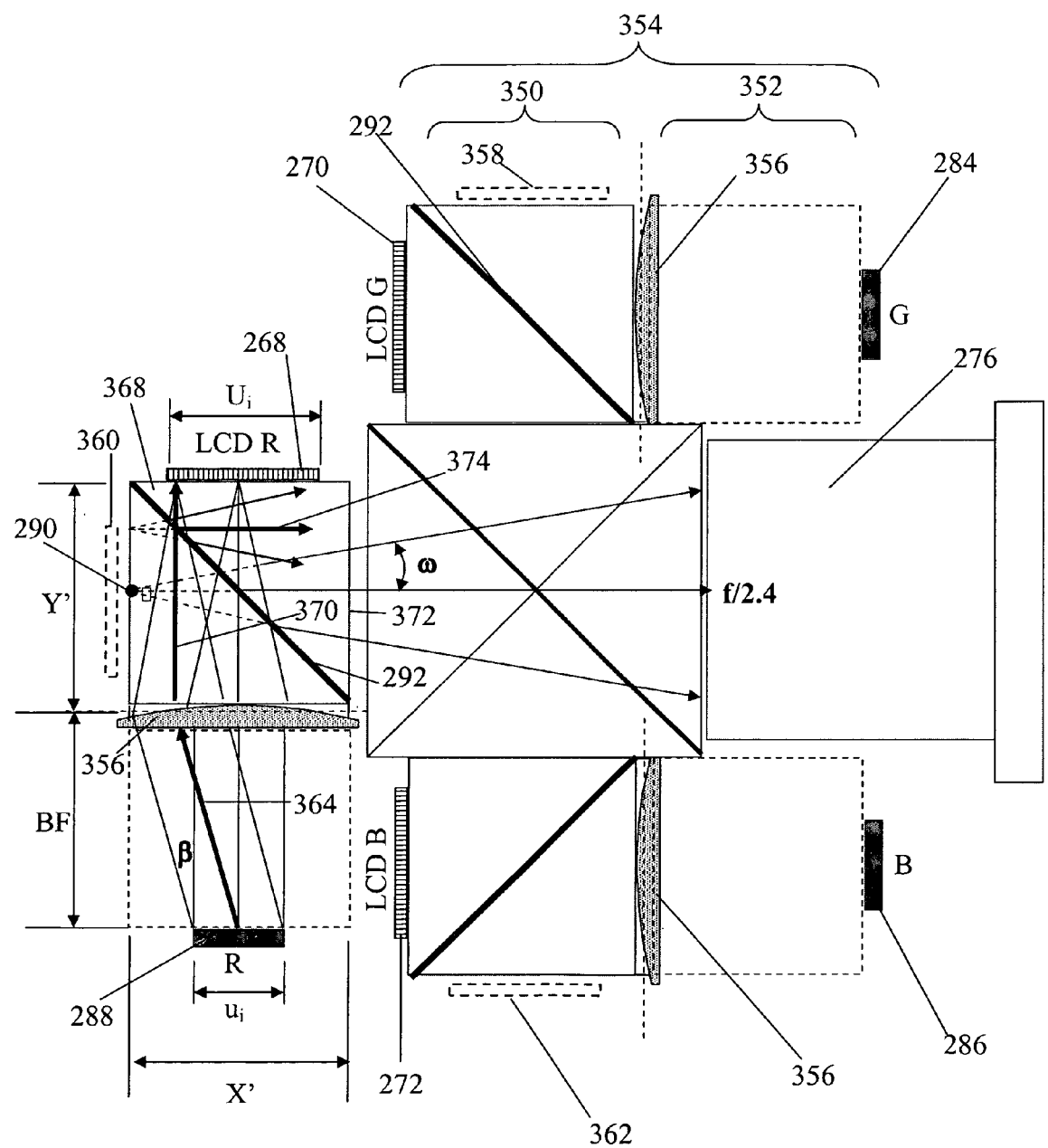
FIG. 20 illustrates a side view of a variation on the practical video projection system of FIG. 17 using three reflective non-imaging angle transformers that each include a refractive lens element rather than a concave reflecting surface.

Another related embodiment is illustrated in FIG. 20 with a refractive Kohler illumination approach replacing the reflector-based ones illustrated in FIGS. 17–19. In this variation, an illustrative aspheric bi-convex lens 356 substitutes for the angle transforming concave mirrors 290 in FIGS. 17 and 291 in FIG. 19, showing one of several equally preferential refractive elements. The lens may have a spherical, conic or aspheric surfaces, or any combination of such surfaces. The lens 356 may be a Fresnel or a pair of Fresnel lens elements. One advantage of a refractive configuration, despite the extra footprint and volume it occupies, is that the need for wide band quarter wave phase retardation films 294 used in FIG. 17 and FIG. 19 as part of the polarization changing mechanism is eliminated. Polarization changing is contributed in this case by the phase retardation and metallic reflection occurring within the reflective LCDs themselves.

In the structure of FIG. 20, each reflective LCD such as 270 may be located in one of two possible positions on the periphery of each secondary angle-transforming cube such as 350. The embodiment as shown in FIG. 20 places LCD 270 in line of sight with light source 284 as for example in the green angle transforming subsystem 354. The alternative locations, 90 degrees to the line of sight with light sources 284, 286 and 288 are shown as dotted rectangles 358, 360, and 362.

The configuration shown in FIG. 20 operates analogously to those shown in FIG. 17 and FIG. 19, and is illustrated by ray paths drawn in the red subsystem. Pre-polarized monochromatic output light (p polarized) from the solid-state panel lamp, beginning as illustrative ray 364, is transformed from +/−22.5 degrees at the source to, as one convenient example, +/−12 degrees, in the same manner as with the concave mirror 290. Instead, the optical power of lens 356 brings all rays collected to its front focal plane 368. The illustrative ray 364 continues through lens 356 as ray 370 which passes through the reflective polarizer layer 292, also as before, either in air or in the medium of an immersing beam splitter cube 372, such as those described above. In this configuration, all light within the beam splitter cube has an angle no greater than +/−8 degrees (or the equivalent angle in the beam splitting medium, $Sin^{-1}[(Sin \omega)/n]$, also as before). On reaching, and passing into and out of the reflective LCD 268, the on state image light is changed from incoming linear polarization state p to the outgoing orthogonal polarization state s that is reflected by the reflective polarizer layer 274 outwards and towards the projection lens 276 as illustrative ray 374. So-called off state light that is not to be part of the modulated output image, develops in spatial regions where the LCD's electronic pixel bias contributes incomplete or no phase retardation to the passing light. Accordingly, the polarization state of such outgoing light is either partially converted or not converted at all to the s-polarized state that reflects efficiently from reflective polarizer 292 to projection lens 276. In this example, all p-polarized light leaving the LCD passes back through reflective polarizer layer 292 along the path it or some other input ray arrived on. In doing so, this light returns back to the light source 288 from which it came, just as was discussed earlier. Once back at the light source 288, this rejected light is mixed inside the source cavity structure as set forth for example in FIGS. 13, 14 and 15A–D, and may be re-emitted (less any transit losses) inseparable from newly emitted light. Such re-emission potentially increases the overall system efficiency without any disadvantage, and without either increase the spatial extent of the beam or widening its angular extent. This behavior is a unique characteristic of a cavity source. Once such recycled light returns to the cavity its re-emission from the cavity is the thermodynamic equivalent to increasing the input power that generates the light in the first place.

X. Video Projector Example 4: 3-Panel Reflective LCD (FIG. 21)

Figure 21:
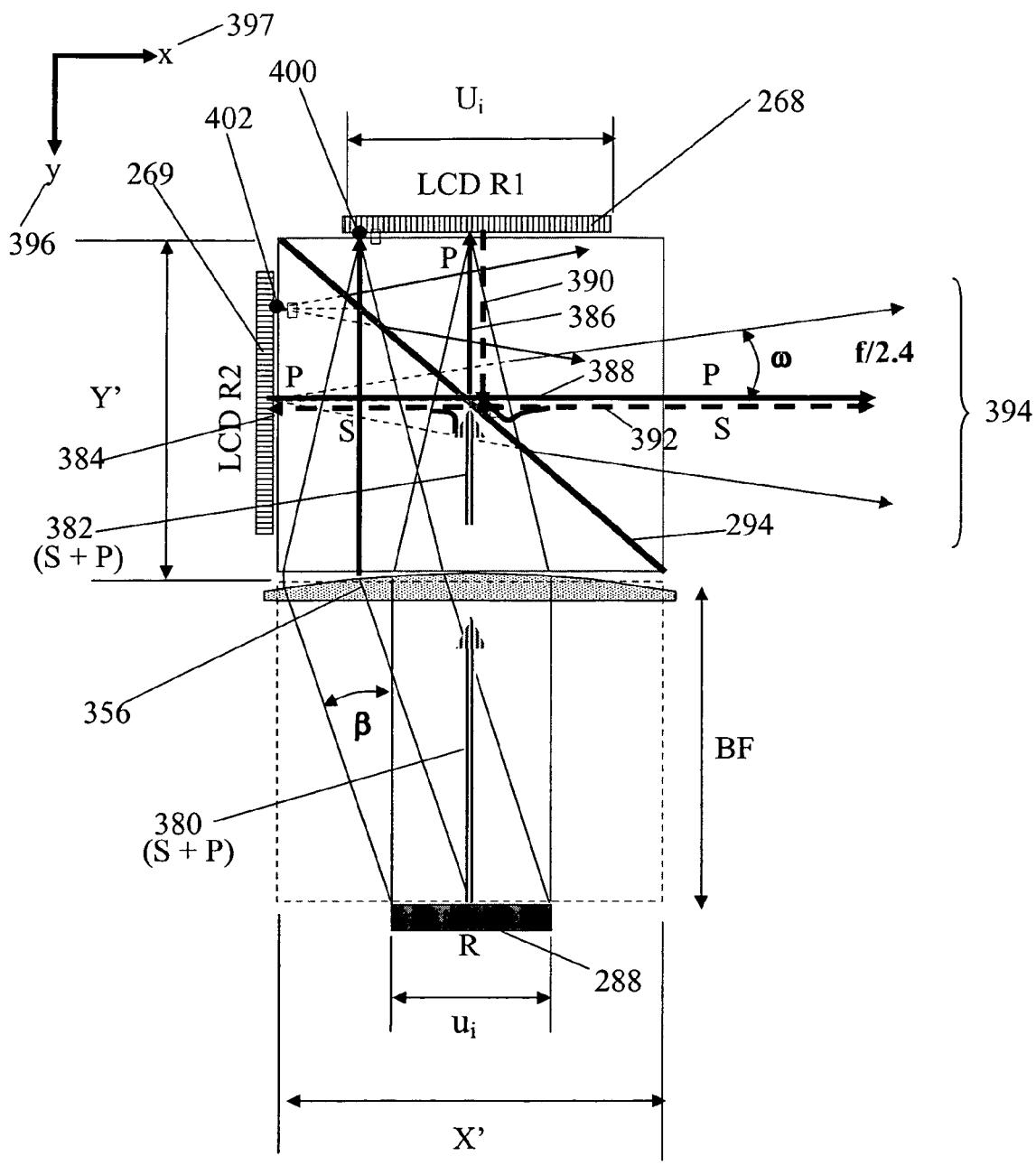
FIG. 21 illustrates a side view of a variation on the reflective non-imaging angle transformer shown in FIG. 20 using two rather than one reflective LCD.

The angle transforming structure of FIG. 20 can be extended, as in FIG. 21, to improve on the conventional polarization recovery process used within light sources 288, 284 and 286, or other equally strategic system recycling reflective polarizer mirror plane locations, which at best convert only 50% of the unusable polarization (i.e. s polarized light) into the desirable one (i.e. p polarized light). In the conventional polarization recovery process a flat reflective polarizer is incorporated, for example, in layer 28 above the angle-controlling layers 58 and 60 as in FIGS. 15A–D. So positioned, the transmission axis of the reflective polarizer is oriented for highest passage of the polarization that must pass through the ensuing optical system (i.e. s polarization), while reflecting or recycling light polarized in the orthogonal state (i.e. p polarization) within white reflecting cavity 217 as in FIGS. 15A–D. Light so trapped inside white cavity 217 scatters randomly off cavity walls 85 and layers such as the undersides of 58 and 60, until a fraction of this light converts statistically to the transmissive polarization state along output ray paths allowed by layers 58 and 60. This recycled light then exits with an incremental gain over the original flux transmitted by the reflective polarizer layer incorporated within sheet 28. All other spatial locations for this recycling element are not as preferable as they return less light to the light source cavities by virtue of the extra optical path length inefficiencies the light encounters and the increased angular spreading that this extra path length imparts.

There is at least one such system variation, however, that eliminates the need for polarization recycling within the source altogether, and recovers substantially all the power of the unused polarization in a completely different way. This alternative situation occurs when a second LCD 269 is added to the first LCD 268 in each of the three angle transformer configurations of FIG. 20. This structure is illustrated for just one transformer subsystem 354, in FIG. 21. In this configuration, lens 356 transforms the angle β of all unpolarized light such as represented by ray 380 from light source 288 so that all light transmitted on the output side of the lens such as represented by ray 382 is converging with maximum angle not exceeding ω (+/−12 degrees in air, +/−8 degrees in dielectric media, as in all previous examples) and that still contains both s and p polarized flux. When this unpolarized light reaches reflective polarizer 292, it is split evenly into two polarized beams, one containing ray 384 (s polarized and reflected towards LCD 269) and one containing ray 386 (p polarized and transmitted towards LCD 268). The LCDs are each arranged as described above so that the so-called on state output light has the orthogonal linear polarization of the incoming illumination. Consequently, LCD 269 reverses incoming s polarized illumination provided for example by ray 384 to outgoing p polarized image light represented by ray 388 that passes sequentially through reflective polarizer 292, beam combiner 274, and projection lens 276, when used in the complete projection system of FIG. 20. And, equivalently, LCD 268 reverses its incoming p polarized illumination that has transmitted through reflective polarizer 292 for example as ray 386 to outgoing s polarized image light as represented by converted ray 390 that passes sequentially through beam combiner 274 and projection lens 276 as reflected output ray 392, after reflection by reflective polarizer 292. The two monochromatic on state output image beams 394 are exactly superimposed on each other spatially and combine to create an unpolarized composite beam.

While viewing unpolarized light on a projection screen is ordinarily quite normal, the output of unpolarized light as mixed by the subsystem of FIG. 21 does eliminate the possibility of reducing the amount of unwanted background light with a clean-up polarizer oriented to block the unwanted light while passing the wanted light. This means that special care is taken to minimize unwanted background and ghost reflections in the first place by means of anti-reflection coatings wherever appropriate such as for example on the faces of lens 356 and on the output faces of each LCD 268 and 269.

The form of FIG. 21 offers potential for 3D viewing. One potential advantage of having two polarized LCD image sources for each monochromatic color, as provided by the subsystem of FIG. 21 is that these separate images can be later separated for independent projection by two projection lenses, one for each polarization, to create a stereo image. In doing so, each LCD, 268 and 269 is controlled by separate electronic pixel addressing means, one for each effective left and right eye images. One standard device for spatially separating beams of s and p polarization is a prism cube in the form taken by the tri-color combiner 274. In this application the internal prism diagonals are coated with reflective polarizing layers whose transmission axes have been oriented 90 degrees to one another.

Y. Video Projector Example 5: 3-Panel Reflective LCD (FIG. 22)

Figure 22:
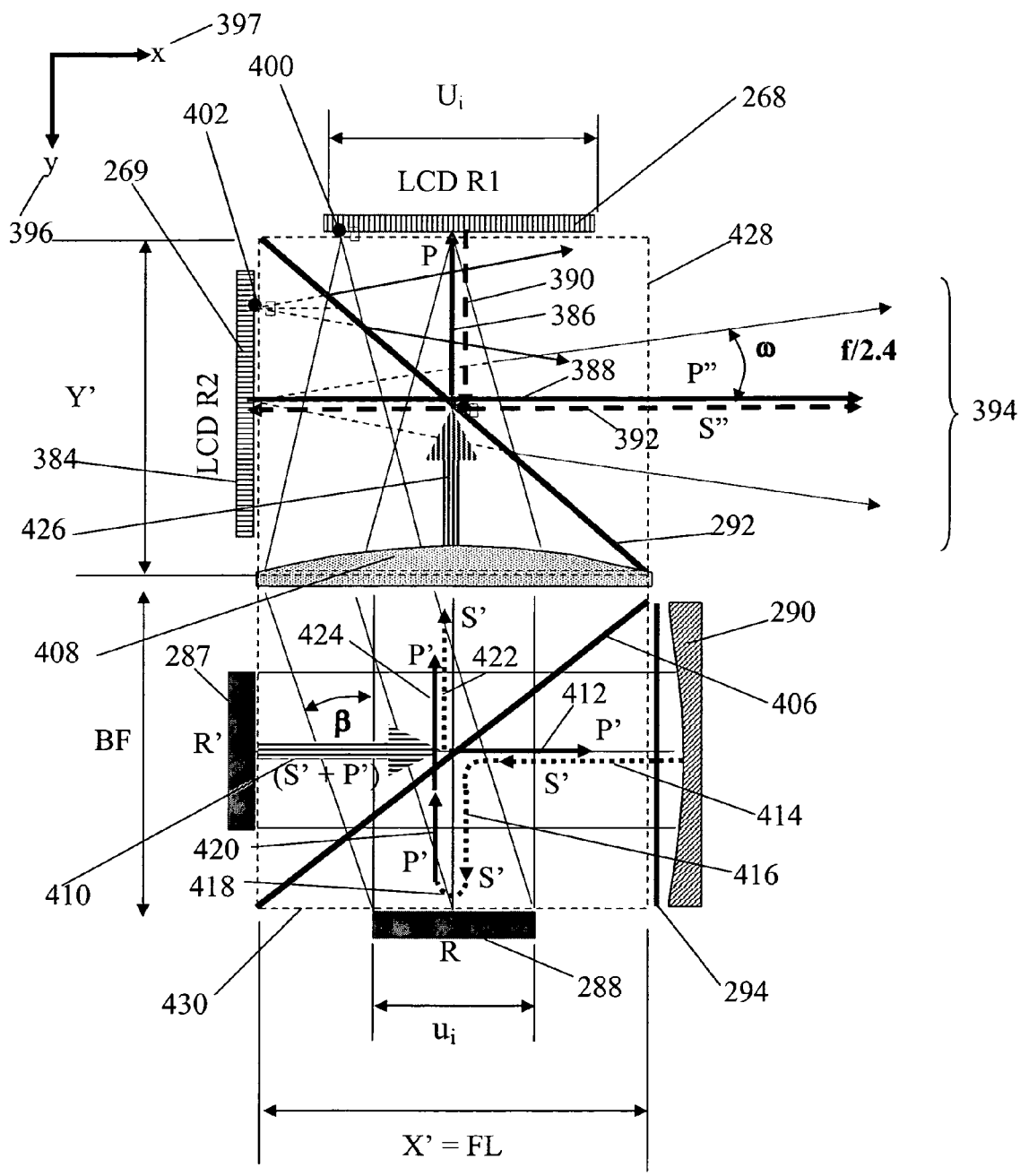
FIG. 22 illustrates a side view of a variation on the reflective non-imaging angle transformer of FIG. 21 using two rather than one light source panel illuminators and both a positive lens and a concave reflecting surface.

Another form of the system of FIG. 21 is illustrated in FIG. 22. In this variation, four extra elements have been added, a second monochromatic light source 287 normally having the same wavelength as first source 288 and placed on the cube face positioned 90 degrees from the first source, a second reflective polarizer layer 406 tilted 90 degrees from the first and oriented to pass p polarized light from the first source 288, a broad band quarter wave phase retardation layer 294, and a concave mirror 290, both as described above, and placed on the cube face directly opposite the new light source 287. Light sources 287 and 288 can each be pre-polarized, one s polarized (287) and the other p polarized (288) or both sources can remain unpolarized, letting the composite structure of FIG. 22 perform both the polarizing and angle transforming functions needed by each LCD.

The basic operating principle of the monochromatic angle-transforming system configured in FIG. 22 is demonstrated by a selected series of illustrative rays that isolate on the behavior of the additional light source 287 only. Light from the first source 288 will follow a similar pattern and then overlap with light from the extra source during input collection by lens 408, which in turn results in converging composite output rays 426 representing the p and s polarized light from both sources. In this system, the lens function is represented only schematically by element 408, and its scale between upper and lower cubes 428 and 430 has been exaggerated for visibility. In its most compact form, element 408 could be a Fresnel lens. Convex optical power could also be added to the opposing output and input faces of the upper and lower cubes, if dielectric.

Illustrative unpolarized light ray 410 from extra monochromatic light source panel 287 is split evenly by interaction with reflective polarizer layer 406 into two linearly polarized rays, p polarized ray 412 and s polarized ray 422. S polarized ray 422 is reflected into the collecting aperture of angle transforming lens element 408, whose back focal plane distance BF equals the 90 degree optical path length taken between the plane of lens 408 and the output aperture plane of light source 287. P polarized ray 412 passes efficiently through reflective polarizer 406 towards the quarter wave phase retardation layer 294 and the collecting aperture of illustrative concave reflecting element 290. On reflection and by element 290, and re-passage through retardation layer 294, the polarization of ray 412 is converted as described several times above, to s polarized ray 414, which heads back towards reflective polarizer 406. On striking reflective polarizer 406 ray 414 is reflected towards first light source panel 288, and into its aperture within an angular range allowing efficient transmission through its upper layers 60 and 58 (as in detail 308 in FIG. 18). Once inside one of the reflecting cavities 228 of any illuminating pixel such as 308, the continuation of ray 414 is a statistical one based on multiple opportunities for scattering and reflection from cavity elements, and all memory of incoming angle and polarization is reduced significantly if not eliminated. As such, the re-emitted ray that eventually emerges, 420, has an equal probability of being p or s polarized. If it emerges s polarized, it will be blocked by reflective polarizer 406 and reflected towards the polarization changing concave mirror element 290, whereupon it will be re-directed to the aperture of the extra light source 287, and re-cycled within its pixel cavities. Such unacceptable output light will continue to move from source to source in this manner until transit losses diminish its energy or a usable p or s polarized output ray is so created by the light source cavity's built in randomization processes. P polarized ray 420, successfully created by this randomization process and symbolized by ray path 418, is re-emitted towards and transmitted through reflective polarizer 406 only within the allowed angular output range of light source layers 58 and 60 (i.e. +/−22.5 degrees). As such, ray 420 is treated by angle transforming lens element 408 no differently than s polarized ray 422 that came directly from light source 287 on the first pass. Accordingly the sum of all recycled rays (s polarized from light source 287 and p polarized from light source 288) add to the directly reflected flux from each source to contribute a composite output beam symbolized by ray 426 whose total number of lumens would be greater by the recycled fraction so contributed than 0.5 of the lumens from light source 287 and 0.5 of the lumens from light source 288. Whether this lumen total is greater or less than the total lumens provided if each light source 287 and 288 had been pre-polarized directly using separate reflective polarizer layers 28 placed above each light source aperture as has been described above, depends on the respective recycling efficiencies of the two methods.

Yet, with either recycling approach available, it seems preferable to perform the polarization recovery process directly within the light source panels 287 and 288 themselves, thereby avoiding the long optical path lengths and the various reflection and transmission efficiencies involved in the recycling processes described for ray 412.

The structure of FIG. 22 is advantageous for two reasons, which ever the polarization recovery approach used. It provides a way to more than double the amount of pre-polarized angle transformed monochromatic light provided to a projection system such as has been described by FIG. 20, and while doing that, it provides a separate means of controlling light level for each of the two LCDs 268 and 269, which is useful when they are used in a stereo projection application. This means of light level control is the independent settings of electrical power to the light source panels 287 and 288, if not each set to the maximum power allowed.

The exact x, y, z location of LCD 268 on its respective focal plane relative to LCD 269 is adjusted until the spatial image output overlap is exact, pixel for pixel horizontally and vertically. Off state light from both LCDs returns, as described before, to the light source cavity, as in the case of LCD 268 by transmission through reflective polarizer 292, and in the case of LCD 269, by reflection from reflective polarizer 292. In this case, the potential contribution to the dynamic brightness peaking mechanism described for the system of FIG. 17 is enhanced by the improved polarization utilization efficiency.

Despite apparent pixel for pixel registration of LCD 268 and 269 by physical alignment, successful image overlap in output beam 394 also requires that image information applied electrically to one LCD (for example 268) be transposed along the x (396) and y (397) axes shown in FIG. 21 and FIG. 22 with respect to the other LCD (for example 267) or visa versa. Without performing such a mirror image transformation on one LCD's image, the two illustrative LCD output images will not superimpose correctly.

Figure 23:
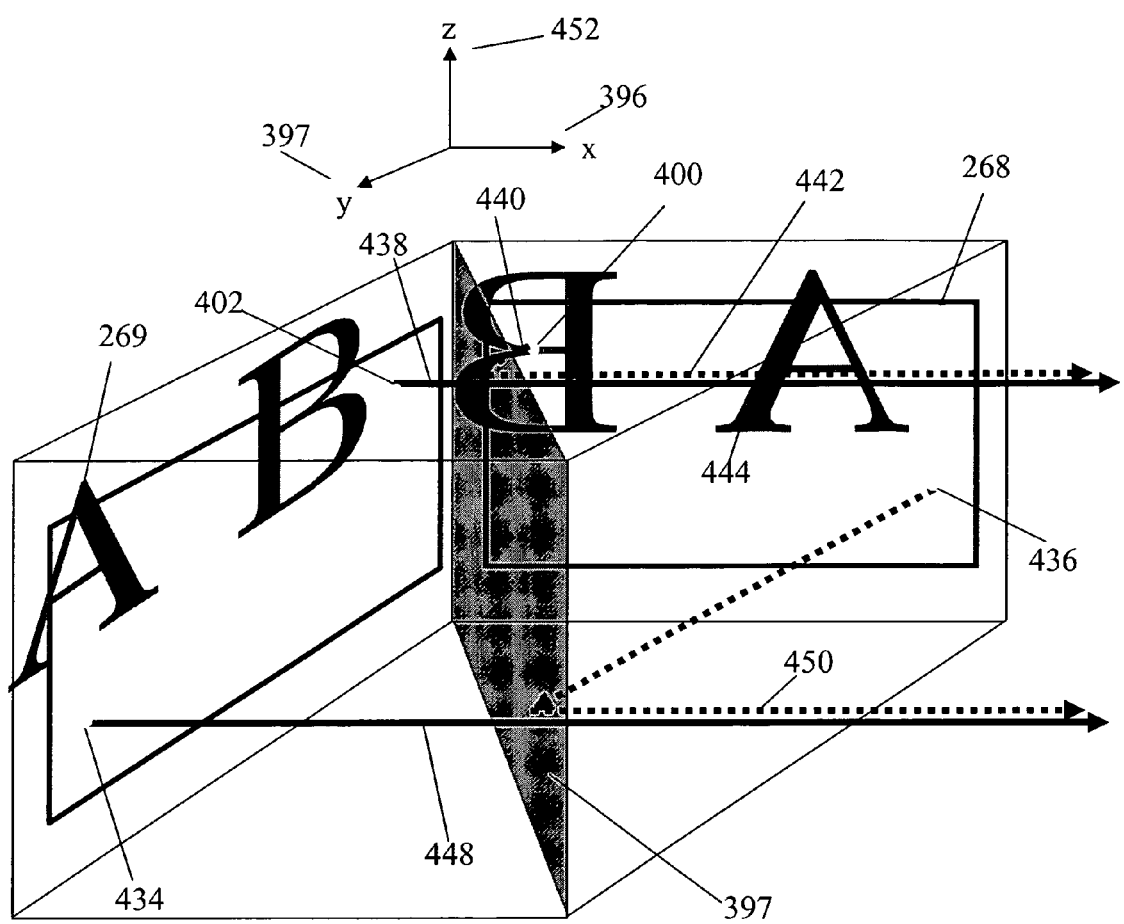
FIG. 23 illustrates a perspective view of the image inversion that takes place on the faces of a polarizing beam splitter such as is used in the reflective non-imaging angle transformers of FIGS. 17–22.

Image Inversion is required in some projection systems. The image inversion required is illustrated graphically in the three-dimensional perspective of FIG. 23, with the mirror image plane being orthogonal to the image plane of LCD 268 and parallel to z axis 452. Identical image information is applied to each of the LCD's pixel arrays forming the respective AB images shown, but the pixel columns on LCD 268 are made the reverse of those on LCD 269. By making this mirror image transformation electronically, light 440 from LCD 268 image point 400 and light 438 from LCD 269 image point 402 can be exactly overlapped spatially as illustrative s and p polarized output rays 442 and 444 demonstrate. This behavior is also shown for image points 434 and 436, which superimpose spatially as illustrative light rays 446 and 448.

This same image transformation approach is applied within the overall projection systems of FIG. 17, FIG. 19, and FIG. 20 to achieve equally precise overlaps between red, green and blue image beams combined in each case by means of dichroic combiner cubes 274. With the arrangement of FIG. 17 as one example, and a conventionally arranged AB image applied to LCD 268, the same conventionally arranged AB image is applied to LCD 272, and the mirror image arrangement is applied to LCD 270. Then, since the system of FIG. 17 allows the locations of the LCD and the light source to be physically reversed, doing this only for LCD 270 and light source panel 284, allows the conventionally arranged AB image to be applied electronically to all three LCDs without such modification. In this case, the desired image inversion is performed optical by means of the 45-degree mirror plane of the reflective polarizer layer 292. In the configuration illustrated by FIG. 19 no such physical image correction is available, and electronic inversion of the image is required on LCD 270. The variation of FIG. 20, however, allows the same degree of physical layout flexibility, as does the system of FIG. 17. As drawn, with a conventional image arrangement applied to LCDs 268 and 270, the mirror image arrangement is applied electronically to LCD 272. The conventional AB image arrangement can be applied to all LCDs including 272, if the position of LCD 272 is moved from the position drawn in FIG. 20 to the dotted position 362, changing only the polarization of light source panel 286 from p polarize to s polarized.

Figure 24A:
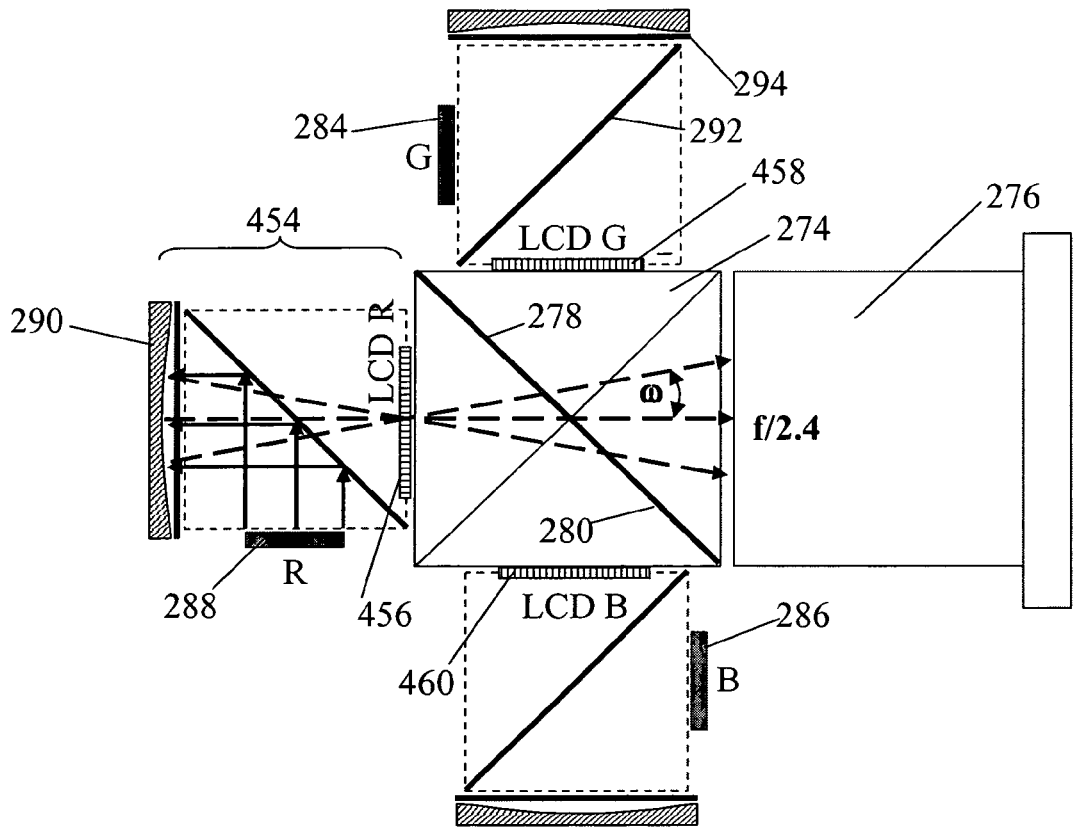
FIG. 24A illustrates a side view of a variation on the practical video projection system of FIGS. 17 and 20 whose three single-colored reflective non-imaging angle transformers use transmissive LCDs rather than reflective ones.
Figure 24B:
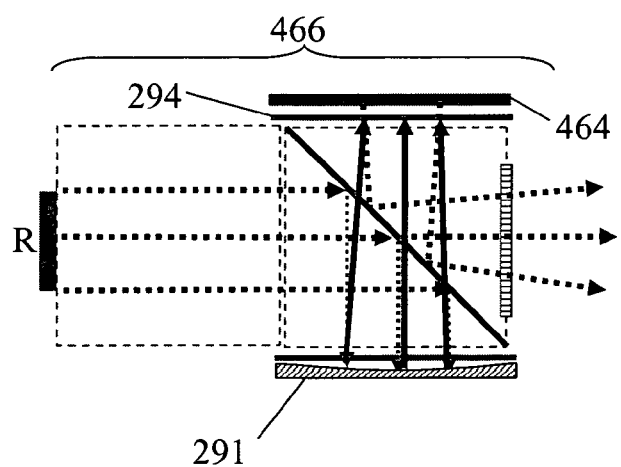
FIG. 24B illustrates a side view of a variation on the non-imaging angle transformers shown in FIG. 24A.

Z. Video Projector Example 6: 3-Panel Transmissive LCD (FIGS. 24A–B and–25)

The basic light source panel and reflective LCD variations of FIG. 17 and FIG. 20 can also be applied with transmissive LCDs using the dichroic tri-color combiner cube 274 of FIGS. 16A and 17 as the angle transformed image light router to a common projection lens 276, as can the Philips prism version shown in detail 310 of FIG. 16B. Corresponding system layouts are shown schematically in FIGS. 24A–B and FIG. 25. In each case, the monochromatic light sources of FIGS. 15A–D are internally polarized as discussed above because the LCD operates preferably with light of a single state of linear polarization.

In the system embodiments of FIGS. 17–25, there are three fundamental relationships that extend to all subsequent examples as well. First, the etendue (aperture dimension times the Sine of the emitted angle) of the light source panel is matched to that of the LCD (spatial light modulator) etendue. Doing so assures that, before losses to inefficiency, the maximum possible transfer of lumens between source and projected image is affected. Since the spatial light modulator apertures are generally rectangular, it is sufficient to match source and modulator etendue along their x and y axes, as in equations 14 and 15.

$$u_x \sin \beta_x = U_x \sin \omega_x \qquad (14)$$

$$u_y \sin \beta_y = U_y \sin \omega_y \qquad (15)$$

This assures that light source panels 284, 286 and 288 are sized preferably for the sizes of the LCD used.

Kohler type illumination optics has been illustrated as the preferential means to achieve the amount of angle transformation needed between source and image. This has been accomplished using reflective power in the embodiments of FIG. 17, FIG. 19 and FIGS. 24A–B, and with purely refractive power, in the embodiments FIG. 20, FIG. 21, FIG. 22 and FIG. 25. The geometric relationships involved are summarized in equations 16 and 17, and apply to all following examples as well. The equations 16 and 17 use F to specify the focal length of the illustrative concave mirror elements 290 and 291, and the back focal distance of the spherical or aspheric lens elements 356 and 408. The equations also use the subscript d to refer to the aperture diagonal rather than the corresponding dimensions along the aperture's x and y-axes. In this manner, a circularly symmetric lens or mirror is used, and truncated to remove those portions of the circle not receiving light. When using cylinder lenses for each of the system's x and y axes, equations 16 and 17 are applied along those axes, using $u_x$, $u_y$, $U_x$, $U_y$, $\beta_x$, $\beta_y$, $\omega_x$ and $\omega_y$ rather than the diagonal values indicated. The angular range along the diagonal for the light source panels of FIG. 16 is about +/−32 degrees.

$$U_d = 2F \tan \rho_d \qquad (16)$$

$$u_d = 2F \tan \omega_d \qquad (17)$$

AA. Video Projector Example 7: Field-Sequential Transmissive LCD (FIG. 26)

The image projection system variations of FIG. 17, FIG. 19, FIG. 20, FIG. 21 FIG. 22, FIGS. 24A–B and FIG. 25 have each used three reflective or transmissive LCD panels per system, one for each of the three monochromatic light source panel colors red, green and blue 288, 284 and 286 respectively. It is equally practical to use a single transmissive or reflective LCD panel, provided that single panel is capable electronic switching speeds that are fast enough to enable field sequential color illumination. Instead of applying the image information monochromatically to three separate LCDs and then mixing the monochromatic image beams into one composite image beam as in the configurations disclosed above, the tri-color illumination is applied to a single LCD in rapidly sequenced periods of red, green and blue that correspond to an image frame rate fast enough that the viewer's eyes are unable to distinguish the individual red, green and blue image frames and the perception is of full color imagery. This single modulator method, discussed further below, has been used successfully with the DMD in many commercial projector products. Recent advancements in LCD technology, however, are leading them towards the faster switching speeds needed as well.

Figure 26:
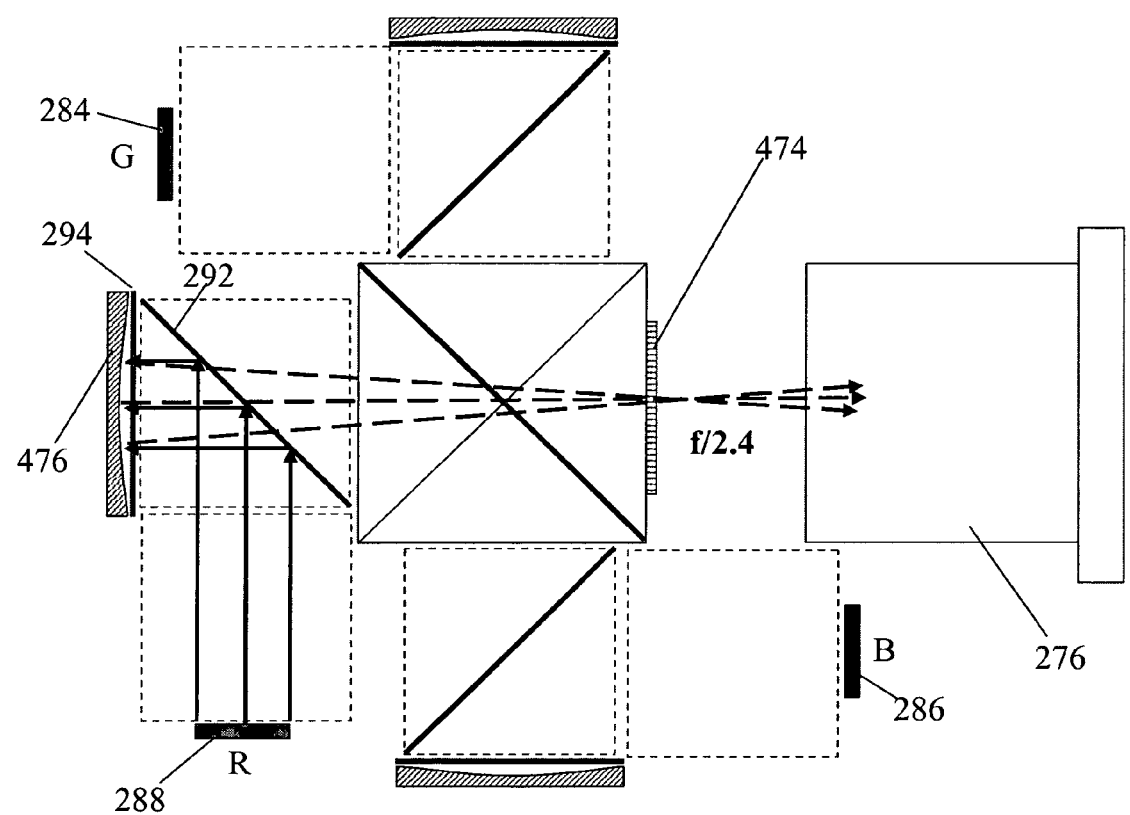
FIG. 26 illustrates a side view of a single transmissive LCD variation on the three transmissive LCD video projection system of FIG. 24 that positions the single transmissive LCD on the output face of a set of color mixing prisms, arranged so that its input faces receive output light from three single-colored reflective non-imaging angle transformers made in the form of FIGS. 17–18, but with a focal length extended so that the distances between the LCDs and light source panels are equalized.

One such system embodiment based on the configuration of FIG. 17 is illustrated in FIG. 26. In this approach, a single dichroic combiner 274 is used to mix the angle-transformed output light from each of three separate monochromatic panels sources 284, 286 and 288. In this arrangement, the focal length of the illustrative mirror 476 must be sufficient to match the optical distance through combiner cube 274 to the single transmissive LCD 474.

AB. Video Projector Example 8: Field-Sequential Transmissive LCD (FIG. 27)

Figure 27:
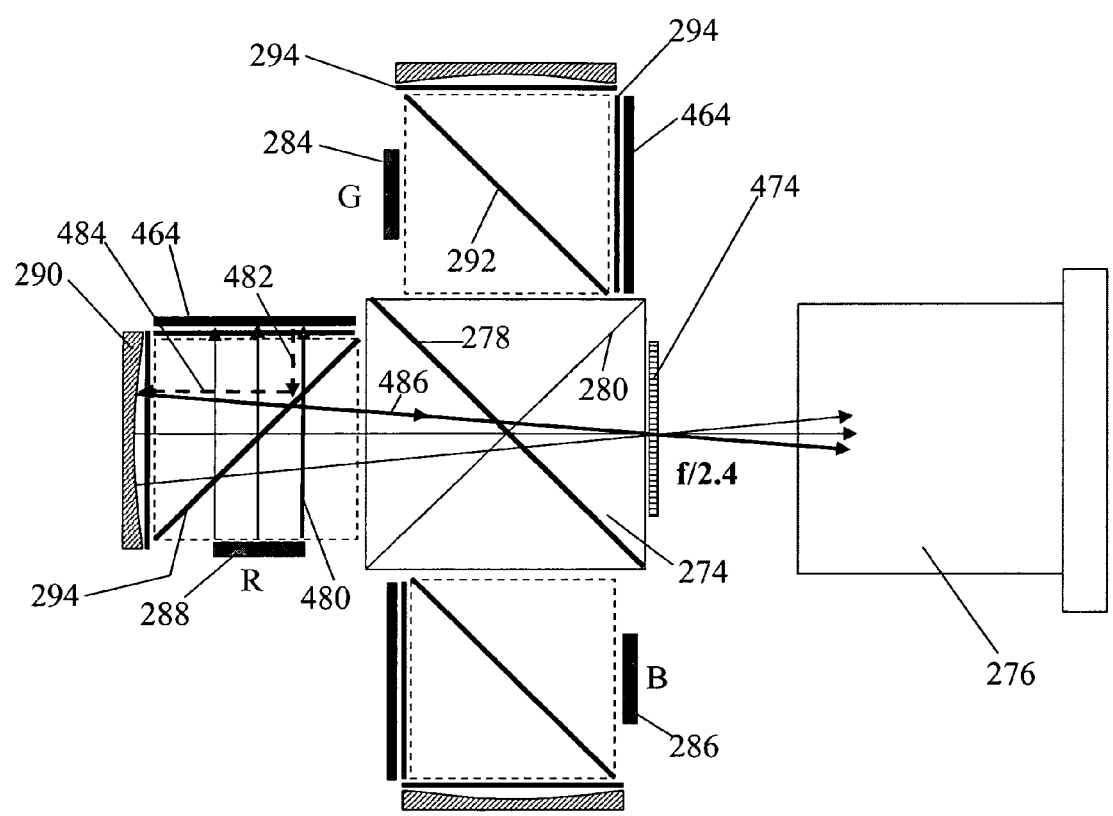
FIG. 27 illustrates a side view of a more compact variation on the single transmissive LCD video projection system of FIG. 26.

A more compact variation on the embodiment of FIG. 26 is shown schematically in FIG. 27 that achieves compactness by making use of the same extra folding path as angle transformer 466 in FIG. 24. This layout eliminates the large separation between, for example, light source panel 288 and mirror element 476 in FIG. 26 by creating this same optical path length over the ray path from light source 288 to polarization converting mirror plane 464, to reflective polarizer 294, and then to concave mirror 290. This approach uses two metallic mirrors 290 and 464 that are placed 90 degrees from each other, and two quarter-wave phase retardation layers 294.

AC. Video Projector Example 9: Field-Sequential Transmissive LCD (FIG. 28)

Figure 28:
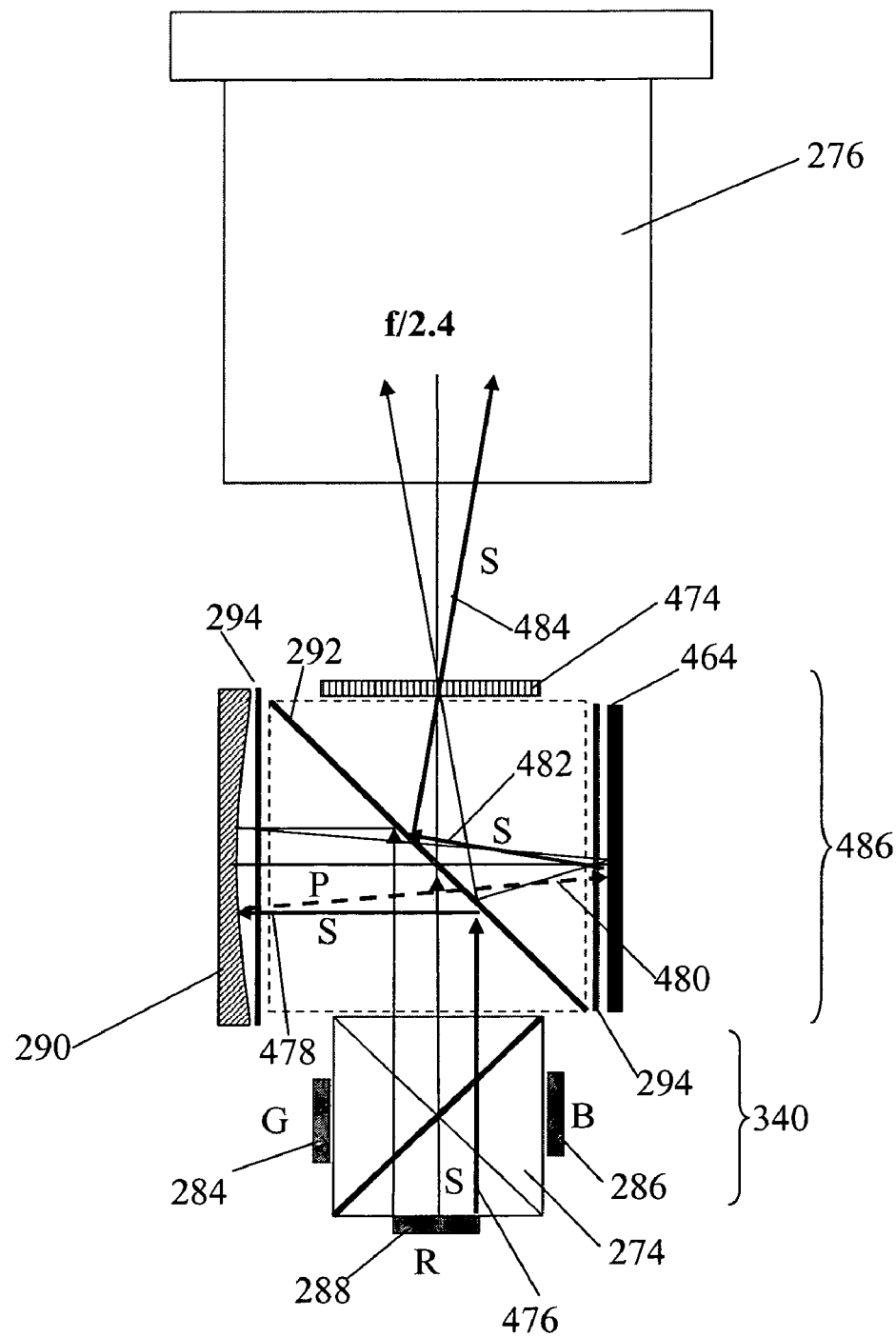
FIG. 28 illustrates a side view of a compact single transmissive LCD video projector system using the dichroic prism arrangement of single-colored light source panel illuminators of FIG. 19 as input to the reflective non-imaging angle transformer arrangement used in FIG. 27.

Yet another compact projection system arrangement is illustrated schematically in FIG. 28. This variation combines light from the three monochromatic light source panels 284, 286 and 288 prior to angle transformation in a single tri-color combiner cube 487, as was done for use with three reflective LCD panels in the compact system of FIG. 19. The variation shown in FIG. 28 uses most compact angle transformer form 486 that includes an extra folding step by means of reflecting element 464, so as to permit transmissive LCD 474 to be closer to the angle transformer cube than it otherwise would be located. Alternatively, and not illustrated, this extra folding step can be removed and the transmissive LCD 474 (and projection lens 276) moved upwards until it is on the focal plane of reflecting element 290.

AD. Video Projector Example 10: Field-Sequential Transmissive LCD (FIG. 29)

Figure 29:
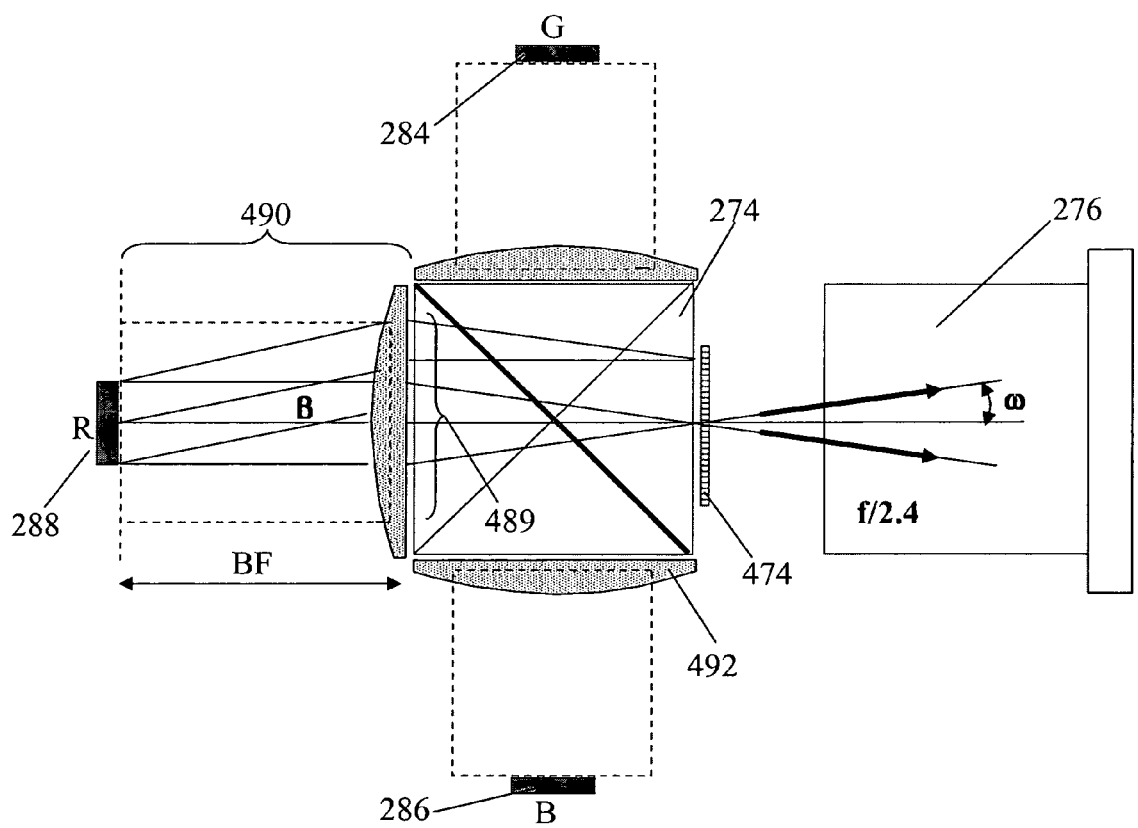
FIG. 29 illustrates a side view of a compact single transmissive LCD video projector system using three purely transmissive non-imaging angle transformers of the form used in FIG. 25.

Still another compact projection system arrangement for single transmissive LCD panel 484 is shown schematically in FIG. 29. In this variation, three monochromatic refractive angle transformers 490, 492 and 494 are combined with a single tri-color dichroic combining cube 274 in a space-saving way that overlaps the output beams within the combiner that was not possible with the 3-panel transmissive system of FIG. 25.

AE. Video Projector Example 11: Field-Sequential Transmissive LCD (FIG. 30)

Figure 30:
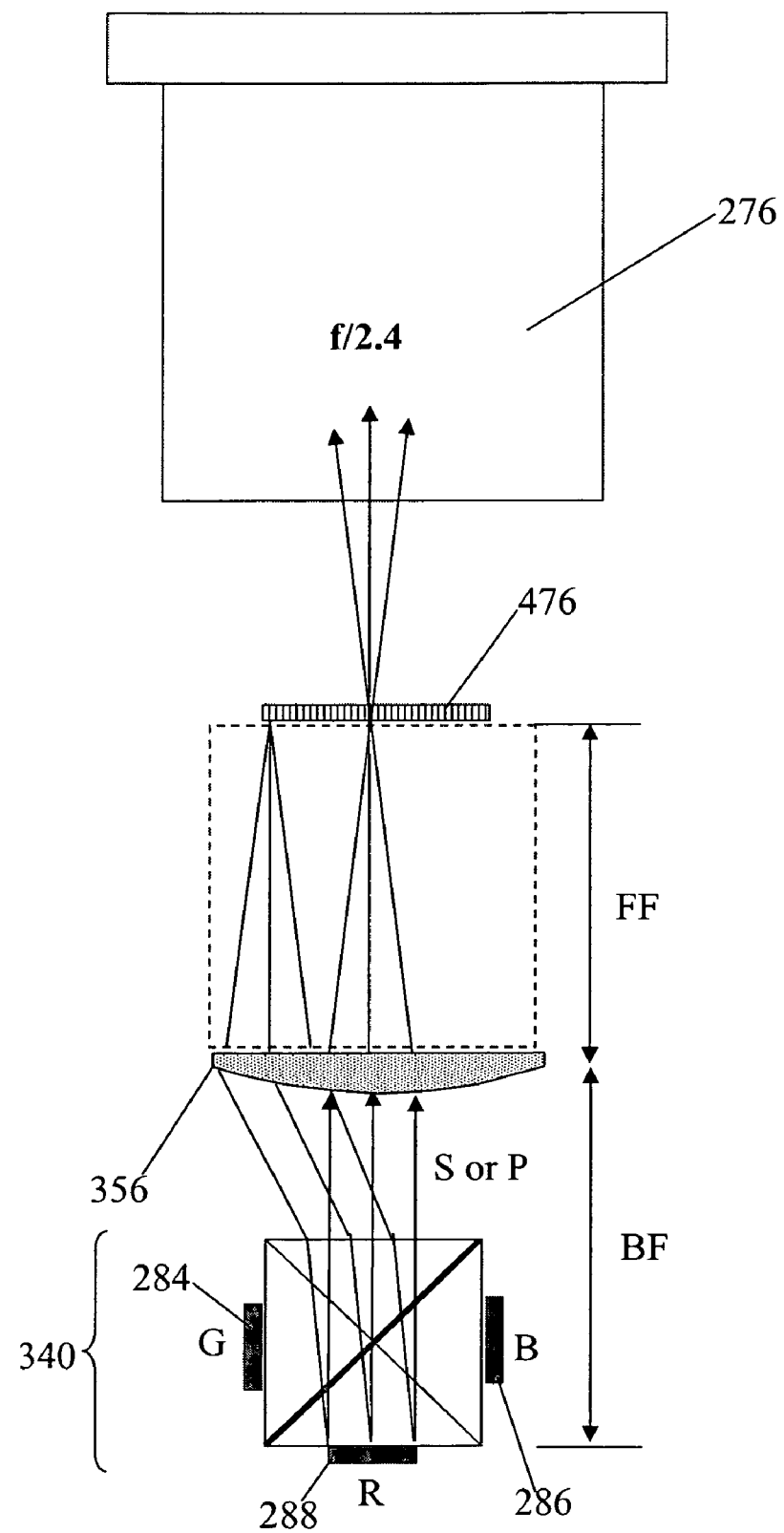
FIG. 30 illustrates a side view of a compact single transmissive LCD video projector system using the dichroic prism arrangement of single-colored light source panel illuminators of FIG. 19 as input to a purely transmissive non-imaging angle transformer of the form used in FIGS. 25 and 29.

A more compact variation on the arrangement of FIG. 29 is shown schematically in FIG. 30 combining a single refractive angle transformer with the composite tri-color output beam of single dichroic combiner cube 274.

Figure 31:
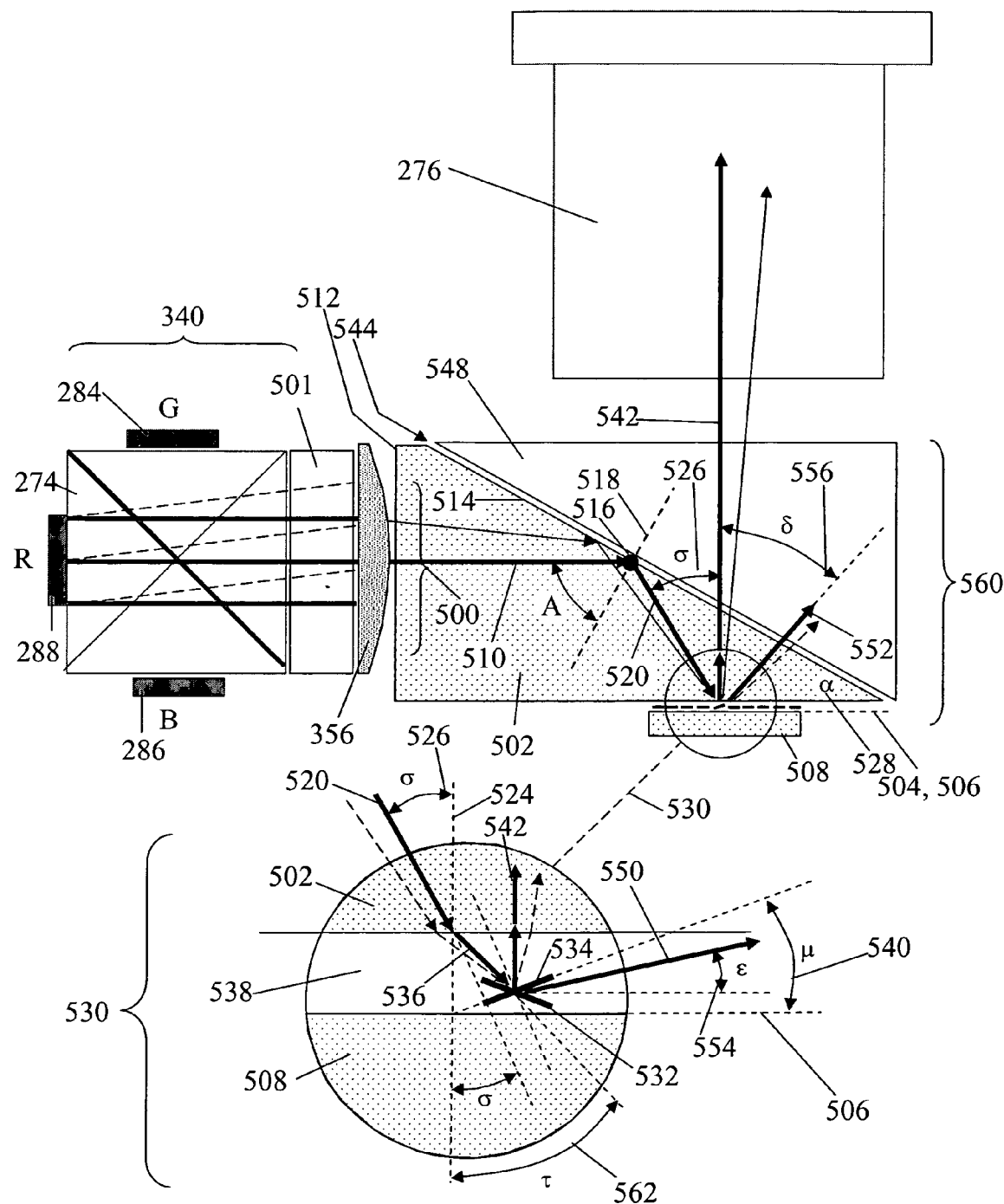
FIG. 31 illustrates a side view of a compact video projection system using a single DMD illuminated by the dichroic prism arrangement of single-colored light source panel illuminators shown in FIG. 19 whose output is then input a transmissive non-imaging angle transformer consisting of a positive lens, two transparent 90-degree prisms, one for input, another for output, that are coupled through an air gap between their hypotenuse faces.

AF. Video Projector Example 12: Field Sequential DMD (FIG. 31)

All light source panel projection system examples thus far have been limited to reflective and transmissive LCDs. The same approaches, however, can be applied with similar advantage, to the reflective digital micro mirror device (DMD) manufactured by Texas Instruments, thereby replacing the mechanical means of sequential color generation with the monochromatic light source panels 284, 286 and 288 of the current invention.

The DMD is a reflection mode SLM that features an array of typically 17 micron square micro mirrors across the rectangular reflecting aperture that deflect very rapidly in response to electronic control signals that change the direction of f/2.4 (+/−12 degree) light falling on each illuminated mirror image pixels. Electronic signals address individual control elements on the DMD's CMOS substrate, pulling mirror corners down into contact with the substrate in what can be described as a see saw manner. Mirror deflection speed can be faster than video frame rates because of the extremely low mass of the thin-film mirrors. Molecular reorientations in liquid crystals, by comparison, are generally more sluggish, making standard LCDs less preferable SLM candidates for field sequential color illumination. With a DMD, light is either deflected within the field of view of the system's projection lens, or outside it, thereby creating the pixel-by-pixel contrast ratios that make up a digital image. Color, in commercial DMD projector products, is derived from the white input beam of a reflectorized halogen discharge lamp. White light from the lamp is broken into brief sequential time bursts of red, green and blue by color filter segments on a rapidly spinning disk (color wheel) placed in the beam path. Electronic bias applied to the mirror array, mirror by mirror, during each period of synchronized monochromatic illumination corresponds to an image frame that has been modulated for the particular color. These very short sequential red, green and blue modulated color image frames are integrated and perceived by the viewer as being a full-color image. Image intensity is developed by a summation process within each modulated color image frame of the number of mirror deflections that are made into the field of view.

DMD projection systems that rely only on the limited deflection angle of the micro mirrors themselves to create image contrast are not as preferable as those systems that use defeat of total internal reflection in a prism structure to increase the effective rejection angle with respect to the systems projection lens 276. This approach is possible in a transparent dielectric medium because the critical angle predicted by Snell's Law between a light ray and the dielectric-air boundary plane is about 42 degrees for acrylic ($\theta_c = \text{Sin}^{-1}(1/n)$, n=1.49). If the angular extent of the collimated light beam is as in the examples above, +/−8 degrees in dielectric, there is ample room for this +/−8 degree beam on both sides of the critical angle. When the beam is to be internally reflected it must be making an angle with the air-dielectric plane of 42 degrees plus 8 degrees or 50 degrees. At a 50-degree angle of attack, light rays at +8 degrees will strike the boundary at exactly the 42-degree critical angle, and light rays at −8 degrees will remain well inside the critical angle, at a strike angle of 58 degrees—so that all rays are reflected dielectrically. Yet, when the DMD's micro mirrors deflect portions of the beam by 20 degrees or more, those portions of the beam strike the boundary at angles greater than the critical angle, and refract through that boundary into air and through all subsequent dielectric materials according to Snell's Law. This construct allows input light to be channeled to the DMD on one path, and the projection lens to image the DMD on another, much the same as was achieved in the systems of FIG. 17 and FIG. 19 with a reflective polarizer and a means for polarization conversion.

Figure 25:
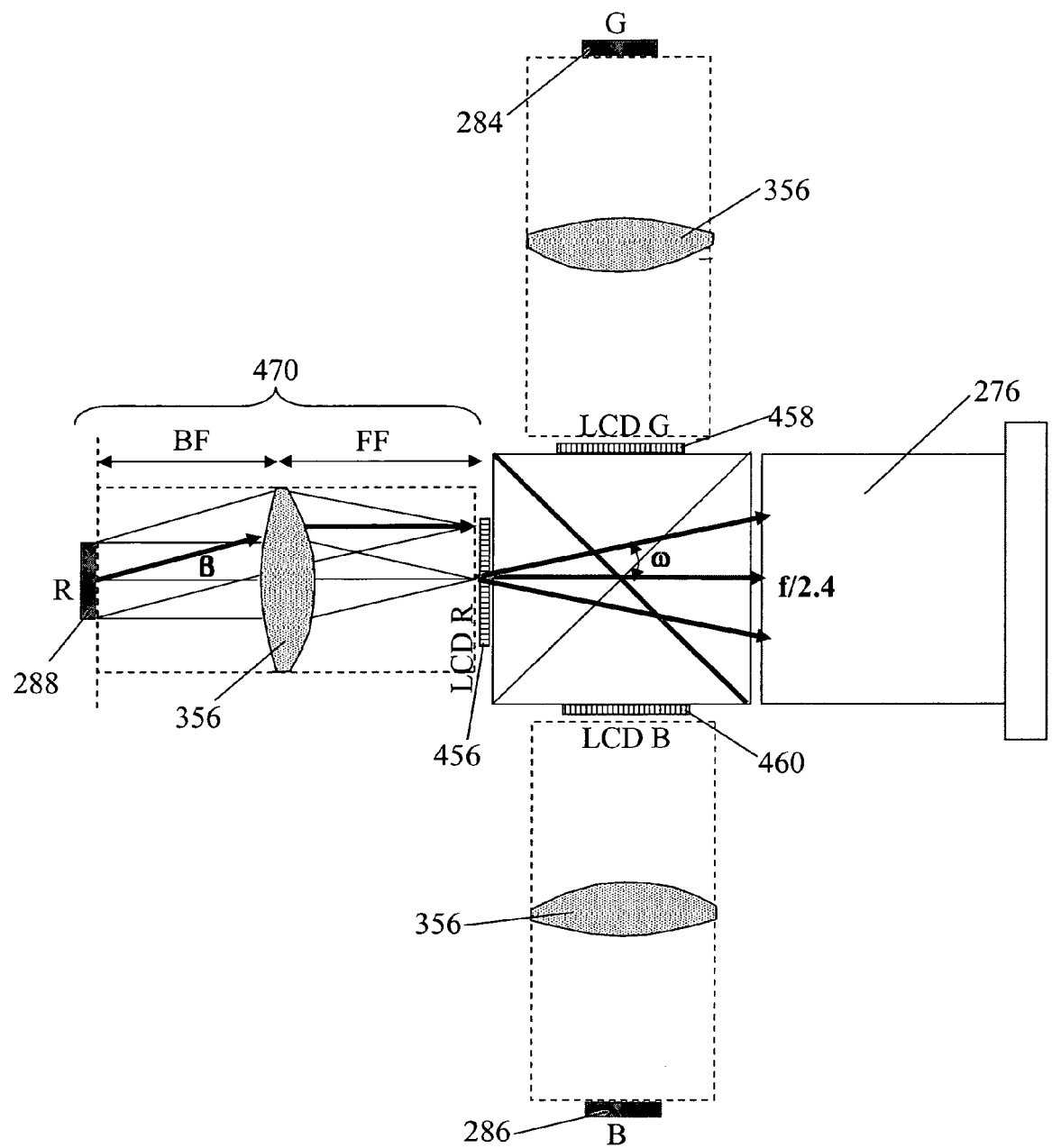
FIG. 25 illustrates a side view of a variation on the practical three transmissive LCD video projection system of FIG. 24 where the three single-colored non-imaging angle transformers each use a purely transmissive design, each featuring a positive lens between the light source panel and the transmissive LCD.

One specific example of a compact DMD projection system using monochromatic light source panels 284, 286 and 288 is given schematically in FIG. 31 using tri-color dichroic combiner cube 274 of FIGS. 16A and 19 (which could also be a Philips prism arrangement as in FIG. 16B) and the refractive non-imaging, Kohler-type angle transformation arrangement of FIGS. 25, 29 and 30. In the system of FIG. 29, the angle transformer's converging output beams 488 were transported through the body of dichroic combiner cube 274. In the system of FIG. 31, it is the three monochromatic beams from the light source panels 284, 286 and 288 that transport through dichroic combiner cube 274, and it is the transformer's output beams 500 that are transported instead through the total internally reflecting prism coupling block 502 to focal plane 504 of lens element 356 arranged to coincide with the mirror plane 506 of DMD substrate 508.

Illustrative red ray 510 emitted from light source panel 288 passes through both reflective filters 278 and 280 of combiner cube 274, is processed by lens 356, passes through input face 512 of prism coupling block 502 and impinges on the prism's tilted output face 514 at illustrative point 516. Provided the angle, A, made with surface normal 518 exceeds the critical angle calculated for the transparent dielectric medium of prism block 502 ($A_c=\text{Sin}^{-1}[(\text{Sin }90)/n]$, where n is the refractive index of the prism medium, and $A_c$ is about 42.2 degrees for n=1.49), the ray reflects from prism surface 514 as if from a perfect mirror. Reflected ray 520 continues trapped in the medium of prism block 502 until reaching prism base 522 at angle σ 526 to surface normal 524, angle σ being A-α, where a is the prism angle 528. Since the prism geometry effects choice of the back (and front) focus distance of lens 356, and determines overall system compactness, the geometric relations are explained in expanded detail by magnified view 530, which shows the effect of DMD mirror tilt, which can be either in the form of 532 or 534, the two extreme mirror positions set electronically. In DMD mirror position 534, for example, the mirror tilts counter clockwise an angle μ 540 measured from plane 506 of the DMD substrate.

When any modulated DMD mirror is in position 534, ray 520 refracts out of prism base 522 (and any planar cover glass protecting the DMD itself) into air space 538 directly above the DMDs as governed by Snell's Law, and then reflects as ray 542 back through prism base 522 and towards tilted prism face 514. In this case, the geometric goal is that axial ray 510 from the center point of light source panel 288 is so reflected that it travels directly along the surface normal 546 of prism base 514, so that on reaching prism face 514, it does so making an angle α with prism face surface normal 518 that is sufficiently less than the critical angle that the ray refracts into the small amount of air space 544 above prism face 514, and in turn, through mating prism coupling block 548, and out into projection lens 276. This ray path represents the on state for DMD mirrors that contribute light to the projected image. This illustrative condition is satisfied when k=2μ. The underlying geometric relationships are given in equations 18–20. Hence, if axial ray 510 makes an angle of 50 degrees with the normal 518 to prism face 514, as explained above, and the DMD tilt angle μ is 20 degrees, the corresponding prism coupler angle α (528) is calculated from equation 19, ($A-\text{Sin}^{-1}[(\text{Sin }2\mu)/n]$), and for A=50 degrees and an acrylic prism is 24.4 degrees.

$$\tau=\text{Sin}^{-1}(n \text{ Sin } \sigma) \tag{18}$$

$$\alpha=A-\sigma \tag{19}$$

$$\epsilon=90-\tau \tag{20}$$

$$\delta=\text{Sin}^{-1}(\text{Sin }\epsilon)/n) \tag{21}$$

When the DMD mirror is flipped electronically to its off state position 532, ray 532 in DMD air gap 538 is reflected as ray 550 which makes angle ε with DMD substrate plane 506, as shown in detail 530, and given by equation 20. For the example conditions, ε=50 degrees and δ, the angle off state refracted ray 552 makes with DMD surface normal 546, is about 31 degrees in the dielectric prism medium. As a result, off state ray 552 makes an angle of δ-α or about 6 degrees with prism face normal 518, which is far from both the critical angle, and the ray refracts from prism block 502 to prism block 548 and exits into air far outside the field of view of projection lens 276.

The sole purpose of the double prism block unit 560 used in the embodiment of FIG. 31 is to shift the DMD's off state light far enough outside the range of view of projection lens 276 so that the DMD's image contrast ratio is maximized. This red, green and blue light from the tri color light source panel block 340 is thereby permanently lost, and cannot be recycled, either for increased efficiency or for what has been described above as a dynamic brightness peaking when the number of on pixels becomes considerably larger than the number off. That is, maximum image brightness in the DMD projection system of FIG. 31 is a constant per pixel no matter how many (or how few) pixels are switched into an on state condition.

AG. Video Projector Example 13: Field Sequential DMD (FIGS. 32–34)

Figure 32:
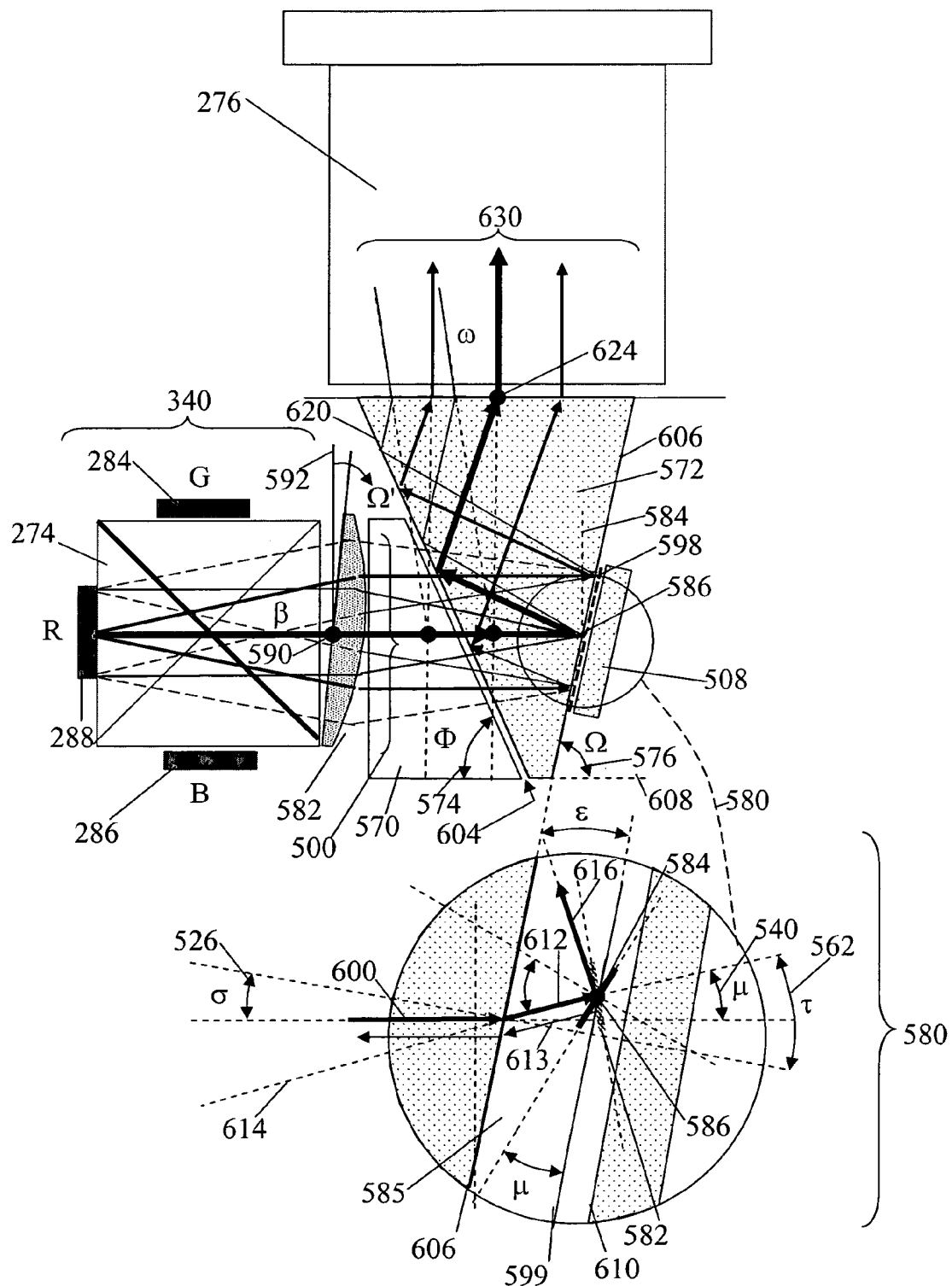
FIG. 32 illustrates a side view of a variation on the compact video projection system using a single DMD shown in FIG. 31, wherein the reflecting plane of the DMD and the focal plane of the transmissive non-imaging angle transformer are made parallel by a tilt applied to the system's positive lens element.

A variation of the DMD projection system of FIG. 31 that is arranged not to have such a visually static behavior is illustrated schematically in FIG. 32. In this case, the two prism-coupling blocks 570 and 572 are each cut with a unique geometry defined by prism face angles Φ, Ω and γ (574, 576 and 578 respectively). In this illustration, block 572 is drawn with γ=0. The resulting face angles assure, as shown in magnified detail 580, that all converging input light rays 500 associated with the DMD's off state (i.e. mirror position 582) are retro reflected back along one of the converging paths they came in on, and thereby return to the source cavities. The same pseudo-Kohler β to ω angle-converting illumination system is used in the system of FIG. 32 as was used in FIG. 31, except that now the lens 582 is adapted to provide a practical means for tilting the system's effective focal plane through an angle Ω 576 about the center point 586 of the DMD aperture, rather than letting it remain parallel to lens plane 592, as it would be under normal circumstances with every focal point falling on plane 584. Since the DMD mirrors are fixed to lie along tilted prism face 606, the light arriving from tri-color source 340 would be out of focus over most of the DMD mirrors leading to loss in uniformity and efficiency. Avoidance of such losses requires that the focal plane be tilted to match slope 606 of the DMD mirror plane. The means for tilting the focal plane of any standard finite imaging lens is known ordinarily as Scheimpfluging, and is accomplished by rotating the lens plane in the same direction as the desired tilt. The Scheimpfluging method applies only to finite imaging systems where neither the object plane nor image plane coincide with the system's focal planes, and where the image has a magnification defined by the ratio of the respective object and image distances. In the present circumstance, however, both object (light source panel 584, 586, or 588) and corresponding image plane are placed deliberately at the lens system's each of the system's focal planes as the means of preventing a sharp image. Under these deliberate non-imaging conditions the conventional Scheimpfluging process will not work properly.

Figure 33:
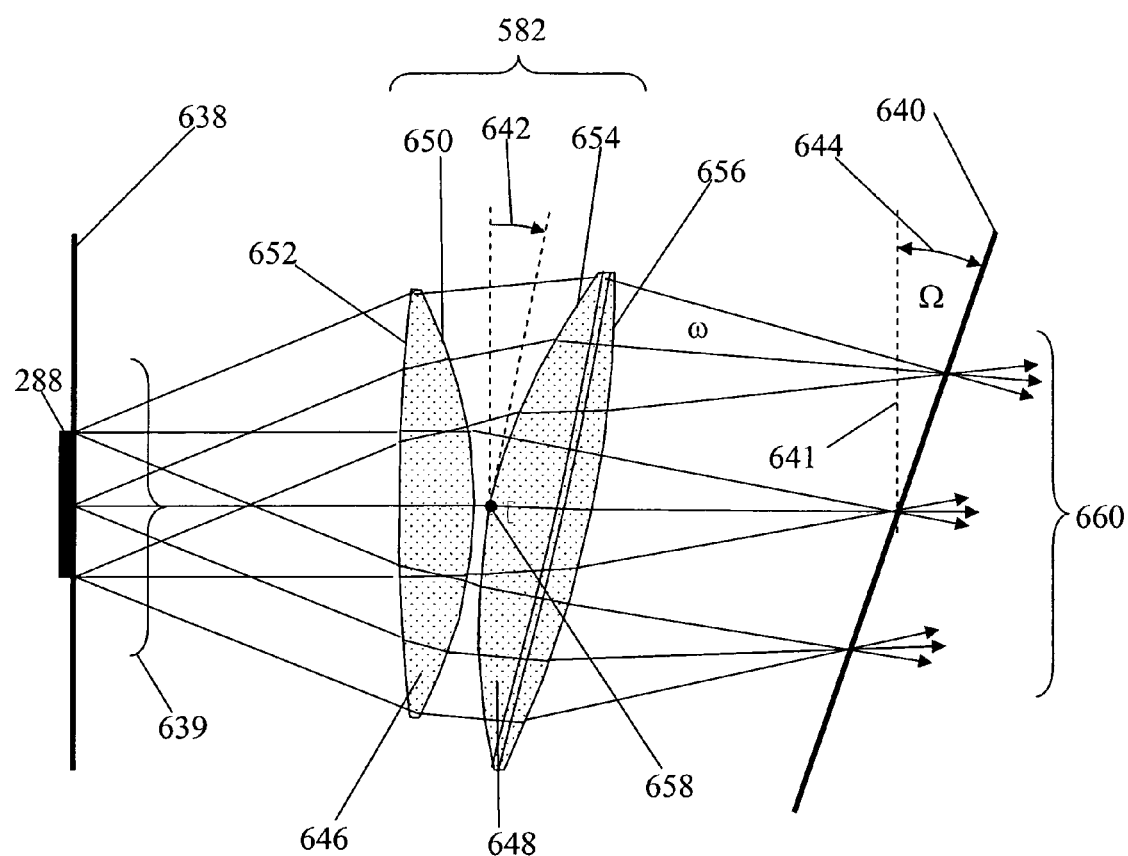
FIG. 33 illustrates a side view of one of the three single-colored dichroic prism-coupled light source panels in the video projection system of FIG. 32 and the tilted bi-convex lens pair used to as part of the non-imaging angle transformer as a means of tilting the output focal plane.
Figure 34:
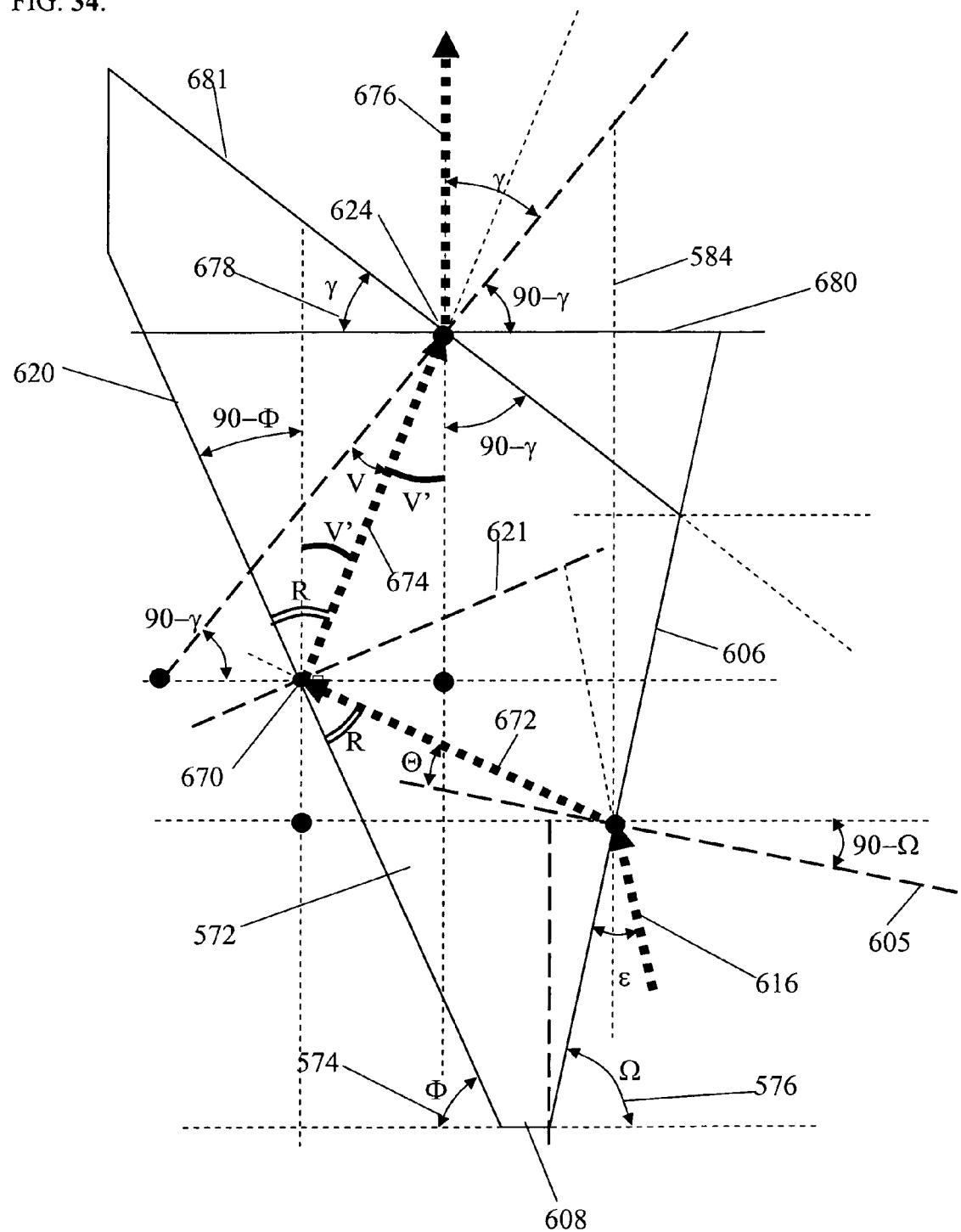
FIG. 34 illustrates a more detailed side view of the illustrative ray paths and geometric relations involved in the operation of the video projection system of FIG. 32.

An alternative to conventional Scheimpfluging is represented schematically in FIG. 33. This preferable two-lens focal plane rotating system 582 tilts one focal plane 640 relative to the axis of the other 638, by fixing one lens element 646 and rotating the other 648. In the example of FIG. 33, the input lens 646 is fixed and the output lens 648 is rotated. In operation, input lens 646, the first of composite lens pair 582, operates on incoming light rays 639 under finite imaging conditions, with plane 638 treated as an object plane rather than a focal plane. Output light rays collected by lens 648 from lens 646 appear as if emanating from a virtual object plane to the left of plane 638, and they are in turn routed to final image plane 640 from what is now a finite (rather than infinite) object distance to the right of plane 641. By the rotation of lens 648 through angle 642, image plane 640 now tilts through angle 644 in accordance with the conventional Scheimpfluging relation. Input lens element 646, in the illustration represented in FIG. 33, is biconvex with 200 mm spherical first surface radius, a 6.5 mm thickness, and a 40 mm conic (parabolic) second surface radius. Output element 648 is also biconvex with a parabolic first surface radius of 50 mm, a 9 mm thickness, and a parabolic second surface radius of 100 mm. The semi-diameters of lenses 646 and 648 are 22 and 25 mm respectively. The semi-height of light source panel 288 is taken as 6.625 mm, the maximum input angle β is 22.5 degrees, the spacing between source 288 and lens 646 is 29.4 mm, and the corresponding transformed output angle ω is 12 degrees. Under these particular circumstances, rotation 642 of 12 degrees results in tilt 644 of about 17 degrees. Output rays 660 arrive on and pass through focal plane 640, as intended, at points corresponding the summation of light emitted from source panel 288 at a given angle.

Hence, with such a lens pair taken as lens system 582 in FIG. 32, not only will the focal plane of the lens system tilt in parallel with neutral DMD mirror plane 599, but the off-state light reflected from mirror position 582 will return to the light source cavities such as the one represented in detail 308 of FIG. 18, where as described earlier, it can be re-cycled in a different output angle and polarization to contribute a dynamic boost or peak in image brightness. For simplicity, only one illustrative off state return path, the one associated with axial illumination ray 600, is represented schematically in detail 580 of FIG. 32. This ray enters prism coupling-block 570 on face 620 and proceeds through the finite air gap 604 between prism block 570 and 572 into block 572 and towards its exit face 606, which is tilted to horizontal axis 608 through angle Ω, 576 (the same angle 644 in FIG. 33). On entering air gap 585 above the DMD's substrate plane 610, which is approximately parallel to the prism block's exit face 606, continuing ray 612 strikes the DMD mirror switched into its off state position (582) at normal incidence. The geometrical relationships that assure axial ray 612 arrives along the surface normal 612 to this mirror position 582 is given in equations 23–25, constrained by τ=μ, μ once again being the DMD micro mirror tilt angle. These relationships extend from equations 18–21 applied to the new geometric orientation of FIG. 32.

$$\Omega = 90 - \operatorname{Sin}^{-1}\left[\frac{\operatorname{Sin}\tau}{n}\right] \quad (23)$$

$$\tau = \operatorname{Sin}^{-1}(n \operatorname{Sin} \sigma) \quad (24)$$

$$\sigma = 90 - \Omega \quad (25)$$

For μ=20 degrees as before, Ω is about 76.7 degrees, which represents a tilt of only 13.3 degrees from the vertical axis. Under these circumstances, incoming axial ray 612 reverses its direction as ray 613, as if it were being emitted towards lens system 582 from focal point 586. Neighboring rays of original incoming ray 600 are all converging to (or near) the same focal point 586, and while these rays do not traverse backwards along the path they arrived on, they traverse backwards along the symmetrical path taken by a neighboring ray set forth by the law of reflection at mirror plane 582. Accordingly, every arriving ray is so returned via lens system 582 to the original emitting aperture of light source panel 288 (or depending on its color, to 284 if green, or 286 if blue) by proper reverse action of dichroic combining cube 274.

When the illustrative DMD mirror is switched to its on state position 584, as also shown in detail 580 of FIG. 32, incoming axial ray 600, and its extension 612 refracted in the DMD air space 585, reflects from the DMD mirror as output image ray 616 whose angle with the DMD substrate plane 610 is ε (or 90−τ), as given in equation 20 earlier. The angle τ has already been constrained by Ω to match μ of 20 degrees. Hence, under these constraints, ε is 70 degrees, and the ray refracts into prism block 572 as continuing ray 672 that reaches prism face 620 at point 670. This ray path is shown as the bolder ray lines in FIG. 32, but the designations are omitted for lack of space. Instead, this same detail is described more cleanly separately in FIG. 34, which is a schematic isolation of the ray paths taken in prism block 572. The path of output ray 672 in prism block 572 between boundary points 587, 670 and 624 involves a sequence of geometrical relations, reflections and refractions coordinated to assure that output ray 676 emerges along the axis of projection lens 276.

AH. Light Source Integration Issues in Video Projection Systems

Illustrative examples of the integration of mono-colored light source panels into reflective and transmissive LCD projection systems were given above in FIGS. 17–30, and for DMD projection system, in FIGS. 31–34. These examples were based on today's red, green and blue LED performance, which are about 20 lumens for 0.5 mm to 1.0 mm chips. Over time, this performance is expected to rise, if history is a fair indication. The number of lumens per chip has risen 35% per year, each year, since 1965. As LED output performance improves, and chips become smaller, certain design preferences and device densities may change, or the total number of RGB lumens produced by any projection system may increase.

It may also become feasible to make LEDs considerable larger than is possible today. The incorporation of larger LED elements may also change the exact way in which the present invention is utilized.

Moreover, all the present examples use a non-imaging angle transformation means, typified by sub-unit 289 in FIG. 17. It is equally practical to use a conventional imaging relay, for form an image of the light source panel onto the aperture of the LCD or DMD, as is often done in the commercial projection systems of today. These issues are discussed in more detail immediately below.

In the image projection system variations of FIGS. 17–22, and 24–33, three separate LED-based light source panels 284 (green), 286 (blue) and 288 (red) were designated by the illustrative form of FIGS. 15A–D in which the light emitting devices 70 were arranged in a two-dimensional array, the space between emitters 70 made about equal to (or less than) the chip size of the emitters themselves. This is thought to be the densest practical packing of such semiconductor light emitting diode substrate chips before the build up of un-dissipated heat associated with the electrical power used to produce the light emission interferes with the amount of light generated and otherwise degrades the device lifetime.

From the standpoint of maximizing lumens emitted per square millimeter, it is advantageous that the light emitting diode chips 70 be packed even more densely, if possible, than the 25% chip density in the arrangement of FIGS. 15A–D. Having such a sparse array density, however, is not fundamental to the operation of any of the projection system configurations described above. All that is required at the systems level is that the lumens be applied in an f/2.4 cone to the entire surface area of the illustrative 1.2" diagonal 4:3 aspect ratio LED or DMD aperture. It is possible that this can be accomplished satisfactorily using a single LED substrate.

As an example of this, the special case is considered where the manufacturers of LEDs achieve devices that are 5 mm×5 mm and greater, having proportional lumen output productions to the 0.5 mm×0.5 mm and 1 mm×1 mm chip sizes being manufactured today. In this case, rather than using the array structure of FIGS. 13–15A–D, there could be practical single monochromatic LED versions of light source panels 284, 286 and 288. The principal advantage of the single LED cavity system detailed for example as corss-sectional detail 308 in FIG. 18A is that the reflecting cavity 228 above the LED chip 70 acts as a preliminary angle transformer, converting the wide angular range (+/−90 degrees) of emission escaping successfully from the LED substrate (240 as in FIGS. 13–14) into the cavity media 238 and 217, and there from into the smaller range of output angles (+/−22.5 degrees) allowed to escape the prism faces of layers 58 and 60. Without such integrated optical layers 58 and 60 above the LED, output angles would remain +/−90 degrees into air, such as air space 41 above LED cavity medium 238 and output aperture 42 as shown in FIGS. 13–14.

Figure 35A:
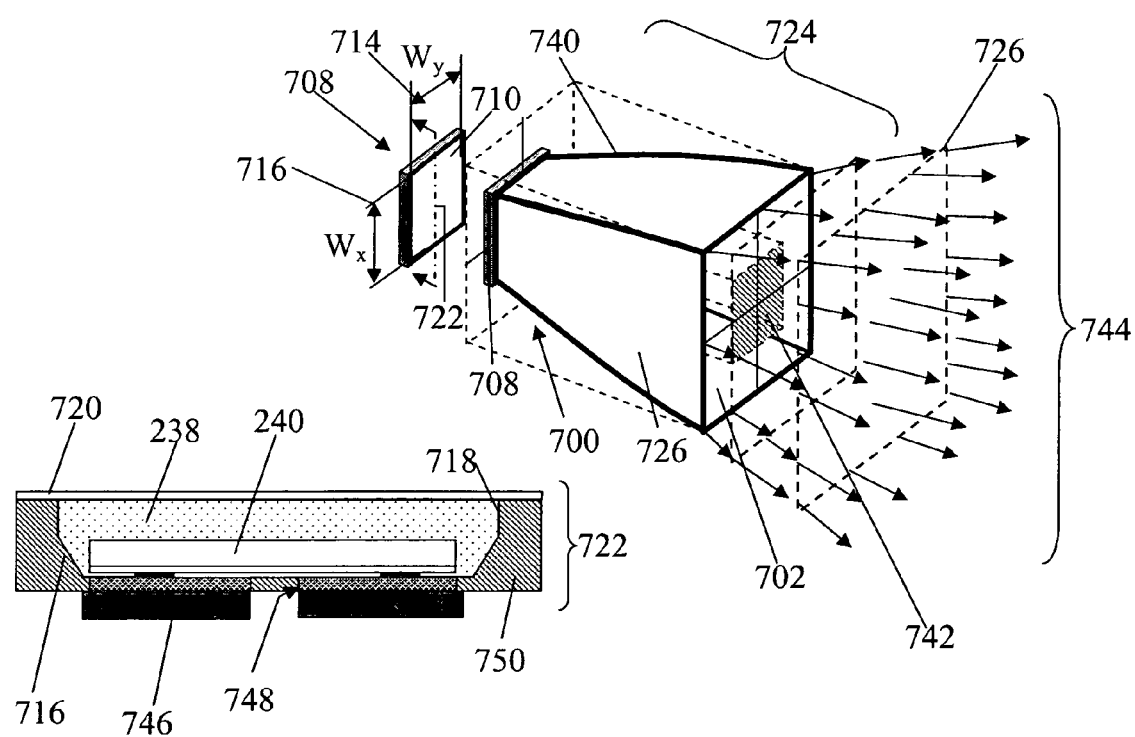
FIG. 35A illustrates in perspective view, a single-colored LED emitter and non-imaging angle transformer package.

The main problem with using such raw wide-angle LED output efficiently enough is that it is difficult, if not impossible, to collect all the emitted optical power using most mirror and lens based angle transforming optical systems such as those employed in FIGS. 17, 19–22, and 24–33. The maximum useful acceptance angles of well-designed optical systems are preferably less than +/−30 degrees. One exception to this is given by the prior art class of dielectric non-imaging angle transformers that were discussed earlier in regard to possible mathematically shaped sidewall curvatures for the reflecting cavities of FIGS. 9. The input apertures 698 of such dielectric angle transformers 700 as shown schematically in the perspective view of FIG. 35A, can be optically coupled to each monochromatic LED's cavity medium, 718 and 238, as shown in the schematic cross-section of FIG. 35B, and then added to tri-color light source cube 274. For such a tri-color cube 274 to be substituted for the ones used in the illuminating projection systems of FIGS. 17, 19–22, and 24–33, the output aperture 702 of each dielectric angle transformer 700 should match the constraints established in the earlier projection system examples, seeking about 1000 lumens over a 13.25 mm×9.94 mm rectangular aperture limited to f/1.3 (+/−22.5 degrees along axes parallel to the aperture edges). Achieving this performance with a single LED chip 70 and minimum power loss requires the cavity aperture 710 ($W_x$ 712×$W_y$ 714) to be 5.167 mm×3.80 mm. The LED substrate size therefore can be as large as about 4.5 mm×3.2 mm, so as to allow some minimum surface area for diffusely reflecting cavity sidewalls 718 that along with aperture volume diffusing layer 720 provide the angle and polarization randomization needed for efficient cavity recycling when that mechanism is needed, and otherwise improve output uniformity. If LED chips sized 4.5 mm×3.2 mm become available that emit, allowing some leeway, 1300 lumens, the monochromatic light emitting structures shown in both perspective view and schematic cross-setion 722 in FIG. 35A can be used in place of the thin light source panels 284, 286 and 288 described by the structures of FIGS. 15A–D.

With approximately 10 lumens output assumed from the apertures of the light source panels of FIGS. 15A–D (assuming 50% efficiency and 20 lumen LEDs), about one hundred and thirty 0.5 mm by 0.5 mm devices are needed to supply the target 1300 lumens. If made as a single 4.5 mm×3.2 mm LED substrate today, that substrate, ignoring the likely thermal degradations, would output about 1080 lumens (20×9×6), which would just barely be enough to meet the target value, assuming the same 50% polarization recycling efficiency as above for the light source panels such as those of FIGS. 15A–D.

While the single LED monochromatic f/1.3 light source systems 724 shown in FIG. 35 simplifies assembly, replacing 130 LEDs conceptually with 1 large junction light emitting device, the cost of doing so is the added length of the non-imaging dielectric angle transformer 700, which in this example would be given ideally by equation 26, with $d_o$ the semi-diagonal of transformer 700's output aperture 702, $d_i$ the equivalent aperture diagonal for light source aperture 710, and $\beta_m$ transformer 700's output angle just inside its dielectric media 726 (having refractive index, n), $\beta_m$ being given by the value of $\mathrm{Sin}^{-1}[(\mathrm{Sin}\ \beta)/n]$ and using the diagonal value of $\beta$.

$$L = \frac{(d_i + d_o)}{\mathrm{Tan}\beta_m} \qquad (26)$$

Figure 35B:
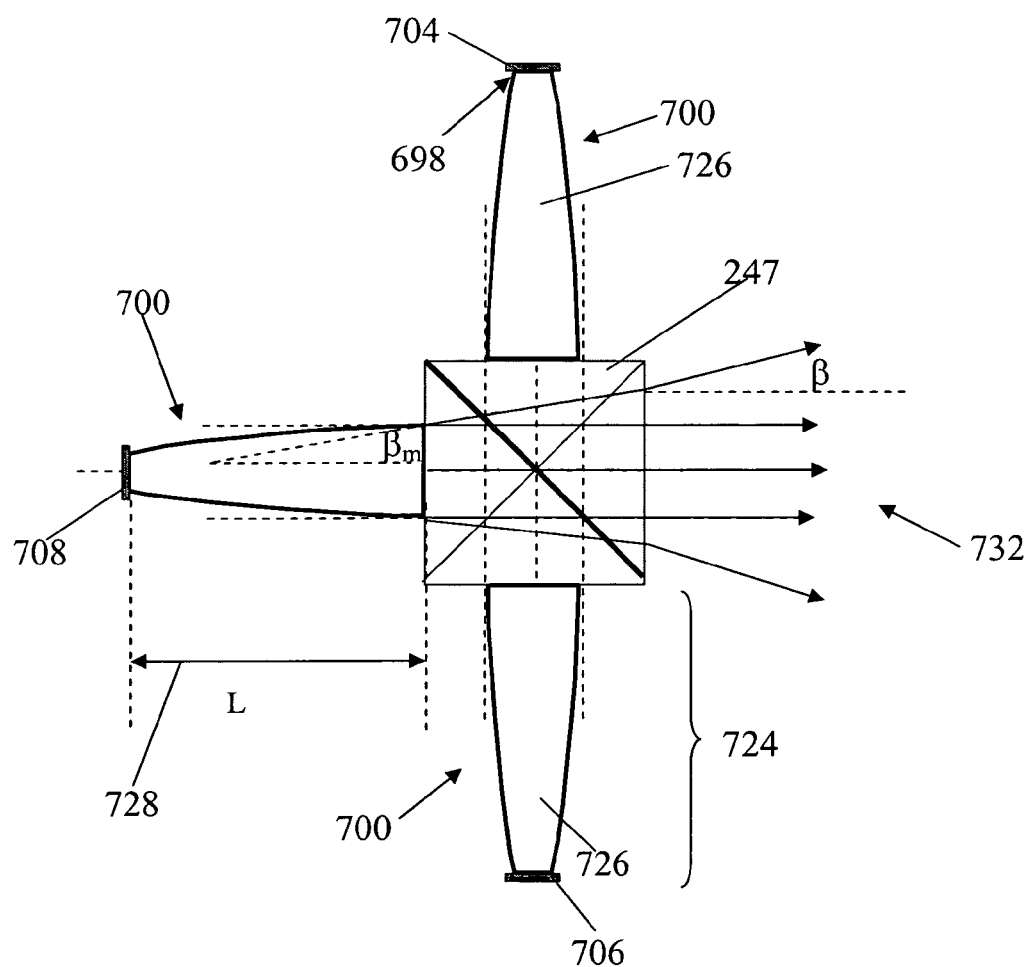
FIG. 35B illustrates a cross-sectional side view of the light source shown in FIG. 35A, including its coupling to the input faces of a set of dichroic color mixing prisms.

Consequently, the length L, 728, of the ideal transformer 700 having the indicated rectangular cross-section, as in FIG. 35B, is 11.05/Tan (14.8) or 41.8 mm, about 1.6 inches. Such a large protrusion is probably not preferable in most commercial applications requiring compactness. Light source panels 284, 286 and 288 with the structure of FIGS. 15A–D are, by comparison, only a few millimeters in their total thickness (T' in FIGS. 15A–D).

Several effective truncation methods have been reported for such dielectric angle transformers that reduce their ideal length in exchange for only minor reductions in their ideal performance, but even after such approximations are made, the net transformer protrusion will still be a noteworthy one, and significantly greater than that of the structures of FIGS. 15A–D.

An efficient means of angle transformation from the substantially +/−90 degree emission of light emitting diodes to some tighter angular range is called for in most practical systems applications. Manufacturers of commercial light emitting diode packages often provide a simple spherical convex output lens surface option as part of the package, usually as a shaped extension of the encapsulating dielectric medium surrounding the emitting substrate or substrates. Doing so definitely increases the amount of usable output light yielded from the device as compared with the amount of light yielded from a flat (no-lens) output surface, but the efficiency of angle conversion is low. A simple one surface lens is not able to handle as wide an angular input range as the diode emits, and because of this, a large fraction of the emission is transmitted outside the angular range desired. In addition, the beam profile produced by this simple lens is generally intense on axis, with falling flux density away from beam center.

Figure 36:
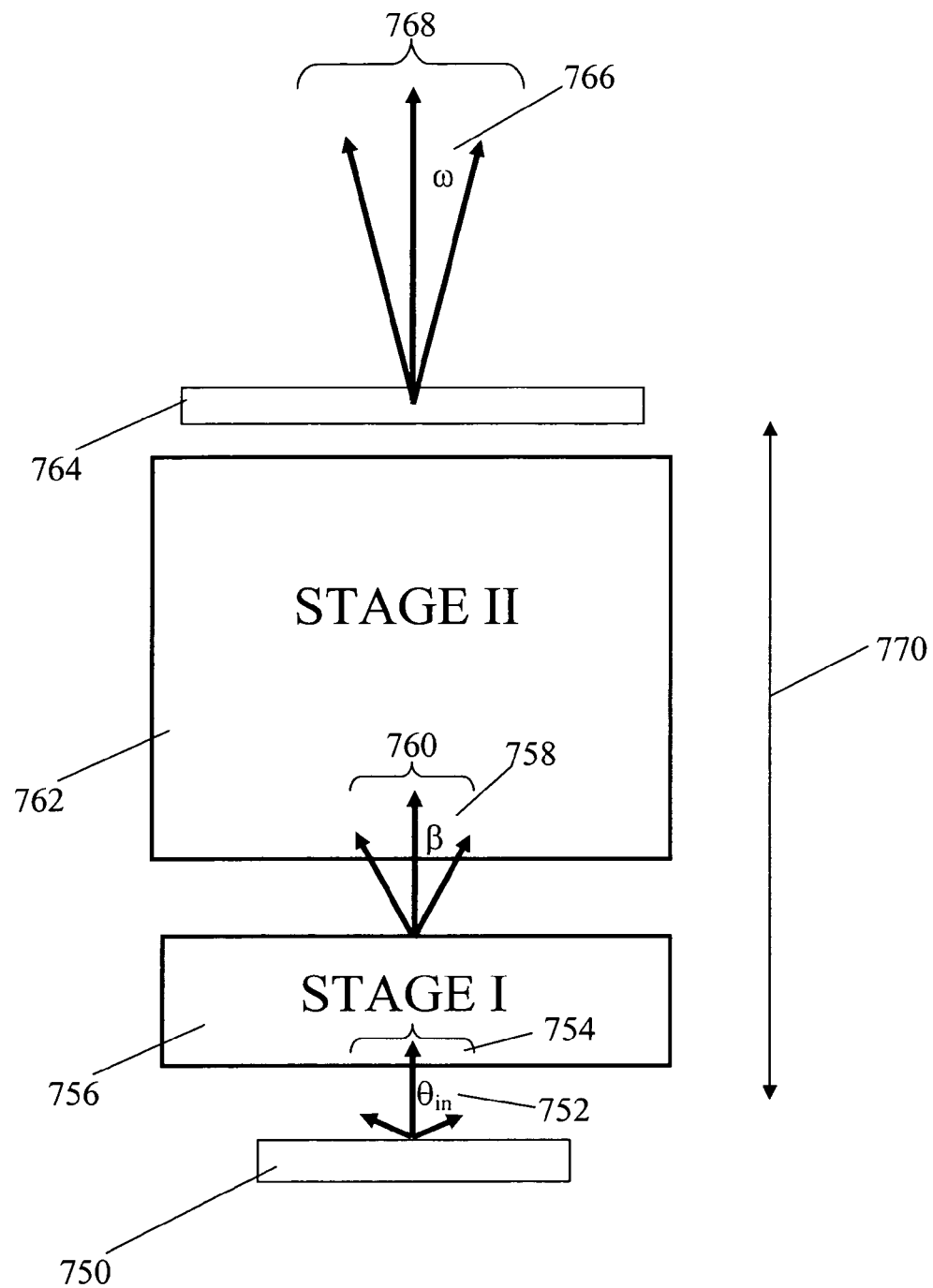
FIG. 36 is a conceptual generalization of the two-stage angle transforming systems used in the systems of FIGS. 17–35.

The compactness of angle transformation approaches embodied in the systems of FIGS. 17, 19–22, 24–33 and 35A–B is due to the fact that they have been made to operate in two sequential angle transformation stages, as generalized schematically in FIG. 36: a first stage 756 that deliberately converts +/−90 degree (generally 752) light (754) to +/−22.5 degrees (or any angle substantially in that range, 758) followed as input 760 to a second stage 762 that then converts the +/−25.4 degree light (758) to the angle of use 766, which for the examples demonstrated so far has been +/−12 degrees in air (f/2.4). First stage transformation 756 includes the lens cylindrical pair method of FIG. 18 that was designed to achieve a different angular range in each meridian.

Only by means of such a two-stage approach 770, can two different means of angle transformation 756 and 762 be used to achieve the large enough amount of angle transformation desired, efficiently, and more compactly than with any single transformation stage.

The un-truncated length of first stage dielectric angle transformer 700 as it was used in the example of FIG. 35B is 41.8 mm (1.6"). Had the same dielectric angle transformer 700 been designed instead to perform the complete +/−90 to +/−12 degree angle transformation that has been required in all the above examples, its dielectric length alone would have to be 128 mm, which is 5 inches. This same light source coupled dielectric angle transformer element 724 in FIG. 35A, to be most effective, would have to be placed directly behind the transmissive LCDs to be so illuminated, as for example in FIGS. 24–25, and could not be used efficiently as an illuminator, for example, with the systems of FIGS. 26–27, which require a sufficient working distance that allows the tri-color cube to be placed in between the transformer output and the corresponding LCD aperture. Dielectric angle transformer 700 has no effective working distance, as light 744 begins diverging directly from output aperture 702. The further the device aperture to be illuminated is separated from transformer output aperture 702, the more that aperture will be inefficiently over-filled by a larger field of light. So, if the 5-inch long single stage monochromatic dielectric angle transformer 724 in FIGS. 35A–B replaced folded transformation system 454 in the system of FIG. 24A, the total system length in FIG. 24A would increase by more than 3 inches.

The classic means of angle transformation in any optical system is the imaging lens relay, wherein one or more lenses are employed to relay a sharply focused and magnified (expanded or contracted) image of an object to a displaced image plane. Such a finite imaging system could be used in place of the single aspheric lens of FIG. 18 or the two-lens system of FIGS. 32–33 to convert the +/−22.5 degree light produced by light source panel 288 to the +/−12 degree light needed at the LCD or DMD apertures, as in the above examples. When doing so, the light source panel aperture is then placed at a suitable object plane and the magnified image is relayed to the corresponding image plane, depending on the system's design parameters, positioned to coincide with the aperture of the LCD or DMD. The principal drawbacks of this approach, compared to those used in the present inventions, is a comparative lack of compactness and spatial uniformity. The reason for the relative lack of compactness is the fact that efficient imaging systems require using several lenses with object and image separated from the lens's focal planes by finite distances. The reason for the relative lack of uniformity is that the imaging system image is a sharply focused replica of the object's uniformity. Any spatial brightness structure occurring within aperture 102 of illustrative light source panels 288 (as in FIG. 17) or 248 (as for example in FIG. 15A) would be faithfully reproduced within the illuminated aperture of the LCD or DMD, and is not preferable. On the other hand, the pseudo-Kohler structures of second stage angle transformers 762 used in the systems of FIGS. 17–22, and 24–33, do not form sharp images, but rather allow the light at every point on the image to be a mixture of light from every point on the object. Because of this, point-to-point brightness variations on the object whose light is to be transformed in angle are not transferred to the resulting image.

AI. Examples of General Lighting Applications

The same advantages of LED lighting that make it an attractive alternative to arc discharge lamps in video projectors, lead to equally attractive alternatives to many types of conventional light bulbs in a broad range of general lighting applications.

Specifically, the thin two-dimensional mono-colored LED array-based light source panels illustrated in FIGS. 15A–D can also be used directly in such single color lighting applications as traffic signaling, warning flashers, and special effects lighting. These same panels can also be made to incorporate white LEDs or LED triads (one red, one green, and one blue) to provide RGB rather than mono-colored illumination. When white LEDs are incorporated in these cases, they may either be of the fluorescent phosphor coated type, or the newer tri-color stacked LED design. And, the mono-colored panels can also be mixed together as they were in the projection systems of FIGS. 17–22 and 24–33 using the dichroic principles of FIGS. 16A–B, to provide concentrated sources of multi-colored illumination for the higher lumen lighting applications such as automotive head lighting, theatrical spot lighting, architectural luminaires, and LCD backlighting.

After a more detailed description of the color mixing process as applied to direct illumination, each general lighting application is explored by way of a specific example.

Prior Art dichroic prism cubes and Philips prism arrangements shown in FIGS. 16A–B have been well described for purposes of separating a single free-air input beam of white light as created by white light bulbs into three primary-colored output beams. Then, they have also well described as a means for recombining such pre-separated primary-colored beams into single output beam mixture. Their use in illumination with the mono-colored beams produced by the LED light source panels of FIGS. 15A–D, however, represents a special case, as the light sources and the light mixing entity are integrated as a single unit that generates the useful output illumination. Moreover, the instantaneous beam color of the output illumination is determined by the exact amount of electrical power applied each of the three constituent light source panels attached to the prism surfaces.

Figure 37A:
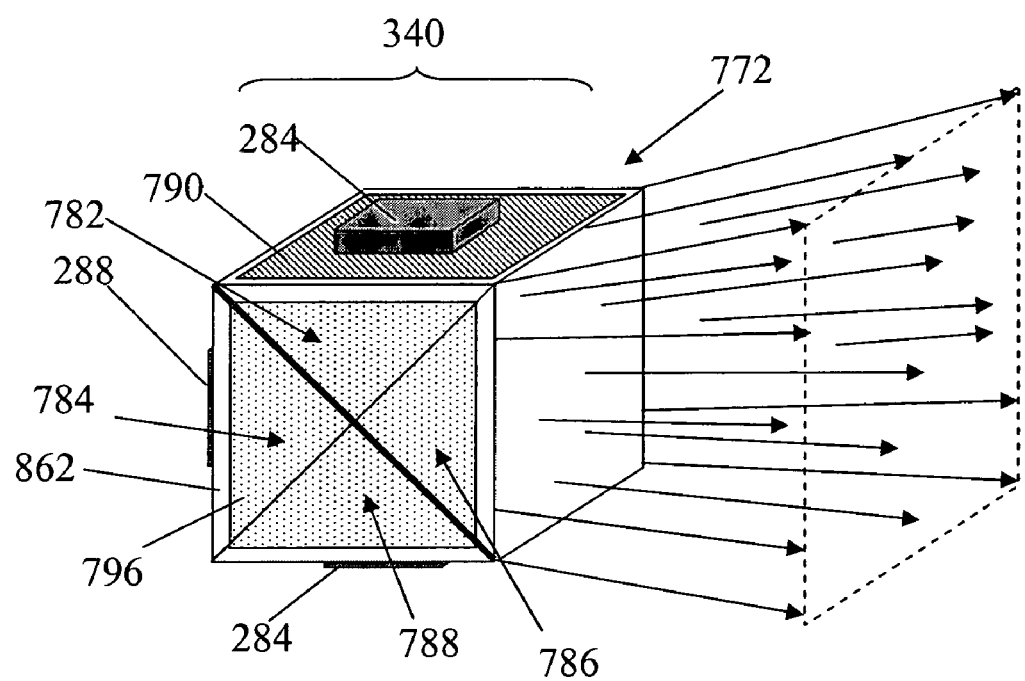
FIG. 37A illustrates a perspective view of the basic red, green and blue single-colored light source panel integrations with a cubic set of four dichroic color mixing prisms and the composite-color output beam so created.
Figure 37B:
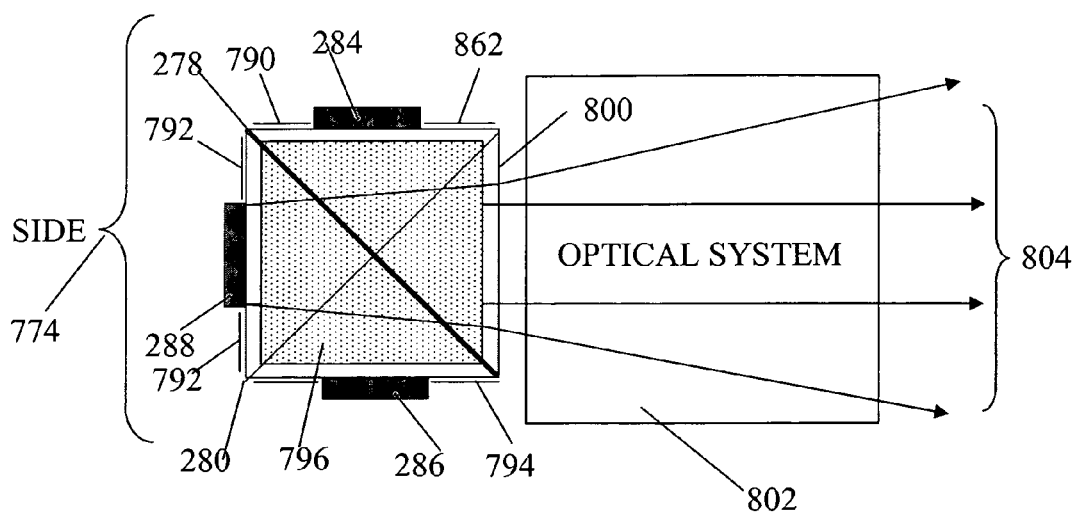
FIG. 37B illustrates the side view of the system of FIG. 37A.
Figure 37C:
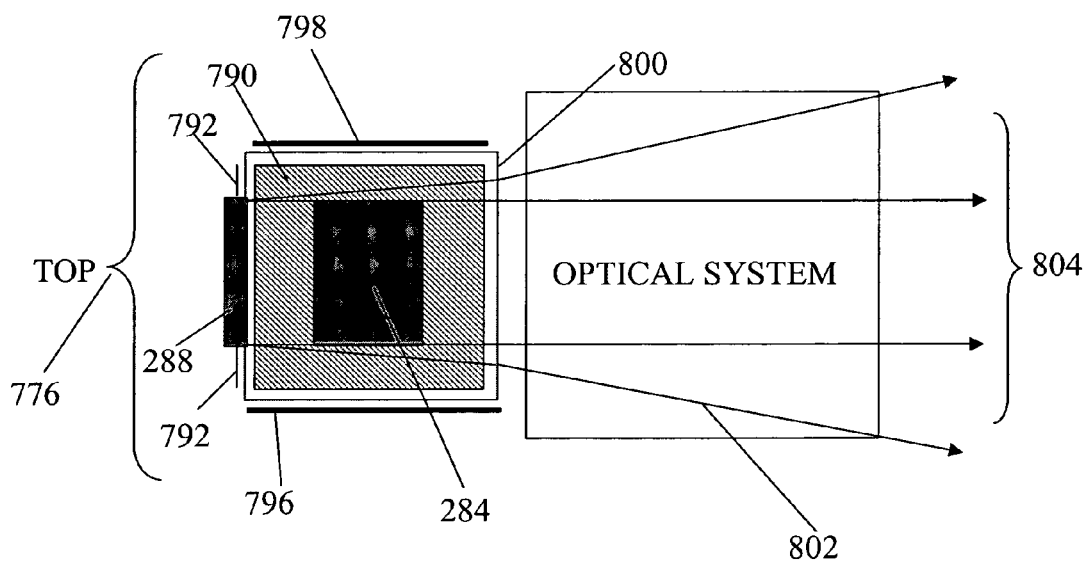
FIG. 37C illustrates the top view of the system of FIG. 37A.
Figure 37D:
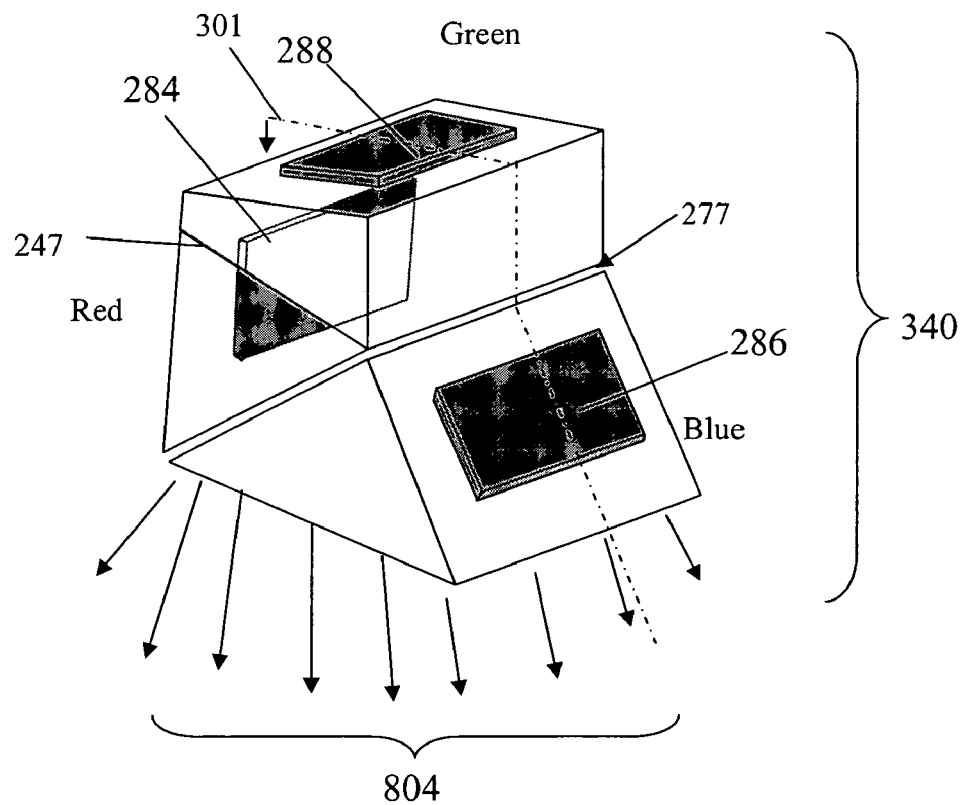
FIG. 37D illustrates a perspective view of the basic red, green and blue single-colored light source panel integrations with a single-colored light source panel with a three dichroic Philips prism color mixing arrangement.

The integration of light source panels with an efficient color-mixing element is depicted for the traditional prism cube structure in FIG. 37A showing perspective view 862. Side and top views 774 and 776 are shown in FIG. 37B and FIG. 37C respectively. The traditional Philips prism arrangement 301 of FIG. 16B is shown in perspective view 340 (FIG. 37C) and in cross-section 301 (FIG. 37D). Either integration is referred in general as light source cube 340.

Light source cube 340, in one illustrative form, is composed of 4 substantially identical Porro (45 degree-45 degree-90 degree) prisms made of glass or plastic that are cemented together as a monolithic block. Prior to cementing the interior prism surfaces, dichroic coatings of type 278 and 280 previously described are applied to the faces of any two opposing prisms, as shown in detail 271 of FIG. 16A. The result is color-mixing cube 772, which is then integrated with three mono-colored light source panels (i.e. green, 284; blue, 286; and red, 288) as shown in FIG. 37A. The thin, monolithic light source panels are preferably glued directly to the three adjacent surfaces of cemented cube 772, with glue applied only to the light source panel's rectangular periphery, just outside its emitting aperture.

As explained earlier, dichroic coatings 278 and 280 both transmit the light of light source panel 288. Dichroic coating 278 also transmits the light of light source panel 286 and reflects the light of light source panel 284. Similarly, dichroic coating 280 also transmits the light of light source panel 284 and reflects the light of light source panel 286. For most visible light applications of interest, the three light source panels will each supply light of a primary color (i.e. red, green and blue). In some applications, light of any three distinctly different wavelength bands can be used, even in the infrared. Porro prisms are defined by their 2 equal 45-degree face angles and their one 90-degree apex angle.

Optionally, thin-film coatings can be applied to each outer surface of cemented prisms 772, coatings 790, 792 and 792 on the surfaces containing each light source panel, coatings 796 and 798 on the side faces, and coating 800 on the cube's output face. Coatings 790, 792 and 794 can be applied either to the cube surface area outside the area of each light source panel, or as a continuous coating covering the entire cube face in between the cube surface and the light source panel coupled to it. When coating s 790, 792 and 794 surround the light source panel apertures, they may be made absorbing black or specularly reflective (metallic or dielectric). When coating s 790, 792 and 794 are made to underlie the light source panels, they must be dichroic themselves, transparent to the wavelength band of the light source panel just above them, and reflecting to one or both of the two other light source panel colors. Side coatings 796 and 798 can be made either absorbing black, or specularly reflective (metallic or dielectric). Front face coating 800 is a dielectric anti-reflection coating to reduce output Fresnel reflection loss. The front face may also be affixed with either an absorption polarizer or a reflective polarizer, as described earlier.

Light source cube 340, coated on its outer surfaces or not, may be combined advantageously with any separate optical system 802, as shown schematically and generally in side view 774 and top view 776 in FIG. 37B and FIG. 37C respectively. In this case, the input aperture of optical system 802 receives light beam 780 directly from light source cube 340, generally in air, and then processes this light so as to output light beam 804, whose angle, polarization, color, and spatial uniformity may be been purposely altered. As a few examples of the many that are possible, optical system 804 may be a lens, a series of lenses, a mirror, a combination of lenses and mirrors, a transparent or reflective diffuser (bulk, surface or holographic), a polarizing system, or a facetted plate. In all previous application examples, optical system 802 is stage two angle transformer 762 (as in FIG. 36).

Figure 37E:
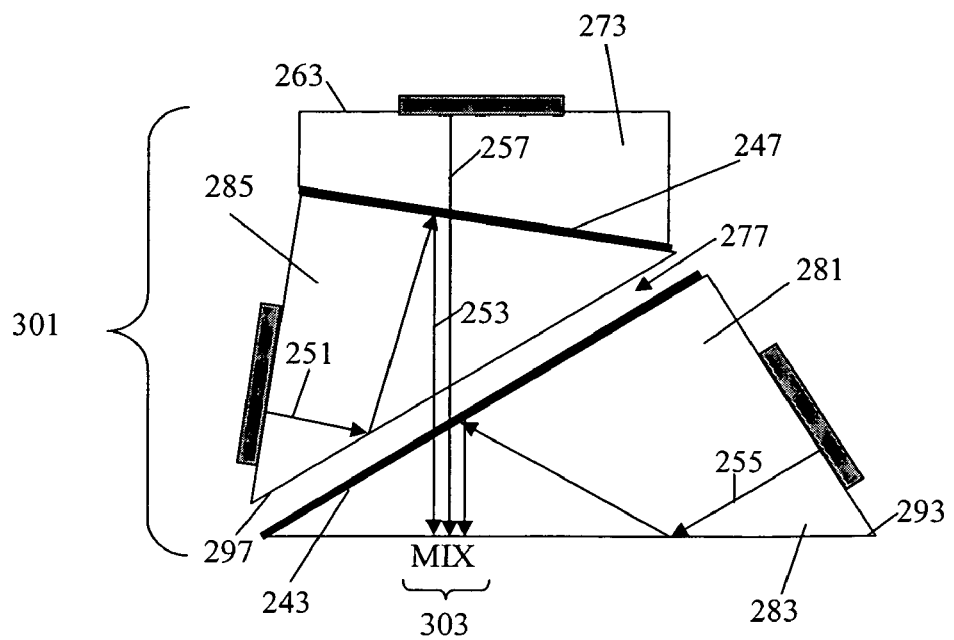
FIG. 37E illustrates the side view of the system of FIG. 37D.

Light source cube 340 in another illustrative form, shown schematically in FIG. 37D (perspective view 340) and FIG. 37E (cross-section 301), is composed of three prisms made of glass or plastic, two of which are cemented together as a monolithic block, the third, separated from the cemented pair, by a small air gap 217. The purpose of air gap 217, as described earlier, is to allow total internal reflection of blue input ray 255 from integrated light source panel 286, and also of red input ray 251 from light source panel 288. Output rays 862 emit through the aperture of prism 281 in a beam equivalent to that 804 as in of FIGS. 37A–C.

The total number of lumens supplied within composite beam 780 from light source cube 340 is given by equation 27 as the sum of lumens from each monochromatic light source panel, wherein $n_r$, $n_g$ and $n_b$ are the total number of LEDs as counted along each edge of the respective light source panels, $L_r$, $L_g$ and $L_b$ are the respective number of lumens generated at each light source panel aperture (after any and all path length and absorption inefficiencies such as those associated with the multiplicity of reflections and refractions occurring within the layered structures of FIG. 15A–D), and $f_r$, $f_g$, and $f_b$ are the respective mixing fractions of each primary color component ($f_r+f_g+f_b=3$) established by setting the electrical power applied to each light source panel, and thereby, to the constituent LEDs within. Nominally, $f_r=f_g=f_b=1$.

$$L_w = n_{rx} n_{ry} L_r f_r + n_{gx} n_{gy} L_g f_g + n_{bx} n_{by} L_b f_b \quad (27)$$

Several examples of direct applications of light source cube 340 follow without detailed descriptions of the optical systems 802 associated with them.

AJ. General Lighting Example 1: Color-Mixed Automotive Head Lighting (FIGS. 38A–B)

Figure 38A:
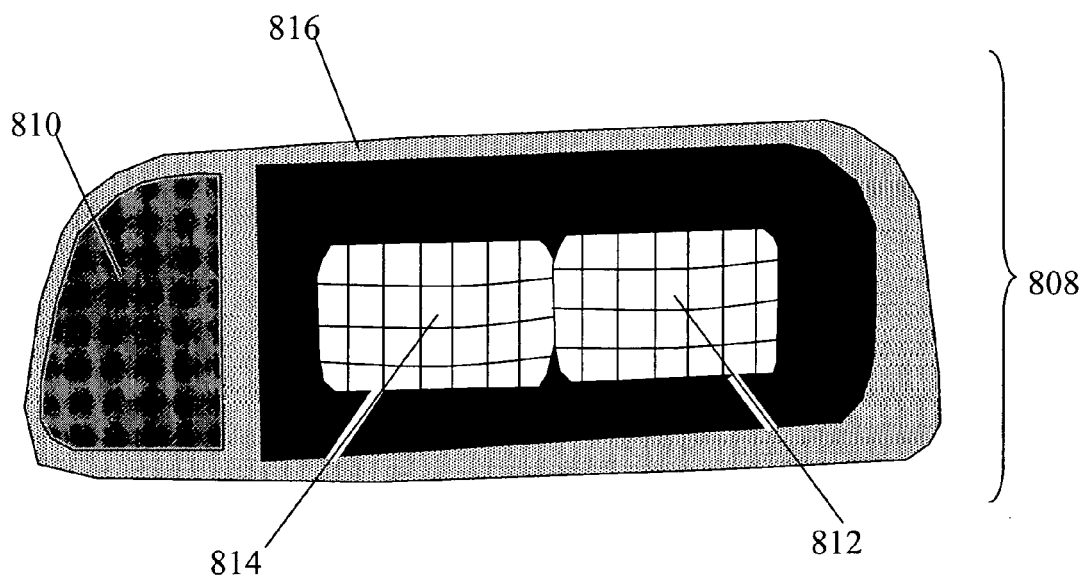
FIG. 38A illustrates a perspective view showing artistically, the front passenger-side head light of a commercial automobile.
Figure 38B:
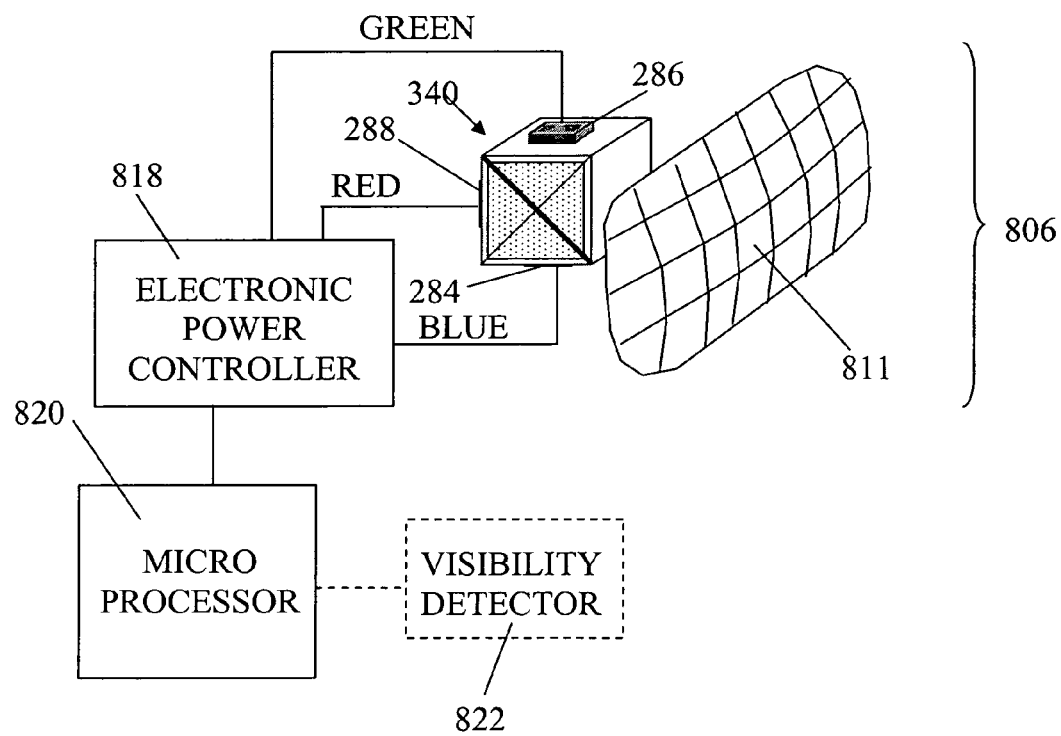
FIG. 38B illustrates a practical lighting application of red, green and blue single-colored light source panel illuminators integrated with a color mixing system as shown in FIGS. 37A and 37B, plus a facetted output lens, a microprocessor and an electronic power controller to perform multiple automotive lighting functions.

One direct lighting application example of light source cube 340 is as an alternative light source for use in the headlights, brake lights or backup lights of an automobile, bus, train, airplane or related vehicle currently using incandescent or halogen light bulbs surrounded by a reflector for that purpose, as illustrated generally in schematic representation 806 in FIG. 38A (basic concept) and FIG. 38B (schematic layout). One miniature light source cube 340 is used with a clear-colored facetted lens (and possibly a diffuser) 811 to spread the light into the auto industry's standard viewing directions. The exact proportion of red, green and blue light is set by electronic power controller 818 which controls the lumens generated by each light source panel 284, 286 and 288 separately. Power controller 818 may include preset power ratios associated with head light color preferences set by the manufacturer to increase customer appeal or to improve driving visibility under specific driving conditions (e.g. standard white, blue-white, daytime driving, nighttime driving, dusk time driving, snow, rain, or fog) that may be activated automatically via micro processor 820, or at the driver's command. Automatic activation of lighting cube 340's optimum brightness and color is controlled by micro processor system 820 linked to power controller 818 and optionally, to driving visibility detection system 822. Visibility detector 822 is any optoelectronic system that samples and analyzes the air space through which the vehicle is passing as a means of determining best lighting conditions. A passenger side front view of the head lighting cluster in a modern automobile is shown schematically in detail 808, FIG. 38A, indicating the right turn indicator system 810 (amber light), the low headlight beam 812 (white light), the high headlight beam system 814 (white light) and the surrounding housing structure 816. Typically, one incandescent or halogen bulb plus a lens or filter to set color and angular directions is used within each lighting system 810, 812, and 816. Conventional light bulbs used in such applications supply between 1500 and 2000 lumens of white light for head lighting, and less for the other lighting functions. Similar treatments exist at each side of the rear of the vehicle for turn signaling (amber), brake indication (red), and back up warning (white). With its multi-color capability, light source cube 340, as shown in FIG. 38B, potentially performs one or more lighting or warning function using the same tri-color element. For example, the same light source cube can serve simultaneously as a brake light (red) and a backup light (white), or simultaneously as a headlight (white) and a fog light (amber). Other advantages of solid-state headlight system 806 would be the shape and brightness uniformity of its rectangular beam cross-section, its simplicity and compactness and its 100,000-hour service life. It is generally difficult to engineer beam shape and uniformity of conventional head light systems because of the amorphous size and shape of the incandescent filament or the halogen discharge. The result on the road is often a considerable compromise in both shape and uniformity. On the other hand, beam shape and the resulting roadway lighting pattern is easy to engineer with light source cube 340 by simply changing the size and shape of its constituent light source panels 284, 286 and 288.

Typically, the light emitted non-directionally by conventional light bulbs in use is partially collected by a concave and or faceted specular reflector that redirects the emitted light rays into an output beam whose angular directions may be further influenced by a lens element so that the result is an output beam having spatial and angular characteristics specified for the task at hand, usually by designated governmental standards setting organizations such as the Society of Automotive Engineering (SAE). Light source cube 340 is therefore not a direct replacement for conventional light bulbs in such conventionally designed headlights. Rather, and as depicted in detail 806, light source cube 340 is at the core of a new automotive head lighting system 806 designed to make best use of light source cube 340's +/−22.5 degree (+/−β degrees) angular cone and rectangular beam cross-section, while simultaneously meeting the associated Industry Standards for roadway illumination.

AK. General Lighting Example 2: Color-Mixed Theatrical and Studio Applications (FIGS. 39A–B)

Figure 39A:
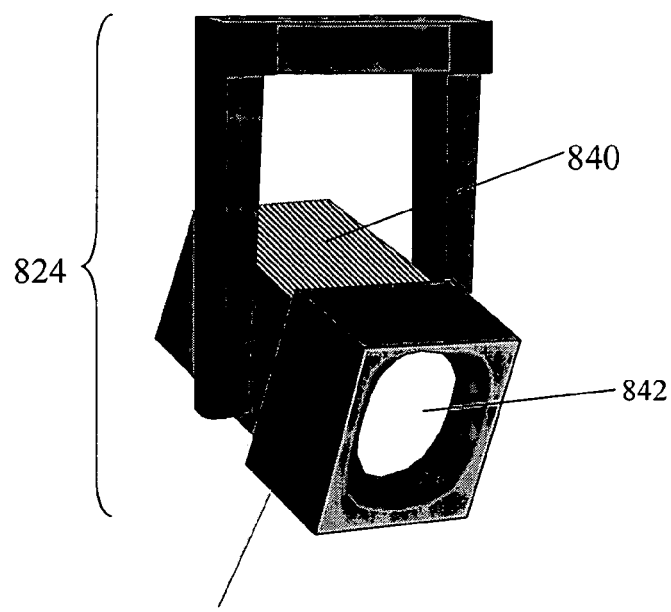
FIG. 39A illustrates a perspective view showing artistically, the basic form of a theatrical or studio spot or flood lighting system.
Figure 39B:
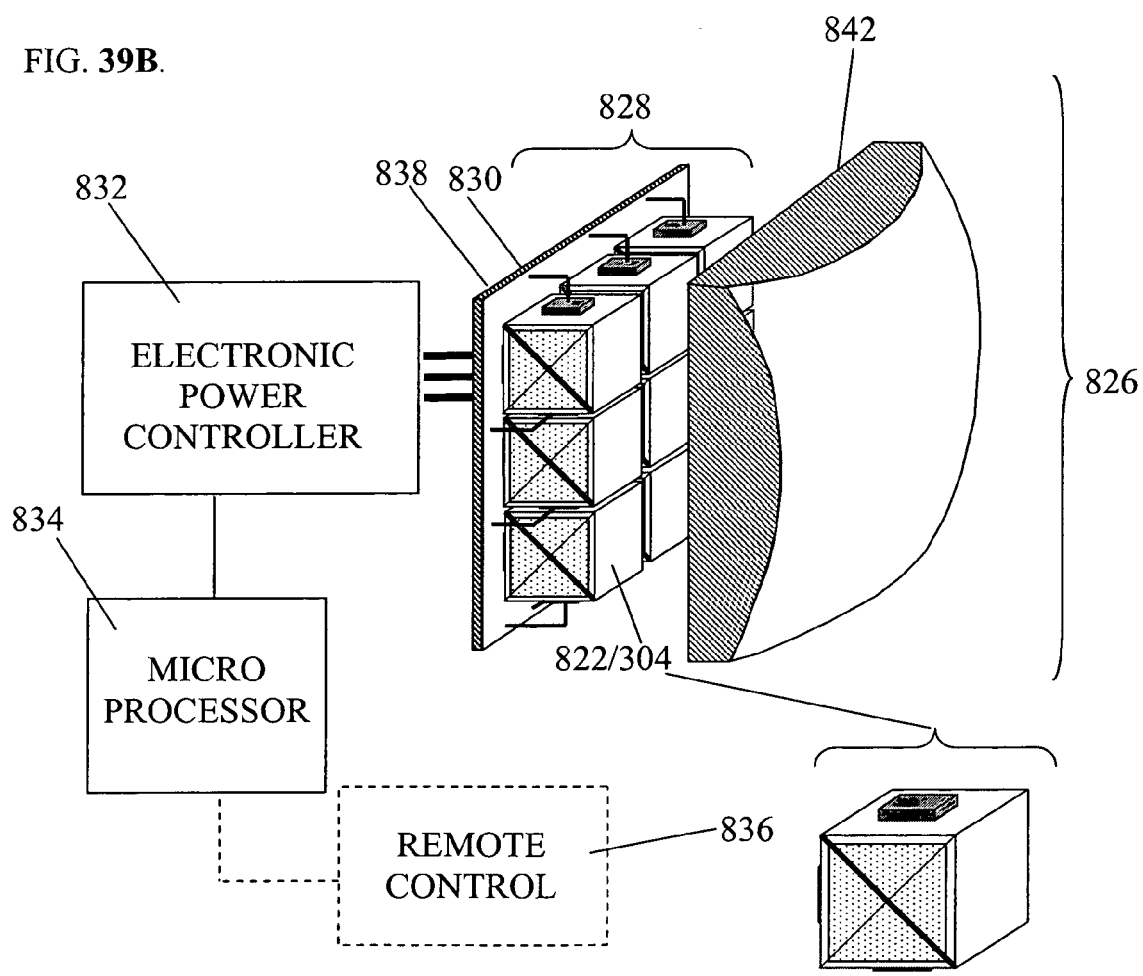
FIG. 39B illustrates a practical theatrical or studio spot or flood lighting system based on an output lens and an array of color mixing elements, each containing separate red, green and blue light source panel illuminators, and their means of independent power control.

Another direct lighting application of light source cube 340 depicted in FIG. 39A is as an alternative high power light source for the theatrical lighting systems used to spot light or flood light performance stages, studios, or remote locations. Similarly improved spot and flood light instruments are also useful for shorter throw distance lighting applications in hospital doctor's office and dentist office operating theaters. In both cases, large amounts of visible lumens (2000 to 30,000 and more) are delivered to a performance area with especially smooth brightness uniformity. The basic configuration 826 of light source cube 340 in such lighting applications is illustrated schematically in FIG. 39B for one of many possible light block 828 arrangements. In this particular illustration, a 3×3 array of light source cubes 340 is deployed to generate 9 times the lumens of any one light source cube 340. The cubes are mounted on interconnection board 830, which routes power to the individual red, green and blue light source panels on each constituent cube from electronic power controller 832, that can be further controlled by micro processor 834 and optional remote control 836. The backing layers 838 of interconnect board 830 provide additional heat sinking, and a means of attachment to the lighting instrument housing 840. Light from the array is a composite beam having an overall beam cross-section matching that of the array itself. The angular characteristics are set by light source cube 340, +/−β degrees along each of the array axes (+/−22.5 degrees as in all previous examples). Lens or lens system 842, shown in FIG. 39B just for example as being piano-convex, may be one or more spherical, aspheric or Fresnel lenses, whose general purpose is to narrow or widen the intrinsic output angle of light source cube 340.

The specific number of light source cubes to be applied in array 828 depends on the lumens yielded per cube, and the total number of lumens needed for the lighting task at hand. Total lumens can then be satisfied either by increasing the size (and lumen output) of a single light source cube (and their constituent light source panels), or by increasing the number of cubes used in the array. In such very high lumen applications, The light beam delivered by each light source cube 340 is spatially uniform across its beam profile, and concentrated as a +/−22.5 degree (+/−β degree) angular cone, which is nearly ideal for flood lighting, depending on the distance between source and performance stage. The narrow beam profile simplifies the additional optics that must be used within the instrument to provide further beam angle control such as for spot lighting, and increases the optical efficiency, delivering more lumen to the spot area than with conventional lamps and optics. Spot lighting often requires beams as narrow as 10 degrees, and typically less than 20% of the lumens produced by the incandescent or halogen lamp is delivered in the spot. Aside from improved efficiency, the multi-color performance of light source cube 340 and lighting system 826 completely eliminates the need for the mechanical color wheels and gelatins needed in the conventional lighting instruments 824 to provide color of choice. Filters and gelatins react unfavorably with the heat they absorb, and degrade in their purity over time. Color selection with the instant invention is electronic, exact, and instantaneous. In addition, and specifically in the case of theatrical lighting, the need is often to turn such lighting on and off instantly, repetitively, or fade to black, all of which is impossible without risking damage to standard high-wattage incandescent and halogen lamps. The light source panels used in each light source cube, however, can be instantly switched on and off, and dimmed completely to black without any change in beam color during the process, or any degrading effect on service life. Dimming conventional lamps by reducing their electrical power often changes the lamp's whiteness significantly, and thereby, even the intensity of light that passes through the color filters being used.

For both theatrical and medical uses, reliability of service is a particularly critical factor, as frequent changing of burnt out light bulbs is not an attractive option during either a theatrical performance or a medical procedure. To avoid just such unwanted interruptions in service, conventional lamp usage is logged, and the conventional lamps replaced as a precaution well before the manufacturer's estimated end of life has been reached. Such lamp replacements are costly and time consuming, as well as, in the case of theatrical lighting, potentially dangerous, as the theatrical lamps are usually located high and at great distances from their point of use.

AL. General Lighting Example 3: Color-Mixed Outdoor Luminaires (FIGS. 40A–B)

Figure 40A:
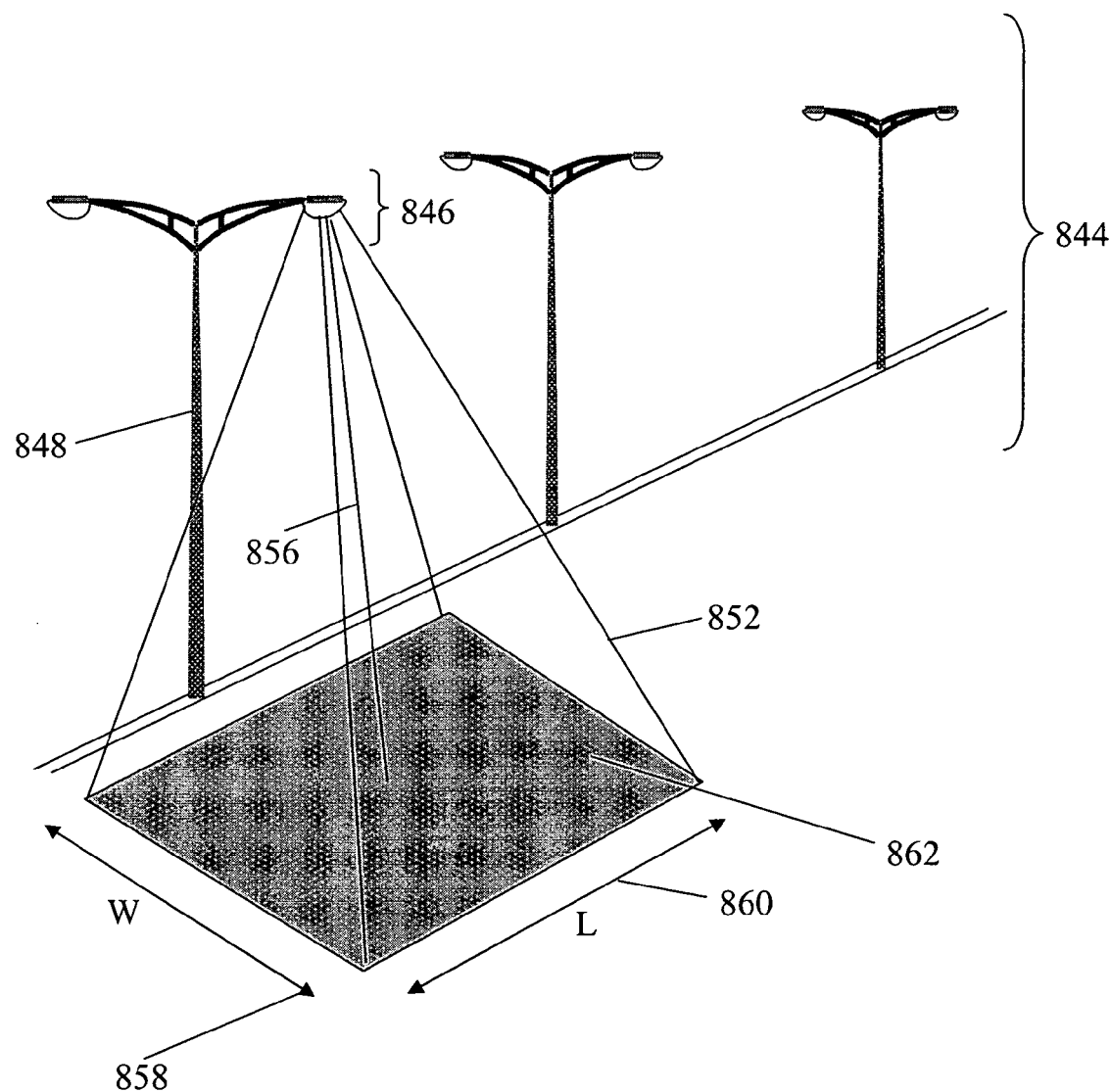
FIG. 40A schematically illustrates in perspective view the use of an angle-limited light source in a roadway lighting application.
Figure 40B:
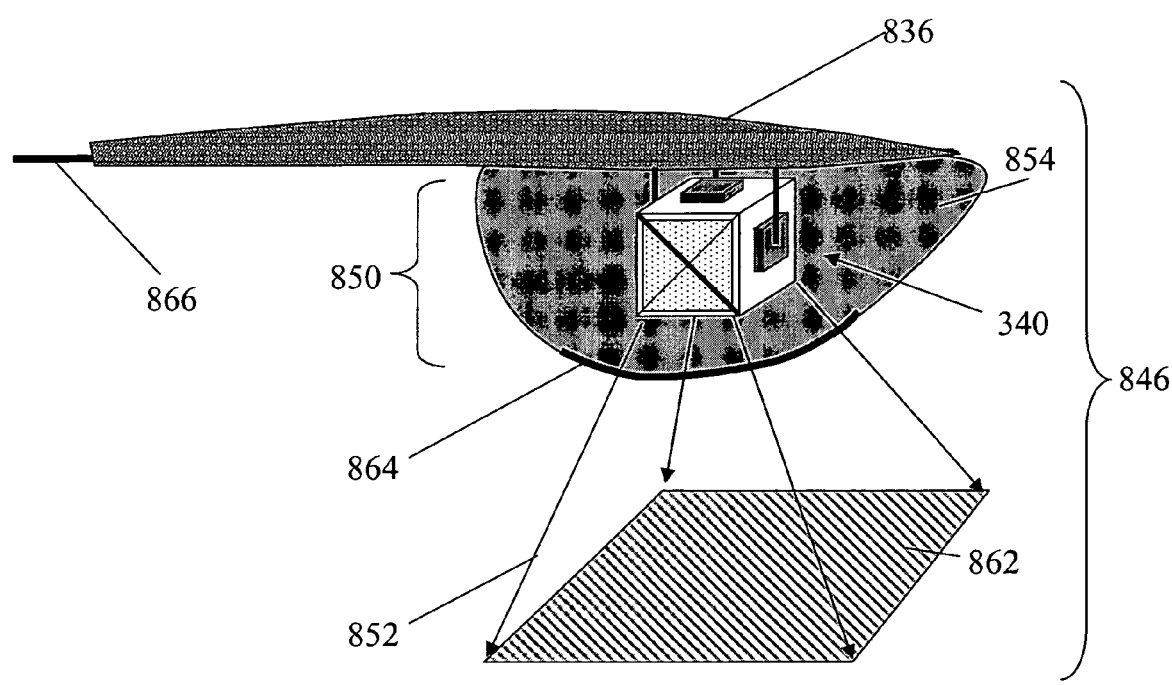
FIG. 40B illustrates a perspective view of a roadway lighting luminaire using the angle-limited color mixed light source panel elements of FIGS. 38A–B and 39A–B.

Yet another direct lighting application of light source cube 340 is as an alternative light source system 846 for outdoor luminaires, as represented schematically in the illustrative roadway lighting example of FIG. 40A (conccept) ad FIG. 40B (schematic). A wide variety of similar outdoor lighting applications for area luminaires, parking luminaires, architectural luminaires, as a few examples, follow the same approach. Standard incandescent or halogen lamps are replaceable with one or more light source cubes 340 in compatible lighting units 846 of FIGS. 40A–B that sit atop roadside or area lighting utility poles 848. System 846 shows a single light source cube 340, but in applications requiring larger number of lumens than can be generated by any single light source cube 340, arrays 828 of light source cubes 340, as were introduced in FIG. 39B, can be installed. While the actual luminaire 850 can be made significantly more compact than the one shown in FIG. 40B with lens 864, lens cover or diffuser 854, support 836, light source cube 340 and electrical control connection wires 866, the example of 846 is made to resemble one popular housing shape (cobra) of present roadway lighting usage. A major performance difference between general lighting system 844 represented in FIG. 40A and conventional designs is that the roadway illuminating beam 852 from any luminaire 850 is directed generally downwards and toward the roadway (or area) to be illuminated within the specific angular cone of $+/-\beta$ (e.g., $+/-22.5$ degrees) of light source cube (or cubes) 340. The advantage of such directed (spot) lighting is that fewer lumens (and watts) are required to provide the roadway (or area) brightness required, and much fewer lumens are wasted lighting areas falling significantly outside the illumination field of interest. While this cone 852 can be enlarged (or contracted) by supplemental luminaire optics 854 and 864, which may be a lens, a diffuser, or both, the pure output beam from light source cube 340 itself may provide sufficient ground coverage due to its height 856 above the ground, as shown in FIG. 40A. If a single light source cube 340 using constituent red, green and blue light source panels having square cross-sections were used, the cube's square illumination footprint 862 on the roadway would contain substantially all lumens generated. For example, the approximately +/-22.5 degree output beam from light source cube 340, elevated a height 856 above the area to be illuminated, deposits substantially all its generated lumens within a 25 foot by 25 foot footprint. Widening illumination cone 856 to +/-40 degrees using a secondary lens or diffuser spreads footprint to 50 feet by 50 feet.

Many roadway and area luminaires in use today flood very large areas purposely with general lighting as a means of enhancing personal security and as a way to provide a facsimile of daylight conditions. The cost of doing so in lighting applications that don't require such massive area coverage is that large amounts of energy is wasted, and large amounts of unused light contaminate the nighttime sky, an annoyance to night sky viewing is some areas of the country know as light pollution.

As one example of this illumination wastage consider one commercial 250-watt metal halide luminaire that generates 23,000 lumens. Photometric data provided by the manufacturer (McGraw Edison) indicates that for a 30 foot mounting height, 1.4 foot-candles of light are delivered within approximately a 30-foot square area beneath the luminaire. Since a foot-candle is the number of lumens deposited per square feet, this means only 1,260 lumens of the 23,000 generated are being utilized in the 900 square foot area directly under the luminaire, an efficiency of less than 6%.

One virtue of flooding a specifically limited target area is that very little wasted light is directed into the higher angle field of view of the on coming roadway traffic, thereby potentially increasing automotive safety. Current luminaires shaped in the form of lens cover 854 deliver light from the lens's entire surface, a large portion of which on occasion interferes with driver visibility, especially during rainy, snowy or foggy weather conditions where light scattering can diffuse this high angle light and actually decrease roadway visibility.

As in the case of using light source cube 340 in automotive head lighting, the illuminating color (and brightness) can be adjusted for optimum visibility as a function of weather conditions if desired. Instead of only having only the fixed white illumination color (temperature) of conventional light do lighting elements using conventional light bulbs, used as the basic lighting element, light source cube 340 could be controlled electronically to provide the needed lumens and a color matched to the weather conditions via the microprocessor control system of FIG. 38B or 39B. In this case, each roadway lighting unit could contain its own local photo detector and microprocessor, or the settings for all lights in a region could be controlled remotely. And, when using multiple light source cubes 340 within the same luminaire, a central cube can be used to flood a specific target area under the luminaire, as in FIG. 40A, but satellite cubes can be tilted away from the central cube to increase the size of the area illuminated. In such designs, the satellite cubes can be turned off in weather conditions where their light actually reduces driver safety.

AM. General Lighting Example 4: Color-Mixed Traffic Signals (FIGS. 41A–C)

Figure 41A:
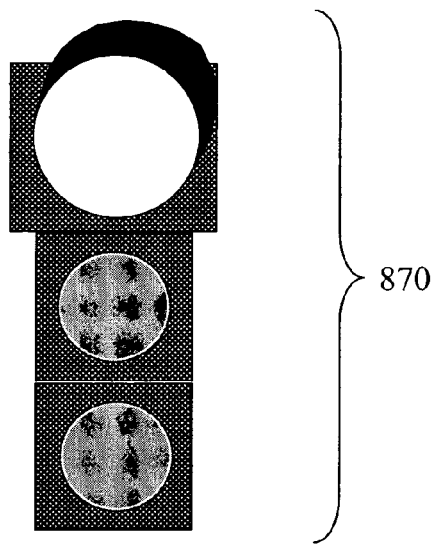
FIG. 41A shows the front view of a symbolic three-color traffic signal system.
Figure 41B:
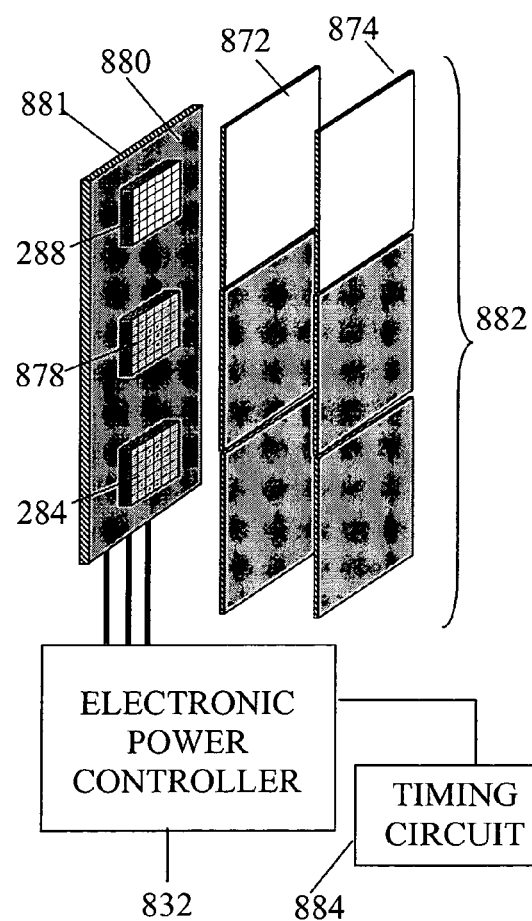
FIG. 41B shows a perspective view of three adjacent single-colored light source panels, one red, one amber, and one green, on a common mounting board controlled by an electronic power supply and timing circuit, along with individual lens elements and diffusers.
Figure 41C:
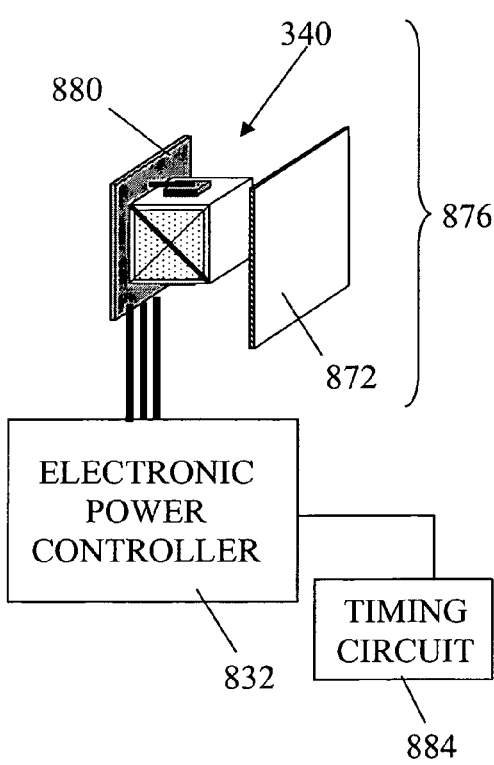
FIG. 41C shows a perspective view of a single color mixed set of single color light source panels, one red, one green and one blue, controlled by an electronic power supply and timing circuit, along with a lens/diffuser element, whose single composite output beam is applied for the purpose of traffic signaling.

Still another direct lighting application of light source cube 340 is as a compact light source for use in traffic lights, illustrated generally in the concept symbol of FIG. 41A and the specific schematic perspectives of FIGS. 41B–C. One light source cube 340 and one or more lens 872 and/or diffuser elements 874 can be used in a slim package to replace the standard bulky three-light red, amber, green light bulb and colored lens systems 870 (FIG. 41A) in common usage around the world. While three lamp systems have become standard, they are bulky, and their need for periodic light bulb replacements creates both maintenance difficulty and nuisance. Alternative structures using a single long-lived multi-colored light source cube element 340 or equivalent (as in FIG. 41C) maximizes convenience and compactness, while completely eliminating a dangerous optical effect known as sun alias, a phenomenon of late afternoon lighting caused by direct sunlight reflecting inside the reflective housings of conventional traffic signals in their off state. These sunlight reflections are at times strong enough that the signal appears on, confusing on coming traffic and creating the potential for dangerous intersection collisions. Use of a single signal element as in 876 of FIG. 41C, however efficient, eliminates the spatial separation between the separate lighting signal units in 870, which may help color blind daytime motorists distinguish which signal is activated. For traffic control systems requiring discrete spatial separation between red, green and yellow signals such as shown in FIG. 41A, light source panels 284 (green) and 288 (red) can be used, along with 878 (amber), mounted on a common interconnect board 880, along with dedicated lenses 872 and diffusers 874, as in detail 882 in FIG. 41B. Whether arranged separately or about a single light source cube, power is supplied to each mono-color light source panel by power controller 832 triggered by the standard traffic light timing circuit 884 as in both FIGS. 41B–C.

General Lighting examples can make use of color mixing with improved compactness. The compactness of light source cube 340 depends on the geometry of the light source panels, and to some extent, on their angular output characteristics. A most general geometric relationship exists between the edge size X of light source cube 340 in any given system application using cube 340 and the total number of red+green+blue lumens, $L_{TOT}$, needed within the cube's output light beam when all LEDs in the constituent light source panel arrays are operated at (or near) their maximum allowable power. This general relationship assumes that the full output beam from each light source panel exists from the cube's output aperture without interference by reflection from any other outside cube surface. The relationship also depends quantitatively on whether the output beam is limited by a down stream etendue constraint such as exists when using this beam to illuminate the spatially and angularly constrained apertures of LCD or DMD spatial light modulators in the above image projection system examples. There are many equally important lighting applications such as those of FIGS. 38A–41C, where the lighting systems impose no such constraint and use beams of particular rectangular cross-section (a by b) with edge angles β. For these unconstrained cases, the edge size, X, of light source cube 340 in the plane perpendicular to its dichroic-coated reflecting planes, is given in equation 28 and 29 below, an alternative form of equation 13. The corresponding light source panel edge, $u_x$, is given in equation 30 in terms of square illuminating pixel size Δ, desired rectangular output beam aspect ratio descriptors a (along the x axis) and b (along the y axis), the number of output lumens yielded per illuminating pixel $L_r$, $L_g$, and $L_b$ (with $L_{pt}=L_r+L_g+L_b$). When there is a system-level etendue constraint on $u_x$, the constrained value of $u_x$ is substituted for the value determined by equation 30. The out-of-plane thickness of cube 340 is determined by applying these same equations to the smaller light source panel dimension, $u_y$, as in equation 31, with the distinction that equation 28 is used only in the dimensions of side view 774 in FIG. 37B and that $X''=u_t+z$ in top view 776, with $u_t$ made the light source dimension $u_x$ or $u_y$ as appropriate.

$$X = u_x \frac{(1+z)}{(1-z^2)} \quad (28)$$

$$z = 2\tan\beta \quad (29)$$

$$u_x = \frac{\Delta\sqrt{ab}}{b}\sqrt{\frac{L_{TOT}}{L_{pt}}} \quad (30)$$

$$u_y = \frac{\Delta\sqrt{ab}}{a}\sqrt{\frac{L_{TOT}}{L_{pt}}} \quad (31)$$

As one of many possible examples of cube sizing equations 28–31, consider the light source cube size needed to supply 2000 lumens in a square beam (a=b=1). Suppose that the basic illuminating pixel is also square and 1.5 mm on a side, 10 lumens are yielded per illuminating pixel (whether red, green or blue) and that the beam angle β along each edge is +/−22.5 degrees in air (14.8 degrees in the cube) as in all above examples. From equation 30, $u_x$ is 12.25 mm. Then from equations 28 and 29, X is 26 mm, and the complete cube is 26 mm×26 mm×26 mm. If, as another example, the same output beam's aspect ratio were 2:1, which might be more of interest in automotive head lighting applications where beam sweep across the roadway to be illuminated is preferably wider than beam sweep between the roadway and sky, $u_x$ becomes 17.32 mm, and the complete cube, 36.77 mm×18.38 mm×18.38 mm.

Figure 42A:
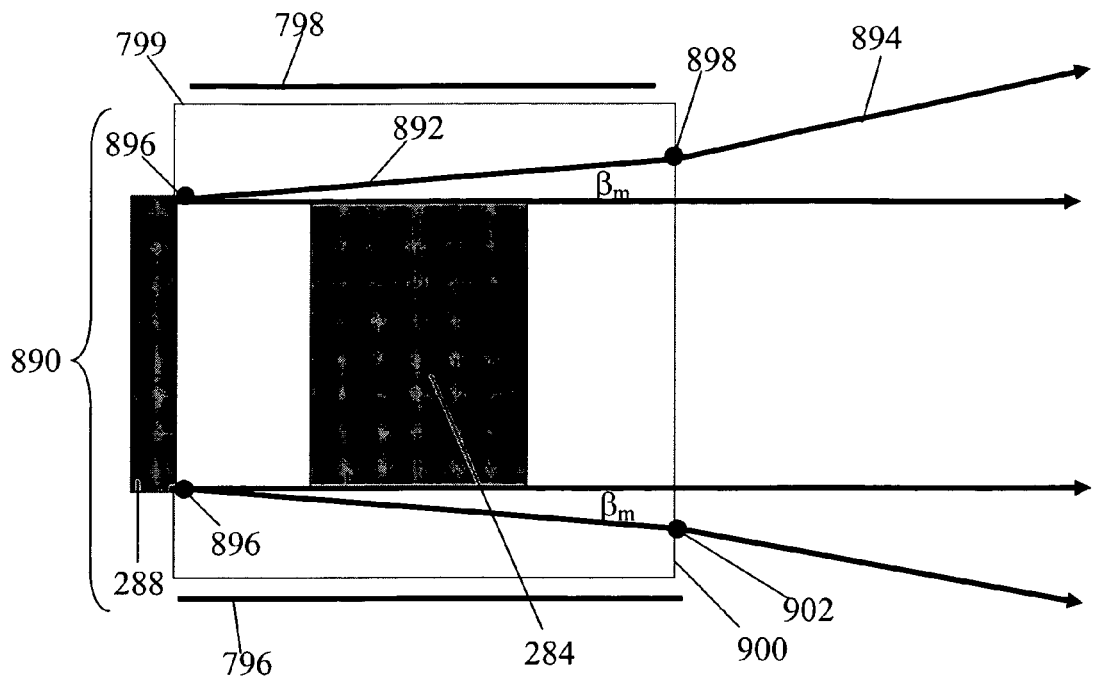
FIG. 42A is the top view of a more efficient variation on the three single-colored light source panels integrated with the color mixing system shown in FIGS. 37A–C.

Yet, cube-sizing equations 28–31 represent a general case, and do not identify the most compact cube sizing possible. Equations 28–31, relate to a dichroic cube 274 that is always made larger than the constituent light source panels 284, 286 and 288 used, so as to avoid reflective interference of non-axial light rays. Illustrative side 774 and top 776 views of light source cube 340 were shown schematically in FIG. 37B and FIG. 37C respectively. Top-view 776 of FIG. 37C is enlarged as 890 in FIG. 42A showing adjacent light source panels 288 and 284, as well as the cube's optional sidewall reflectors 798 and 796. Extreme angle light ray 892 leaves light source panel 288 at point 896 at angle β that immediately becomes $β_m$ inside the cube medium. When this ray reaches output cube face 900 at point 898 it continues outwards as output ray 894 at angle β. The cube dimension clearing ray 898 is then the distance between points 989 and 902, which as above is $X''=u_t+z$.

Figure 42B:
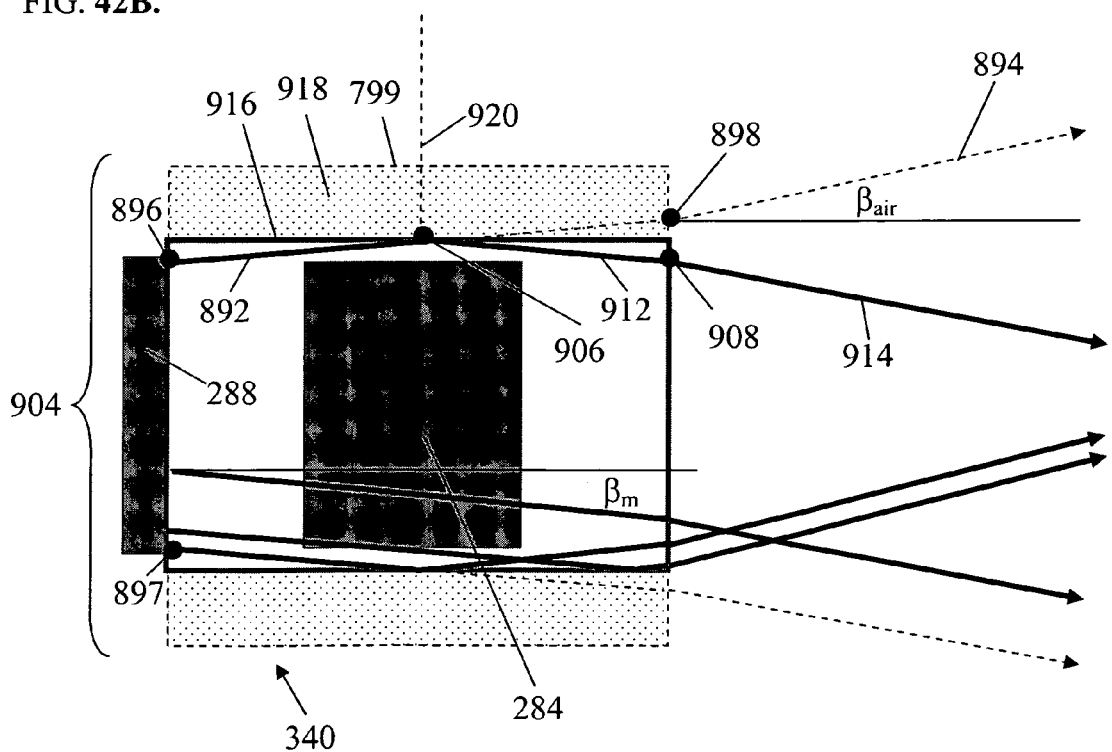
FIG. 42B is the top view of the color mixing system shown in FIG. 42A, including one means of prism truncation.

A means for increasing cube compactness is shown immediately below in top view detail 904 of FIG. 42B, which in the limit reduces cube size to just that of the light source panel aperture length. In top view 904, cube edge 799 is truncated along line 916 thereby forming new cube edge face 916. The dotted region 918 represents the cube medium removed in doing so. With this for shortening of cube 340 ray 892 leaving point 896 at angle $β_m$ strikes for shortened cube edge 916 at point 906 making an angle $β_m$ with the face plane. When for one example, effective output light from source panel 288 is +/−22.5 degrees, $β_m$ is 14.8 degrees, and the corresponding angle with face normal 920 is 90-bm or 75.2 degrees, which is almost twice the critical angle. Consequently, incoming ray 892 cannot escape by refraction at point 906 and is total internally reflected as reflected ray 912, as if from a near perfect mirror, in FIG. 42B. Reflected ray 912 is the mirror of original transmitting ray 892 but makes angle $-β_m$ with cube face 916 and is directed out the cube's output face 900 at point 908. Since this truncation is performed on both sides, any change in the flux density occurs on both sides of the output beam in this top view perspective and actually restores the beam's original flux density to the one it had at across the light source panel aperture edge between points 896 and 897 by folding the edge rays inwards.

Figure 43A:
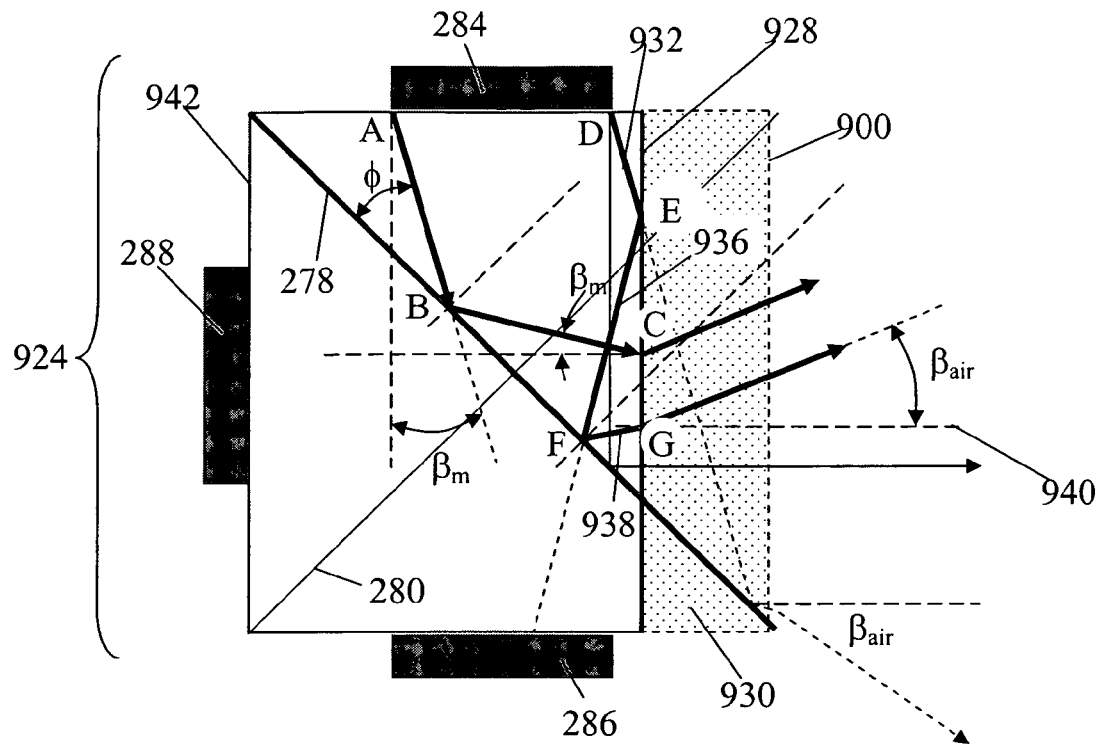
FIG. 43A is a side view of the color mixing system shown in FIG. 42B, including a second means of prism truncation.

The same means of cube size reduction is applied in details 924 and 926 (of FIG. 43A and FIG. 43B respectively), to the cube's side view perspective 774 shown originally in FIG. 37B. Detail 924 in FIG. 43A shows a truncation applied to the cube's original output face 900, for-shortening it to plane 928 including points E, C and G. Once again, the dotted portion 930 represents the cube medium removed in doing so. In this instance, illustrative ray 932 leaves point D on green mono-colored light source panel 284 and enters the cube medium at angle $\beta_m$ to cube face surface normal 934. Ray 932 travels along line D–E a short distance until reaching face point E at angle $\beta_m$ to the face surface. As above, this angle significantly exceeds the critical angle for total internal reflection in the medium. Accordingly, ray 932 does not refract at point E as an output ray and is reflected to point F on dichroic reflecting face 278. Since dichroic reflecting layer 278 is an efficient reflector of green light, ray 936 is reflected at F towards point G on output face 900 as ray 938. Ray 938 makes angle $\beta_m$ with output face normal 940, and as such, refracts into air at point G with angle $\beta_{air}$. The same behavior applies to rays emitted from symmetrically disposed blue light source panel 286, except these rays reflect from dichroic reflecting layer 280 rather than 278 which is transparent to them.

Figure 43B:
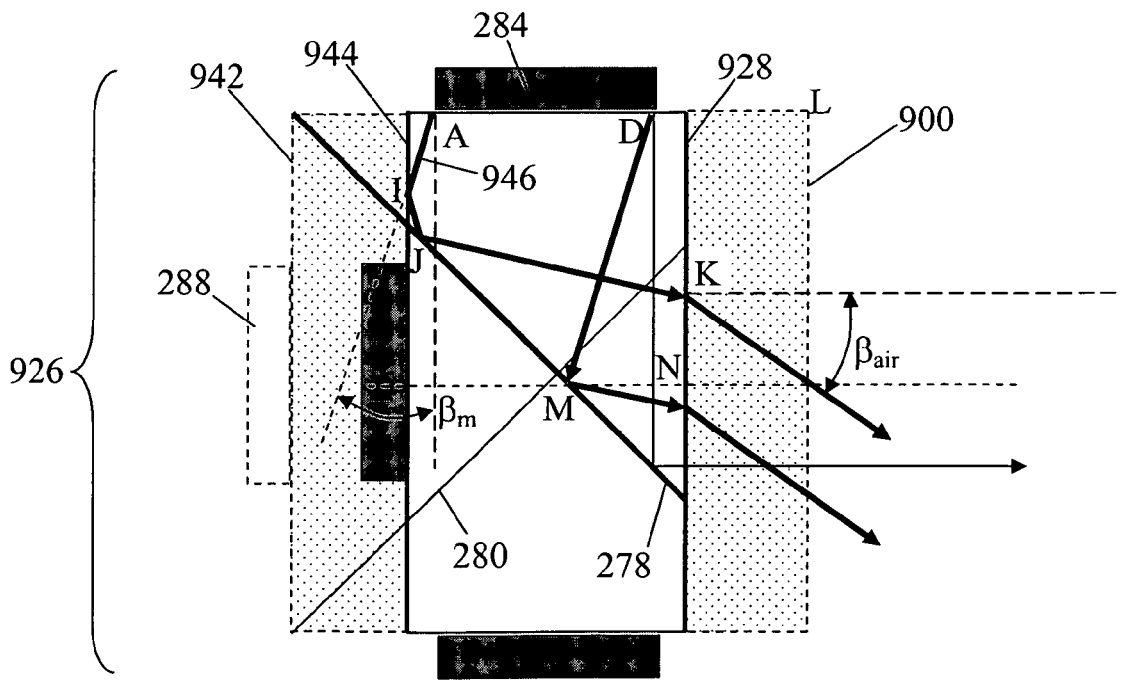
FIG. 43B is a side view of the color mixing system shown in FIG. 42B, including a third means of prism truncation.

Detail 926 in FIG. 43B shows the compacting effect of performing a second truncation to cube face 942 on which light source panel 288 is mounted. For-shortening cube face 942 to plane 944 and re-locating light source panel 288 from 942 to 944 has an equally beneficial effect to the one above, as illustrated by ray path H-I-J-K through the cube medium. Extreme ray 946 leaving light source panel 284 at point H ordinarily would have exited cube face 900 at point L, follows alternative path H-I-J-K and exits truncated cube face 928 at point K at an output angle from flipped in sign (direction) from $+\beta_m$ to $-\beta_m$ just as was the case with ray 932 in detail 924. The effect of such a redistribution on spatial an angular uniformity across the output face 928 aperture is symmetrical and beneficial in that it concentrates the output flux to an output beam aperture that approaches that of the original aperture of each light source panel.

Figure 44A:
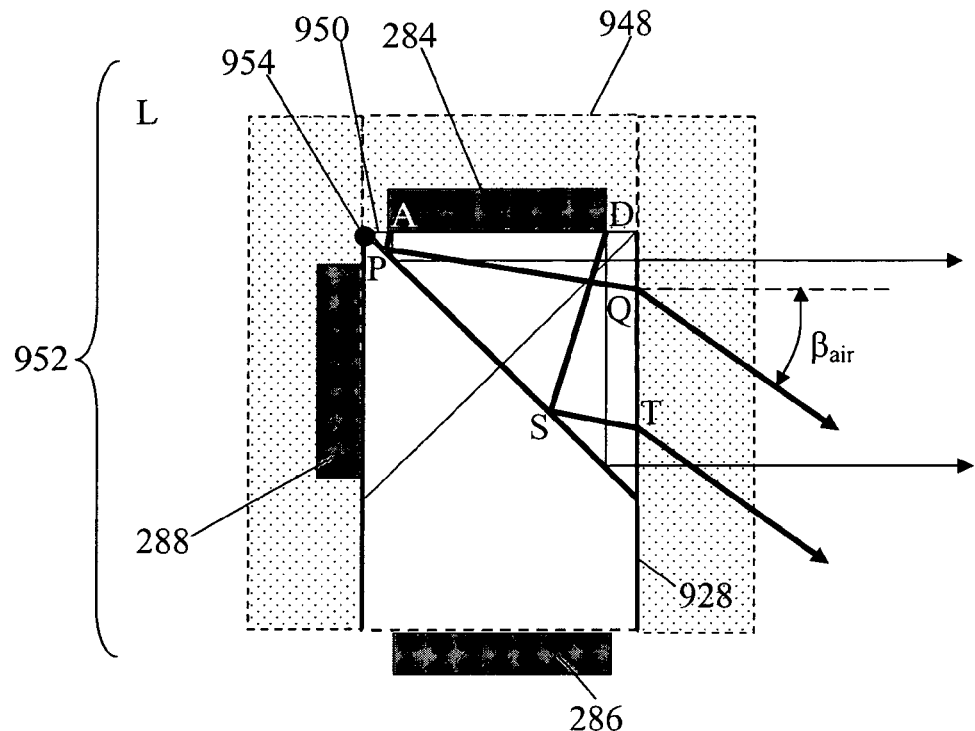
FIG. 44A is a side view of the color mixing system shown in FIG. 42B, including a fourth means of prism truncation.
Figure 44B:
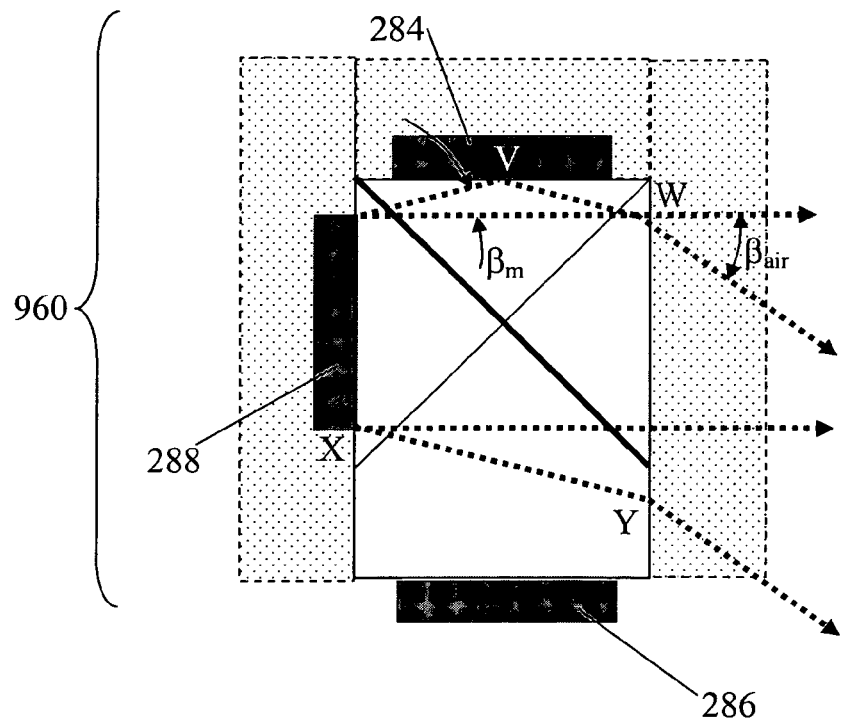
FIG. 44B is a side view of the color mixing system shown in FIG. 42B, including a fifth means of prism truncation

Still another useful truncation to cube 340 is illustrated in FIGS. 44A–B, for-shortening cube face 948 to plane of 950 and relocating light source panel 284 as shown. This improvement, first illustrated in detail 952 in FIG. 44A brings light source panels 284 and 288 into closer proximity at truncated cube corner point 954. The effect of doing so further consolidates the flux distribution of effected rays on truncated output cube face 928. Illustrative ray paths A-P-Q and D-S-T fall as expected between aperture ray lines 956 and 958 on output face 928. Detail 960 in FIG. 44B shows two illustrative extreme ray paths for light source panel 288. Ray path X-Y occurs in the final region of the original light source cube 340 left to be truncated.

Figure 45A:
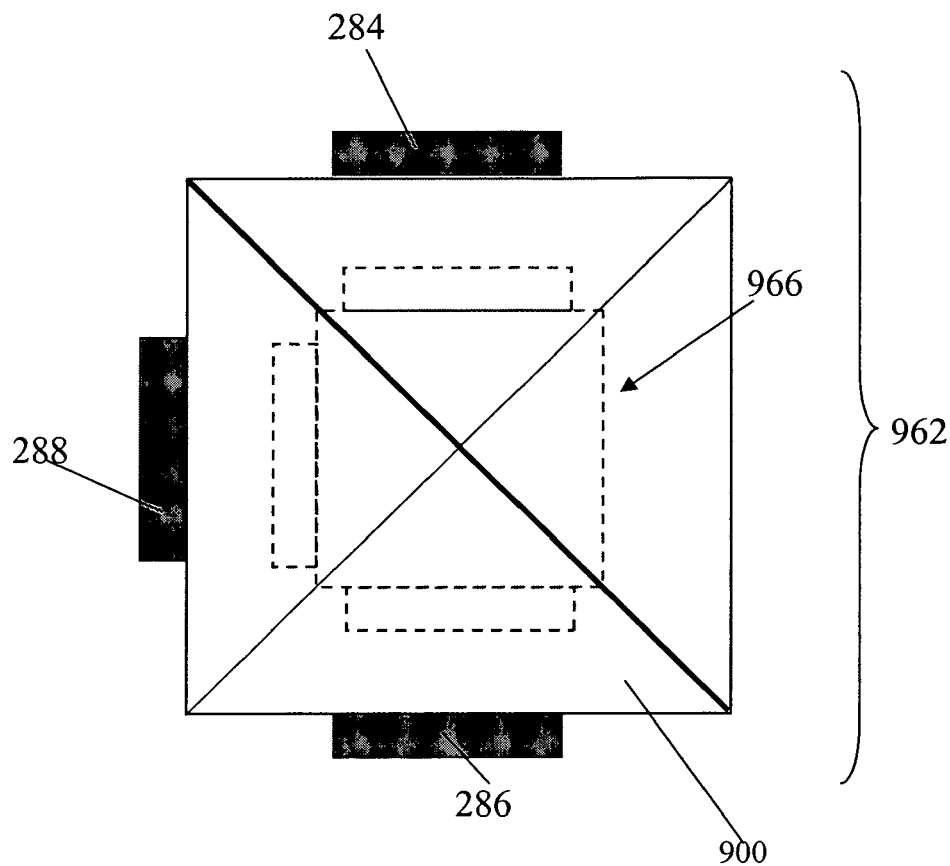
FIG. 45A is a side view of the color mixing system shown in FIG. 42B, including a sixth and final means of truncation, the entire 6-step truncation shown as dotted lines within the original full-size boundaries.
Figure 45B:
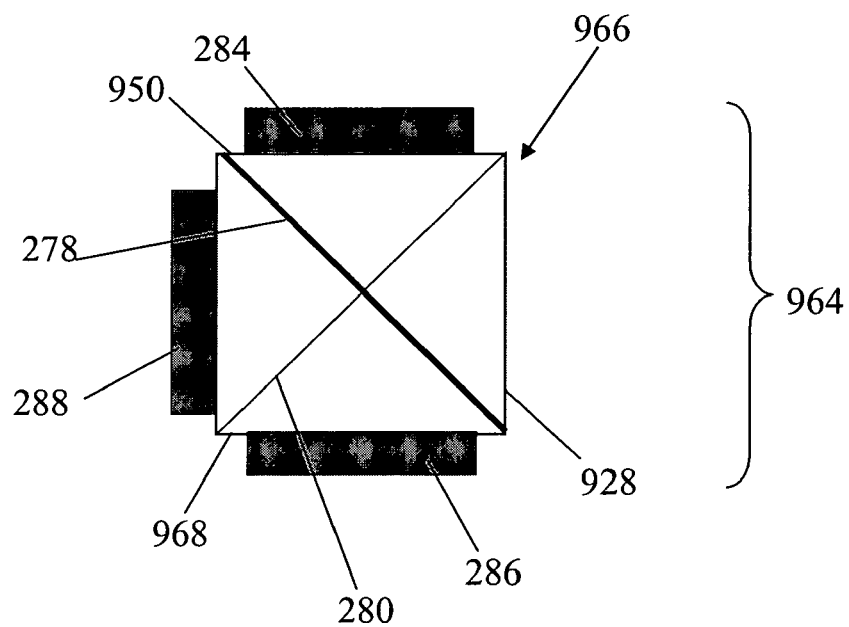
FIG. 45B shows the fully-truncated side view of the miniaturized color mixing system previously illustrated by dotted lines in FIG. 45B.

This final truncation of light source cube 340 is shown in detail 964 of FIGS. 45A–B. A size comparison between the fully truncated version 966, of light source cube 340 in FIG. 45B, and the originally over-sized version 340 is shown in detail 962 of FIG. 45A. The maximum size improvement from the cube's side view perspective is found from equation 20 as the factor $(1+z)/(1-z^2)$ where $z=2 \tan \beta$. When $\beta$ is 14.8 degrees in the cube medium, the potential improvement factor becomes 2.12, which means that a cube ordinarily 2.12 times the edge size $u_i$ of the light source panels becomes about $u_i$. From the perspective of cube area, the fully truncated cube is reduced in size by a factor of 4.

In lighting applications requiring fewer total output beam lumens than those generated with the smallest practical illuminating pixel size D, the smallest permissible LED chip sizes LL (236 as in FIG. 14) and the maximum allowable electrical power per constituent light emitting diode, any one or all of the following measures can be taken to set the lower level needed: the electrical power applied can be reduced (dimming), the illuminating pixel size can be increased, and/or the LED chip size can be reduced.

AN. General Lighting Example 5: Multi-Colored Light Bars in LCD Backlighting (FIGS. 46A–C–FIGS. 50A–C)

Light source cubes 340 (or 966) and light source panels 970 (284, 286, or 288) can be combined advantageously with clear plastic light pipes to provide high lumen illuminators for a wide variety of efficient LCD backlights.

Long, small diameter cold cathode fluorescent tubes (CCFTs) are the light source of choice in most of today LCD backlights. One or more of these tubes are coupled into one or more edge of a thin, rectangular light distribution system placed behind the LCD screen to be backlit. White light is emitted from the entire surface of the CCFT into every angular direction. A reflector is used to direct this light into the light distribution system, typical a clear plastic plate.

Some approaches proposed for replacing fluorescent tubes with an array of LEDs would arrange the LEDs (either in RGB triads or as the new white LEDs) along a rectangular bar the same length and width of the edge entrance to the backlight's plastic plate, letting the light distribution system provide the needed color mixing and brightness homogenization. Since the entrance edges to any given backlight plate is fixed in area, there is a limit to the number of LEDs that can be so distributed.

Some current 18.1" LCD backlights use two CCFTs along the top edge and two CCFTs along the bottom edge of a 10 mm thick light distribution plate in order to generate LCD screen brightness in excess of 200 Nits (61.6 FL). As it is preferable to dispense this brightness over all viewing angles, the total number of lumens that must flow through the LCD to do this is 1340. Then, compensating for losses in the light distribution system, between 1500 and 2000 lumens need be provided as input light. With 1 mm×1 mm white LEDs delivering 10 lumens apiece, 200 such emitters could be arranged along the backlight's 367.8 mm edge in some distribution where they would be more than about 1 mm apart. With 3 mm×3 mm RGB LED triads, each potentially yielding 60 RGB lumens, only 33 such units would be needed. Since 122 such units could be arranged in a line along the 367.8 mm edge, each triad unit would then have to be on 11 mm centers. In either case the input light would be far from uniformly mixed and have a point-lie character, which is not desirable.

The alternative to this offered by the present invention is a means for coupling the LED's lumens into a long plastic rod, which disperses and mixes them, using the rod as a means of coupling to the same backlight plate's entrance edge.

Figure 46A:
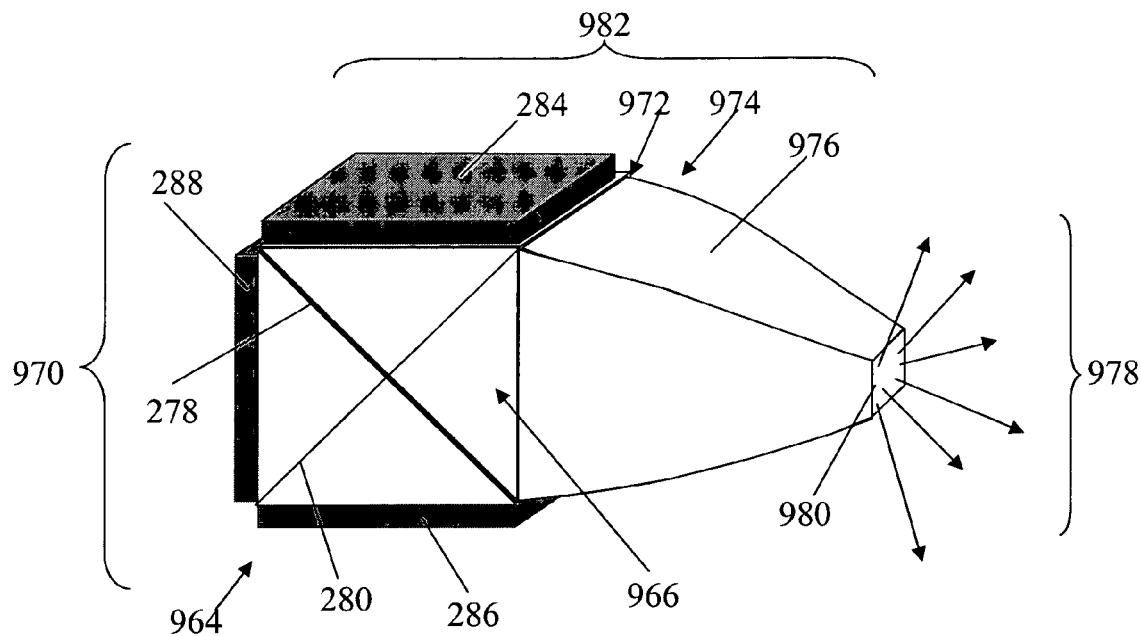
FIG. 46A is a perspective view of the integration of the three-color panel mixing system of FIG. 45B with a non-imaging angle transformer element emitting a color-mixed beam of light.

The basic means of light source panel coupling is illustrated schematically in FIG. 46A where the $+/-\beta$ light source output beam couples directly to an angle transformer arranged to expand (rather than contract) the system's output angle to substantially +/−90 degrees in air. While such angle expansion can be performed using a traditional condenser lens (spherical, aspheric or Fresnel) applied to or near the output face of the associated light source cube or adjacent to the output aperture of the associated light source panel, the ideal non-imaging angle transformer as described above in FIGS. 8A–C with regard to sidewall shape 135 and with regard to angle reduction as in the system of FIG. 35A may be preferable in many of the backlighting applications to follow. Not only does the non-imaging concentrator perform with highest possible transformation efficiency, its physical shape and form simplifies the alignment needed for efficient input and output optical coupling. One example of this particular angle conversion sub-system is shown schematically as 970 in FIG. 46A wherein fully-truncated light source cube 966 is combined with tri-color light source panels 284, 286 and 288 as in all the examples above, and mated, as one example, to the large aperture 972 of a non-imaging angle transformer 974 of square (or rectangular) cross-section. Output light from the light source cube section 964 immediately becomes input lighting within aperture 972, and then by efficient reflections from sidewall boundaries 976, output lighting 978 from transformer 974's output aperture 980. The design of transformer 974 is such that output light 978 is substantially +/−90 degrees into air. Alternative embodiment of this sub-system, 984, combines transformer 974 with a single light source panel 976 that may be one of the mono-color elements 284, 286 or 288 as in FIG. 46B or it may be a light source panel whose constituent illuminating pixels each contain triads of red, green and blue LEDs, as shown illustratively in FIG. 46C.

Figure 46B:
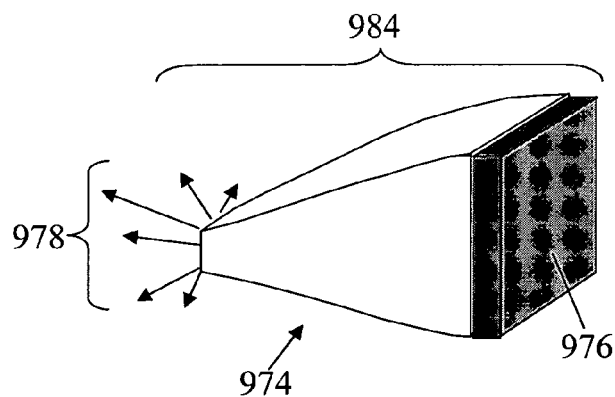
FIG. 46B is a perspective view of the integration of a single-color light source panel with a non-imaging angle transformer element emitting a color-mixed beam of light.
Figure 46C:
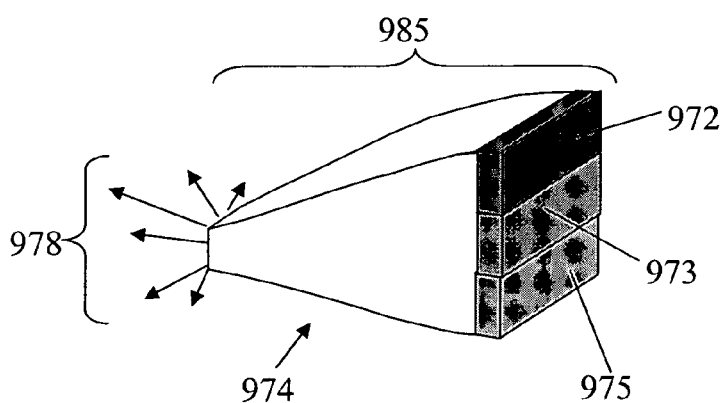
FIG. 46C is a perspective view of the integration of three single-color light source panels with a non-imaging angle transformer element emitting a color-mixed beam of light.
Figure 47A:
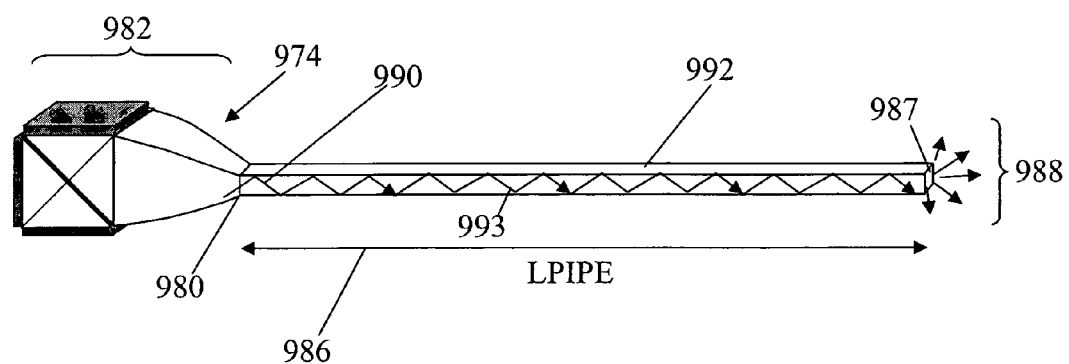
FIG. 47A is a perspective view of a lighting system that couples the illumination system of FIG. 46A to a long clear light-pipe element showing the total internal reflections of light within the pipe.

One beneficial use of the wide-angle light source systems of FIGS. 46A–C is as the source of light for a backlighting illumination system. For this purpose, an extension element, 992 in FIG. 47A, is required to distribute output light 978 FIGS. 46A–C within the context of backlighting, as in backlighting an LCD screen, a photographic transparency or an appliqué. This element is a transparent lightpipe illuminator 992 of length LPIPE 986 matched and attached to the transformer's output aperture 980, as shown schematically in FIG. 47A. Lightpipe illuminator 992 is any transparent, low optical loss material, including glass, acrylic, and polycarbonate as a few of the possible examples. Output light 978 as in FIGS. 46A–C enters lightpipe illuminator 992 and is trapped by the total internal reflections 993 illustrated in FIG. 47A, eventually escaping lightpipe 992 with minimum loss through its end face 987 as output rays 988. In order to facilitate reasonably uniform escape of the trapped light from lightpipe 992 through the long bounding faces running along the lightpipe length, surface scattering elements 998 are added along one or more of long faces 994 (or within the lightpipe volume) in the manner that has become commonplace in the so-called dot-pattern backlight plates used in the backlighting of almost all flat panel LCD screens. The escape mechanism is illustrated in magnified detail 996 in FIG. 47B by total internally reflecting ray 1000 which encounters scattering element 998 on face 994 at point A, whereupon the ray is scattered backwards in approximately a Lambertian distribution of rays 1002, with only a small energy fraction remaining in the specularly reflected ray 1004. All rays 1002, whose angles fall within about +/−42 degrees from any lightpipe face surface normal are refracted outwards by Snell's Law into the air (or medium) surrounding lightpipe illuminator 992. Light rays such as 1006 whose scattered angle with any surface normal exceeds about +/−42 degrees remains trapped by total internal reflection until encountering additional scattering elements 998 at downstream location within lightpipe 992, where new chances for scattering and escape are presented.

Figure 47B:
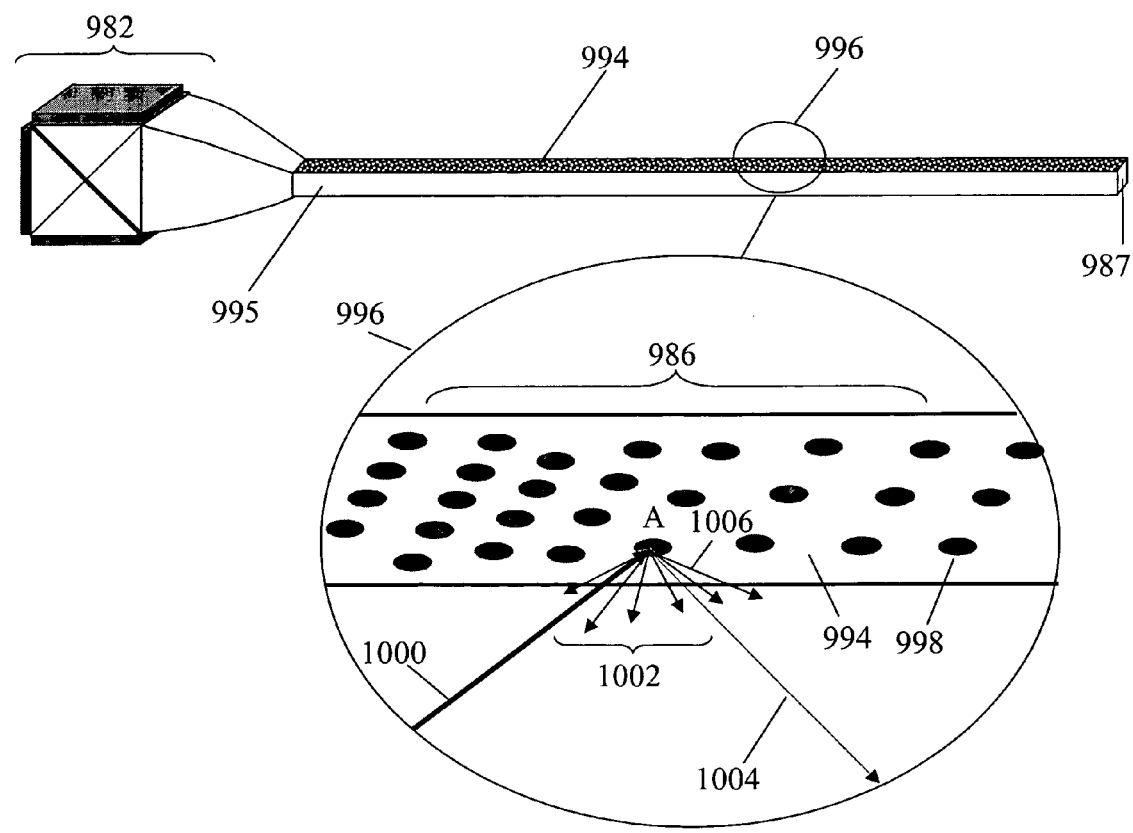
FIG. 47B is a perspective view of the lighting system of FIG. 47A showing that the long clear light-pipe element is made with light scattering dots imprinted on at least one and no more than three of its four long faces.
Figure 48:
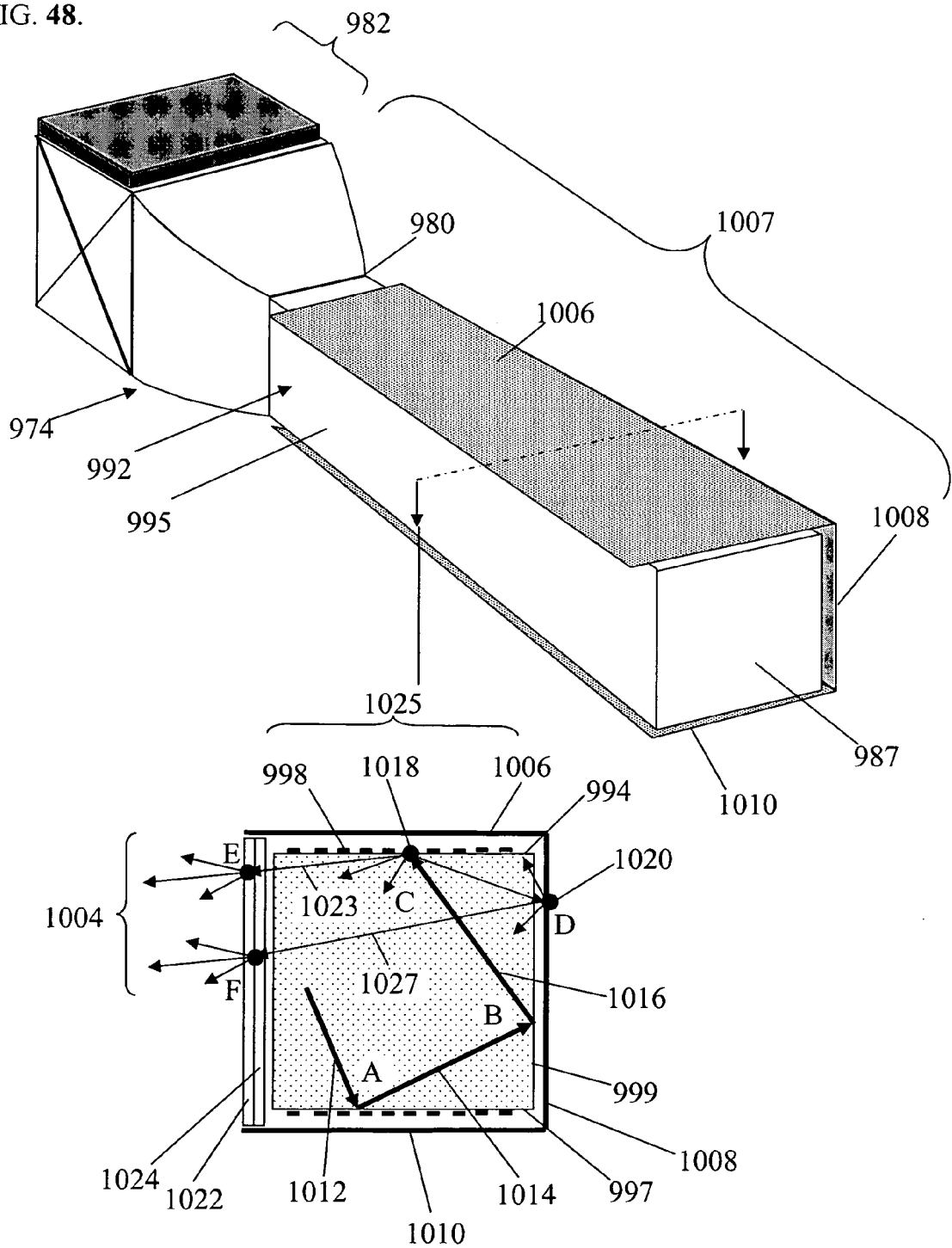
FIG. 48 is a perspective view with indicated cross-section detail of the illuminator of FIGS. 47A–B with the light-pipe surrounded by a three sided reflector so as to output light preferentially from the light-pipe's exposed output face.

If light source system 982 in FIGS. 47A–B couples substantially all its lumens into lightpipe illuminator 992, substantially all such lumens are radiated by the structure into air or the medium surrounding length 986 of lightpipe 992. As such, lightpipe illuminator 992 provides wide-angle output light in much the same light distribution, as does a fluorescent tube. Accordingly, to make best use of this widely dispersed light emission, a three-sided reflector system 1006, 1008 and 1010 is included, as is illustrated in FIG. 48, to channel light emission from three faces of lightpipe illumination element 992 through one designated lightpipe output face 995. In one possible example of this compound reflector, each element is a plane white diffusely scattering sheet that may be in close proximity to lightpipe faces 994, 997, and 999.

Density 986 (FIG. 47B) of scattering elements 998 deposited on one or more surfaces of lightpipe illuminator 992 (and optionally within the lightpipe medium itself) must be sufficient to extract substantially all light coupled into lightpipe 992 at aperture 980. When this ideal scattering cross-section is achieved, very few rays such as 988 exit lightpipe end face 987 and substantially all exit at face 995. Light extraction from lightpipe illuminator 992 occurs as it does in all prior art dot-pattern backlight plates, by the mechanisms illustrated in cross-section detail 1025 as shown in FIG. 48. Illustrative lightpipe ray 1012 makes one of many total internal reflections at point A because ray 1012 reflects as ray 1014 from bottom surface 997 bounded by air without contacting a scattering element 998. Continuing ray 1014 strikes rear lightpipe surface at point B, reflecting as ray 1016, and also avoids a scattering event. Illustrative ray 1016, however, on striking upper lightpipe surface 1001 at point C, does so on scattering element 1018, and thereupon scatters in multiple directions. Scattered ray 1023, for example, scatters into a direction eligible for escape through front face 995, which in this illustration is covered with external output layers 1022 and 1024, which may provide additional diffusive scattering (1024) and/or specular reflection as in the case of a reflective polarizer (1022). As another example, scattered ray 1020 scatters in a direction eligible for escape through face 999, but in doing so strikes back-reflector sheet 1008 at point D, and is further scattered. One of the scattered rays at point D, ray 1027, scatters in a direction eligible for escape through output face 995, near point F on first output layer 1024.

The resulting light source system of FIG. 48 is 1007, the sum of light source element sub-system 982, lightpipe 992 and reflectors 1006, 1008, and 1010, plus any output layers such as 1022 and 1024. One illustrative application 1031 of light source system 1007 is illustrated schematically in FIG. 49A, with edge face 992 brought into close proximity with the corresponding edge face of dot-pattern backlight system 1026, itself composed as in most prior art descriptions of at least one lightpipe plate 1030 (containing scattering elements in its bulk or on its lower plane surface) lower reflector sheet 1032, and upper light diffuser 1028. Exit light from face 995 of light source system 1007 is coupled efficiently into lightpipe plate 1030 as total internally reflecting rays 1029. These rays escape from backlight system 1026 by the same mechanisms described above as backlighting output rays 1033, which back illuminate the correspondingly rectangular aperture of an LCD screen or any passive appliqué, pattern or film. One higher performance variation on system 1031, 1032, is shown in FIG. 49B using two light source systems 962, one at each end of lightpipe 992.

Figure 49A:
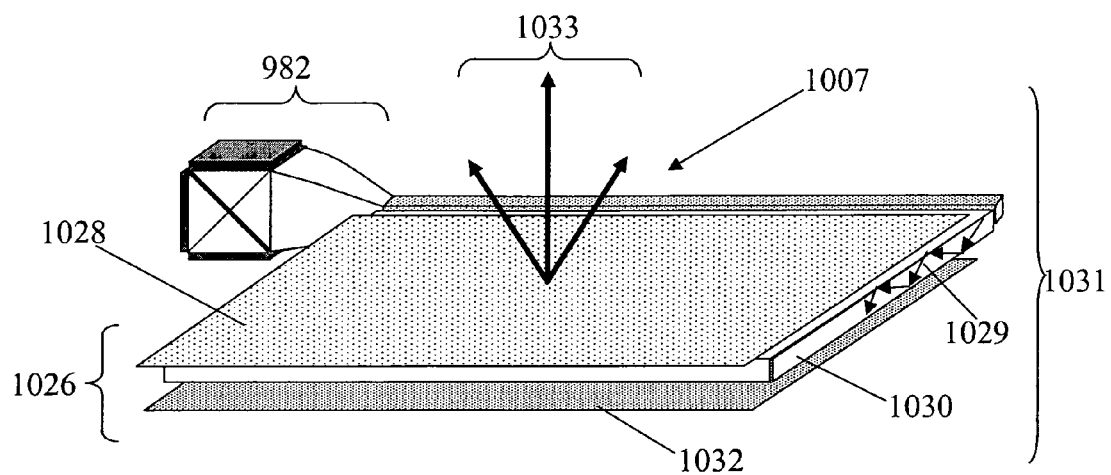
FIG. 49A is a perspective view of the illumination system of FIG. 48 used as a source of input light by an edge of a traditional dot-pattern backlight.
Figure 49B:
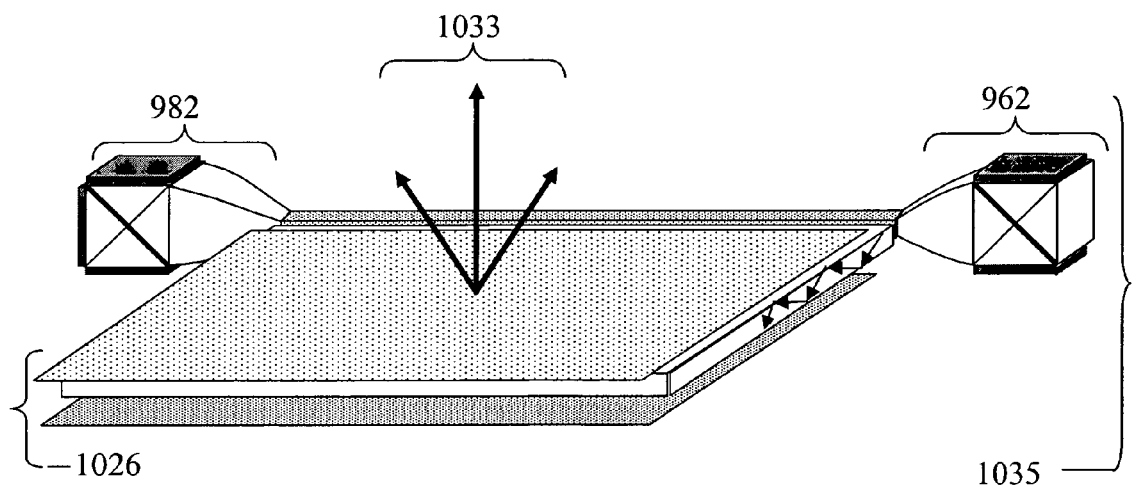
FIG. 49B is a perspective view of the illumination system of FIG. 49A using a variation on the lighting system of FIG. 47A with two rather than one of the color-mixing input systems of FIGS. 46A–C.

The systems of FIGS. 49A–B enable a very large number of lumens to be emitted through the output aperture of backlighting system 1026. Suppose as one of many possible examples, illustrative light source cube 966 (or 340) of previous examples is used in light source sub-system 982 with light source panels 284, 286 and 288 each arranged to provide 1300 lumens. The respective transmission efficiencies of dichroic combiner cube 274 and angle transforming element 974 are about 0.81 and 0.9 respectively. The respective light extraction efficiencies from lightpipe illuminator 992 and its surrounding reflectors, and from backlighting system 1026 are about 0.75 and 0.70. Hence, the total unpolarized RGB output light extracted in variation 1031 of FIG. 49A over the backlighting aperture is about 1,500 lumens. Adding polarization recycling means to layer 1022 or to the light source panels themselves, the polarized output becomes about 1,100 lumens. Then, if the backlighting system is for an 18.1" diagonal LCD screen (such as the LQ181 manufactured by Sharp), screen brightness over all angles is about 110 FL (376 Nits). Using system 1032 of FIG. 49B under the same conditions, output brightness doubles to 750 Nits.

Figure 50A:
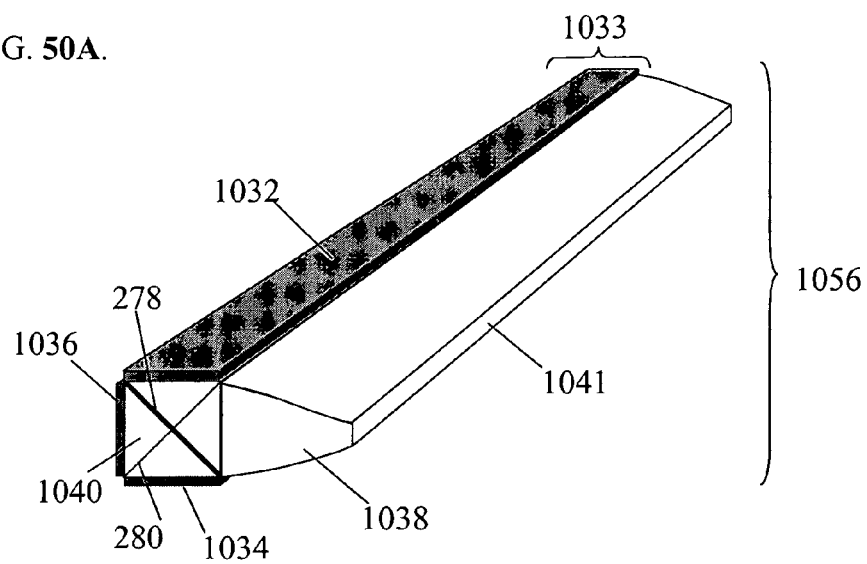
FIG. 50A is a perspective view of a linear variation on the color-mixed lighting system of FIG. 46A using the single-colored light source panels formed as bars or strips of LED elements.
Figure 50B:
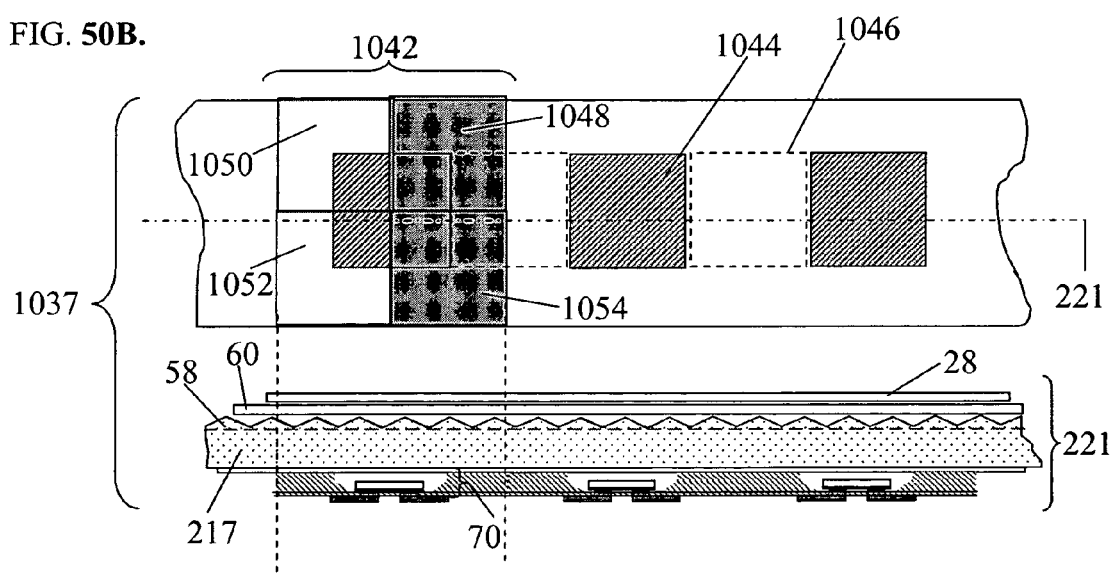
FIG. 50B is a top view of the output side of the light source bars shown in FIG. 50A along with a cross-section showing the multi-layered light source bar's internal structure.
Figure 50C:
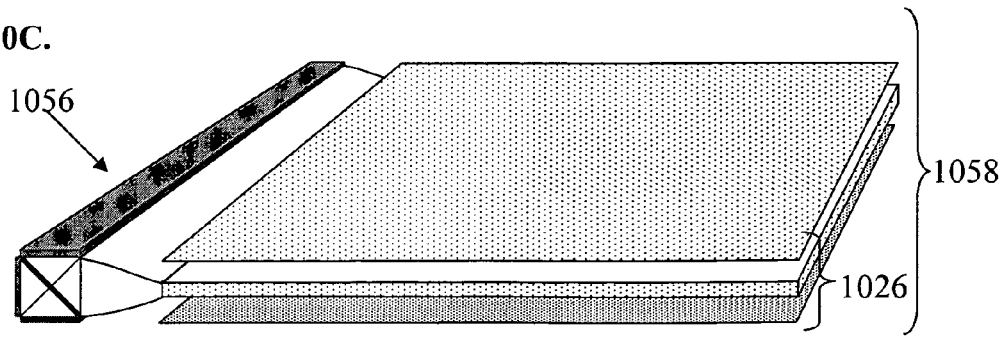
FIG. 50C is a perspective view showing the lighting system of FIG. 50A coupled to an input edge of a traditional dot pattern backlight.

A variation on the use of light source system 982 in backlighting applications is illustrated schematically in FIGS. 50A–C. In this variation, the aspect ratio or shape of the constituent light source panels is changed dramatically from the nearly square (13.5 mm×9.94 mm) implementations of panels 284, 286 and 288 to the bar-like shapes of 1032 (green), 1034 (blue) and (1036 red) shown in the schematic details of FIG. 50A. Deployed in this instance more as a light source bar, the constituent mono-color light source panels 1032, 1034, and 1036 are each composed of, for example, one row of illuminating pixels 1042, shown in FIG. 50B as the illustrative top and side views of light source bar 1036 hidden in the perspective view of FIG. 50A. In this example, pixel structure 221 of FIGS. 15A–D is used to expand the light emitted from each constituent LED 70 into the four virtual image outputs 1048, 1050, 1052 and 1054 shown in the top view 1037 of FIG. 50B that comprise each effective illuminating pixel 1042, as originally described in FIG. 4. Optical layers 58 and 60 in 221, as arranged in all earlier examples, maintain output light favorably within +/−β (e.g., +/−22.5 degrees in air). Light bars 1032, 1034 and 1036 are arranged about the adjacent sides of an elongated version of dichroic combiner cube 274, 1040, in the perspective views of FIG. 50A and FIG. 50C whose axial length has been made equal to that of the light source bars themselves. The resulting combiner bar 1033 is coupled to dielectric angle transformer 1038 whose aperture length has been extended to match the aperture length of the combiner bar, forming light bar sub-system 1056 shown by itself in FIG. 50A. Light bar sub-system 1056, and its output aperture 1041 (FIG. 50A) is coupled along one edge of backlighting system 1026, as in the complete lighting system 1058 of FIG. 50C.

The backlighting system variation of FIG. 50C provides a more compact means for distributing LEDs and their illuminating pixels than does the arrangements of FIGS. 49A–B. System 1058 of FIG. 50C disposes illuminating elements 1042 in a row along an edge of the backlighting system, while light source system 1007 of FIG. 48 concentrates its illuminating pixels in an external block (or blocks) 964.

If as one example of system 1058 in FIG. 50C, illuminating pixels 1042 are so that each constituent light source bar (1032, 1034, and 1036) contains the same number of elements (130), as did the more symmetrical light source panels (284, 286 and 288). For this to be possible, each illuminating pixel would be (375.76/130) or 2.8-mm. on each edge, which is not unreasonable. In this case, backlighting system 1058 in FIG. 50C yields about 2,100 unpolarized (1,600 polarized) RGB lumens and a resulting LCD brightness, over the full output aperture of about 155 FL (538 Nits).

Of these two backlighting examples, system 1058 in FIG. 50C is preferred over the system of 1031 of FIG. 49A on the basis of its 1.4× higher brightness per LED chip (or brightness per watt). System 1058 is also preferred because of its efficient utilization of backlight system volume. For highest lumen delivery performance applications, one light source bar 1056 as depicted alone in FIG. 50A can be deployed on each of the four edges of backlighting system 1026.

Light source sub-systems 1007 (FIG. 48) and 1056 (FIG. 50A) are used as the input light source for any standard (dot-pattern or facet-pattern) backlight (edge light), replacing the conventional fluorescent tube and its surrounding reflector, or any equivalent bar of LEDs and associated reflectors.

Merely arranging LEDs in or along a long rectangular bar, and directly coupling the wide angle light from that bar to the edge of a dot-pattern backlight system 1026 is one approach, but it involves certain fundamental design limitations and that are minimized or avoided altogether using the preferable forms of FIGS. 49–50.

Yet another potential backlighting example is presented by the small 1"–2" diagonal sized direct-view transmissive LCDs used to preview pictures taken with digital cameras. The backlight's power must be as low as possible to minimize drain on the camera's limited battery capacity. Yet, to assure high-contrast viewing in the most brightly lit of user environments, it would be desirable that the backlight be made strong enough so that the display brightness is on the order of 500 Nits, and if possible, over a full range of viewing directions. The LCD diagonal on the compact Olympus D-400 digital camera is 47 mm. The LCD's transparency to unpolarized light is about 5%, and to polarized light, about 9% (as in the above examples with Sharp's LQ181 18" diagonal LCD screen). The active display area of this much smaller display is 0.0114 ft$^2$. Using unpolarized backlighting, the preferable backlight must then provide 2 lumens from the LCD or about 20 lumens from the backlight. Suppose the 47 mm diagonal conventional dot-pattern backlight delivers to the LCD 70% of the lumens coupled into a lightpipe single edge. This in turn means that about 30 lumens must be delivered by the source of white edge light.

Since each of today's modern red, blue and green LED chips as introduced in the examples above deliver about 20 lumens apiece, it would be best to use only one LED chip of each color. If so, the three LEDs and a 50% coupling efficiency to the backlighting systems 37.6 mm input coupling edge would supply the 30 input lumens needed. Yet, with each chip approximately 0.5 mm on an edge and the coupling edge 37.5 mm in length, some mixing means must be involved to assure that the backlight system's output light 1033 is well mixed over the entire output aperture.

In principal, either light source sub-systems 1007 or 1056 (FIGS. 48–49B or FIG. 50A) provide the means for color mixing and light distribution over the 37.6 mm coupling edge. Of the two approaches, system 1007 and its backlighting implementation 1031 of FIG. 49A is used as an example. In this case, each mono-colored light source panel used in sub-system 982 consists, in one example, of a single 4 mm×4 mm illuminating pixel 1042 providing at least 10 lumens of unpolarized light to its corresponding 4 mm dichroic combiner cube. The total etendue of the combiner cube aperture (in the combiner media) is from equation 14–15 above, (16) $\text{Sin}^2$ (14.8) or about 1 mm$^2$. This suggests that the preferable size of output aperture 980 of dielectric angle transformer 974 is about 1.5 mm square, which then becomes the preferable cross-section for lightpipe illuminator 992, which is made 37.6 mm in length 986 (FIGS. 47A–B). In this example, corresponding dot-pattern lightpipe plate 1030 is made 28.2 mm by 37.6 mm by 1.5 mm. Using the same transmission efficiencies in the examples above, the backlighting system's output light 1033 contains 11.5 unpolarized RGB lumens (8.6 lumens polarized). With 9% LCD transmission of polarized lumens through the LCD this small (0.0114 ft$^2$) display panel exhibits 68 FL (or 235 Nits) of white-field image brightness. Then adding a second identical light source sub-system 982 as in backlighting system 1035 in FIG. 49B, a total of 6 LED chips can supply a viewable brightness of 470 Nits over all angles of view across the 28.2 mm by 36.7 mm display screen aperture.

AO. General Lighting Example 6: White or Color-Mixed Task/Flood Lighting (FIGS. 51A–B and FIGS. 52A–F)

Numerous other general lighting and image display applications exist for the light source panel, and the light source cube. The light source panel itself can be used as an efficient general lighting element, wherein its +/−β (illustratively in the range of +/−22.5 degree) output beam is used for lighting a specified task area, with or without with secondary optics that spreads out or condenses the illuminated area differently than does the intrinsic illumination angle. In such task-lighting applications, the preferable light source panel embodiment is selected for the specific lighting task involved. One standard illustrative work surface area to be lighted is a 60" by 30" desk. A standard under-cabinet commercial illuminator housing is 52" long, 11" deep and 2" thick. The housing contains one 34 watt Philips fluorescent tube and is typically mounted approximately 17" above the surface to be lighted. Direct illuminance measurements made in foot-candles (lumens per square foot) for such a treatment, show 65 fc at the very center of the field illuminated, with intensities rising to a maximum of 85 fc along the back edge, dropping to 10–30 fc at field corners and toward field edges rather quickly. In order to supply 100 fc over the entire 12.5 sq. ft. surface to be lighted requires a source of 1250 white lumens. Achieving this coverage with no additional angular diffusion from the standard light source panels of FIGS. 15A–D having preferentially more light within about a +/−22.5 degree illumination cone than beyond, physically requires one centrally mounted 16" by 46" panel, or as one of many other possibilities, a single 16"×31" array of 6 separate 1" light source panels each spaced from each other by 14" gaps as shown schematically in FIG. 51. If using six 1" square light-source panels each would supply 208 lumens over their 1" square output apertures. Yielding 30 RGB lumens from each illuminating pixel implies that there are about seven illuminating pixels per panel. One possible format for the 1" square light source panels involved would be sixteen tri-color illuminating pixels per panel in a 4×4 illuminating pixel array. Each illuminating pixel then is a 6.35 mm square and each triad of red, green and blue LEDs are contained within their associated 3.175 mm square reflecting cavities. Accordingly, each 1" square light source panel of these dimensions supplies 480 lumens when driven at about 0.25 watt per LED, which is roughly twice the lumens needed for the average 100 fc work surface luminosity sought. Operating the LEDs at 0.11 watt apiece achieves this 100 fc task lighting performance and does so over the entire surface. There are 288 LEDs (16×3×6), so the total operating power for 100-fc performance (assuming equal amounts of red, green and blue) is 28.8 watts, roughly the same as for the 34-watt fluorescent tube used commercially.

This illustrative six-element task light spreads illumination evenly over the entire work surface, is several millimeters in thickness rather than several inches, and allows precise electronic control over the lighting color and color temperature. Moreover, it is dimmable to any lighting level, and provides a peak work surface illuminance of up to 230 fc everywhere when operated at full (72 watt) power that is applicable to tasks demanding such higher lighting levels.

The 34-watt commercial housing with its fluorescent tube wastes considerable more than half the lumens it provides, is much bulkier, only supplies a one color temperature, is not dimmable, and creates uneven illumination.

There is no clear standard in overhead lighting luminaires for offices and workspaces. Many of these lighting requirements are fulfilled by a wide variety of overhead troffers built into (or hanging from) the ceiling. Other common lighting treatments involve combinations of overhead flood and spot lamps having a wide variety of sizes, wattages and physical arrangements. Whatever their configuration, overhead luminaires are expected to convey sufficient light to task areas and less light as background illumination of the floors and walls. In one typical office environment, 80–125 fc of illuminance has been provided on key work areas and about 10 fc in the more peripheral areas. In one typical 17'×17'×8' conference room containing a central 10.5'×6' table, lighting is provided by an array of twelve separate sealed-beam halogen flood lamps sited 66" above the table top. The maximum tabletop illuminance is measured as 75 fc. General illuminance away from the table is 10–15 fc. The lamps are 75-watt GE PAR 30/L Long Neck Wide Floodlight Indoor Light Bulbs, each supplying 1050 lumens over a useful life of 2000 hours.

Figure 51A:
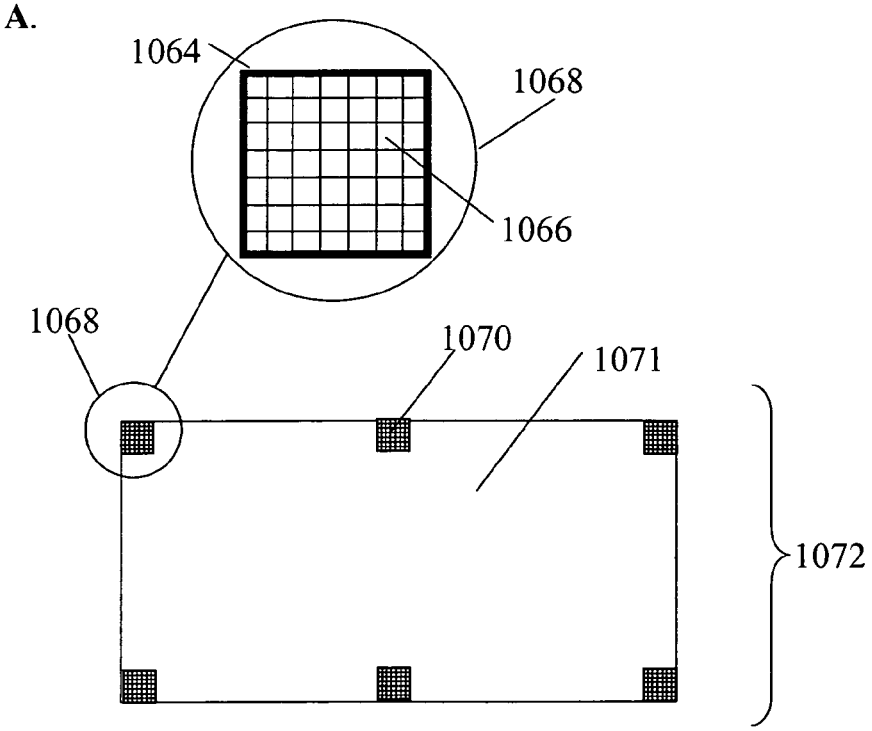
FIG. 51A is the schematic layout for an overhead lighting system using six multi-colored light source panel illuminators formed as shown in FIGS. 15A–D, and arranged on the periphery of a rectangular ceiling or support so as to provide uniform and efficient task or flood lighting to a work surface or workspace.
Figure 51B:
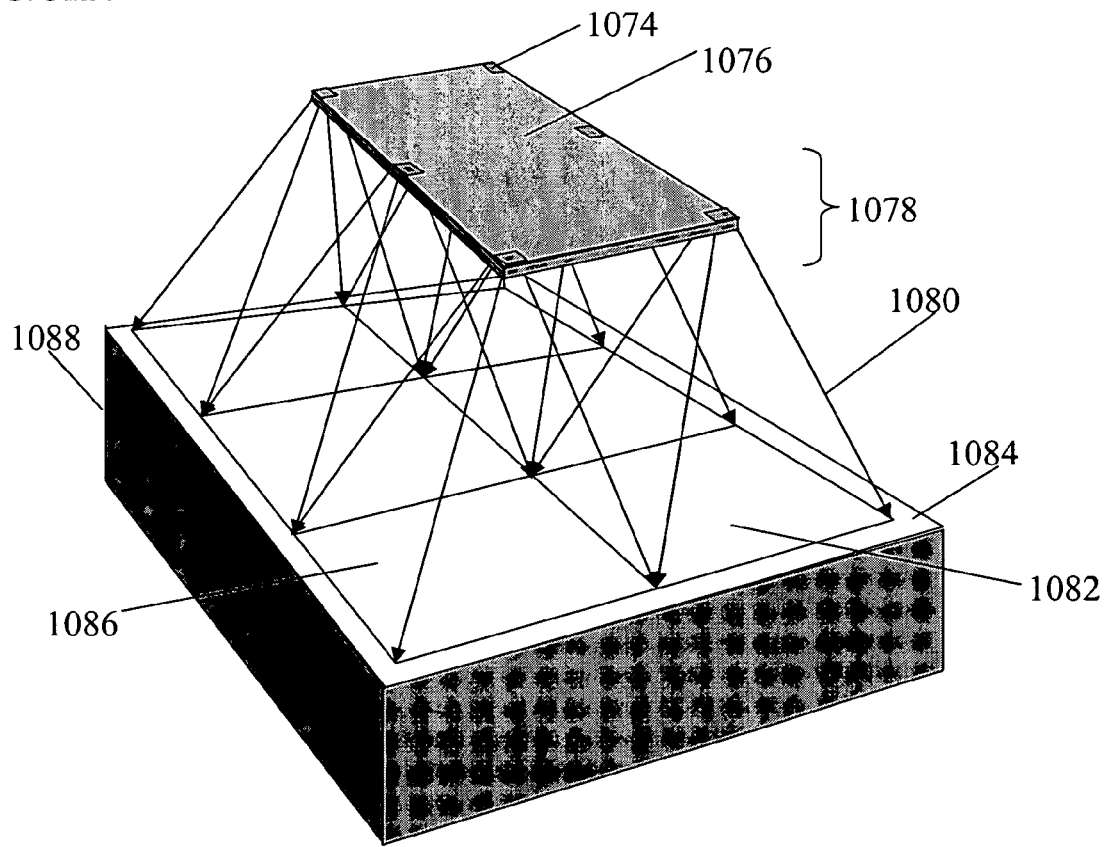
FIG. 51B is a perspective view of the schematic overhead room or table lighting layout shown in FIG. 51A.

The same performance can be achieved using six 2" square light source panels, each panel an 8×8 array of illuminating pixels, supplying 1,920 lumens in the illustrative +/−25.4 degree angular range common to all examples thus far. These six light source panels are arranged the same way as in the task lighting example of FIGS. 51A–B, this time along the edges of a 62"×122" backing plate mounted to the ceiling and centered on the conference room table, one light source panel in each corner, and one on the center of each long edge. In this particular configuration, however, every 2" light source panel sits 58" from its neighbors. Each panel in this arrangement produces a 60"×60" illumination footprint on the tabletop plane that contains a uniform distribution of 1,920 lumens. At the 58" spacing, these 60" square lighting patterns are contiguous with each other, just as shown in the example of FIGS. 51A–B. The resulting tabletop illuminance from this configuration is 76.8 fc (6 panels×1,920 lumens/panel divided by 150 square feet). Each of the six 2" square light source panels used contains a total of 192 LEDs driven by 48 watts (0.25 watt per LED). Total electrical power is therefore 288 watts, about one-third the conventional twelve-lamp usage, saving in this case, 612 watts.

Figure 52A:
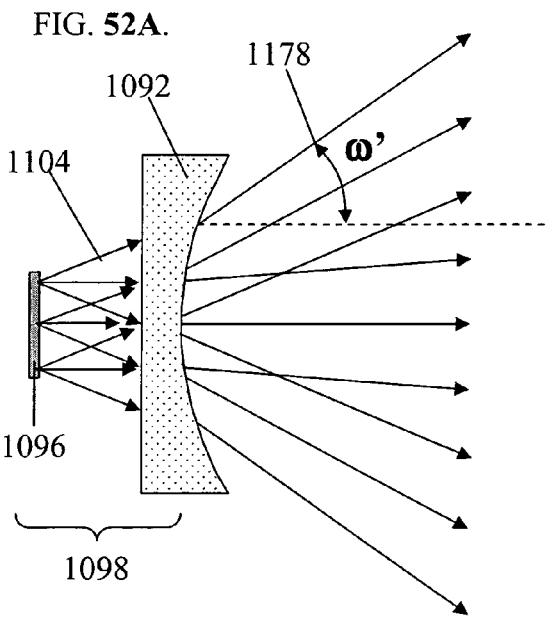
FIG. 52A shows a cross-sectional side view of the light source panel of FIGS. 15A–D combined with a negative output lens to expand the angular field coverage as in the task or flood lighting applications of FIGS. 51A–B and in conjunction with the color mixed illuminators of FIGS. 37A–E, 38A–B, 39A–B, 40A–B, 41A–C, and 45A–B.
Figure 52B:
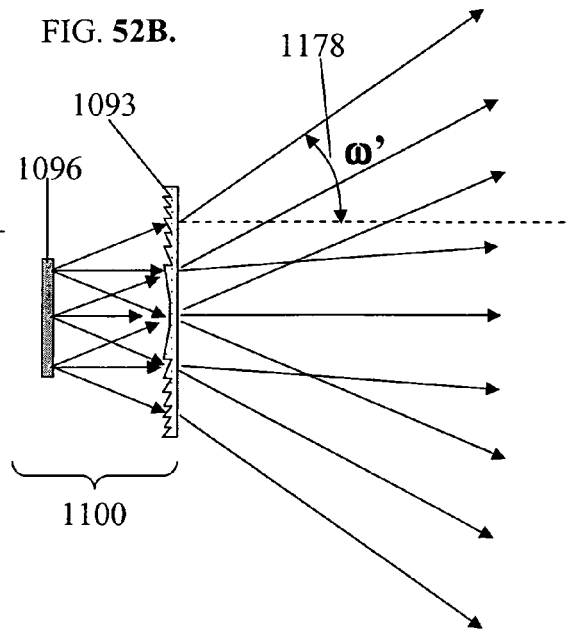
FIG. 52B shows a cross-sectional side view of the light source panel of FIGS. 15A–D combined with a negative Fresnel lens.
Figure 52C:
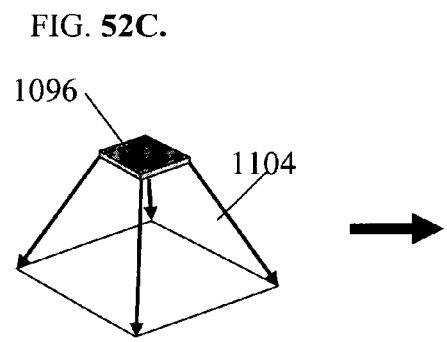
FIG. 52C is a perspective view showing the illumination pattern developed by the light source panel of FIGS. 15A–D.
Figure 52D:
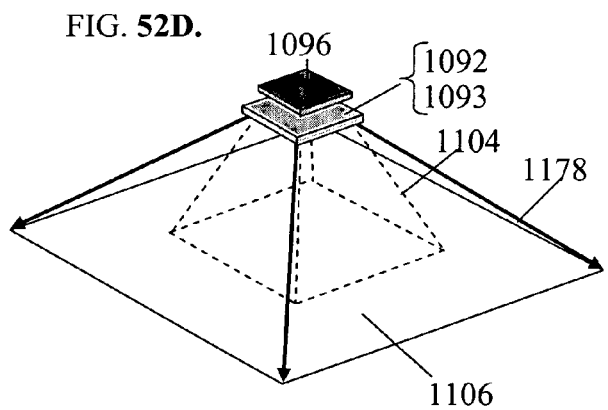
FIG. 52D is a perspective view showing the widened illumination pattern developed by the light source panel of FIG. 52C in conjunction with the negative lens of FIGS. 52A–B.
Figure 52E:
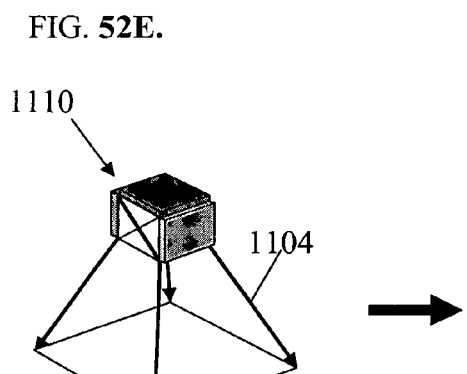
FIG. 52E is a perspective view showing the illumination pattern developed by the light source panel color mixing systems of FIGS. 37A–E, 38A–B, 39A–B, 40A–B, 41A–C, and 45A–B.
Figure 52F:
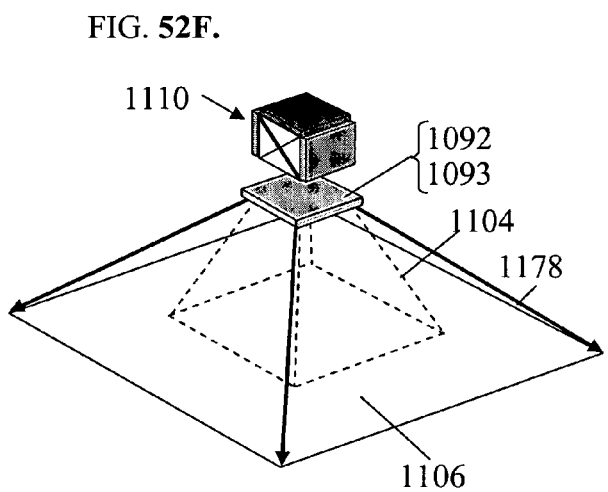
FIG. 52F is a perspective view showing the widened illumination pattern developed by the color mixing systems of FIG. 52E in conjunction with the negative lens of FIGS. 52A–B.

Yet another way to achieve the same 76.8 fc illuminance spread over a 10'×15' area is to use a single light source panel 1096 of FIGS. 51A–B and 52C or light source cube 1110 of FIGS. 52E–F mounted on the ceiling in the center of the room in conjunction with an output lens 1092 or 1093 (FIGS. 52A–B, or D) or diffuser to increase the spread of the light from the illustrative +/−22.5 degrees effective angular range 1104 to the larger angles 1178 (FIGS. 52B, 52D and 52E) needed to make the desired footprint. This straightforward principle is illustrated schematically in the side cross-sectional view of FIG. 52A for a bulk plano-concave lens element 1092 and for a negative Fresnel lens 1093 in FIG. 52B. Lenses 1092 and 1093 can be either spherical or cylindrical, depending on the illumination pattern 1106 sought. When light source panel 1096 contains tri-color illuminating pixels (separate red, green and blue LEDs within each pixel) as in the example above and has a substantially square output aperture, its intrinsic illumination pattern 1104 is transformed to a symmetrically enlarged illumination pattern 1178 by a spherical lens, or to an asymmetrically enlarged pattern 1106 by two crossed cylindrical lenses as in FIGS. 52D and 52F. The most compact arrangement is provided by the use of one spherical (or aspheric) Fresnel lens for symmetrical patterns and by two sequential cylindrical (linear) Fresnel lenses, axes crossed 90-degrees to each other, each Fresnel designed for the required angle in the direction it controls. In the conference room example, the required angles are approximately +/−53.75 degrees to spread the light 15' and +/−42.3 degrees to spread the light 10'. Since the sizes of the light source elements (panels or cubes) are so much smaller than the spreads to be created, the light source dimensions can be neglected.

AP. General Lighting Example 7: Direct View Image Display

Thus far, all application examples of light source panels and light source cubes have involved their use as illuminators. Every mono-colored LED was operated collectively as a mono-colored group, each group having particularly even uniformity whatever its monochromatic or composite output color. When independent control is provided for the red, green and blue emitters within each separate illuminating pixel, the spatial uniformity is modulated rather than even, and the light source panel becomes a spatial light modulator capable of monochromatic or full color image display across the beam's aperture. This usage, however, is differentiated from most present image display technologies in that pixel sizes range from 1–2 mm on the low end to tens of millimeters and more on the high end. In this context, each illuminating pixel of the earlier examples becomes an image display pixel. As such, one large light source panel, or a two-dimensional array of separate light source panels can be deployed as one large pixel image display for outdoor use in stadiums, along highways, as electronic signage, or as display walls in large office workspaces.

Operating a light source panel as an information (or image) display assumes that a means of interconnection is arranged beyond the ones described in FIGS. 10 and 13 which provides a common buss for each of the two diode contacts in the array that is interconnected. For display, each mono-colored diode has to be controlled separately, requiring a dynamic interconnect system analogous to those used with LCDs and DMDs.

Assuming such interconnection means is implemented practically, display applications of the light source panel range from low information content alphanumeric characters and icons, to full-color, full-motion, high-information content video displays. Image display brightness is governed by the lumens generated by the individual pixels, the pixel aperture and the pixel's effective output angle. Potentially, each LED chip is capable of enormous direct viewing brightness, as it generates a relatively large number of lumens over a very small surface area. This capacity is evident by just staring directly at almost any fully powered LED, which often appears too bright to look at. That such pinpoint brightness is possible from an LED is not surprising as the highest performing chips release 20 viewable lumens over all angles from a surface area of about 0.3 mm$^2$ (3.2E-06 ft$^2$). This corresponds to a Lambertian brightness of 6M FL. When used in display, these lumens have to be dispersed over a considerably larger pixel area. If as in previous examples, the fully-powered illuminating pixel nets 30 RGB lumens over its illuminating aperture, the effective Lambertian brightness of a 20 mm square pixel is still about 7,000 FL (24,000 Nits), which while still much higher than that of common direct view LCD image displays, provides the necessary brightness to compete with direct sunlight in outdoor viewing situations such as stadium scoreboards, view screens and highway billboards. Yet, there are many possible lower brightness applications that become practical when operating the constituent LEDs at a fraction of their maximum levels and spreading their light over larger pixel areas. One example of this is a rolling message board with completely contiguous 8 mm square pixels. As just one example, a display module containing 100 pixels (300 LEDs) operating at 20 mW per diode draws a total of 6 watts and produces an RGB brightness that is 0.02-watts/pixel and pixel brightness is still about 3500 FL (12,000 Nits). Visually more appealing than the dot-pattern like appearance of traditional arrays or clusters of pre-packaged plastic encapsulated LEDs, the comparable light source panel displays described above would allow much more realistic font and image representations regardless of pixel size used.

AQ. Precise Control Over Source Images and Beams Using the Method of Elevated Prism Sheets Preferred embodiments of the multi-layer illuminator inventions of FIGS. 1–3, 7, and 10–15A–D, share two distinguishing features: the emitting sources are separated from each other by non-emitting regions, and the illuminator's directional output light is made to appear continuous by the use of prism-like array sheets elevated within the illuminator a preferable distance above the emitting sources.

The physical mechanisms by which elevated prism sheets convert discontinuous, non-directional input light into continuous and directional output light is both complicated and non-intuitive.

Despite the fact that prism arrays have become common elements in practically all illuminators used to back light LCDs, their influence on the spatial uniformity of output light and the development of spatially uniform beams of light has been neither well-established nor productively exploited.

The most common prism-sheets used to enhance backlighting brightness are manufactured by the Minnesota Mining & Manufacturing Company under the trade name BEF, an acronym for brightness enhancement film. Such plastic prism films are generally composed of 50-micron wide micro prism grooves each having 90 degree apex angles. Such films are commonly placed between a uniform wide angle fluorescent light source and an LCD screen, prism points towards the LCD, for the express purpose of brightening the output appearance of the display (hence their commercial description as brightness enhancement films). Display brightness increases through the use of such BEF sheets because the sheet's prismatic grooves concentrate lumens transmitted through the display into a narrower range of viewing angles than the un-modified illuminator would have otherwise developed on its own. Two BEF sheets, their prism axes crossed 90-degrees with respect to each other, are commonly used to achieve the highest possible LCD brightness enhancement. The standard brightness enhancement application is with the "dot pattern backlights" already described above. Within a "dot pattern backlight," substantially uniform light emitted by one or more cylindrically shaped fluorescent tubes is fed through one or more edges of a transparent lightpipe disrupted only by a distribution of scattering features (dots or facets) arranged to cause uniform escape of light through the lightpipe's large rectangular aperture and into the mating aperture of the LCD. Diffuser sheets are used above and below the dot pattern lightpipe to make the backlight's spatial uniformity at the rear of the LCD, featureless. No effort has ever been made to adjust or set the exact height of the BEF sheets above the lightpipe illuminator in a preferable manner. The magnitude of LCD brightness enhancement produced by the prism sheet is not affected the prism sheet's height above the diffused lightpipe.

A less common type of LCD backlight involves a parallel array of fluorescent tubes within a white diffusing box. In these higher brightness backlight's, one or more diffuser plates are used between the diffusing box and the LCD to even out the illumination. Backlight brightness is usually high enough with multiple lamps that the expense and angle narrowing of BEF sheets is rarely warranted.

There has only been one known LCD backlight application, where the positioning of a BEF sheet has been used to modify the spatial uniformity of the backlight's output. This special purpose backlight involved two different types of light sources: one array of separated fluorescent tubes for high brightness daytime use, and one electro-luminescent source placed in the spaces between the fluorescent tubes, for low level night time use. In this case, the physical positioning of a single BEF sheet was used as a means to balance out the illumination provided by each source.

Successful practice of the present inventions depends on setting the spacing between sheets of prisms and the discrete emitting arrays beneath them, along with the characteristics of the prisms themselves. Preferably elevated, the prism sheets enable spatially discontinuous emitters to appear continuous and with the collective output illumination angularly directed within +/−β, the extreme angle β depending on the prism's geometry (β=22.5 degrees when the prism apex angle is 90 degrees). Prism sheet elevation above discontinuous emitting arrays is to provide even beam uniformity while concentrating the angular cone of output illumination as compared to that of the original emission.

Preferable practice of the multi-layered illuminator inventions described herein (FIGS. 1–3, 7, and 10–15) relies on disposing the prism sheets at a unique height above the light emitters, that unique height depending quantitatively on a variety of prism characteristics such as apex angle, base width, base angles, refractive index, the height of the prism base above the emitter's output plane, emitter size, spacing between emitters, and the brightness variation that exists within the emitter's boundaries. There are also two important external factors affecting this multi-layer illuminator's performance, including how the illuminator's prisms are to be viewed in use (i.e. either directly by eye or indirectly, through one or more light scattering materials) or whether the prism's output beam, unviewed, is to be used to provide source of general illumination.

Figure 53:
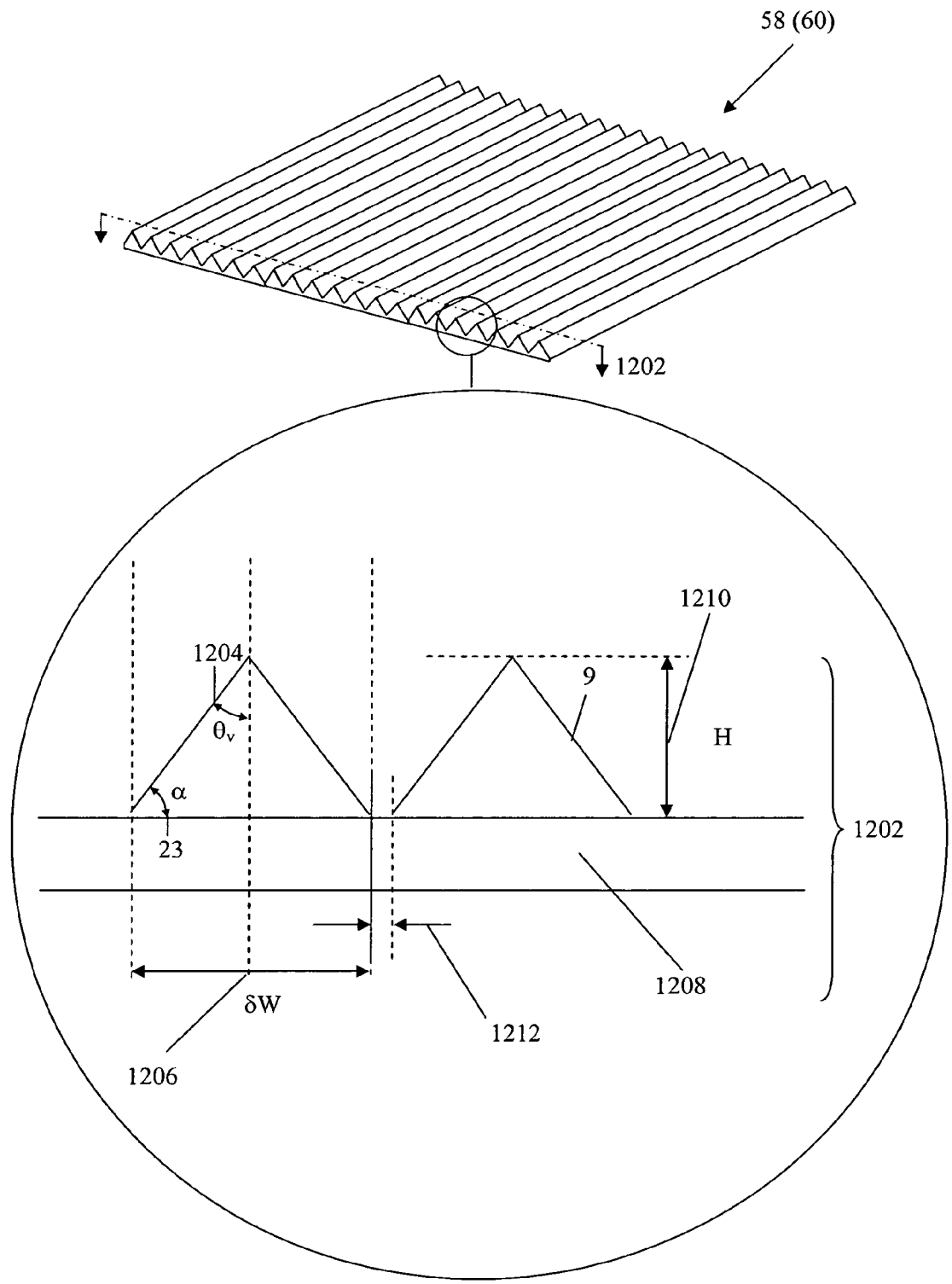
FIG. 53 illustrates perspective and cross-sectional side views of a generalized prism array sheet, showing the prism element's geometrical relations.
Figure 54:
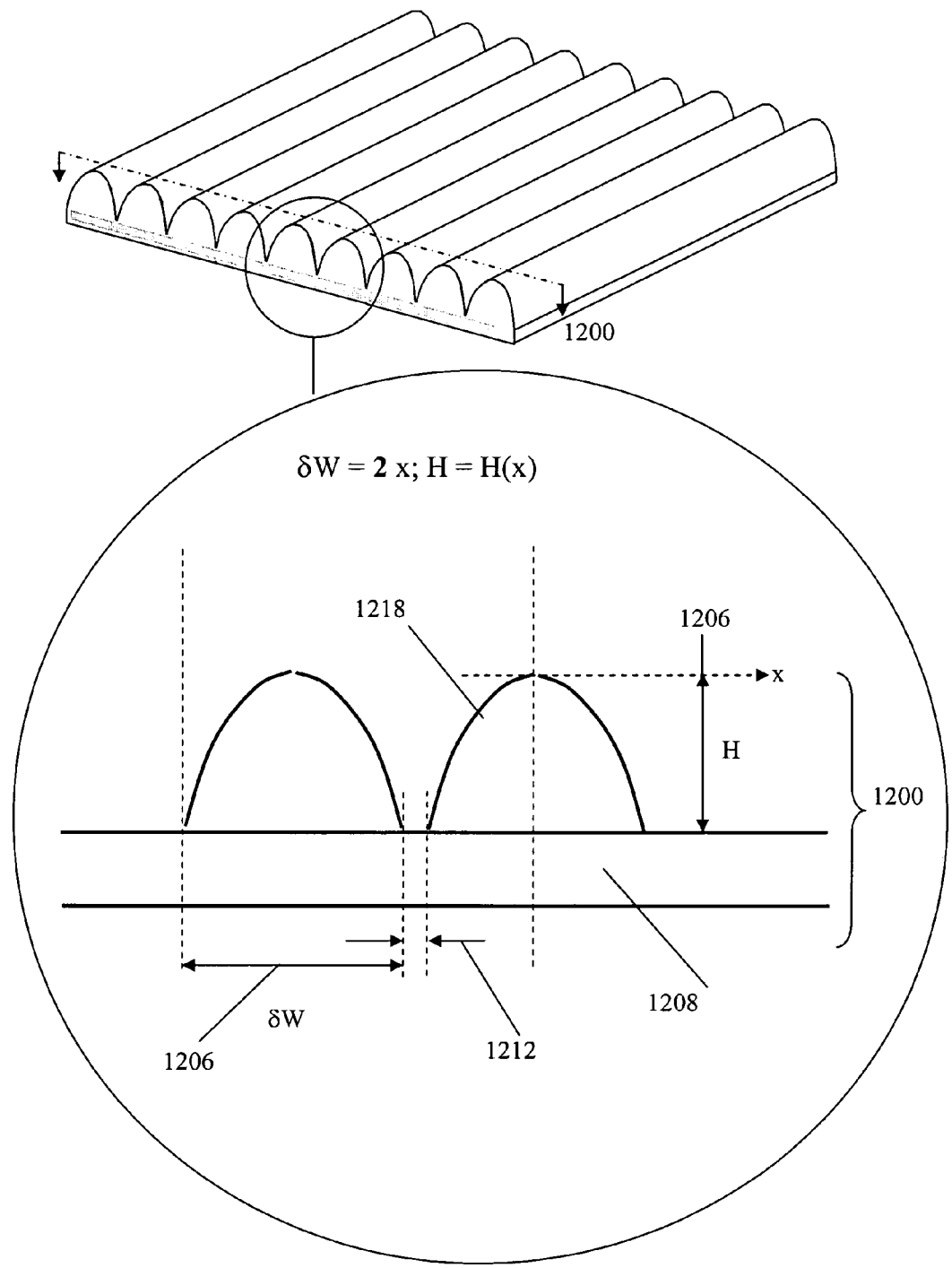
FIG. 54 illustrates perspective and cross-sectional side views of a generalized lenticular-like aspheric lens array sheet, showing the aspheric element's geometrical relations.

The basic prism sheet cross-section is represented schematically in FIG. 53 for triangular prism elements and in FIG. 54 for aspheric prism-like elements. Aspheric elements 1218 of FIG. 54 are quite unlike classical spherical lenticular lens structures, and behave more like prismatic lenses. The general prism form 1200 is shown in cross-section 1202. The apex angle $\theta_v$ 1204 is best in the range 35 degrees to 60 degrees half angle as shown, and preferably 45 degrees. Base angle α 1206 is 90−$\theta_v$. Base width δW 1206 depends on the dimensional scale of the emitting elements they are to be used with and the method of prism sheet manufacture. For the LED emitters of FIGS. 14–16, as one example, base width δW is preferably 25 to 50 microns. For larger emitters such as the Corning's 12 mm wide fluorescent there is latitude to use larger prisms. For applications requiring maximum compactness it is advantageous to make the prisms as small as practical, which makes the prism sheet as thin as possible. Prism sheets are easily cast and cured, embossed or compression molded. Substrate layers may be a different material than the formed prisms, and can be for example, polyester, polycarbonate or acrylic. When embossed (or molded), the prism material is melted, formed to a tool, and cooled. Various polymers and polymer composites are suitable for this process. Prism sheets can be laminated or bonded to thicker plastic or glass layers (for example see base layer 217 in FIGS. 15B–D), to achieve the exact spacer height G1' in FIGS. 15A–D that is required. Prism height H (1210 in FIG. 53) depends on prism angles and base width, with δW=2H Tan $\theta_v$, or as in FIG. 54, the polynomial expression given in equation 32 where k is the conic constant, R, the radius of curvature, a, b, c, and d, the aspheric coefficients.

$$H(x) = \frac{(x^2/R)}{1+\sqrt{1-(1-k)(x/R)^2}} + \quad (32)$$
$$ax^4 + bx^6 + cx^8 + dx^{10} + \ldots$$

When the aspheric terms are adjusted, aspheric elements of the general shape illustrated in FIG. 54 are obtained which act in a prism-like manner. As one example, a radius of 0.135, conic constant, −1, a, b, c, and d coefficient of 2, 50, −4000 and 10,000 respectively develops for δW of 0.5 mm and H that is about 0.2 mm. This design can be easily scaled to smaller dimensions.

Often, for manufacturing tooling relief, a small gap or tool land 1212 is allowed between prism elements. Similarly, the apex may have a similarly small flat mesa.

One unique aspect of elevated prism sheets 58 and 60 as used in all previous illumination examples, is that they do not have to exhibit the extreme standards in cosmetic perfection that have been associated with 3M's BEF in direct view brightness enhancement applications. Cosmetic defects in 3M's BEF are directly viewable through the LCD display screens beneath which they are used. And, the LCD viewing standard is for zero viewing defects. Accordingly, extreme quality measures are taken during BEF's manufacturing, packaging and handling to prevent cosmetic damage to the prism substrate and the prism tips, which are extremely fragile. Preventive measures include discarding all damaged BEF sheets. No such costly measures are needed with present prism sheets 58 and 60. Cosmetic defects in prism sheets 58 and 60 cannot be directly viewed, and are therefore much less critical to function. Some degree of spatial mixing has been included above the prism sheets that blur or totally homogenize any visual defects local prism imperfections might contribute. Light source panels 248, 221, 223 and 229 as in FIGS. 15A–D, for example, provide an optional diffuse scattering layer 28, which hides minor scratches and abrasions. The projection systems of FIGS. 17–22, and 24–32, each employ a Kohler-type angle transformation process intended to average out any spatial non-uniformity in the light source panels 284, 286 and 288 containing prisms sheets 58 and 60.

Whatever their origin, prism and prism-like structures develop virtual images of the light sources placed beneath them that displace as a function of the prism elevation and the prism geometry.

Classic large prisms are well known for their ability to shift and displace well-collimated beams of light by means of refraction. When a well-collimated light source is viewed through such a prism, the light actually comes from a virtual representation of the source, and not the source itself. The virtual source is an image of the real source and has been shifted in position away from the real source location. When the prism apex is centered over the real source, and pointing away from the source, two virtual source images are so formed. One source image and beam displacement is associated with each of the two oppositely tilted prism facets.

These same two virtual source images are characteristic of arrays of prisms as well.

The illumination system invention of FIG. 1 shows the two bilateral virtual images 26 and 27 of real emitting strip 24 being displaced by the action of prism sheet 7 with respect to one another as a result of prism apex angle 8 and prism sheet height 18. Provided the prisms used have substantially smaller base widths δW than width W 42 of emitting object 24, the two virtual images overlap almost exactly when prism elevation 18 is made substantially zero (and the prisms are sufficiently small). These overlapping virtual images then separate form each other as prism sheet elevation 18 is deliberately increased. The illumination system inventions of FIGS. 3 and 7 show the more complicated set of quadra laterally disposed virtual images resulting in two-dimensions by virtual of the action of two crossed prism sheets 58 and 60. The set of four virtual images 108 of a single, square, emitting object 110 has been shown schematically in FIG. 4.

Figure 55:
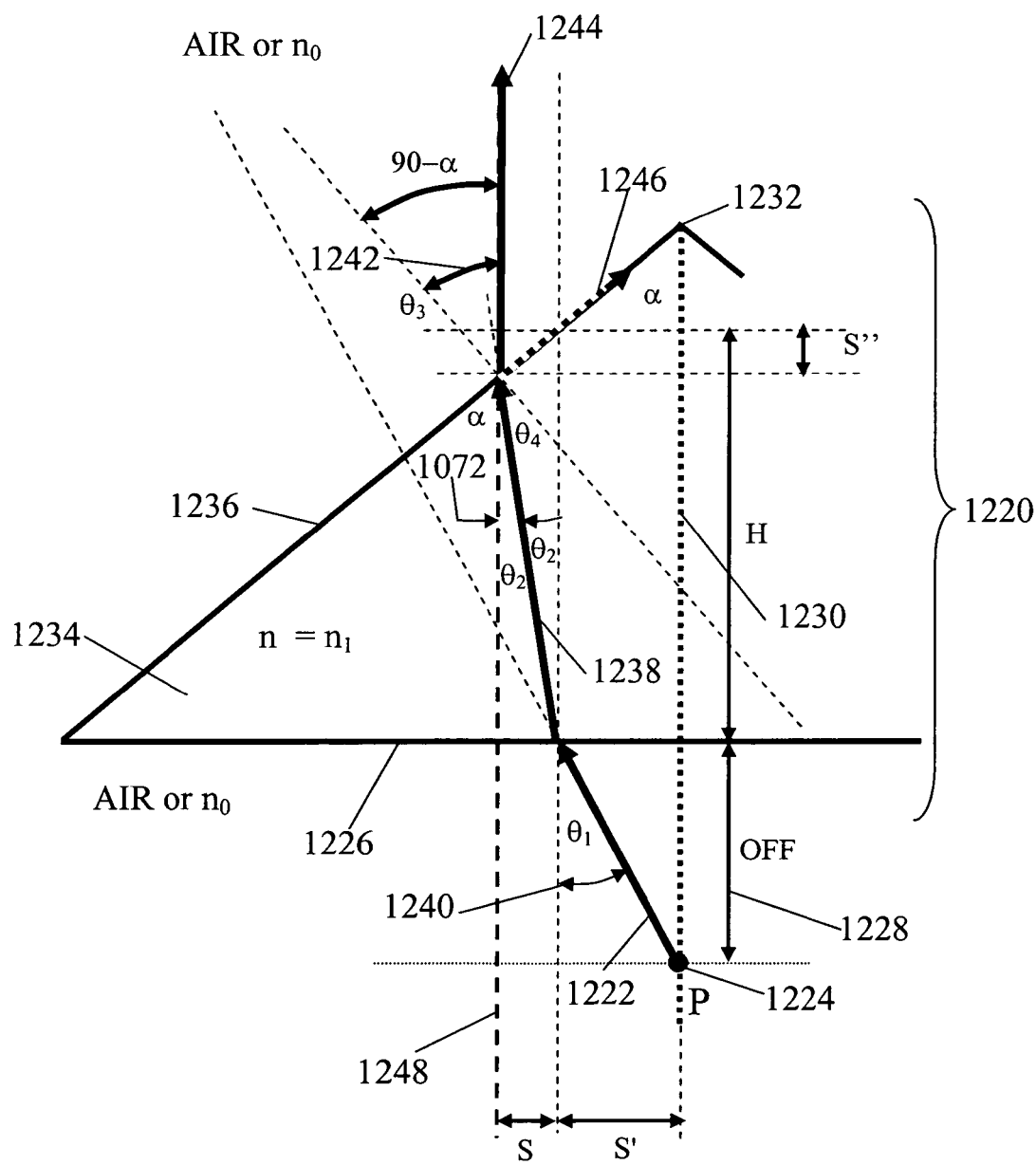
FIG. 55 illustrates a side view of the left half of a prism element's cross-section, along with the trajectory of a single light ray emitted from a narrow emitting line P positioned beneath the prism's apex, a distance OFF from the prism base.

The virtual image shift with prism sheet elevation (or offset) is explained schematically for a single half-prism element relative to a very small diameter line emitter, in FIG. 55. In this generalized schematic cross-section 1220, only the left hand side of the idealized prism element is shown (for emphasis). A single (paraxial) light ray 1222 is followed first in air as if leaving the narrow line emitter 1224 at a point P, located in this example directly below the prism's base 1226a distance 1228, OFF, that resides on a line 1230 drawn vertically downwards from the prism's apex 1232. This ray 1222 is shown to pass into the prism through its base 1226 as continuing ray 1238, whereupon it transmits through the prism material 1234 towards the hypotenuse edge 1236. On reaching slanted output face 1236, ray 1238, depending on its incoming angular direction 1240, $\theta_1$, either transmits as ray 1244 into air at an angle 1242, $\theta_3$, if less than 90 degrees, or suffers total internal reflection (TIR), if 90 degrees or greater. The critical boundary ray 1246 is shown heading along prism face 1236. Illustrative output ray 1244 shown in FIG. 55 emerges directly upwards along what would be the standard direction of view or use 1248 of output light.

As seen from FIG. 55, TIR prevents observation of light from a region of half width (S+S'), whose boundary at zero offset (S) is defined by the onset of TIR, as in equation 33, where H is the effective height of the prism above the object, α is half the prism's full apex angle, and $\theta_2$ is the angle made by the transmitting ray with the prism base's surface normal $(90-\alpha-\theta_4)$.

$$S = \frac{\text{Tan}\theta_2}{1 + (\text{Tan}\theta_2 / \text{Tan}\alpha)} H \quad (33)$$

When the source of light 1224 is offset a vertical distance 1228 (OFF) below the prism's base 1226, the boundary half-width is increased by S' as in equation 34, where $\theta^1 = \text{Sin}^{-1}$ (n Sin $\theta_2$), with $\theta_2 = 90-\alpha-\theta_4$, $\theta_4 = \text{Sin}^{-1}$ (Sin $\theta_3$/n) and $\theta_3 = 90-\alpha+\phi$ ($\theta_3 = 90$ degrees for TIR).

$$S' = (\text{OFF}) \text{Tan } \theta_1 \quad (34)$$

The exit position of any output ray angle 1242, $\theta_3$, can also be calculated from these equations by using the desired output angle less than 90 degrees, rather than the 90 degrees needed as the pre-condition to TIR. For example, 45 degrees is the angle used to represent ray 1244 that is transmitted vertically upwards and directly towards the viewer along axis 1248. It is this vertical ray, under all conditions, that defines the center of one side of the prism's output angular distribution.

Figure 56A:
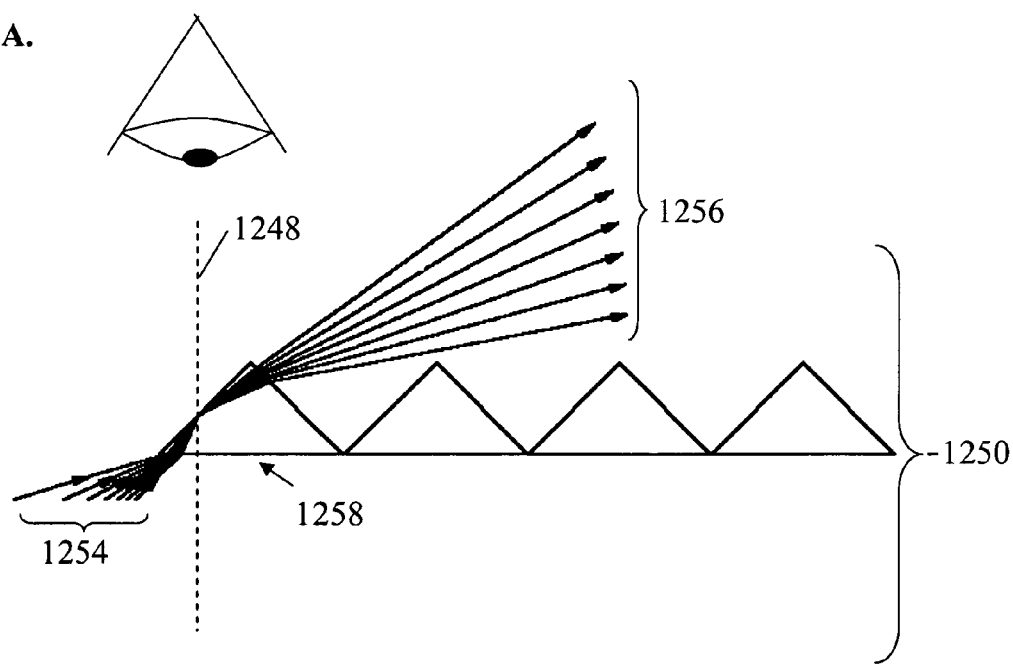
FIG. 56A illustrates a cross-sectional view of four 90-degree micro prisms with a set of illustrative paraxial rays from an underlying emitter, each of which transmitted as output but not seen by a viewer positioned directly above.
Figure 56B:
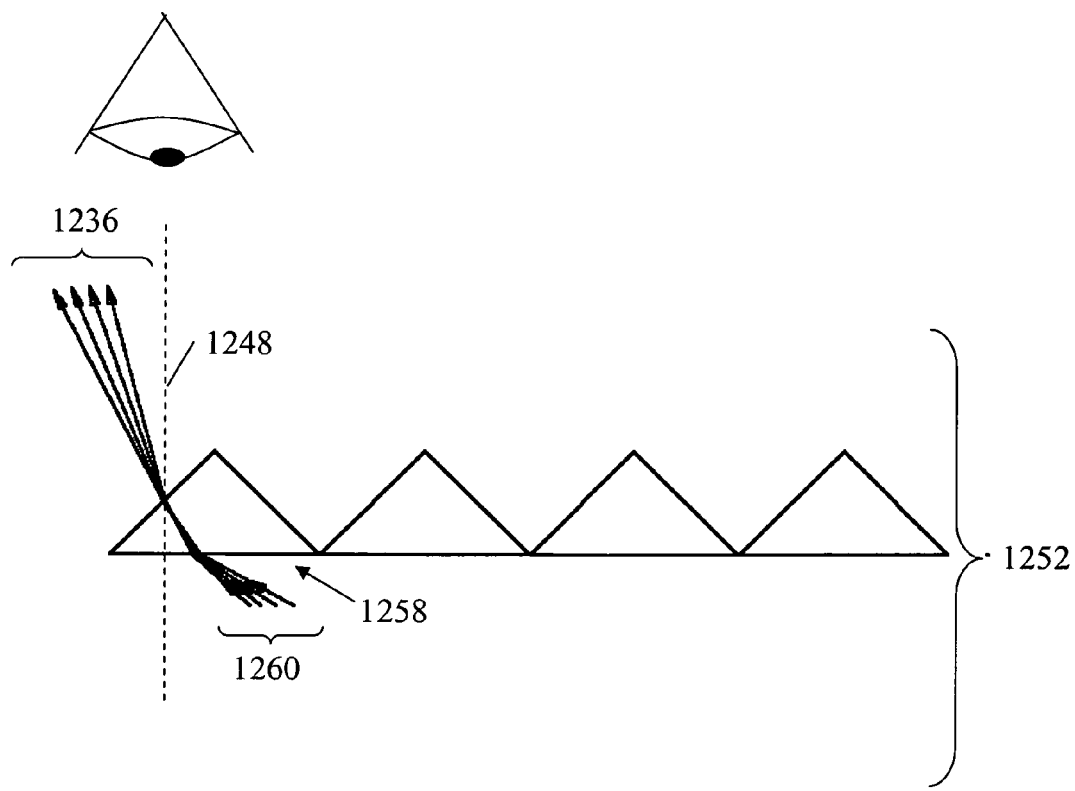
FIG. 56B illustrates a cross-sectional view of four 90-degree micro prisms with a different set of illustrative paraxial rays from an underlying emitter, each of which transmitted as output and seen by a viewer positioned directly above.
Figure 57:
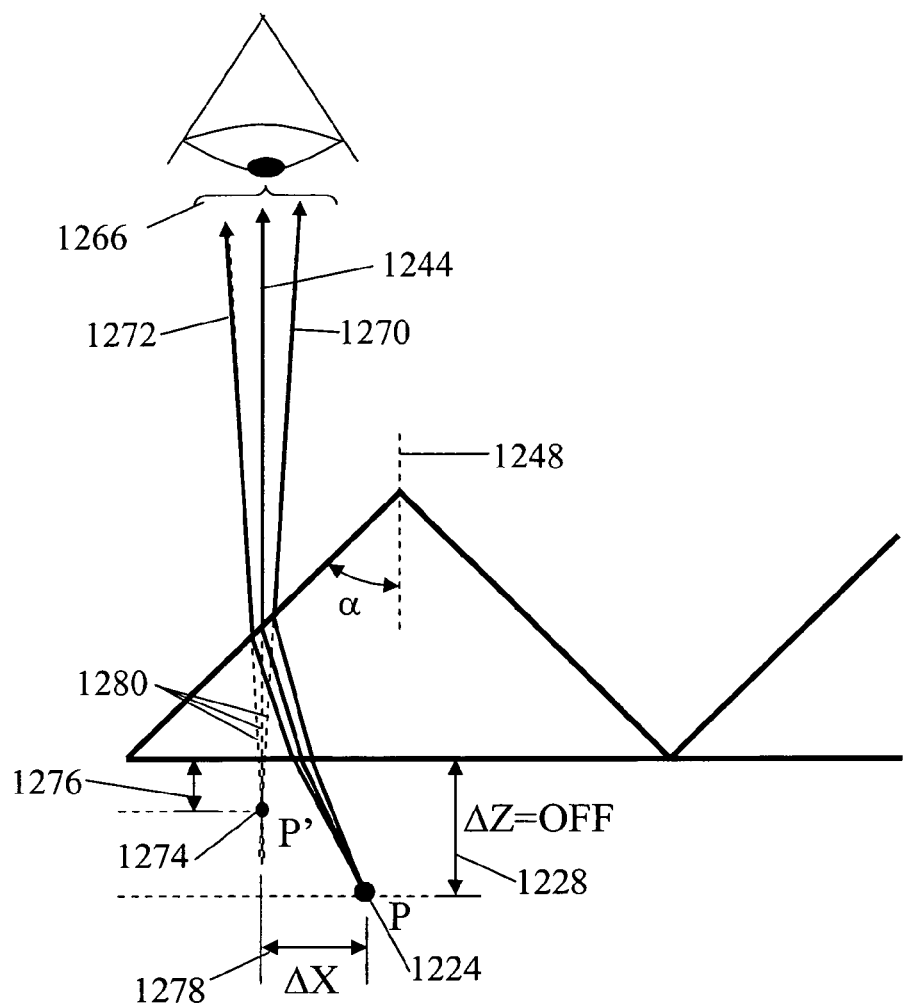
FIG. 57 illustrates a cross-sectional view of a single 90-degree micro prism and a set of selected paraxial rays from one point P on an underlying line emitter that would be transmitted and seen by a viewer positioned directly above.

Output ray 1244 as shown in FIG. 55 is unique in that it points directly in a major direction of use, prism sheet surface normal 1248, which is also the most common axis of view. Not all emergent rays from a given object point 1224 are as visible along axis 1248. Two illustrative sets of paraxial input rays 1254 and 1260 resulting in output rays that would not be perceived by a viewer positioned along axis 1248 are shown in the two cross-sectional side views of FIGS. 56A and 56B respectively. These rays are actually traced using commercial ray-tracing software ASAP™ (Breault Research Organization). Illustrative prism element 1258 in prism sheet section 1250, fed with oblique input rays 1254 return practically horizontal output rays 1256, far outside a viewer's field of view along axis 1248. Illustrative prism element 1258 in prism sheet section 1252, fed with oblique input rays 1260 return output rays 1262 that fall just outside a viewer's field of view along axis 1248. These rays 1262, while not viewable by eye, make up a key portion of the prism sheet's output beam. The unique set of rays that would be seen (imaged) by a viewer staring down axis 1248 is shown schematically in FIG. 57, which adds ray-tracing detail to the generalized schematic representation of FIG. 55. Peripheral output rays 1270 and 1272 shown in FIG. 57 fall within about +/−3-degrees of view axis 1248, and emanate from common object point 1224. The backward intersection of these rays, via dotted construction lines 1280 drawn along each ray in FIG. 57 determines the virtual image point 1274 and its focal plane depth 1276 for the corresponding object point 1224. The corresponding virtual image displacement 1278 is given by the lateral shift ΔX that transmission through the prism brings about for the prism sheet offset 1228 from object point 1224. Useful mathematical relationships for these displacements will be derived shortly.

It is also necessary to understand that not all rays emitted by a light source array placed beneath a prism sheet are transmitted directly, and that neighboring prism elements in the sheet become involved in both the transmission and rejection process.

Figure 58:
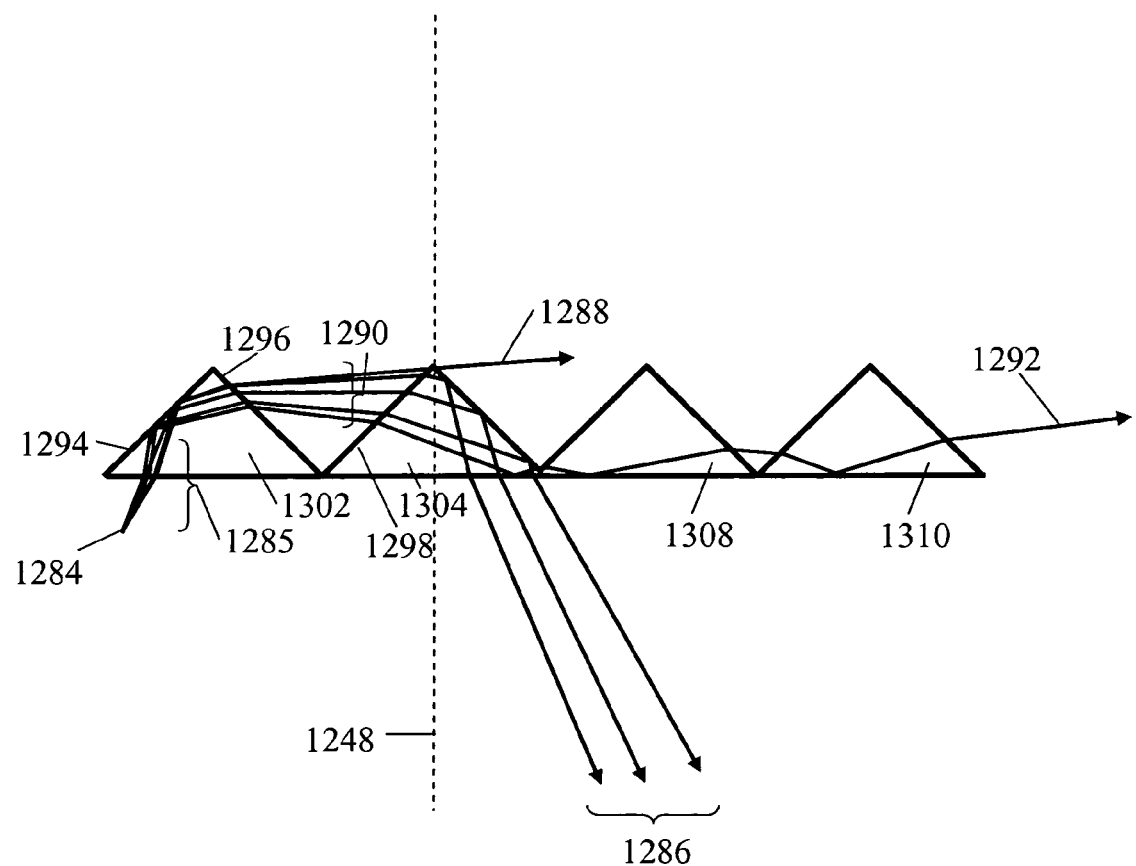
FIG. 58 illustrates a cross-sectional view of four adjacent 90-degree micro prisms with a set of selected paraxial rays that undergo total internal reflection twice, once within the starting prism and then again within a neighboring prism.
Figure 59:
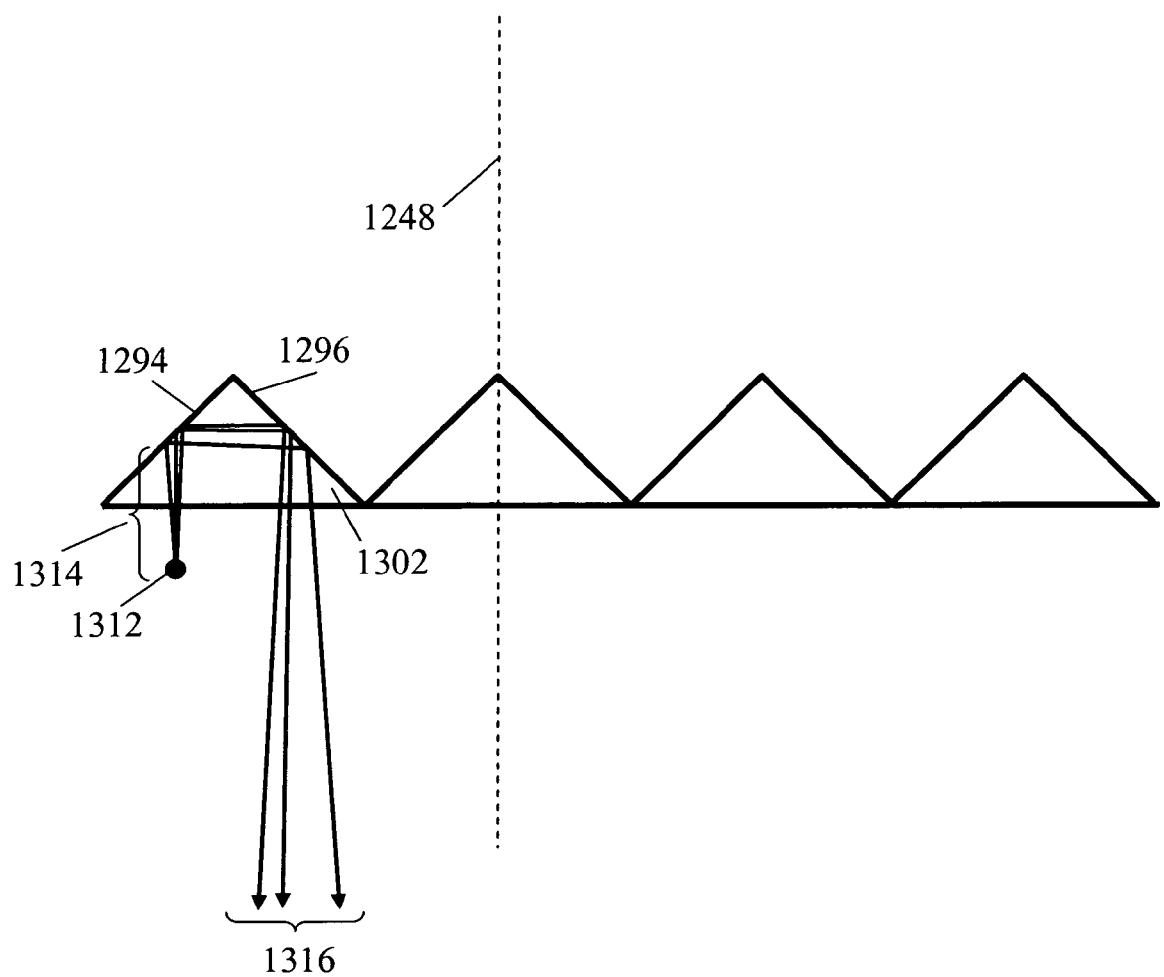
FIG. 59 illustrates a cross-sectional view of four adjacent 90-degree micro prisms with a set of selected paraxial rays that undergo total internal reflection twice, both times within the starting prism.

Illustrative ray bundle 1285 is traced from object point 1284 in leftmost prism element 1302 in FIG. 58. These rays undergo TIR at leftmost hypotenuse face 1294 of prism element 1302, and refract through the prism's opposing hypotenuse face 1296 at an angle that is not only far outside the viewer's field of vision, but on line with neighboring prism element 1304. The one ray 1288 that escapes capture by neighboring prism element 1304 practically runs along the plane of the prism sheet. The larger fraction of rays 1290 return as ray bundle 1286 to the light emitting objects from which they came below the prism sheet, by entering and reflecting from neighboring prism 1304. A small fraction of rays 1290 remains trapped within the prism sheet structure, as illustrated by ray 1292 (FIG. 58). Yet other rays, such as the practically vertical bundle 1314 traced in FIG. 59, undergo two total internal reflections within their initial prism element 1302, one on face 1294 and a second on face 1296, the combined action of which can be seen to return all this flux as rejected bundle 1316.

These angle-specific total internal reflections, when combined with some type of reflective return mechanism, constitute the basis for the backlighting-specific brightness enhancement that has been the hallmark of 3M's commercial prism array film, BEF. Rejected photons that reflect or scatter back into angles of prism transmission, increase viewable power within the directly transmitted range of angular output. While reuse of wasted photons is an admirable feature of prismatic structures in general, the reuse in and of itself does not influence the output uniformity in any appreciable manner, and is therefore not a critical feature for their use in the present invention. Photons are reflectively recycled randomly, and as such are equally apt to enhance bright regions of non-uniformity, as they are to affect dark ones.

The reflective recycling of the rejected ray fractions illustrated by bundles 1286 (in FIG. 58) and 1316 (in FIG. 59) is important to the present inventions only in that recycling efficiency increases the percentage of input light that becomes a usable part of the prism sheet's total light output.

Human perception of the prism sheet's angular viewing characteristics is affected by TIR processes within the prism sheet and by the limited acceptance angle of the human eye. The reason such effects are important to understand is that they influence how well one perceives the prism sheet to be working as opposed to how the prism sheet actually works within the illuminator inventions presently described. Visual perceptions not critical to illuminator function may cause misinterpretations of the prism sheet's effectiveness. One example of this is given for traced rays in FIG. 60, which follows the wide range of ray angles emitted from infinitesimal line emitter 1320 placed in close contact with base plane 1322 of single prism element 1324. A viewer staring along axis of view 1248 visualizes the line emitter 1320 as two separated sharply focused virtual line images 1338 and 1340 via output ray bundles 1326 and 1328. Other output ray bundles 1330, 1332 and 1334 are hidden from view by their angular directions. Yet, collecting all these output rays 1332, 1326, 1334, 1328, and 1330 on diffusion screen 1342 and looking at the screen, a very different result is perceived. Direct view of screen 1342 shows general illuminance from ray bundles 1332, 1334 and 1330, and concentrated illuminance from bundles 1326 and 1328, which might appear to be blurred representations of the line emitter 1320.

Figure 60:
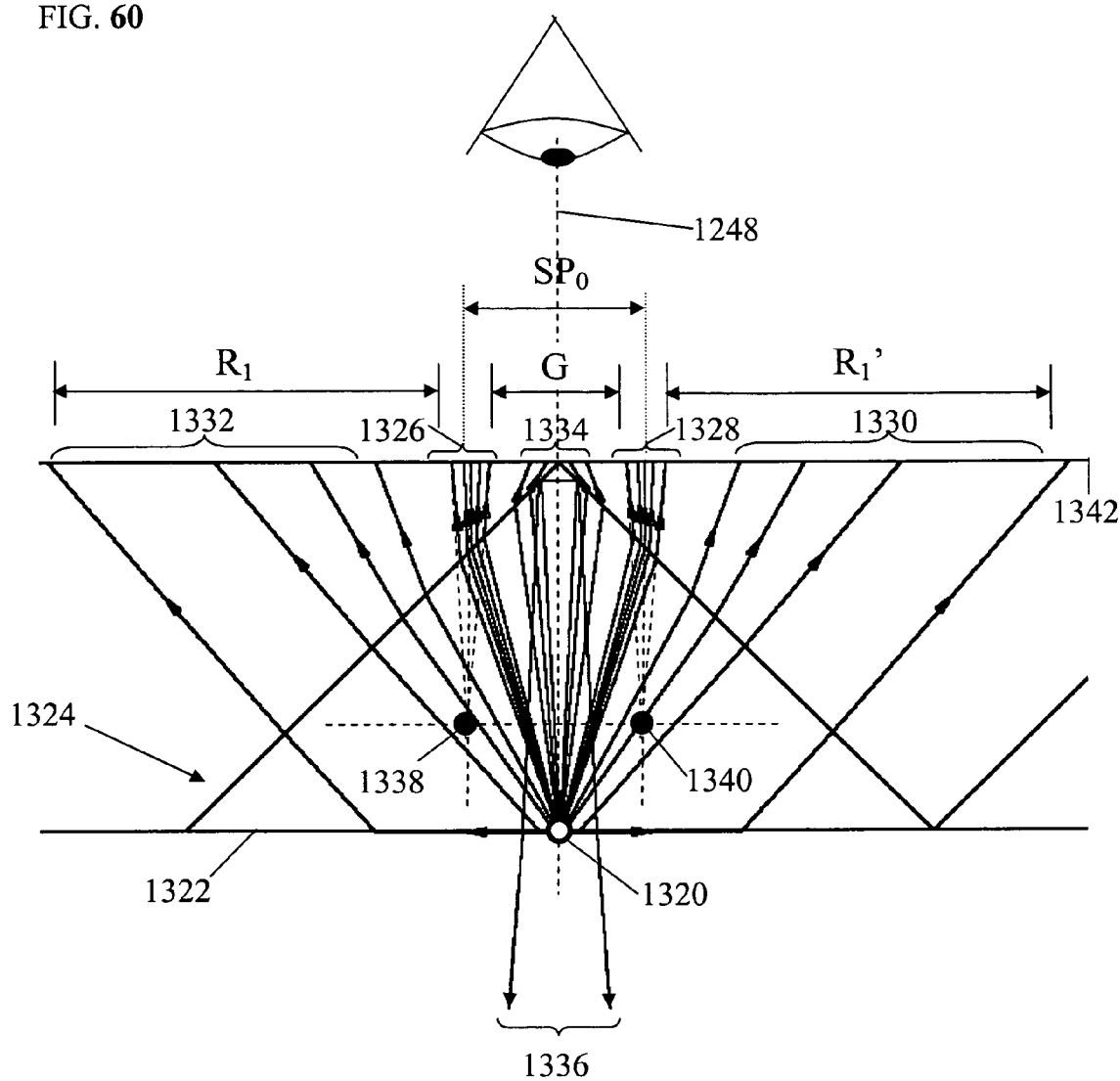
FIG. 60 illustrates a cross-sectional view of a single 14 mm high by 28 mm wide 90 degree prism element and the set of paraxial rays that spread out from a narrow line emitter located just beneath the prism's base on a line with its apex and that pass through the prism material to an output plane placed just above the prism's apex in air.

There is, as indicated in FIG. 60, a much wider usable output field than perceived by a human viewer's eyes, when all paraxial ray directions are used as they are in each of the present inventions. The human eye sharply focuses light collected over only about +/−1 degree. Human perception outside this angular range falls off rapidly. This difference is easily demonstrated when a real prism is used with a single, sharply ruled pencil line to approximate behavior of a line emitting element. A 14 mm high glass prism with a 90-degree apex and a 28 mm wide base is used as an example. A viewer standing over the prism apex sees two well-focused pencil lines displaced from each other about 6.5 mm. This is exactly the value given by the paraxial approximation of equation 33; $\theta_3$ set to 45 degrees.

The dichotomy between visual perception and full system behavior raises an important design issue that impacts preferable use of prism sheets in the present inventions. The critical elevation G1 of prism sheet 7 as in FIG. 1 (and FIG. 2) or G1' for prism sheets 58 and 60 in FIGS. 3, 7 and 15 can be set by visual judgment made directly through the prism sheet or it can be made through diffusive layers 28 elevated above them. Critical elevations G1 and G1' can also be set by system-level mathematical calculation. Deciding which is the best approach depends on the way in which output light from the prism sheet or sheets is to be used.

Figure 61A:
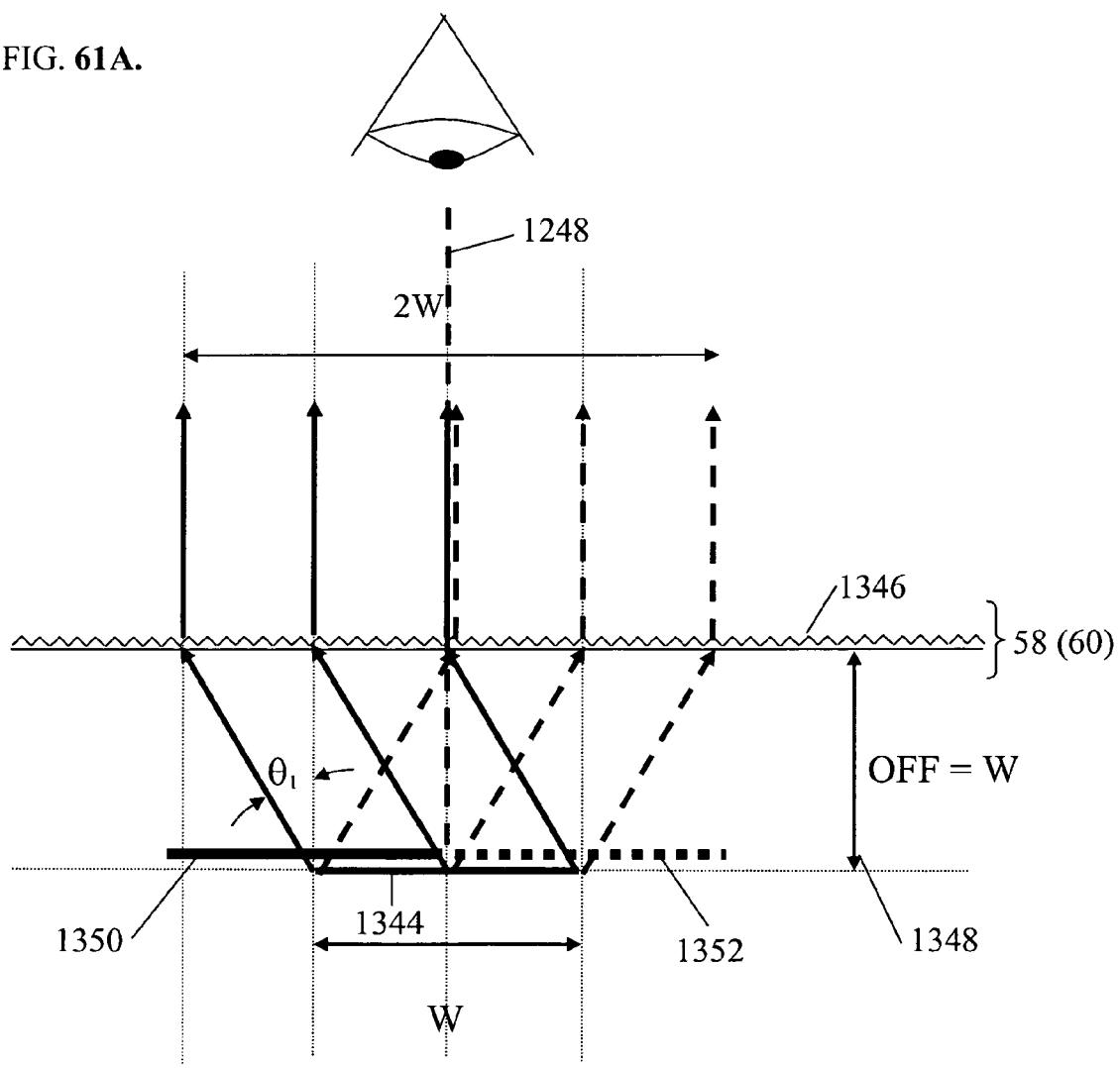
FIG. 61A illustrates a cross-sectional side view of the idealized virtual image-separation that occurs when a single uniform emitting stripe of width W is viewed directly from above through a 90-degree prism array sheet elevated above the stripe a distance W.
Figure 61B:
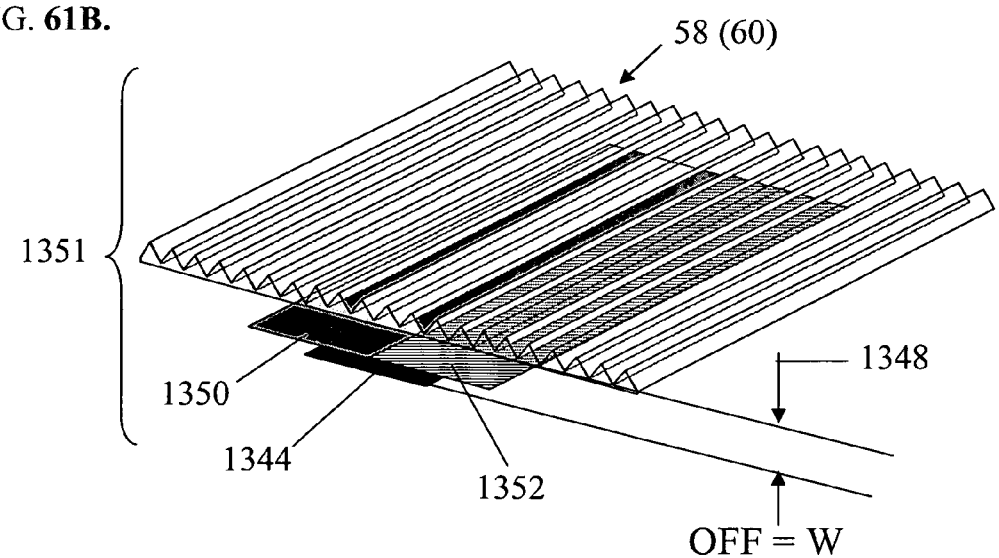
FIG. 61B shows a perspective top view of idealized virtual image-separation depicted in FIG. 61A

The same dichotomy between human viewing and system performance exists as well for micro prisms, as shown in FIGS. 61A–B, which provides a schematic representation of the cross-section of a single micro-scale prism sheet 58 in FIG. 61A and its effect on light emitted from the 7.4 mm wide aperture of a single stripe emitter 1344 (equivalent to 24 in FIG. 1). A three-dimensional perspective view is shown in FIG. 61B. Stripe and prism axes are arranged parallel. The smaller the micro prism 1346 height H, the smaller the internal image displacement distance S (as in FIG. 55). In the limit, the total image displacement with a sufficiently small micro prism array becomes approximately S', as given in equation 34. For convenience in depicting (and modeling) a dense micro array, a single 90-degree prism design has been scaled down from the illustrative 14 mm high prism described above, to a 145-unit array with 0.276 mm prism element base widths that is actually traced. Micro prism elements 1346 are further placed in optical contact with a thin (0.1 mm) planar support substrate 1348 made of the same optical material (e.g. acrylic, n=1.49). This convenient depiction, though 5.5 times larger in scale than 3M's BEF, is actually its functional equivalent with regard to geometry and optical performance. Emitting stripe 1344 may also be thought of as a very dense array of parallel and infinitesimal emitting lines, each of which is separately split and displaced as in FIGS. 55, 57 and 60.

The paraxial theory from the geometry of FIG. 61A–B and represented in equation 35 predicts, that when a uniform emitting stripe of width W is offset from the prism substrate by the equivalent distance 1348, W, a human observer citing along axis 1248 sees two virtual stripe images 1350 and 1352 practically touching each other. The geometry implied by this is what is actually experienced in a real experiment. As one example of this, two sharp pencil lines are ruled parallel to each other and 8 mm apart on a sheet of white paper. For easier viewing, the stripe area between the pencil lines is colored orange. Standard 1 mm thick glass microscope slides are stacked as physical spacers between the plane of the paper and the plane of a single sheet of 3M's BEF, prism grooves aligned parallel to the rule pencil lines. One stack of slides is placed on each side of the stripe to be observed so that the gap between BEF and paper is air rather than glass. With an 8 mm offset between prism array and stripe plane, the virtual images created by the prism sheet appear right beside each other, with about 1 mm (or less) of white space between them. This suggests a small deviation between paraxial theory and the reality occurring when skew rays are taken into account. Perfect registration actually occurs when the offset is made slightly less than the paraxial approximation, which is confirmed both experimentally and by full ray tracing. Direct view along 1248 shows what appears to be a single orange stripe of width 2W.

$$OFF_{Paraxial} = \frac{W}{2\tan\theta_1} \quad (35)$$

Figure 62:
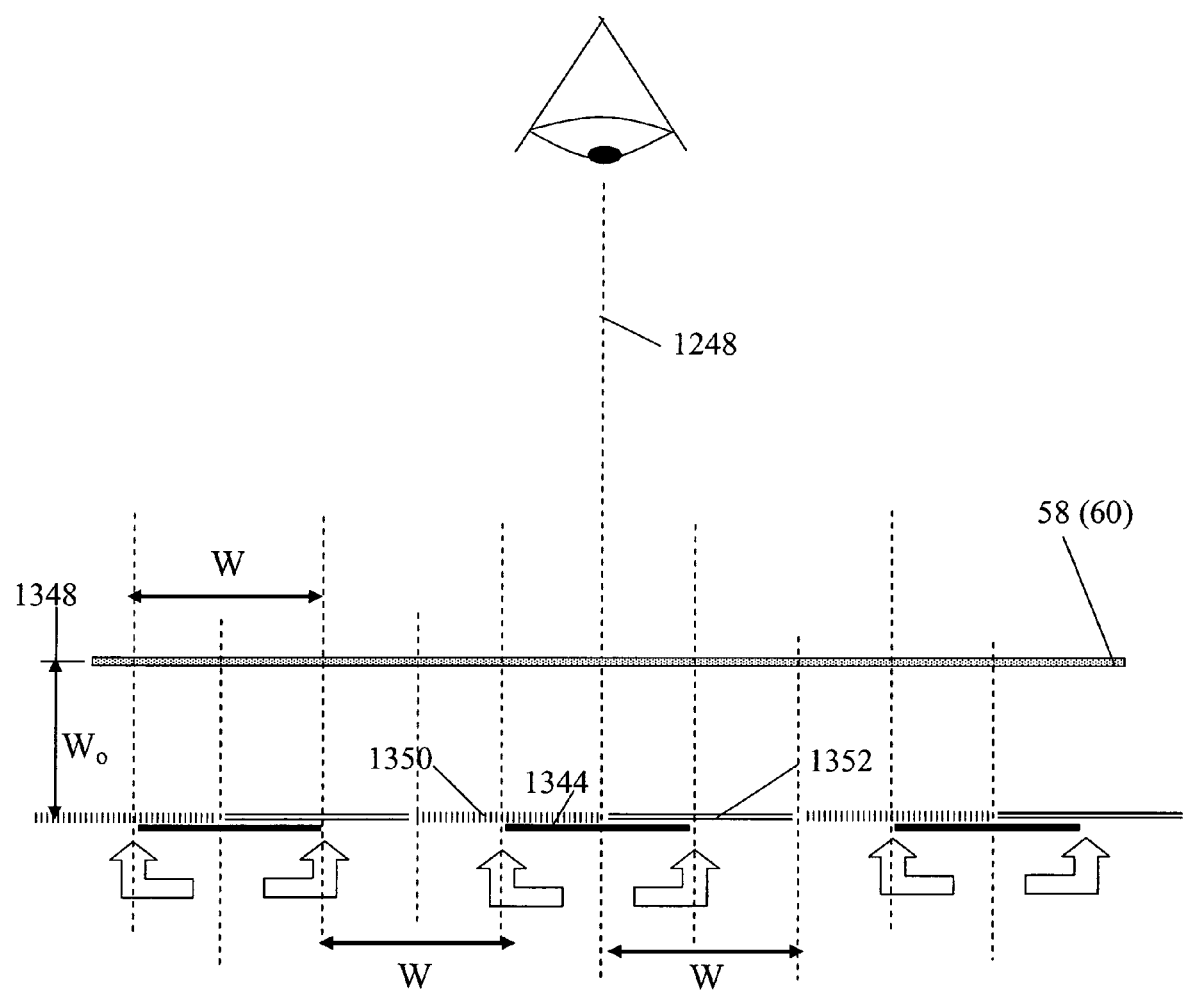
FIG. 62 illustrates an idealized cross-sectional view of the virtual image-separations that occur when uniformly bright stripes of width W are viewed directly through the a 90-degree prism array sheet, elevated above the plane of the stripes, as in FIG. 61A, a distance W.

In general then, the ideal offset for the special case of on-axis viewing a uniform stripe emitter directly through a single 90-degree micro prism sheet is just slightly less than the emitter's physical width, W, at least to a first approximation. And, when there is an array of identical stripe emitters, the ideal spacing between them for perfect virtual image registration is also about equal to the width, W, of the constituent emitter. The reason for this, as diagramed schematically in FIG. 62, is that the virtual image of a flat emitter has practically unity magnification. Consequently, each virtual image ideally displaces a distance equal to slightly more than half its width. This means that when the offset between the stripe plane and the prism sheet is just less than W mm, the image displaced W/2 mm to the right from one emitter and the image displaced W/2 mm to the left by the adjacent emitter, can fit together with practically no overlap in the virtual empty space that exists between the two real emitters spaced W/2+W/2 or W apart.

A similar analysis is made for two orthogonal prism sheets 58 and 60 placed above a two dimensional array of emitting squares (as in FIG. 4 and the multi-layer illuminator cases of FIGS. 3, 7 and 15). This is shown schematically in FIG. 63, including for simplicity, just a single emitting square 110, its four shifted virtual images 1356, 1358, 1360 and 1362 (hidden), and the two prism sheets 58 and 60 elevated above the emitting plane the preferred height 1384 (G1'). Each prism sheet 58 and 60 has a passive substrate layer 1372 and 1376, and a layer 1374 and 1378 of parallel prisms. Prism-element geometry limits the angular extent of the output beam 1386 in the axis perpendicular to their respective groove axes. That is, prism sheet 58 limits output light to $+/-\beta_y$ 1392 and prism sheet 60 to $+/-\beta_x$ 1390. As such, output light 1386 appears to originate and project from each of the four virtual images 1356, 1358, 1360 and 1362 (hidden). This arrangement is fundamental to the LED arrays deployed in the inventions of FIGS. 15A–D, and all subsequent application examples. The prism sheets 58 and 60 give forth a directed beam whose cross-sectional uniformity is affected by maintaining proper spacing 1384 between the prism sheets and the emitters. Developing an exact analytical expression for spacing 1384 is complicated by passage of paraxial and skew rays through both a lower 58 and an upper 60 prism-sheet, which creates too many analytical possibilities for refraction and reflection. A simplistic approximation can be made for a skew ray that encounters both a lower and an upper prism element. This situation is described by placing another prism element just beneath element 1220 of FIG. 55. In this arrangement, the output of the first prism element becomes input for the second. Under these conditions, geometric relations for $\theta_1$, $\theta_2$ $\theta_3$, and $_4$ as used above reveal that the lower prism sheet 58 should be spaced about W/2 above the emitting array for contiguous virtual images shown in FIG. 63. Actual experiment (as well as full ray trace analysis) applied for example to 8 mm wide emitting squares exactly 8 mm apart show that the actual spacing is slightly more than W/2 and is closer to 5 mm or 0.625 W.

Figure 63:
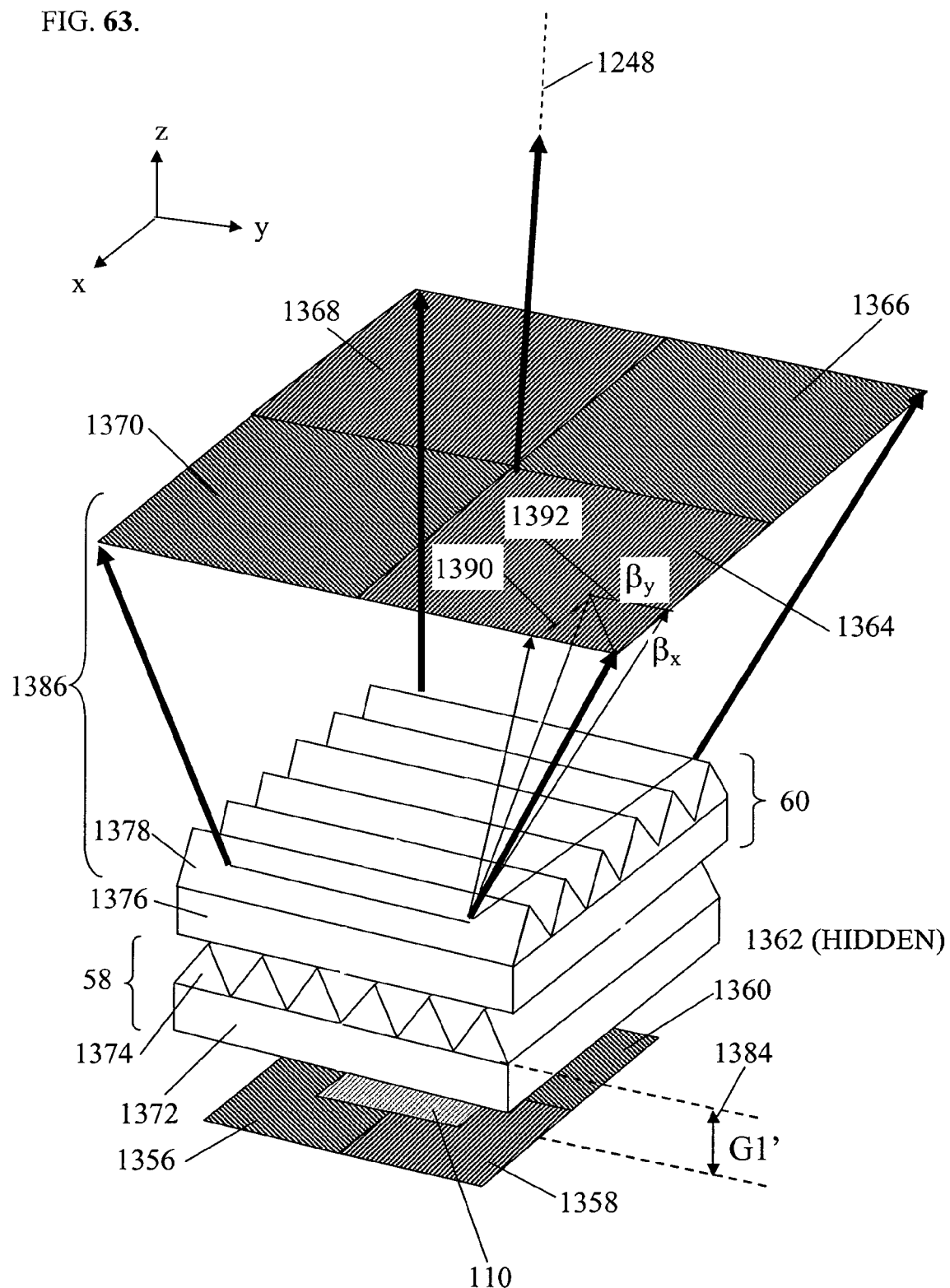
FIG. 63 illustrates a perspective view of the idealized virtual image formations and separations that occur, and the output beam that results, when two 90-degree prism sheets arranged with grooves running 90 degrees to each other are elevated above a square emitting aperture.

The invention of FIGS. 15A–D, as represented functionally in FIG. 63, can be used as a source of illumination to be viewed directly (as, for example in the backlight applications allowed by FIGS. 1–2, the traffic light applications of FIGS. 41A–C, and the potential headlight (or taillight) applications of FIGS. 38A–B), as a source of illumination to be viewed indirectly (as in the projection system examples of FIGS. 17–34 and the backlight applications of FIGS. 47A–B, 48, 49-A–B and 50A–C), and as a source of illumination that provides illuminance on a viewed surface (as in the automotive headlight applications of FIGS. 38A–B, the theatrical lighting applications of FIGS. 39A–B, the roadway lighting application of FIGS. 40A–B, and the task lighting applications of FIGS. 51A–B and FIGS. 52A–F).

When the light source panel illuminators or combinations are viewed indirectly, spatial uniformity is finalized by system elements placed between the viewer and the light source. In each of the projection system applications of FIGS. 17–34, for example, a second stage angle transformer provided output light, every spatial point of which represented an average of all points on the light source aperture. Consequently, any uniformity artifacts caused by the invention of FIGS. 15A–D are diffused significantly by system behavior.

When a viewer is able to see the light source panel illuminators (or combinations) directly, it is preferable to enhance spatial uniformity by their conjunction with conventional diffusers, as in the inventions of FIGS. 1–2. The amount of conventional diffusion used depends on the application.

Figure 64A:
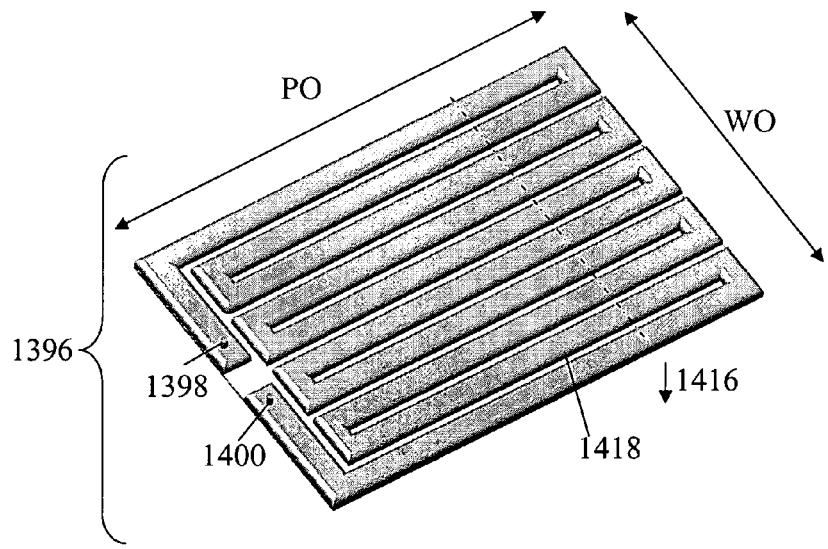
FIG. 64A illustrates perspective view of a representative flat monolithic serpentine fluorescent lamp developed by Corning Inc.
Figure 64B:
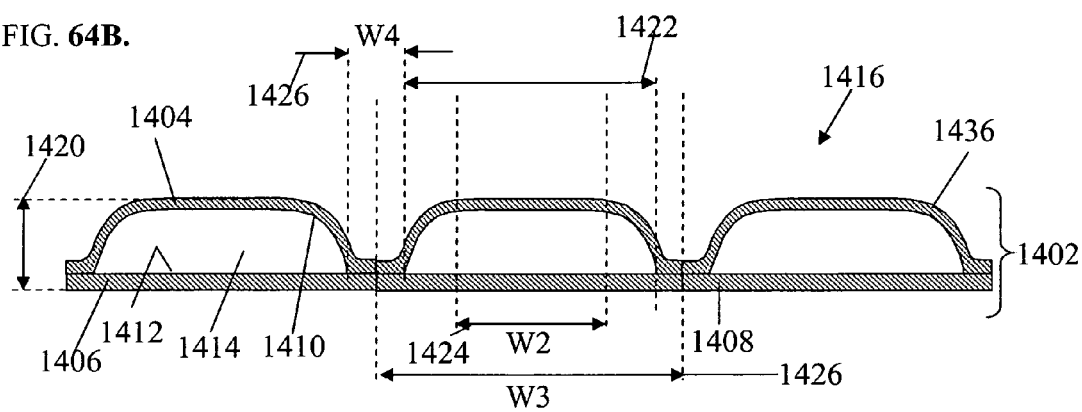
FIG. 64B shows a side cross-section view of the serpentine fluorescent lamp depicted in the perspective of FIG. 64A.
Figure 64C:
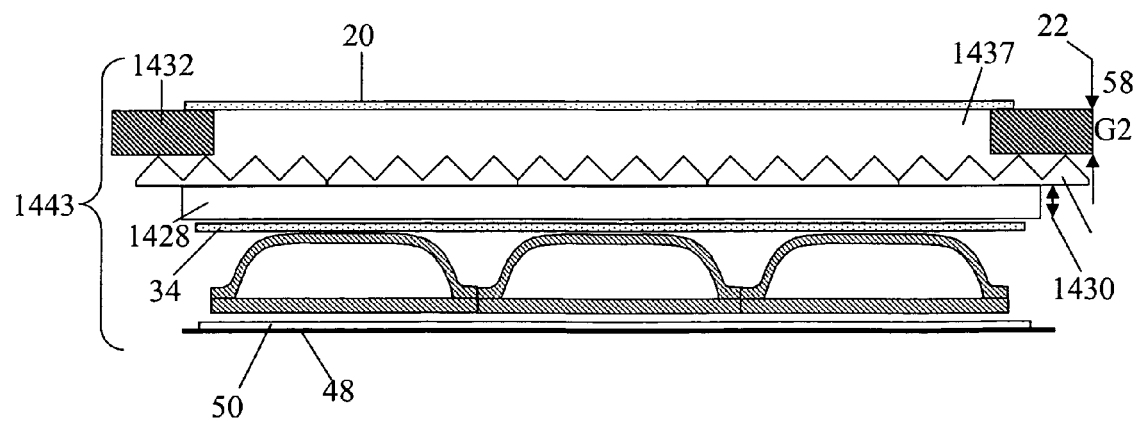
FIG. 64C shows a side cross-section view of the lamp depicted in the side cross-section of FIG. 64C applied with the multi-layered elevated prism sheet configuration of FIG. 1.

AR. Practical Example of Virtual Image Beam Overlap in Serpentine Fluorescent Backlight (FIGS. 64A–C)

Figure 12:
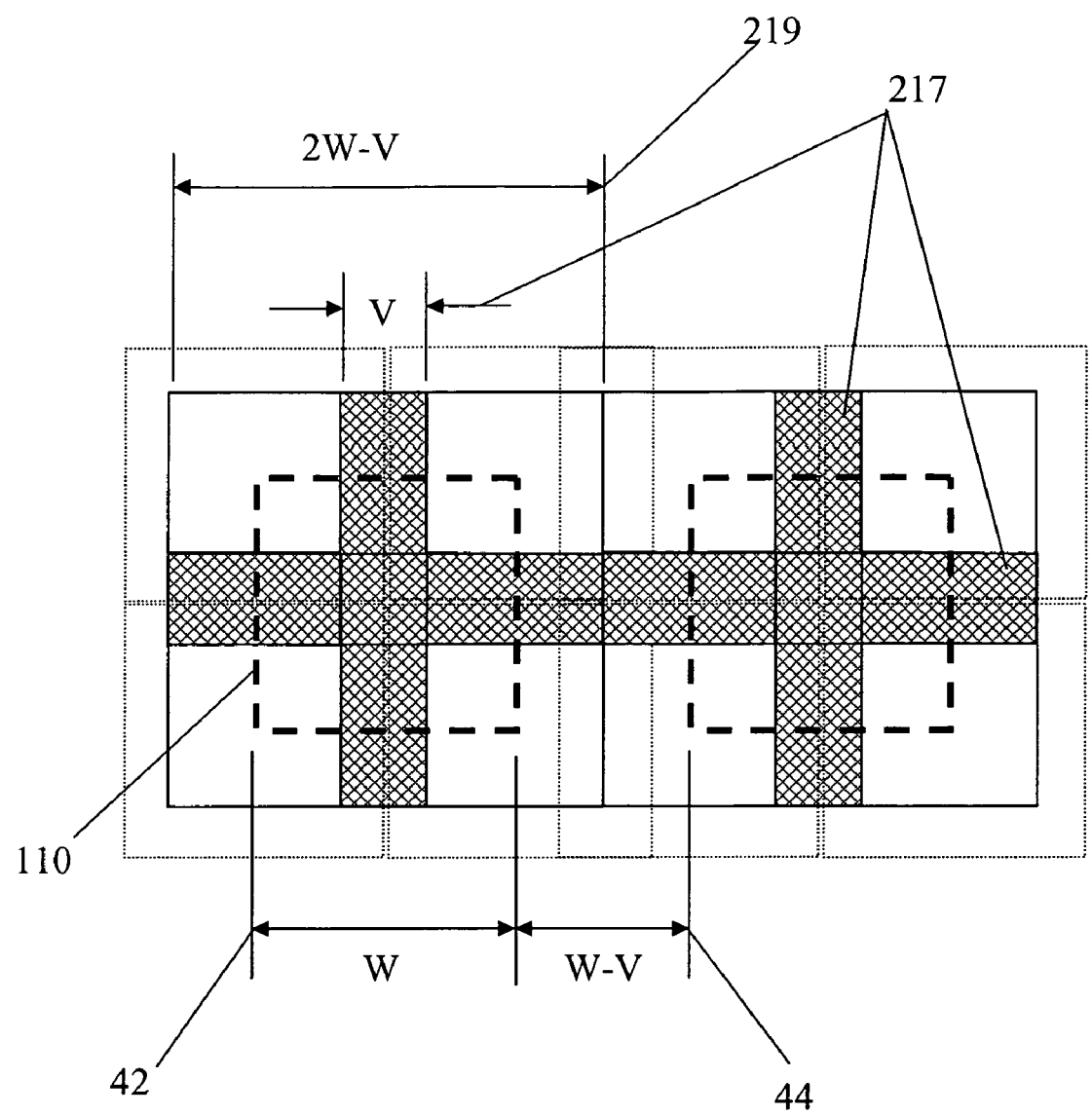
FIG. 12 illustrates for two adjacent emitting regions, each set of four corresponding virtual emitter images and the geometric mathematical relationships allowing for their contiguous arrangement.

All examples of the present invention thus far have concentrated exclusively on cases where the virtual image displacement brought about by prism sheets 58 and 60 were used to achieve a substantially contiguous or nearly contiguous pattern of images, as in FIG. 4 or FIG. 12. Spacing between emitters was made approximately the emitter's width and the elevation of the prism sheets then set for the contiguous or nearly contiguous condition. Not only isn't it always possible to achieve sufficient spatial uniformity by the image displacement mechanism alone, but at times the emitting array used will not have emitter widths and spacings that can be made equal or where its preferable to make them equal.

Under either or both these circumstances, beneficial results are still possible.

One example of this situation is presented by the invention of FIG. 1 applied as an LCD backlight using a new flat fluorescent lamp developed by Corning, Inc. In LCD backlight applications, the viewer always looks directly through the LCD screen at the effective uniformity of the backlight providing the LCD's illumination. Featureless illumination is the performance standard by which most, if not all, backlit image display applications are judged. Meeting this standard typically requires a featureless backlight appearance. One preferable emitter for such backlight applications is a new, flat serpentine, fluorescent lamp shown schematically in FIGS. 64A–C, with FIG. 64A being a top-oriented perspective view, FIG. 64B being a cross-section, and FIG. 64C showing the cross-section of FIG. 64B along with the cross-section of a corresponding embodiment of the present invention. The lamp's perspective view 1396 (FIG. 64A) shows a prototype 10.3"×13.75" glass structure having a continuous hollow channel winding in a serpentine manner in sixteen parallel 12" sections from electrode 1398 to electrode 1400. If unwound as a single straight channel the total running length, electrode-to-electrode would be approximately 18 feet.

The flat fluorescent lamp's cross-section 1402 in FIG. 64B is shown for 3 of the 16 parallel channels. This unique cross-section is formed by Corning Incorporated from a single layer of borosilicate glass that while still molten is folded in half so that the two halves, a molded surface 1404 and a relatively flat surface 1406 seal together cleanly and completely at all common joins 1408 without collapsing the molded structure. The result on cooling is the continuous hollow channel plate shown in perspective 1396. This hollow glass plate is transformed into a fluorescent lamp by coating the interior channel walls 1410 and 1412 with a standard phosphor, adding electrodes, an appropriate gas, a getter, and then sealing under pressure. Matched with a ballast, power supply, and optional impedance conditioning conductors 48, the lamp emits white light through both glass surfaces 1406 and 1404 from its excited phosphor coating. Direct view of the lighted emitting plate is similar to what one would see looking at an array of parallel fluorescent tubes. The spaces 1416 between channels 1418 appear dark, and the overall emitter brightly striped.

The illustrative emitting geometry is shown in cross-section 1402 (FIG. 64B). The lamp thickness 1420, T1, is 7.25 mm. The phosphor-coated channel width 1422, W1, is about 12 mm. Flat section width 1424, W2, is about 8 mm. The horizontal distance between phosphor-coatings 1424, W4, is about 3 mm. The basic repeat distance 1426, W3, for each channel is about 15 mm.

The striped lamp's illustrative geometry 1402 has not been matched to the ideal geometry for the invention of FIG. 1, emitter widths and spacings made equal. Corning, to generate the maximum lumens possible from the lamp's aperture, created channel separations of approximately 3 mm.

Despite this tight emitter spacing, the multi-layer method of FIG. 1 can still be used advantageously to achieve the backlight illuminator performance required. Elevation of prism sheet 58 and the associated emitter image displacements the elevation causes are optimized for the minimum peak-to-valley brightness variation possible with the complex parallel channel emitter cross-sections involved. Then as shown in FIG. 64C, associated diffusion layer 20 is elevated above prism sheet 58 the minimum distance 22, G2, that makes illuminator 1434 (FIG. 64C) appear visually featureless at all angles of view.

Uniformity optimization is possible because of the complex nature of the fluorescent emitting channel's actual brightness profile, which peaks at the center and tapers off across the rounded sections 1436 because of changes in plasma density and coating thickness. In addition, back reflector 50 recovers backside light output by the channels through surface 1406 (FIG. 64B), and scatters it in all forward directions, including the dark spaces between channels. For these reasons, there is an optimum overlap of virtual channel images that can be set by varying the thickness 1430 of spacer layer 1428 as in backlight cross-section 1434 (FIG. 64C).

For this illustrative example, layers 34 and 20 in FIG. 64C are 60-degree×60-degree holographic diffusers manufactured by Physical Optics Corporation (POC), layer 50, a white diffuse reflector manufactured by Kimoto, Inc., layer 58, 90-degree prism sheet with 50 micron wide prisms manufactured as BEF-50 by 3M, layer 1428a 2 mm thick acrylic plate, and gap spacer 1432 made 8 mm in thickness. In addition, there is a 1 mm air gap between layer 50 and lamp 1402.

In this arrangement, output light is observed as being visually featureless at all angles of view, across the LCD backlight's 15" diagonal aperture. On axis brightness measurements fall between 18,000 and 20,000 cd/m2 (nits) depending on lamp efficiency for 12-volts dc and 2.8-amps dc (34 watts) applied to an optimized ballast circuit attached to electrodes 1398 and 1400 as shown in the perspective view 1396 a in FIG. 64A.

With the specific elements used in this example, high viewing brightness is observed over a wide range of vertical and horizontal viewing directions. Brightness exceeds 10,000 cd/m2 over a +/40-degree range, and remains above +/−6,500 cd/m2 over a +/−75 degree range. Still other combinations can be arranged for progressively narrower viewing ranges, with associated increases in viewing brightness.

The narrowest possible illumination range is achieved when single prism sheet layer 58 is replaced by two orthogonal prism sheet layers 58 and 60, as previously described, with thickness 1430 of spacer 1428 reduced accordingly, and output diffuser 20, changed to a narrower range of scattering, such as for example a 30-degree×30-degree or 20-degree by 20-degree holographic diffuser made by POC.

Featurelessness is characterized by the degree of brightness variation that occurs spatially, both over large distances (i.e. about 10 mm to 100 mm) and over small distances (i.e. about 0.5 mm to 10 mm). When there are no visible hot spots, cold spots or shadows discernable anywhere within the viewing field, the result is considered to be featureless. Human vision responds to each scale of brightness variation differently, and featurelessness requires acceptable performance in both regimes. Judgment of featurelessness is a human response best made directly, either by direct viewing through neutral density filters or by a filtered CCD camera. The height (G2) 22 of output diffuser 20 is adjusted until stripe visibility vanishes. In the present example, this occurs when height 22 is about 8 mm. When spacer layer 1428 and prism sheet layer 58 of FIG. 64C are removed, a similar degree of featurelessness is achieved with a total gap spacing of 25 mm, which is about twice the comparable thickness in the present example.

Idealities of prism and prism sheet design are introduced that lead to improved illuminator performance. Prism and prism-like arrays develop virtual source images, and beams emanating from them, whose degree of overlap depends on the prism's elevation above the emitters, which in turn depends on prism geometry and refractive index. As described above, prism sheets with more steeply angled prisms exhibit more image and beam displacement for a fixed prism elevation. Prism sheets with more gradually angled prisms exhibit less image and beam displacement for a fixed prism elevation.

As one example of this for 90-degree prisms and centered output along direction of view 1248 (as in FIG. 55), the critical input angle, $\theta_1$, is 25.3 degrees; with $\theta_3$, 45 degrees; $\theta_4$, 28.33 degrees; and $\theta_2$, 16.17 degrees. When the prism's apex angle is reduced (or increased) from 90 degrees, all angles change accordingly. For example, when the apex angle is reduced to 80-degrees, $\theta_1$ increases to 29.1 degrees, with the effect that there is a larger image displacement at any given prism-film offset than there was with 90-degree prisms. This means that images seen viewing an 8 mm wide stripe through 80-degree prisms register perfectly at a smaller offset than they would with 90-degree prisms. The actual offset needed is 7.14 mm, a gap-reduction of 0.86 mm or 12%, important in applications where greatest possible compactness is sought.

Preferable performance of present illuminator inventions depend on more than the relationship between virtual image displacement and prism elevation, which can be determined for any prism design. Properly elevated for the prism designed, the directional output beam that results must also have a uniform cross-section and an included power that represents a significant fraction of the input light emitted. In most cases of practical interest, beam power needs to be well confined within the beam's effective angular range, nominally +/−β in both meridians, as described above. The less light transmitted outside this range the better, except in some limited flood and task lighting circumstances, when a small amount of wide-angle fill light is often tolerable. In video projector applications in particular, any beam power conveyed outside the maximum permissible illumination angular range is completely wasted.

Prism sheet design variables affecting the illumination beam include the shape and angular inclination of the prism or prism-like facets that make up the prism sheets used, refractive index of the prism medium, and the efficiency of the recycling mechanism used to make a portion of the un-transmittable light, transmittable.

It turns out that the preferable prism geometry for the present inventions is the symmetrical (45-degree-90-degree-45-degree) Porro prism with 90-degree apex angle. Other geometric variations show certain deficiencies in either or both the distribution of output light with angle, and total delivered output power transmitted. Narrower apex angles used with symmetric side angles 23, result in a slightly narrower beam, but also much more significant light transmission at higher angles. Wider apex angles used with symmetric side angles 23 generally widen the beam angle. All geometrical asymmetries achieved with unequal side angles lead to wider, more diffuse beam angles. Similarly, any changes in facet curvature such as the preferable prism like facets of FIG. 53, widen the beam's angular range and soften its angular fall-off.

Beyond this, the prism's refractive index does not show a particularly significant effect on performance. The refractive index of acrylic is about 1.49. Raising prism much beyond this is impractical as it restricts the amount of output light.

The present elevated prism sheet inventions are intended primarily for use with planar or nearly planar emitting arrays such as LEDs and flattened serpentine fluorescent channels. The inventions also apply to arrays of tubular emitters (i.e. standard fluorescent tubes) as a special case. The virtual images of tubular sources, however, develop curved fields, which must be considered properly in their best use. Because of this, the ideal prism sheet elevation differs substantially from the examples with planar emitters.

For tubular emitters of diameter W, the comparable image splitting seen by an on-axis viewer is achieved when the emitting surfaces are separated from each other by a distance that is at least approximately equal to their emitting diameters, W, when the 90-degree prism sheet is elevated above the closest point on the emitting surface by about W/2—rather than by the full emitting width W, as was the case with stripes. The paraxial ray geometry of this curved-surface configuration is examined more carefully in FIG. 65 and FIG. 66.

Figure 65:
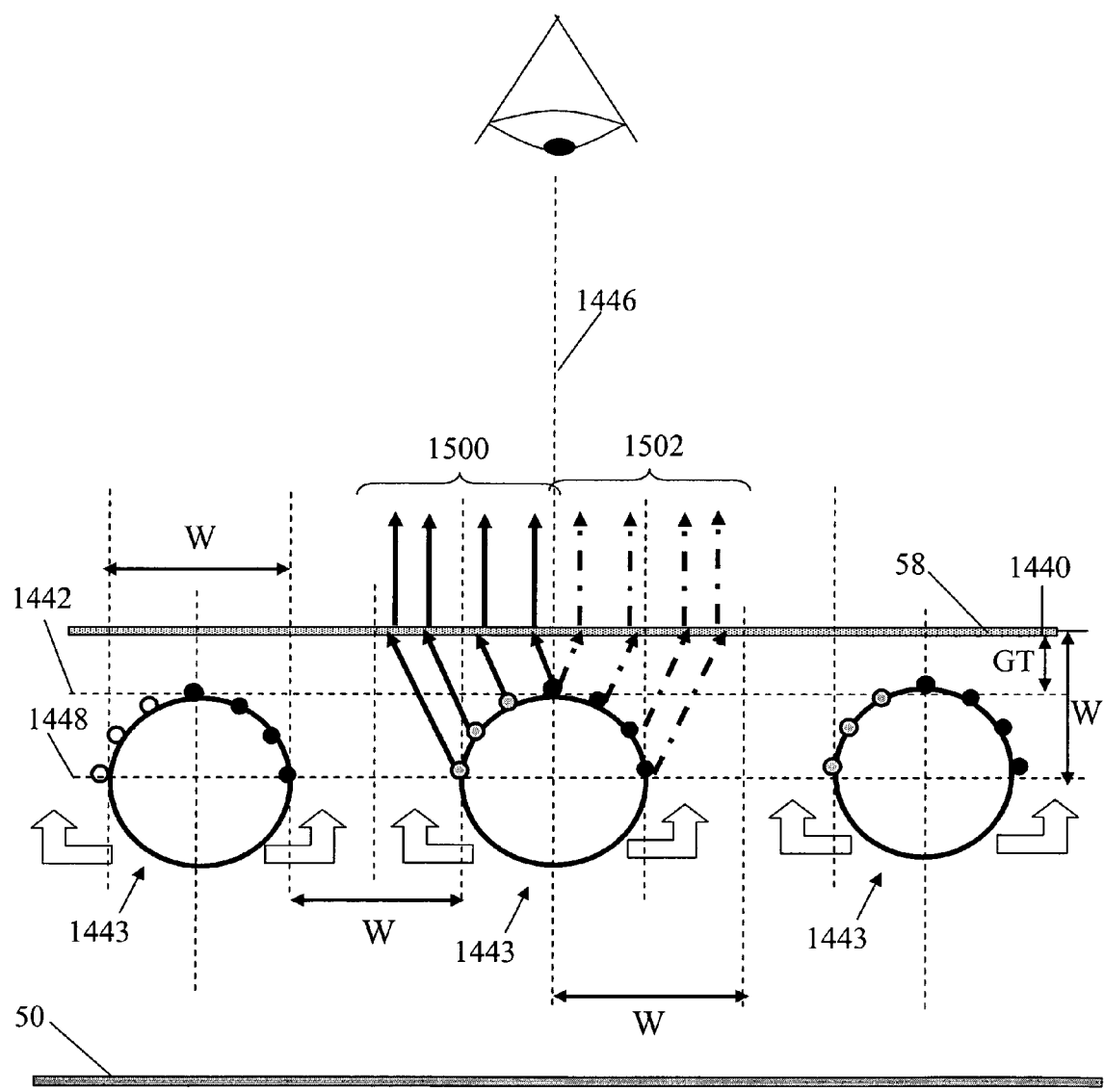
FIG. 65 illustrates a cross-sectional view of the idealized virtual image-separation that occurs when uniformly bright emitting cylinders of width W are viewed directly through the prism points of a 90-degree prism array sheet.

A single prism sheet 58 is shown schematically as elevated distance GT 1440 above the tangent plane 1442 to the circumference of three substantially identical tubular emitting sources 1442 in the cross-sectional view of FIG. 65. Tubular emitters 1444 of diameter W emit light from every point on their circumference and every point along their length, in a Lambertian or near-Lambertian manner. Diffusely reflecting back plane 50 forms the bottom of a box-like container surrounding the emitters 1444, so as to scatter light emitted from the bottom half of each tubular emitter generally towards the gaps between emitters and back though the emitters themselves. Prism sheet 58, prism grooves running parallel to the emitting tube axes, is elevated preferably a distance equal to W/2 above tangent plane 1442 (W above emitter centerline 1448) so that the boundaries between emitted output beams 1500 and 1502 are substantially contiguous as perceived along axis of view 1446.

Figure 66:
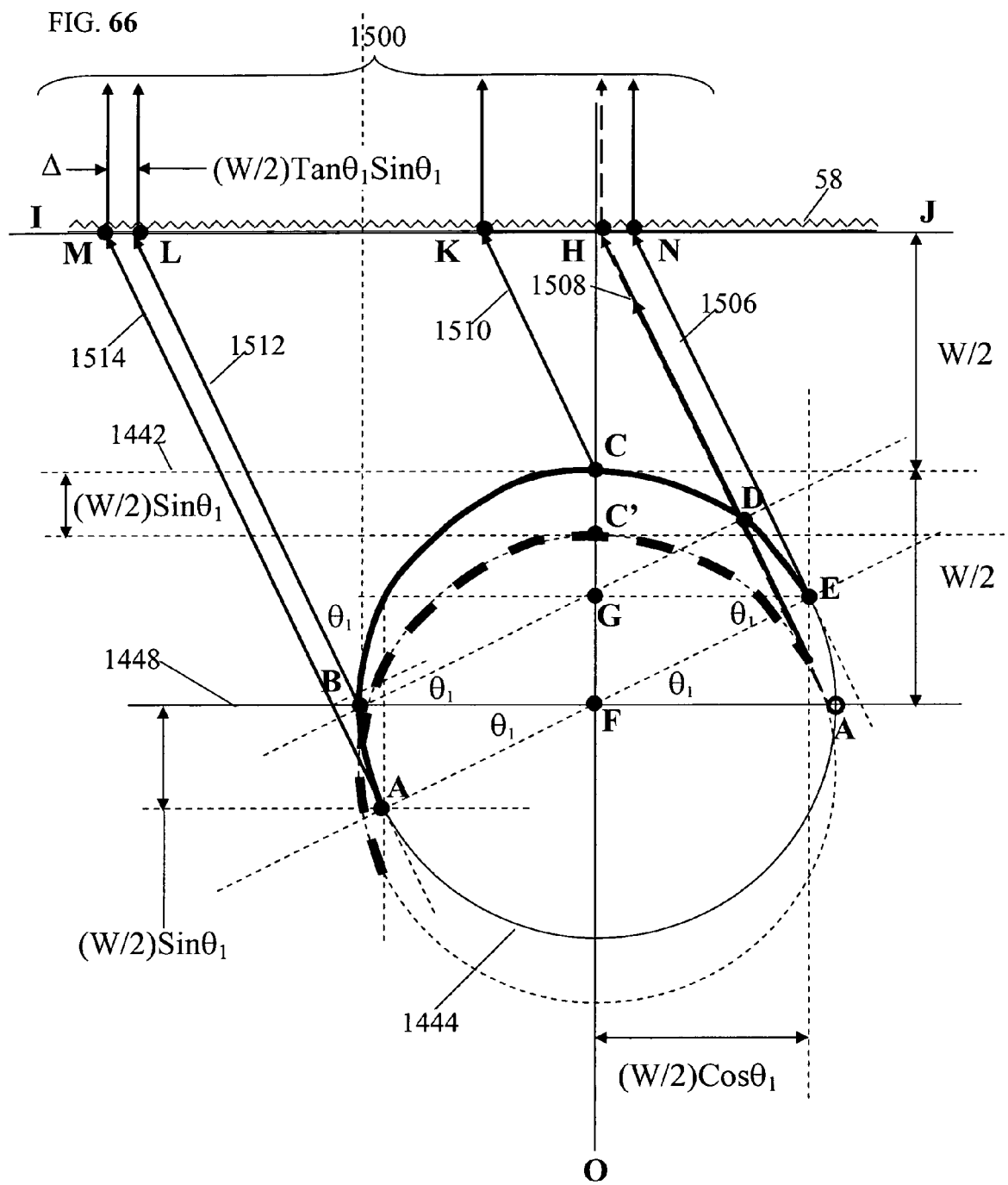
FIG. 66 provides a more detailed cross-sectional analysis of the viewable paraxial rays that emit from the surface of a cylindrical source when viewed directly through the prism points of a 90-degree prism array sheet.

The way elevated prism sheet 58 develops left side output beam 1500 is described more rigorously isolating on the central emitting tube of FIG. 65 in the cross-section of FIG. 66. In this case, the emitting cross-section 1444, in FIG. 66, is centered initially at point F. The 90-degree prism sheet's cross-section is oriented as shown, and situated above the emitter in the plane of line I-J a distance W/2 (W being the emitting width or diameter). The axis of view is along lines parallel to H'-H. The axis of incidence for paraxial rays exiting the prism film along the axis of view is parallel to line K-B, and as developed above, makes an angle, $\theta_1$, with the axis of view, which in this illustrative case of 90-degree prisms is approximately 25.3 degrees. The portion of the emitting surface contributing visible rays to the left hand virtual image, at least theoretically, is highlighted with the thick black line running between surface points A-B-C-D-E, a section covering exactly half of the emitting surface. Effective rays from emitting point A cannot reach a viewer without having to pass through the emitter's interior and crossing a visible part of the emitting surface A-B-C-D-E. Accordingly, the visible portion of the emitter as seen through the prism sheet is not the upper half of the emitter that would be seen under normal circumstances, but rather the portion A-B-C-D-E, that is rotated counterclockwise $\theta_1$ from surface B-C-D-E-A. This means that by citing through the prism sheet, the viewer is seeing effectively around the emitter's horizon point B. The projected width (M-L) of this emitting section, A-B, is (W/2) Tan $\theta_1$ Sin $\theta_1$ or about 0.86 mm for an 8.5 mm diameter cylinder.

The virtual image's entire projected width is W, presuming visually effective paraxial light rays from the entire surface are received. Yet notice at the starting offset between prisms and emitter, which is W/2, that rays from extreme point E on the emitting surface do not reach the emitter's center line, F-H. The implication of this is that there would be an incomplete separation (or overlap) between the left and right side virtual images. The correction for this deficiency would be to increase the offset between the cylinder's vertex point, C, and nearest prism sheet point, H.

This raises a critical design issue regarding specifications for the best output brightness uniformity. If rays E-N, D-H, C-K, B-L and A-M each presented comparable output flux to the axial viewer, then the conditions for perfect left and right virtual image registration at point H would require shifting the emitter's vertex point C downwards and away from the prism sheet an additional distance (W/2) Sin $\theta_1$. If, however, considerably lower flux reaches the viewer from the sections A-B and D-E, where emitted rays approach the points of emitter tangency, A and E, than making this correction could result in an apparent gap between the otherwise adjacent images. This design choice underscores the importance, in general, of understanding the emitter's intrinsic brightness uniformity, and as a function of the angle of view.

A few simple visual experiments using 3M's standard 90-degree prism sheet, BEF, illustrate the importance of understanding, and then correctly compensating for, a tubular emitter's emitting characteristics.

First, a common 8.5 mm diameter artist's crayon is used as an illustrative cylindrical emitter. Any cylindrical object can be used for this purpose, but the readily available crayon is a particularly convenient and graphic one. In this case, the 1 mm glass spacers are placed on top of several adjacent dummy crayons so they will accurately set the air-gap between the 3M BEF-substrate and the top of the crayon under observation—BEF prism grooves running parallel to the edges of the crayon beneath. When the BEF sheet is suspended directly by the spacer crayons (i.e. no glass spacers), the smooth side of the BEF substrate rests exactly on the periphery of the crayon under view (constituting the condition of zero offset). In this case, the image of the viewed crayon appears to have enlarged to a width of about 14.5 mm as a result of its sub-division into two overlapping crayon images having an intermediate 4 mm wide region of apparent overlap symmetric about the line of contact. This central portion of the image appears considerably brighter (and sharper) than the displaced portions.

When adding in five 1 mm spacers on each side, the prism offset increases to 5 mm. At this spacing, the crayon images appear to be approximately 0.5 mm apart along the centerline. An underlying sheet of white or colored paper is used to provide best contrast with the crayon images. Careful observation suggests that the crayon surface-images actually tilt downwards at approximately 45 degrees with respect to each other from their contact along the centerline, and appear as if the originally circular cross-section has been flattened into what looks like a slab. Because of this, the printing on the crayon's paper wrapper can be read as if from a nearly flat rather than curved surface. The visual width of each image, however, appears to have magnified slightly, from the original 8.5 mm diameter to a "flattened slab" of 10.5 mm width. This 1.23× magnification is not predicted by the paraxial ray geometry of FIG. 66, which suggests no magnification. Magnification, and associated image blurring cannot be explained by the normal 2-degree angular acceptance of the human eye, and must be due to the behavior of skew rays.

Aside from the apparent 1.23× image magnification factor, closer examination reveals still more about the nature of the curved image. A paper strip with 1 mm marking lines is applied and taped to the crayon wrapper's circumference. With addition of this scale, and the physical highlighting of the crayon's vertex point, we are able to view the resulting image organization more critically. The paraxial equations predict a vertex point shift of 1.9 mm at an offset of 4 mm. We actually observe, within the accuracy of observation, a shift of about 2.5 mm, which is close to the predicted shift multiplied by the apparent magnification factor. To the right and left of the vertex marking line we can see respectively, four and nine of the 1 mm circumference marking lines taped to the crayon surface, with the last marking line on each side very difficult to visualize without aid of a magnifying glass. The actual crayon circumference between points A and E in FIG. 66 is 13.35 mm. Hence, at least in this case, we seem to be seeing light from practically the entire 180 degrees designated by points A-B-C-D-E in FIG. 66.

The same experiment is performed for purposes of comparison, with a planar stripe. In this case, the stripe is sharply ruled onto a white sheet of paper using two parallel lines 8.5 mm apart. This sheet of paper is then placed on a flat surface and positioned so that the lines run vertically. For clarity, the region between the lines is colored orange. Again, 1 mm glass slides are placed in two equally high stacks, each an inch or so to the left and right of the colored stripe, and both well out of the field of view. The BEF sheet is laid, as before, smooth side down, so as to be suspended, prism points facing the viewer. The film's grooves are oriented so they run parallel to the edges of the underlying stripe. When no glass spacers are used, one sees a single stripe as clearly as if the corrugated prism film were completely transparent. As the number of glass spacers used on both sides of the stripe is then increased, the stripe, as indicated by its total width edge-to-edge, appears to progressively wider. When the stacks are both 8 mm high and the stripe width appears to have almost exactly doubled. Visually, one sees two adjacent stripe images with only a thin (0.5 mm) white gap between them—suggesting that the offset used was just slightly larger than that which would have achieved perfect visual image registration. The brightness of each stripe image, as with the crayon images, appears to be approximately half that of the original stripe. Visual measurements are compared with paraxial calculations based on equations 1–3, and with the results predicted by a faithful computer ray trace model in Table 1, for a set of offset distances.

TABLE 1

The total image width of an 8.5 mm colored stripe as viewed from above through a 90-degree 3 M BEF prism sheet suspended above the stripe by various amounts (Air-Gap): as viewed by eye (Visual), by computer model (ASAP) and by paraxial calculation (Paraxial).

| Air-Gap, mm | Visual, mm | ASAP, mm | Paraxial, mm |
|---|---|---|---|
| 0 | 8.5 | 8.5 | 8.5 |
| 2 | 11.0 | 10.3 | 10.4 |
| 4 | 13.3 | 12.6 | 12.3 |
| 6 | 15.5 | 14.5 | 14.2 |
| 8 | 17.5 | 17.1 | 16.1 |
| 10 | 19.5 | 19.5 | 18.0 |
| 12 | 22.0 | 22.0 | 19.9 |

The commercial ray trace software ASAP™, developed and supported by the Breault Research Organization of Tucson, Ariz., was used to create a dynamic system model comprising one or more wide-angle stripe emitters, a functionally realistic prism sheet and a viewing condition made to approximate that of the human eye.

The results in Table 1 show excellent agreement between the computer model and the visual measurements. The deviation is largest for the smaller offset distances, but never exceeds about 6%. Even the paraxial calculations are quite reasonable up to an offset of 8 mm, and the deviations beyond that never exceed 5–6%.

Figure 67:
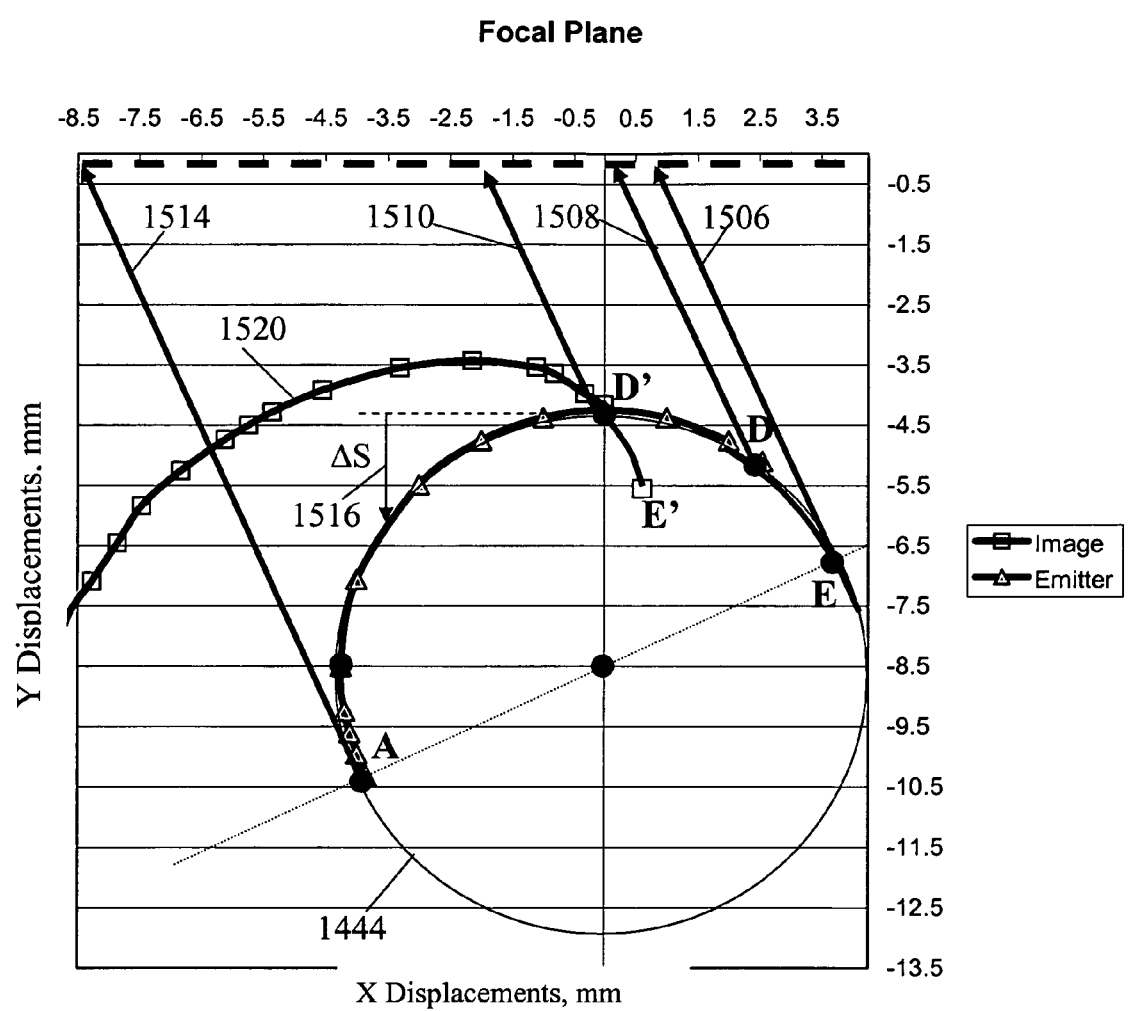
FIG. 67 illustrates a cross-sectional view of the virtual image-separation and focal plane depth in millimeters calculated for paraxial rays when a uniformly bright 8.5 mm emitting cylinder is viewed directly through the prism points of a 90-degree prism array sheet elevated 4.25 mm above the cylinder's vertex point.

One reason why the emitting tube is visualized differently than the emitting stripe when viewing it directly through prism sheet 58 is that the offset between any emitting line along the periphery of the tube and the prism array varies with position, as shown schematically in FIGS. 66 and 67. It is seen in FIG. 66 that physical emission from the emitter's vertex point C appears to have come from spatial point K on prism sheet 58. And with reference to FIG. 68, the origin of such emission appears to come from a curved plane 1520 whose curvature is quite different that that of the physical emitter 1444 itself, and where the distance shifted depends on where on the cylinder the emission actually started. (Note: With the flat emitting stripes, every parallel line within the stripe shifts an identical distance to the left and right for any given air gap.)

The triangular (Δ) points shown on cylinder periphery 1444 of FIG. 67, however, represent the locations of selected emitting lines 1506, 1508, 1510, and 1514 along the surface of the emitter. The exact sag 1516 (ΔS) of each point below the cylinder's vertex point D' is given by the standard mathematical expression reproduced for reference in equation 34 for a surface having a circular cross-section of radius R. In this expression, x is the axis parallel to the plane of the prism sheet base and R for the cylindrical emitting case is W/2. The points designated by squares (θ) represent the focal plane depth of the displaced virtual source image and its spatial shift corresponding to each original emitting point. The curve 1520 drawn through these points should be considered the effective focal plane for the left-hand directly viewed virtual image created under this condition. Emitting lines closer to the edge of the cylinder are shifted a larger distance than are those lines nearer to the cylinder's vertex.

Hence, the way a prism sheet is elevated to homogenize the emitting channel's brightness non-uniformity depends strongly on the cross-sectional shape of the emitter, and then on any brightness non-uniformity over the emitting surface. Standard commercial fluorescent tubes are spatially uniform Lambertian emitters. Some other fluorescent sources, for example, such as the serpentine flattened channels depicted in the perspective view of FIG. 64A, show considerable center to edge brightness roll-off.

$$\Delta S = \frac{(x^2/R)}{1+\sqrt{1-(x/R)^2}} \quad (34)$$

Figure 68:
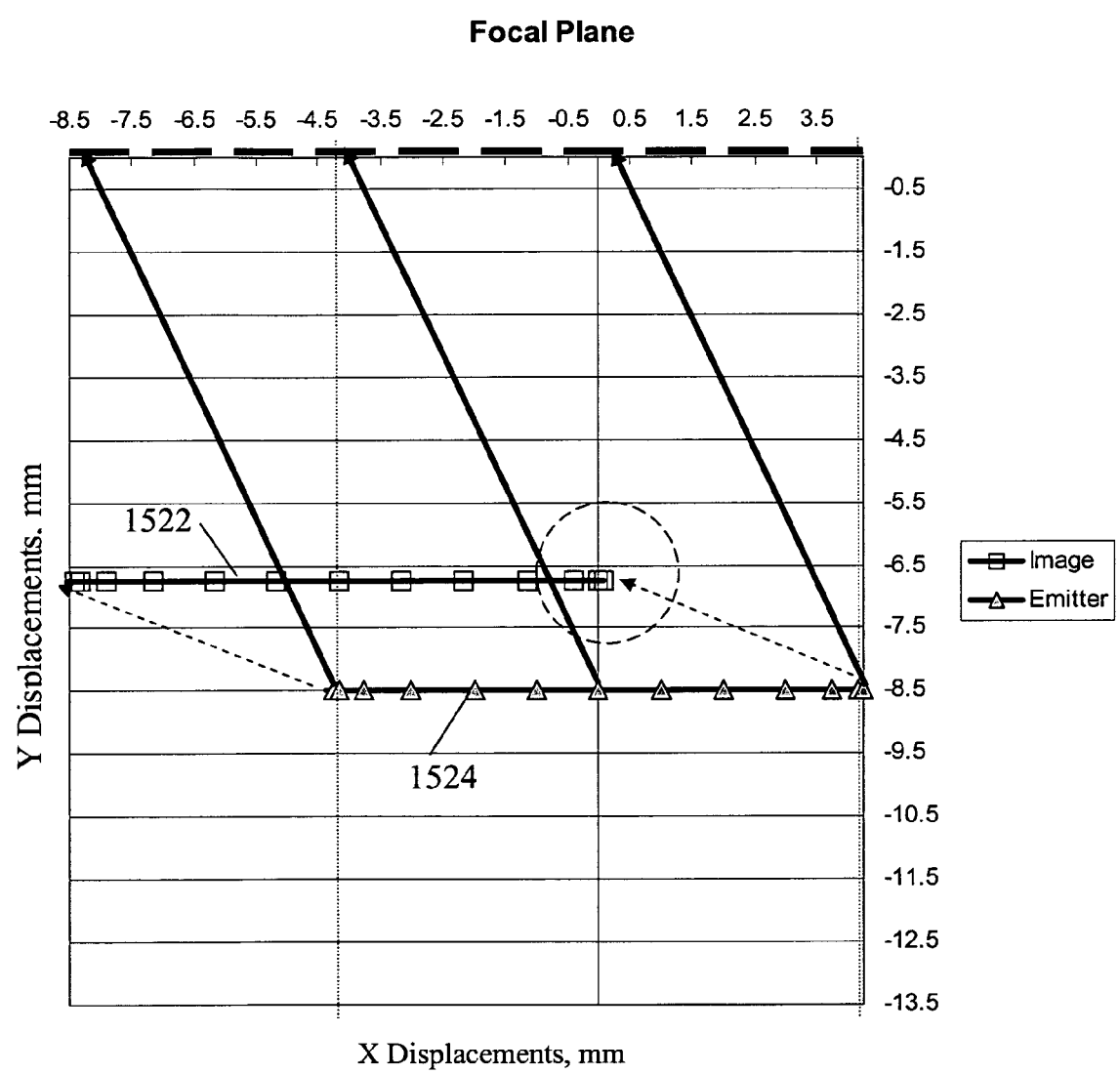
FIG. 68 illustrates a cross-sectional view of the virtual image-separation and focal plane depth calculated for paraxial rays when a uniformly bright 8.5 mm wide stripe is viewed directly through the prism points of a 90-degree prism array sheet elevated 8.5 mm above the stripe's center-point.

A similar representation for the experimentally evaluated 8.5 mm wide emitting stripe is presented in FIG. 68. With prism sheet 58 elevated exactly 8.5 mm above emitting plane 1524, virtual image plane 1522 is formed a little more than 6.5 mm below the prism sheet and a little less than 2 mm above the emitting plane.

The primary reason virtual image separation mechanisms are so important to understand, and correctly set, is that wrongly elevated prism sheets, even by a relatively small percentage, can introduce brightness variations that become as visually distracting to a viewer as the discontinuously emitting light source array viewed directly by itself. Optimally elevated, however, the prism sheets alone can significantly improve visual appearance along their axis of view by a combination of changes to the illumination including magnification, image shifting, image blurring and image overlap, such that the composite effect shows the minimum possible difference between peak brightness and minimum brightness across the viewing aperture for the conditions involved.

Some applications of directly viewed illuminators, however, require what may be termed as featureless uniformity across the illuminator's output aperture. While there is a best overlap of virtual source images created in the present invention by means of exactly elevating the prism sheets above the source, the prism sheet elevation process alone may not produce sufficiently featureless uniformity on its own. There may still be visible brightness variations at the displaced image boundaries.

While the image displacements themselves significantly improve output uniformity, still better results are obtained by filtering output light through one or more additional diffusion mechanisms. Rather than viewing virtual image's focal plane directly through the transparent prism-like layers, direct viewing is preferably accomplished indirectly by looking through one or more diffusively scattering layers that have been elevated above the elevated prism sheet (or sheets), as shown schematically and idealistically in FIGS. 69A–B.

Figure 69A:
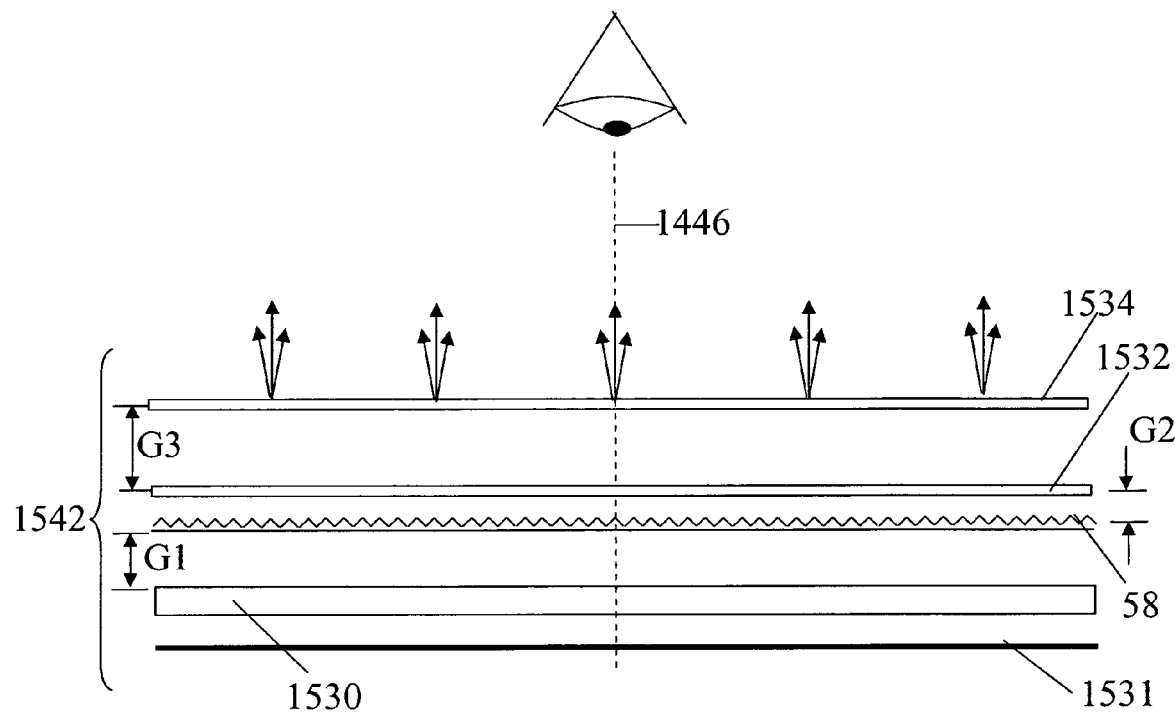
FIG. 69A shows a generalized cross-sectional view of the multi-layer diffuser system application of FIG. 1 and its elevated prism-sheet layer when viewed indirectly through one or more diffusely-scattering layers.

In the generalized schematic cross-section 1542 of FIG. 69A, single prism-like layer 58 is elevated a distance G1 above the discontinuously-emitting light source 1530, followed by two standard diffusers 1532 and 1534, the first elevated a distance G2 above the prism sheet; the second 1534, a distance G3 above the first 1532. This sequential and multi-layered combination of prism sheet and conventional diffusion mechanisms develops improves on the brightness uniformity for a given total diffuser thickness than can be obtained using any conventional diffuser by itself, as shown in cross-sectional detail 1544 where standard light scattering diffuser (or diffusers) elevated a distance G above the same discontinuously emitting light source 1530. In each case plane back reflector is placed beneath the emitter, so as to return any backward emission from the emitters through the gaps between emitters and the emitting channels themselves, establishing the emitting arrays intrinsic brightness variation as one between $B_{MAX}$ and $B_{MIN}$, rather than $B_{MAX}$ and zero. It will be seen that the closer the ratio between $B_{MAX}$ and $B_{MIN}$, the better the overall brightness uniformity achieved by the system of diffusers.

Figure 69B:
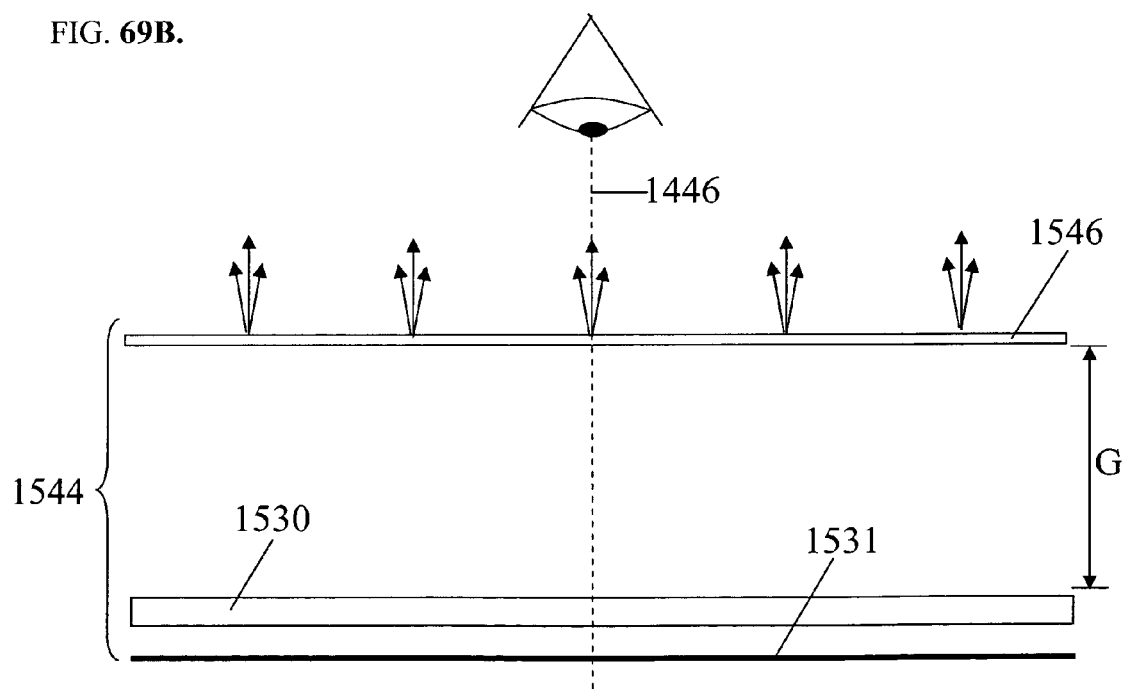
FIG. 69B shows a generalized cross-sectional view of a conventional elevated diffuser system.

Almost any brightness non-uniformity can be minimized to the point of near featurelessness by the standard elevated diffuser method of detail 1544 as shown in FIG. 69B, provided the offset distance, G, between diffuser 1546 and underlying discontinuous emitter 1530 is made large enough, and the diffuser, strongly enough scattering. Under such circumstances, the larger the gap, the more equalized is the number of rays reaching any two small regions on the diffusion plane can become. The present invention's multi-layer combination of elevated prism sheet(s) and conventional diffusion, however, achieves the same visual result, but in a smaller total thickness. The reason this improvement is possible is due to the smoothing action of the elevated prism sheet(s) whose displaced virtual images significantly reduce the peak-to-valley brightness variations to be further minimized by standard diffusion, and they do so with an elevation that is small compared to that elevation which would have been required using standard diffusion alone.

Standard diffuser 1546 is elevated a distance G above a discontinuously emitting reference source 1530, as in cross-sectional detail 1544 of FIG. 69B, until the discontinuous emission has been observed to have become visually featureless. As a simple experiment, the discontinuous source is a series of emitting stripes separated by non-emissive regions equally as wide as the stripes themselves. Although featurelessness is a qualitative judgment, distinctions as to when a striped pattern becomes invisible can be made with acceptable reliably. Instrument measurements of featurelessness are extremely difficult as the peak-to-valley differences in brightness involved can be significantly less than 1%.

At the large offset distance G needed to establish featureless image brightness, the brightness at the maximum and minimum points on the standard diffuser's surface, $B_{MAX}$ and $B_{MIN}$ are each considerably lower than half the undiffused stripe brightness, and ratio $B_{MAX}/B_{MIN}$ is reduced from a very large value at G=0 to less than 1.05 at G=G1.

Specifically, with 8 mm wide windows, 8 mm apart, cut into a thin, opaque, white, diffusely reflecting backlit sheet, we find that the intrinsic $B_{MAX}/B_{MIN}$ is about 15–20 and that in this example $B_{MAX}$ is about 3030 FL everywhere within the stripes. Such an emitter was formed placing the pattern over a very bright and uniform wide-area fluorescent source to generate even emission through the stripes. Stacks of 1 mm thick spacers were used to offset a thin holographic diffuser from this illustrative emitting surface. The output was viewed by eye, and by means of a CCD camera. Brightness measurements were made with a Spectra Scan Model P-640 radiometer.

At an elevation of 8 mm, the emitting stripes were clearly visible, and the gaps between them visibly darker. As the diffuser's elevation increased, the differences between bright and dark regions reduced, but did not disappear. Only when G exceeded 26 mm in this case did the stripes appear to fade to near invisibility. No visual contrast at all was discerned at a diffuser spacing of 28 mm. When two rather than one holographic sheets were stacked together, the diffuser elevation for featurelessness was achieved at 24 mm. All other traditional bulk diffuser materials tried required elevations as large as 32 mm for comparable results. When using a single diffuser layer, the average brightness was 1300 FL. When using two layers, the brightness was 1100 FL.

A multi-level prism sheet system in accordance with the present invention was constructed in accordance with cross-sectional detail 1542 of FIG. 69A, using only a single standard diffuser layer 1534. Prism sheet 58 was first elevated the height G1 above the striped reference source at which the ratio $B_{MAX}/B_{MIN}$ minimized, which for this example was 7.9 mm. Then G3 was progressively increased until the observed output uniformity appeared similar to that obtained with just a standard diffuser. The best result was about 8 mm less than that of the single holographic diffuser layer described above, or about 21 mm in total. This final thickness varied +/−3 mm with the precision used to set the prism-sheet's initial spacing. Such an improvement in over-all thickness can be significant when extended to many of today's flat panel display applications where package slimness is considered an important aspect of market appeal.

Output brightness in this case was about the same as with the standard diffuser, as no effort was made to recover any of the prism sheet's back reflected light.

The output uniformity of a preferably elevated prism sheet is best for on-axis viewing, which in some cases reduces the system's hiding power in off-axis viewing directions. This tendency for reduced off-axis hiding power was effectively eliminated, by adding a relatively weak diffusing layer 1532 in FIG. 69A just above the prism points. Without this extra diffusing layer, the single diffuser elevation had to be increased 4 mm before off-axis viewing was as featureless as on axis viewing. Yet, with a weak diffusing sheet just above the prism points, no extra thickness was needed.

Another perspective on the multi-layer diffuser's advantage over the otherwise well-adjusted configuration. When this was done, the bright and dark bands of non-uniformity reappeared quite strongly. A stack of three standard diffusers was needed at this 13–14 mm spacing to restore featureless viewing.

With the above discussions in mind, we already know enough to reason, qualitatively at least, why in principal the sum W+G2 for this hypothetical multi-level system can be less than the corresponding spacing, G1, for the standard diffusing approach alone—with brightness, B2, of the multi-level approach potentially higher as well.

Suppose, for purposes of argument that the emitter spacing in each case is made exactly equal to the emitting width. We know qualitatively that for a standard diffuser, the smaller the emitter's intrinsic peak-to-valley brightness ratio, the smaller the spacing G that is needed to smooth out the brightness variations to the level desired. We also know that the 90-degree prism sheet, acting by itself, reduces the worst brightness variations by filling in the dark spaces between the emitting ones with symmetrically disposed virtual images of the emitters themselves. And, we know that the closer these virtual images come to registering with each other without any gap or overlap, that the resulting brightness ratio will be significantly better than it was before its transformation. FIG. 68 has already established the focal depth of the virtual images of an 8.5 mm wide stripe as being approximately 6.8 mm below the prism plane or about 0.8 times the emitting width. The spacing of the standard diffuser above the prism sheet, G2, then must only be enough so that when added to the prism sheet's focal depth, FD, there is sufficient overall optical standoff to improve the already-improved brightness distribution to the standard adopted above. Since the prism-sheet, properly elevated, achieves the same (or better) peak-to-valley brightness ratio as a standard diffuser, but does so at a significantly smaller physical standoff (W<<G), it follows that we can expect the total thickness (W+G$_2$B) of the multi-level system to be substantially less than the standard thickness G1.

Generally, the optimum viewing-axis for the illumination provided by elevated prism sheets is perpendicular to the base plane of the prisms. When the viewing direction shifts away from this axis, the preferable virtual image registration achieved with the prism elevation above the source plane deviates from what was intended.

Such directionally sensitive viewing may have little or no importance in some illuminator applications of the present inventions, but can be visually distracting in other applications. A simple design adjustment is introduced with regard to emitter spacing that can be used in applications where the constancy of the illuminator's visual appearance is important, and where the inefficiency and thickness increases caused by adding additional diffusion layers is neither practical nor preferable.

One particularly severe example of this directional variability occurs when emitter spacing has been made exactly equal to the emitter width, and when the prism sheet elevation has been set for perfectly contiguous on-axis virtual image registration. As the viewing direction shifts further and further off-axis, the conditions of perfect image registration are compromised, and associated variations in brightness uniformity introduced, as illustrated in the spatial brightness plot of FIG. 70. In fact, this same kind of spatial brightness instability can be induced when the prism sheet is miss-positioned, whether by human error, material tolerances, or thermal expansions due to changes in ambient temperature. In any of these unintended circumstances, the maximum to minimum brightness ratio presented to the output diffuser may become no better than that of the intrinsic emitter's $B_{MAX}/B_{MIN}$ ratio itself. In such cases, the elevated prism sheet method offers little uniformity advantage over a standard single-level diffuser.

There is, however, a practical means for limiting the severity of such effects. The spacing between emitters is chosen deliberately to minimize the effects of image overlap, whatever the mitigating cause. The most effective spacings range ideally from those less than the emitter width to those less than half the emitter width. The output uniformity with emitter spacing at half the emitter width is illustrated in FIG. 71.

Figure 70:
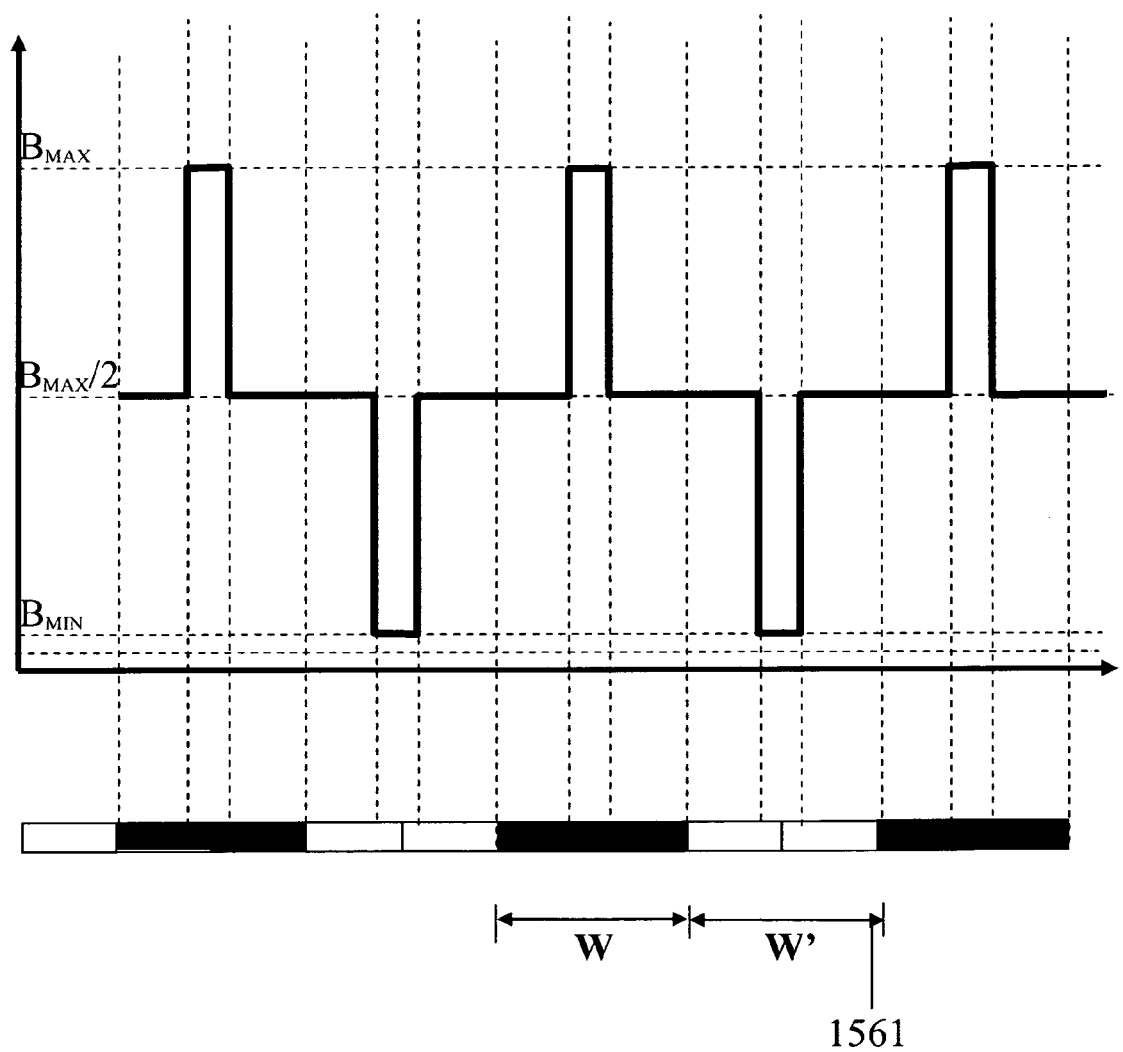
FIG. 70 illustrates one possible off axis brightness uniformity that arises in the multi-layer illumination systems of FIG. 1 when the prism sheet is elevated above the emitting plane a distance exactly equaling the width of emitters.
Figure 71:
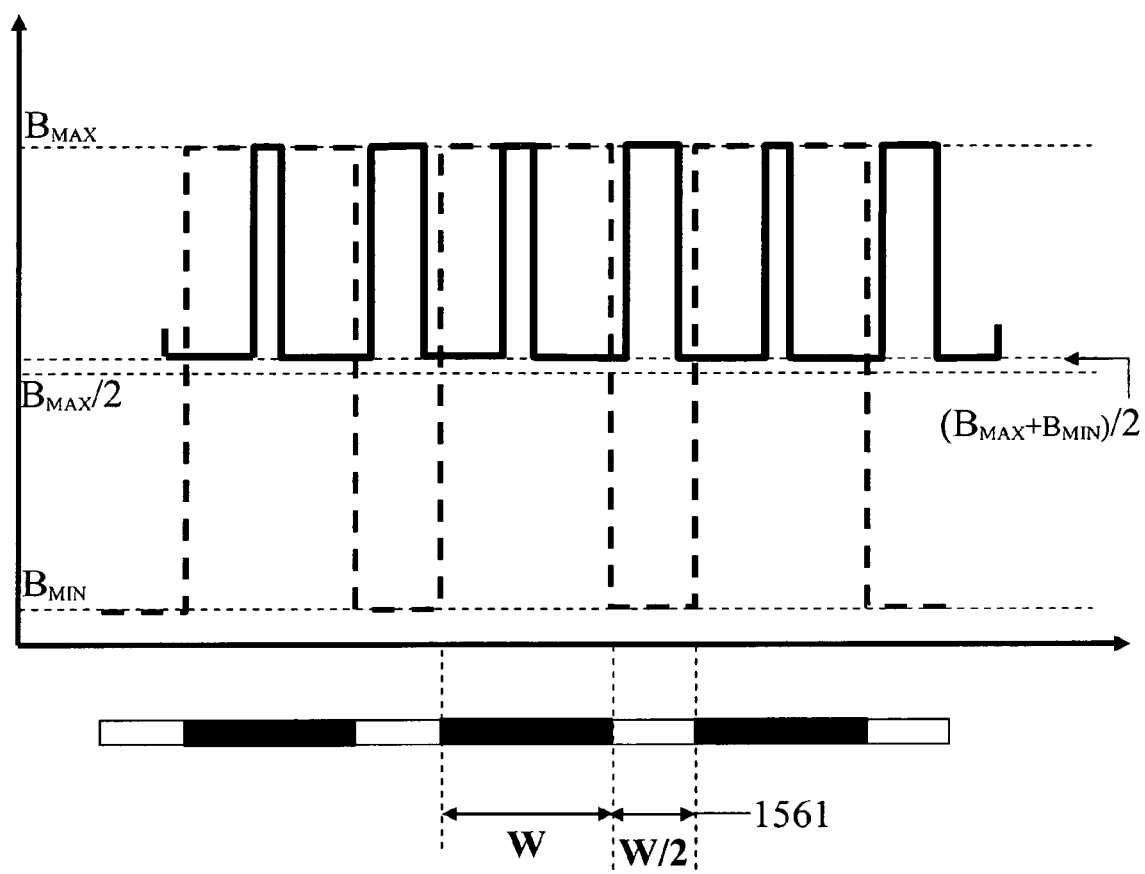

It is the difference in brightness ratio between the examples of FIG. 70 and FIG. 71 that establishes a preference for narrower emitter spacings in applications calling for more directionally independent illuminator viewing. Other applications, such as the video projection systems of FIGS. 17–33, or the indirect LCD backlighting applications of FIGS. 46–50, both providing internal means of the illuminator's brightness homogenization and a single axis of output illumination, can use the elevated prism sheets illumination method without having to take any such extreme measures to stabilize off-axis viewing. This is equally true of general illumination applications in automotive head lighting (FIG. 38), theatrical spot lighting (FIG. 39), roadside lighting (FIG. 40), and interior flood/task lighting (FIGS. 51–52). Yet, for applications like classical LCD backlighting, traffic signals (FIG. 41) and other directly viewed illuminators, including high mount stop lamps on the rear end of automobiles (FIGS. 10C–D), the illuminator's visual appearance from any angle of view is considered an important aspect of its performance.

By moving the emitters closer together than their physical widths W, the virtual emitter images can be made to overlap in the gaps between emitters for some finite distance that provides an effective tolerance against unintended shifts in image displacement, provided they are not so extreme that the overlap is eliminated. Under such conditions, the brightness ratio, $2B_{MAX}/(B_{MAX}+B_{MIN})$, as in the example of FIG. 71, remains constant despite even moderate shifts in the degree of image overlap (and viewing direction) affecting only the apparent spatial frequency of the overlap peaks. A conventional diffuser's hiding power is relatively insensitive to changes in spatial frequency, provided, as in this case, the brightness ratio remains invariant. For such situations, the hiding power of the multi-level system's output diffuser is made just sufficient to handle the reduced brightness variation, which will always be more than half that of the intrinsic emitter.

This emitter spacing illustration also points out the importance of providing as much illumination between the intrinsic emitters as possible, such as for example by back reflector 50 in FIGS. 1, and 64–66, 1531 in FIG. 69 or by means of the fundamental recycling mechanism in prism sheets 58 and 60 and via the diffusely reflective materials placed beneath them. The larger $B_{MIN}$, the larger is the prism sheet's effectiveness in reducing the intrinsic brightness variation. In the worst case, where the emitter has no effective emitting thickness, and very little if any light is contributed between the emitters, $B_{MIN}$ will approach zero, and the resulting brightness ratio will approach 2:1. In most practical emitting arrays, cross coupling between individual emitters, and reflectors below them, will generate appreciable emission between emitting areas, and the resulting brightness ratio internal to the multi-level diffuser will be considerably smaller than 2:1, leading to even more appealing applications.

Provided the emitting array's intrinsic brightness ratio is substantially greater than 2:1, the prism-based multi-level configuration adds value over standard diffusers alone, and does so over a wide range of viewing directions.

So far, the illustrations have centered on emitters (be they LED chips, LED cavities or emitting stripes and tubes) that provide (or can be made to provide) substantially uniform illumination over their entire emitting surface. Very few real life emitters behave quite this ideally. When each emitter element in the array displays a significant brightness variation, such as might exist from its brighter center to its dimmer edges, that variation can have a strong affect on the uniformity established by the prism sheet, and must be accounted for in the choice of prism elevation and the associated image overlap it creates. As an example of this, consider the same intrinsic (one-dimensional) emitter array envisioned in FIG. 71, but with brightness falloff at the edges instead of the previously emitting uniformity. For illustrative purposes, it is assumed that brightness varies as a sinusoid: $B=B_0 \sin K$, where K is the appropriate spatial coordinate. Many real emitters actually show such reduced brightness towards their edges where less flux is emitted for a variety of reasons, including the effects of total internal reflection and longer optical path lengths.

Figure 72:
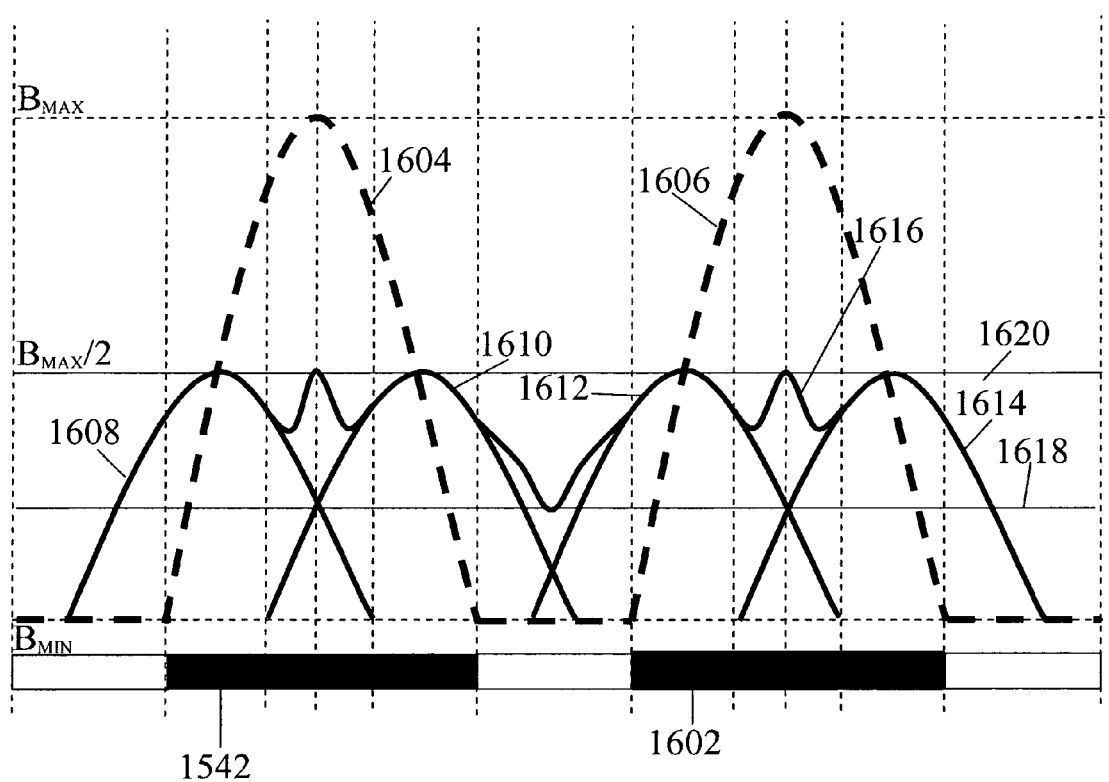

The brightness variation that results from such non-uniformity is idealized in FIG. 72 which shows the conceptual cross-section of two emitting stripes 1600 and 1602, the emitter's brightness profiles 1604 and 1606, and the four overlapping virtual images 1608, 1610, 1612 and 1614 created by elevating prism sheet 58 from the emitting surface. As above, the associated image displacements depend on and are controlled by the exact amount of prism elevation, as well as by the direction of view. Also shown in FIG. 72 is the composite brightness variation 1616 that results from the sum of these particularly overlapping virtual images. This function has two critical brightness values 1618 and 1620 whose ratio determines the amount of hiding power that must be associated with the output diffuser (i.e. 1534 in FIG. 69 or 28 in FIG. 1). As the image displacement changes, for whatever the reason, the composite function changes in response, causing corresponding changes to the effective brightness ratio.

This sinusoidal situation can be represented analytically and generalized to any emitting array characterized by emitters of width W and spacing S, where as the result of an offset prism sheet, there has been a peak-to-peak image displacement of $\Delta$.

The peak brightness of each virtual emitter image, $B_0$, before any transmission loss (or gain) in the prism sheet, is half the brightness of the emitting object, $B_E$, time a normalization factor K ($B_0=KBE/2$). For this example, which relates to a brightness ratio, we will not attempt to calculate the actual brightness levels resulting from K, as it will cancel out. Keeping this in mind, there are two image brightness functions and three key brightness levels in the prism-shifted composite brightness distribution. The virtual image two brightness functions, $B_{VIM-}$ and $B_{VIM+}$, are given in equations 5 and 6, where the parameter, $\Delta$, is the center-to-center shift in millimeters between each set of the two symmetric virtual images associated with each emitter. The origin (x=0) for these functions is taken as the left hand edge of the left hand emitter. One key brightness level is of course the peak brightness of any given virtual image, which is $KB_E/2$. The two other key levels, $B_C$ and $B_G$, are calculated respectively at the center point of one emitter channel (i.e. x=W/2) and at the center point of the gap between adjacent emitter channels (i.e. x=(W+S/2). These two values are then calculated from equations 34 and 35, as equations 36 and 37.

$$B_{VIM-} = B_0 \sin\left[\frac{180(W+\Delta/2)}{W}\right] \quad (34)$$

$$B_{VIM+} = B_0 \sin\left[\frac{180(W-\Delta/2)}{W}\right] \quad (35)$$

$$B_C = 2B_0 \sin\left[\frac{90(W+\Delta)}{W}\right] \quad (36)$$

$$B_G = 2B_0 \sin\left[\frac{90(W+S-\Delta)}{W}\right] \quad (37)$$

The factor of two in equations 36 and 37 results because the brightness of any point on the composite brightness distribution is the sum of the two overlapping virtual image brightness at the same spatial coordinate x.

Given this, the operative brightness ratio for any specific setting of W and S is the maximum value of $B_0$, $B_C$ and $B_G$, divided by the minimum value of $B_0$, $B_C$ and $B_G$.

Using these expressions, the brightness ratio can be explored as a function of the degree of virtual image separation, $\Delta$, for selected sets of W and S.

The reason for examining these relationships analytically is to demonstrate a basis establishing the importance of specific emitter width-to-spacing ratio in obtaining preferable performance with a multi-level diffuser system of the present invention when direct viewing appearance is important. To illustrate this, we first let W=8 mm and examine the effect of image displacement S on the corresponding brightness ratios versus image shifts via equations 34–37, as in the plots of FIG. 73. For reference, dotted line 1622 is drawn on FIG. 73 corresponding to the brightness ratio of 2.0, which is taken as one possible standard for the minimum improvement contributed by the elevated prism sheet illuminating system. In doing this, we also presume that only a single conventional output diffuser 1534 has been spaced G2+G3 mm from the prism sheet 58, as in FIG. 69, so that its view is featureless when the prism's brightness ratio is 2.0 or less. Then, when the emitter spacing is 4 mm (half the emitter's width), we see that the brightness ratio remains below 2.0 despite any change in image shift up to 1.1 mm or +/−0.55 mm from center point. If the emitter separation were only 0.5 mm more, 4.5 mm, the range of stability drops to 0.75 mm or +/−0.375 mm, almost a 50% reduction. Yet, when the emitter spacing is reduced the same amount to 3.5 mm, the associated range of stability rises 30% to 1.45 mm or +/−0.725 mm. When the emitter spacing is halved to 2 mm, a reduction of 100%, the range of stability rises to 2.3 mm, a gain of 100%. Reference to FIG. 24 shows that for W=8 mm, the variation of range of stability with emitter spacing is a roughly linear one.

Figure 73:
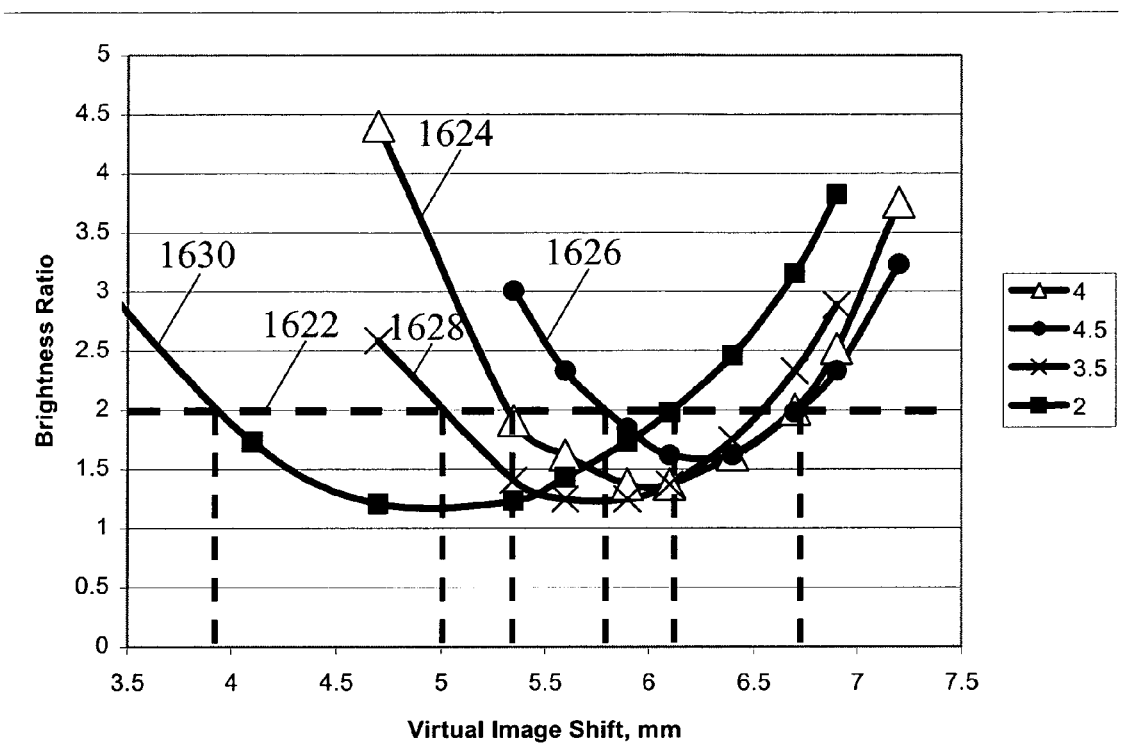
Figure 74:
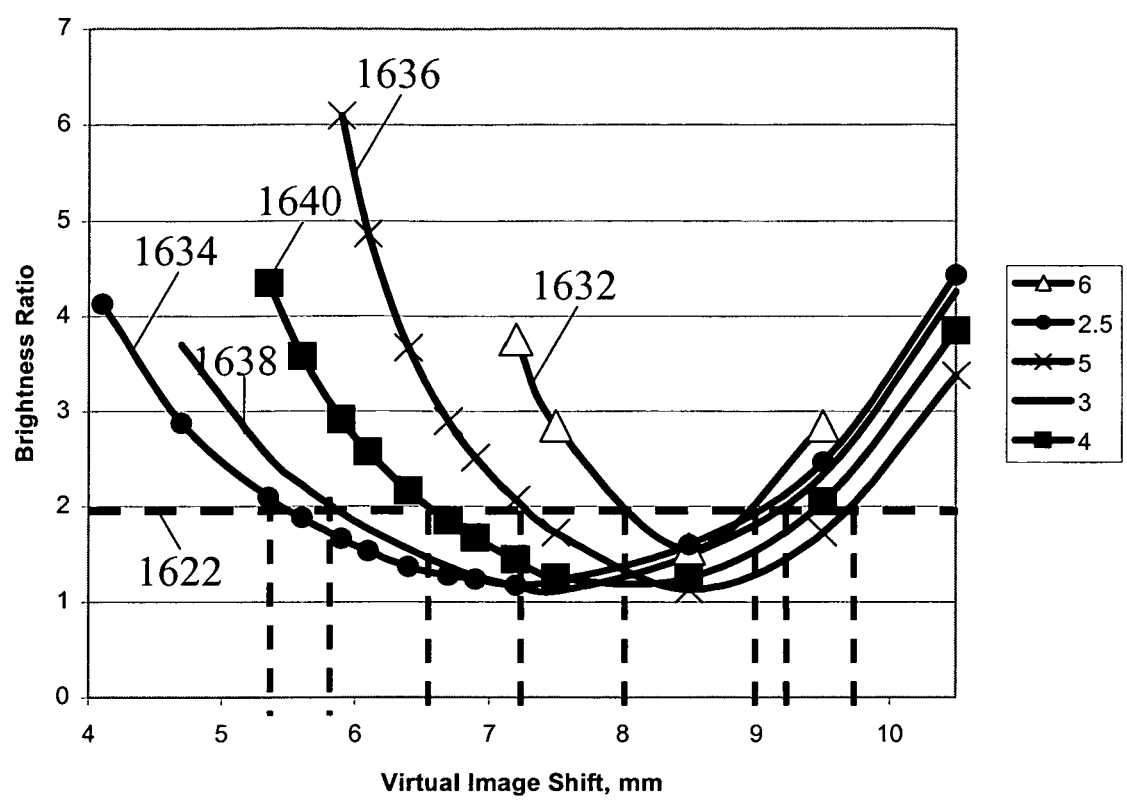

The same analysis is summarized for a 12 mm wide emitter in FIG. 73. These results are compared with those of FIG. 73 in FIG. 75 where the effective brightness ratio is summarized for both emitter widths, but as a function of the common ratio of emitter width to emitter spacing. This comparison shows that multi-level diffuser systems become more stable both as the emitting element is widened and as the gap between emitters is narrowed.

The invention claimed is:

1. An image display system, comprising:
    means for generating image information including a spatial light modulator; and
    a light source system for directly illuminating said spatial light modulator comprised of:
        a one-dimensional array of substantially parallel emitting channels located behind said spatial light modulator, said array having an output area and shape arranged to at least match the aperture size of said spatial light modulator, each channel of said array having an emitting width W defined by the projected length of emitting material enclosed by said channel, as measured perpendicular to the axis of said channel and as viewed from above said array, adjacent of transparent regions of equal intra-channel separation W', with the separation W' being substantially less than the width W and equal to the shortest distance between said emitting material of any one said channel and said emitting material of any adjacent said channel;
        a first light directing layer including a parallel array of at least one of transparent dielectric micro prisms and aspheric semi-cylinders on a transparent substrate, said substrate arranged parallel to an output plane of said emitting channels and between the output plane of said emitting channels and the input side of said spatial light modulator, separated from said emitting channel output plane by an optical distance G1, with the optical distance G1 being less than the width W;
        a second light directing layer disposed between said first light directing layer and said spatial light modulator arranged parallel to and above said first light directing layer by an air-gap of thickness S1, with the thickness S1 being substantially less than W+W', said second light directing layer including one or more of a holographic diffuser sheet, a bulk diffuser sheet, a surface diffuser sheet, a lenticular lens diffuser sheet, and a reflective polarizer film; and
        a light reflecting layer located behind a rear side of said emitting channels a distance Y from a rear side emitting plane, the distance Y being substantially less than the separation W', said light reflecting layer including at least one of a white diffuse reflecting material, a specular reflecting material, a prismatic reflecting material, a structured transparent reflecting material, a bulk diffuser, a holographic diffuser, and a flat substantially transparent substrate.

2. The image display system as defined in claim 1 wherein said spatial light modulator comprises a direct view transmissive liquid crystal display (LCD).

3. The image display system as defined in claim 1 wherein said spatial light modulator comprises a passive alphanumeric appliqué such as found in conventional EXIT signs.

4. The image display system as defined in claim 1 wherein said spatial light modulator comprises a photographic transparency.

5. The image display system as defined in claim 1 wherein said first light directing layer includes a plastic sheet of substantially parallel grooves whose cross-section forms a contiguous array of micro prisms.

6. The image display system as defined in claim 5 wherein said first light directing layer includes a plastic sheet of substantially 90-degree micro prisms, said micro-prisms being about 50 microns center to center.

7. The image display system as defined in claim 1 wherein said first light directing layer includes a sheet of substantially parallel short-focal length plastic cylinder lenses.

8. The image display system as defined in claim 7 wherein said first light directing layer includes a sheet of aspheric plastic cylinder lenses whose cross-sectional shape can be inscribed within a prism whose apex angle is approximately 90 degrees full angle.

9. The image display system as defined in claim 1 wherein said second light directing layer consists of a single holographic diffuser sheet whose output angle specification, when asymmetric, is made widest in the plane perpendicular to the axes of said emitting channels.

10. The image display system as defined in claim 1 wherein said second light directing layer comprises two holographic diffuser sheets positioned at least one of touching each other and separated from each other by an air-gap thickness in the range of 1 to 3 mm.

11. The image display system as defined in claim 1 wherein said second light directing layer includes a reflective polarizer film whose polarization transmission axis has been aligned parallel with the direction of any input polarizers transmission axis that can be coupled to said spatial light modulator.

12. The image display system as defined in claim 1 wherein said emitting channels comprise a hollow, thin-walled structure, made of glass, approximately rectangular in cross-section, and whose inside walls have been coated with a fluorescent phosphor material.

13. The image display system as defined in claim 12 wherein said emitting channels are attached to each other in a continuous serpentine manner by means of short interconnecting channel sections perpendicular to the axis of the interconnected parallel sections.

14. The image display system as defined in claim 12 wherein said emitting channels have substantially equal emitting widths falling between 10 and 15 mm and substantially equal transparent separation regions falling within the range of 1 to 5 mm in width.

15. The image display system as defined in claim 1 wherein said emitting channels are formed within and between two substantially flat transparent plates.

16. An illuminating system comprising:
- a planar array composed of two or more light emitting diode chips, the same substantially identically sized with largest lateral dimension LL, each said light emitting diode chip separated from neighboring chips by a substantially equal center-to-center spacing W+W' being less than or equal to a distance 2 LL;
- a flat mounting plate disposed behind said array of said light emitting diode chips, providing support and electrical interconnection means for said light emitting diode chips;
- a first light redirecting layer of thickness H+G1', disposed above said flat mounting plate, comprising an array of substantially same-sized tapered holes, sidewalls of each said hole slanting outwards from a first opening having first edges of a length greater than or equal to LL, to a second opening having second edges of length W+W', said sidewalls being smooth and reflective, said second openings having said second edges substantially contiguous with one another; and with each said first opening containing at least one of said light emitting diode chips in said planar array;
- a second light redirecting layer comprising a transparent dielectric medium whose top surface contains a regular array of substantially contiguous v-shaped grooves with each groove having a smooth sidewall, substantially equal groove angle, and substantially equal groove depth, said second light redirecting layer disposed a first elevation G1'+H above said array of said light emitting diode chips; and
- a third light redirecting layer disposed above said second light redirecting layer, including at least one of a light scattering diffuser, a quarter-wave phase retardation film, and a polarizer for at least one of absorbing and reflecting light of a first polarization state and transmitting light of a second polarization state orthogonal to said first polarization state.

17. The illuminating system as defined in claim 16 wherein said light emitting diode chips are approximately square with said largest lateral dimension LL lying between 0.2 mm and 3.0 mm on a side.

18. The illuminating system as defined in claim 17 wherein said light emitting diode chips have transparent substrates and both electrical contacts located on a same side of said transparent substrate.

19. The illuminating system as defined in claim 17 wherein said light emitting diode chips are electrically interconnected to said electrical interconnection means on said flat mounting plate.

20. The illuminating system as defined in claim 17 wherein each of said light emitting diode chips in said planar array emits substantially a same color of light.

21. The illuminating system as defined in claim 17 wherein each of said light emitting diode chips in said planar array emits a spectrum of colors approximating white.

22. The illuminating system as defined in claim 16 wherein said light emitting diode chips in said planar array have center-to-center spacing W+W' within a range no less than about 1.5 LL and no greater than about 2 LL.

23. The illuminating system as defined in claim 16 wherein said first light redirecting layer is coated with a highly reflective metallic film.

24. The illuminating system as defined in claim 23 wherein said highly reflective metallic film is at least one of protected silver, enhanced aluminum, and aluminum.

25. The illuminating system as defined in claim 23 wherein said same-size tapered holes are filled with transparent dielectric material of refractive index greater than 1.45 and less than 1.55 at visible light wavelengths.

26. The illuminating system as defined in claim 23 wherein said first light redirecting layer of said thickness H+G1', first edge length greater than or equal to LL of said first opening and said second edge length W+W' of said second opening are interrelated geometrically by said sidewall's slant angle $\alpha$ measured from the normal to the surface of said first light redirecting layer substantially as Tan $\alpha=(W+W'-LL)/(2(H+G1'))$.

27. The illuminating system as defined in claim 16 wherein a spatial distribution of output light emitted from said second light redirecting layer results from overlapping virtual images of said light emitting diodes and said sidewalls of said first light redirecting layer.

28. The illuminating system as defined in claim 27 wherein said second light redirecting layer contains prismatic brightness enhancement film, whose equal groove angles are nominally 90 degrees and whose groove depths are generally in the range between 15 microns and 25 microns.

29. The illuminating system as defined in claim 27 wherein said smooth sidewalls have equal groove angles lying between 85 and 110 degrees.

30. The illuminating system as defined in claim 29 wherein said transparent dielectric medium is made free of birefringence effects.

31. The illuminating system as defined in claim 16 wherein said third light redirecting layer is composed of two sub-layers, the first sub-layer being a quarter-wave phase retardation film and the second sub-layer being a reflective polarizing film.

32. The illuminating system as defined in claim 31 wherein said first sub-layer is disposed above said second light redirecting layer, and said second sub-layer disposed above said first sub-layer.

33. The illuminating system as defined in claim 31 wherein said reflective polarizing film comprises a DBEF type film arranged to reflect substantially all light in a first linear polarization state and reflect substantially all light in a second linear polarization state.

34. The illuminating system as defined in claim 33 wherein said quarter-wave phase retardation film comprises a stretched polymeric multi-layer, whose optical property converts light beams transmitting through with said first linear polarization state into light with a first circular polarization state and light transmitting through with said second linear polarization state into light with a second circular polarization state, both when said retardation film's polar axis is oriented at 45-degrees to said light beam's plane of polarization.

35. An image projection system comprising:
- a projection lens having an acceptance angle +/−ω;
- a color mixing system having a first, second and third input faces and a single output face, with first second and third light beams of first second and third emitting colors respectively provided to said first, second and third input faces respectively, and then combined as a single output beam of light passing through said single output face, said output beam of light formed as a superposition of said first, second and third input beams;

first, second and third LCD micro-displays having respective first, second and third image apertures of equal rectangular horizontal and vertical edge dimensions H and V;

first, second and third angle transforming sub-systems, each of the sub-systems including at least one of a first, second and third positive lens, a first, second and third concave mirror, a first, second and third polarizing beam splitter, a first, second and third quarter-wave phase retardation layer;

first, second and third planar light source arrays, each said array including an array of equally spaced light emitting diode chips respectively of first, second and third emitting; color, a flat interconnection plate, an array of hollow bins having tapered specularly-reflecting sidewalls, first and second light redirecting layers, a quarter-wave phase retardation film and a polarization-selective reflector, with each said hollow bin disposed about each of said light emitting diode chips, said first and second light redirecting layers disposed above said array of hollow bins; and said projection lens focused on each said rectangular image aperture, said first, second and third angle-transforming sub-systems collecting input illumination from said first, second, and third planar light source arrays, respectively, each over an equal input angular range $+/-\beta$, said first, second and third angle-transforming sub-systems functioning to convert respectively said first, second and third input illumination each from angle $+/-\beta$ to first, second and third light beams of first, second and third output illumination angle $+/-\omega$, while simultaneously redirecting said first, second and third light beams respectively to said first, second and third image apertures of said first, second and third LCD micro-displays.

36. The image projection system of claim 35 wherein said first, second and third LCD micro-displays comprise transmissive elements each located at said first, second, and third input faces of said color mixing system and simultaneously at or near the respective first focal planes of said first, second and third positive lenses.

37. The image projection system of claim 36 wherein said first, second and third emitting colors comprise respectively red, green and blue.

38. The image projection system of claim 37 wherein said color mixing system is selected from the group of a dichroic X-cube and a Philips prism arrangement.

39. The image projection system of claim 36 wherein said first, second and third planar light source arrays are disposed respectively substantially in second focal planes of said first, second and third positive lenses.

40. The image projection system of claim 39 wherein said first, second and third positive lenses include at least one of a first glass, a second glass, and a third bulk glass or plastic condensing lens, and a first Fresnel lens, a second Fresnel lens, and a third Fresnel lens.

41. The image projection system of claim 35 wherein said first and second light redirecting layers each comprise an upper surface structured with a contiguous array of similarly v-shaped micro-grooves, a groove axis of said first light redirecting: layer aligned orthogonal to a groove axis of said second light redirecting layer, said v-shaped grooves of said second light redirecting layers disposed above said v-shaped grooves of said first light redirecting layer, and peaks of both said v-shaped grooves facing away from said array of hollow bins.

42. The image projection system of claim 41 wherein said contiguous array of similarly v-shaped grooves is composed of substantially the same groove angle, $\gamma$.

43. The image projection system of claim 42 wherein the angle $\gamma$ between adjacent groove sidewalls is about 90-degrees.

44. The image projection system of claim 43 wherein said contiguous array of similarly v-shaped grooves comprises a prismatic BEF film.

45. The image projection system of claim 41 wherein said projection lens is disposed beyond said single output face of said color mixing system.

46. The image projection system of claim 45 wherein said acceptance angle $+/-\omega$ is $+/-12$ degrees.

47. The image projection system of claim 45 wherein said acceptance angle $+/-\omega$ is greater than $+/-8$ degrees and less than $+/-20$ degrees.

48. The image projection system of claim 41 wherein said first, second and third planar light source arrays each provide the major portion of their illumination within said equal angular range $+/-\beta$, $+/-\beta$ being between $+/-20$ degrees and $+/-40$-degrees.

49. The image projection system of claim 35 wherein said first, second and third LCD micro-displays comprise reflective types of micro-displays and each being located at a first face of said first, second, and third polarizing beam splitters, said first, second and third planar light source arrays each emitting polarized light respectively of said first, second and third emitting colors and disposed at a second face of said first, second and third polarizing beam splitters, said second face being disposed 90-degrees to said first face, a first, second and third mirror set being located at a third face of said first, second and third polarizing beam splitters, said third face being opposite to said second face, and a fourth face of said first, second and third polarizing beam splitters being opposite to said first face and disposed adjacent to said first, second, and third face of said color mixing system.

50. The image projection system of claim 49 wherein said first, second and third LCD micro-displays comprise a liquid crystal on silicon (LCOS) type structure.

51. The image projection system of claim 49 wherein said first, second and third polarizing beam splitters are each formed by two 90-degree glass or plastic prisms joined together with optically transparent adhesive applied to a polarization selective coating deposited or affixed to one prism's hypotenuse face.

52. The image projection system of claim 49 further including a generally cubic hollow frame to support a multi-layer glass or plastic plate occupying its slanting diagonal plane, said multi-layer glass or plastic plate including, in addition to said glass or plastic plate, at least one of a polarization-selective reflector, an absorption polarizer, and an optically transparent adhesive.

53. The image projection system of claim 35 wherein said first, second and third emitting colors are substantially red, green and blue.

54. The image projection system of claim 49 wherein said first, second and third mirror sets comprise said first, second and third concave mirror and said first, second and third quarter-wave phase retardation film, said first, second and third quarter-wave film disposed on a plane facing the mirror surface of said first, second and third concave mirrors, and said first, second and third concave mirrors functioning to focus through said first, second and third polarizing beam splitters onto the aperture planes of said first, second and third planar light source arrays and also onto said aperture planes of said first, second, and third LCD micro-displays.

55. The image projection system of claim 54 wherein said first, second and third concave mirrors include at least one of a metallically-reflecting spherical surface, a metallically-reflecting aspherical surface, a metallically-reflecting Fresnel surface, and having a metallically-reflecting mirror plane disposed behind a convexly-shaped dielectric medium.

56. An illumination system comprising,
a color mixing system having a first, second and third input faces and a single output face, with the mixing system functioning to provide first, second and third light beams of first, second and third emitting colors, respectively, provided to said first, second and third input faces, respectively, and then combined as a single output beam of light passing through said single output face, said output beam formed as a superposition of said first, second and third input beams;
first, second and third planar light source arrays, each including an array of equally spaced light emitting diode chips respectively of first, second and third emitting color, a flat interconnection plate, an array of hollow bins having tapered specularly-reflecting sidewalls with each said hollow bin disposed about each said light emitting diode, a first and second light redirecting layers, said first and second light redirecting layers disposed above said array of hollow bins; and
said first, second and third planar light source arrays each located at said first, second, and third input faces of said color mixing system.

57. The illumination system of claim 56 wherein said first, second and third emitting colors are respectively red, green and blue.

58. The illumination system of claim 56 wherein said color mixing system comprises a group of dichroic reflecting layers arranged on plates, on the required faces of an X-prism cube or on the required surfaces of a Philips prism.

59. The illumination system of claim 56 wherein said first light redirecting layer includes at least one of the following: (a) a sheet of contiguous and substantially equivalent v-shaped grooves, (b) a negative cylindrical lens, (c) a lenticular array of negative cylindrical lenses, and (d) a negative cylindrical Fresnel lens.

60. The illumination system of claim 56 wherein said second light redirecting layer includes at least one of the following: (a) a sheet of contiguous and substantially equivalent v-shaped grooves, (b) a negative cylindrical lens, (c) a lenticular array of negative cylindrical lenses, and (d) a negative cylindrical Fresnel lens.

61. The illumination system of claim 56 wherein said array of equally spaced light emitting diode chips is composed of at least two light emitting diode chips identically sized with largest lateral dimension LL, each said light emitting diode chip separated from neighboring chips by a substantially equal center-to-center spacing W+W', W+W' being less than or equal to 2 LL.

62. The illumination system of claim 61 wherein said light emitting diode chips are approximately square with said largest lateral dimension LL lying between 0.2 mm and 3.0 mm on a side.

63. The illumination system as defined in claim 62 wherein each of said light emitting diode chips has a transparent substrate and both electrical contacts located on a same side of said transparent substrate.

64. The illumination system as defined in claim 62 wherein said light emitting diode chips are electrically interconnected to said flat interconnection plate.

65. The illumination system as defined in claim 64 wherein said flat interconnection plate is made predominately of silicon and contains metallic circuitry electrically insulated from said silicon that provides electrical interconnection means for said light emitting diode chips.

66. The illumination system as defined in claim 56 wherein said array of hollow bins has tapered specularly-reflecting sidewalls, said array having thickness L, said array disposed above said flat interconnection plate, and said array of hollow bins comprising identically sized holes, each of said holes having sidewalls slanting outwards from a first opening having first edges of length LL, to a second opening having second edges of length W, substantially contiguous with one another; with each said first opening containing one said light emitting diode chip in said planar light source array.

67. The illumination system as defined in claim 66 wherein said thickness L, first edges of length LL of said first opening and said second edges of length W of said second opening are interrelated geometrically by said sidewall's average slant angle a measured from the normal to the surface of said first light redirecting layer approximately by the expression $\tan \alpha = (W-LL)/2 L$.

68. The illumination system as defined in claim 66 wherein said hollow bins are filled with a dielectric medium having refractive index n between 1.45 and 1.6 for said first, second and third emitting colors.

69. The illumination system as defined in claim 66 wherein said second edges of length W calculated separately in both X and Y meridians are approximately equal to $LL(n)/\sin \beta$ where $+/-\beta$ is the predominate range of angular illumination in each meridian in air for said first, second and third light beams having said first, second and third emitting colors respectively, and n being the refractive index of the dielectric medium filling each said hollow bin.

70. The illumination system as defined in claim 66 wherein said thickness L is approximately $(W-LL)/(2 \tan \beta')$, with $\beta'=\sin^{-1}(\sin \beta/n)$ where $+/-\beta$ is the predominate range of angular illumination in air for said first, second and third light beams having said first, second and third emitting colors respectively, n being the refractive index of the dielectric medium filling each said hollow bin.

71. The illumination system as defined in claim 56 wherein said hollow bins are filled with a dielectric medium having refractive index n between 1.45 and 1.6 for said first, second and third emitting colors.

* * * * *

UNITED STATES PATENT AND TRADEMARK OFFICE
CERTIFICATE OF CORRECTION

PATENT NO. : 7,072,096 B2
APPLICATION NO. : 10/319800
DATED : July 4, 2006
INVENTOR(S) : Robert L. Holman and Arthur Cox It is certified that error appears in the above-identified patent and that said Letters Patent is hereby corrected as shown below:

Claim 67, line 32, delete "$\alpha=(W-LL/2\ L$" and insert --$\alpha=(W-LL/2L$--.

Claim 70, lines 47-48, delete "$(W-LL/(2\ Tan\ \beta')$" and insert --$(W-LL)/(2\ Tan\ \beta')$--.

Signed and Sealed this

Nineteenth Day of December, 2006

JON W. DUDAS
*Director of the United States Patent and Trademark Office*